United States Patent
Arayama et al.

(10) Patent No.: US 11,209,582 B2
(45) Date of Patent: Dec. 28, 2021

(54) COMPOSITION, CURABLE COMPOSITION, CURED FILM, NEAR INFRARED CUT FILTER, INFRARED TRANSMITTING FILTER, SOLID IMAGE PICKUP ELEMENT, INFRARED SENSOR, AND CAMERA MODULE

(71) Applicant: FUJIFILM Corporation, Tokyo (JP)

(72) Inventors: Kyohei Arayama, Haibara-gun (JP); Takuya Tsuruta, Haibara-gun (JP); Yuki Hirai, Haibara-gun (JP); Kazutaka Takahashi, Haibara-gun (JP); Tokihiko Matsumura, Haibara-gun (JP); Suguru Samejima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 617 days.

(21) Appl. No.: 16/108,290

(22) Filed: Aug. 22, 2018

(65) Prior Publication Data

US 2018/0356573 A1    Dec. 13, 2018

Related U.S. Application Data

(63) Continuation of application No. PCT/JP2017/006566, filed on Feb. 22, 2017.

(30) Foreign Application Priority Data

Feb. 26, 2016 (JP) .............................. JP2016-035022
Jul. 27, 2016 (JP) .............................. JP2016-146953
Feb. 9, 2017 (JP) .............................. JP2017-022240

(51) Int. Cl.
*G02B 5/20* (2006.01)
*G02B 5/22* (2006.01)
(Continued)

(52) U.S. Cl.
CPC .............. *G02B 5/22* (2013.01); *C08F 222/28* (2013.01); *C08F 290/12* (2013.01);
(Continued)

(58) Field of Classification Search
CPC ........ G03F 7/0007; G03F 7/028; G03F 7/032; G02B 5/208; G02B 5/22; G02B 5/223;
(Continued)

(56) References Cited

U.S. PATENT DOCUMENTS

2011/0012075 A1    1/2011    Nii et al.
2016/0282531 A1    9/2016    Murayama et al.
(Continued)

FOREIGN PATENT DOCUMENTS

JP    2003-171574 A    6/2003
JP    2009-29952 A     2/2009
(Continued)

OTHER PUBLICATIONS

Taiwanese Office Action and Search Report for corresponding Taiwanese Application No. 106106016, dated Jul. 2, 2020, with an English translation.
(Continued)

*Primary Examiner* — John A McPherson
(74) *Attorney, Agent, or Firm* — Birch, Stewart, Kolasch & Birch, LLP

(57) ABSTRACT

Provided are a composition that has excellent pigment dispersibility without affecting the color of a pigment in a visible range, a curable composition, a cured film, a near infrared cut filter, an infrared transmitting filter; a solid image pickup element, an infrared sensor, and a camera module. The composition includes: a pigment; a pigment derivative that includes a compound represented by Formula (1); and a solvent, in which $R^1$ and $R^2$ represent an aryl
(Continued)

group or the like, $R^3$ to $R^6$ represent a cyano group, a heteroaryl group, or the like, $R^7$ and $R^8$ each independently represent —$BR^9R^{10}$ or the like, $R^9$ and $R^{10}$ each independently represent a hydrogen atom, a halogen atom, an alkyl group, an aryl group, a heteroaryl group, an alkoxy group, an aryloxy group, or a heteroaryloxy group, L represents a single bond or a linking group, X represents an acidic group or the like, m represents an integer of 1 to 10, and n represents an integer of 1 to 10.

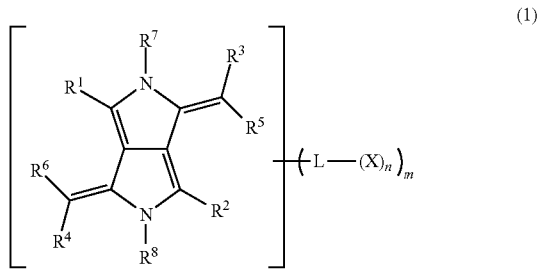

(1)

24 Claims, 1 Drawing Sheet

(51) Int. Cl.
| | |
|---|---|
| C08F 222/28 | (2006.01) |
| C09B 67/22 | (2006.01) |
| G03F 7/032 | (2006.01) |
| G03F 7/00 | (2006.01) |
| G03F 7/028 | (2006.01) |
| C08F 290/12 | (2006.01) |
| G02F 1/1335 | (2006.01) |
| H01L 27/146 | (2006.01) |

(52) U.S. Cl.
CPC ......... C09B 67/0033 (2013.01); G02B 5/208 (2013.01); G02B 5/223 (2013.01); G02F 1/1335 (2013.01); G03F 7/0007 (2013.01); G03F 7/028 (2013.01); G03F 7/032 (2013.01); H01L 27/14649 (2013.01)

(58) Field of Classification Search
CPC .......... H01L 27/14649; C09B 67/0033; C09B 67/0034
USPC .................................................. 430/7, 281.1
See application file for complete search history.

(56) References Cited

U.S. PATENT DOCUMENTS

| | | | |
|---|---|---|---|
| 2017/0010528 A1* | 1/2017 | Takishita | ............ C09B 23/0075 |
| 2017/0012072 A1 | 1/2017 | Tsuruta et al. | |
| 2017/0174869 A1* | 6/2017 | Arayama | ............... G02B 5/223 |

FOREIGN PATENT DOCUMENTS

| | | |
|---|---|---|
| JP | 2009-263614 A | 11/2009 |
| JP | 2011-246649 A | 12/2011 |
| JP | 2012-78396 A | 4/2012 |
| JP | 2015-163955 A | 9/2015 |
| JP | 2015-200878 A | 11/2015 |
| WO | WO 2016/035695 A1 | 3/2016 |
| WO | WO 2015/166779 A1 * | 11/2018 |

OTHER PUBLICATIONS

Japanese Office Action for Japanese Application No. 2018-501732, dated Aug. 6, 2019, with an English translation.
International Preliminary Report on Patentability; English Translation of Written Opinion of the International Searching Authority, dated Aug. 28, 2018, issued in PCT/JP2017/00656 (Forms PCT/IB/373 and PCT/ISA/237).

* cited by examiner

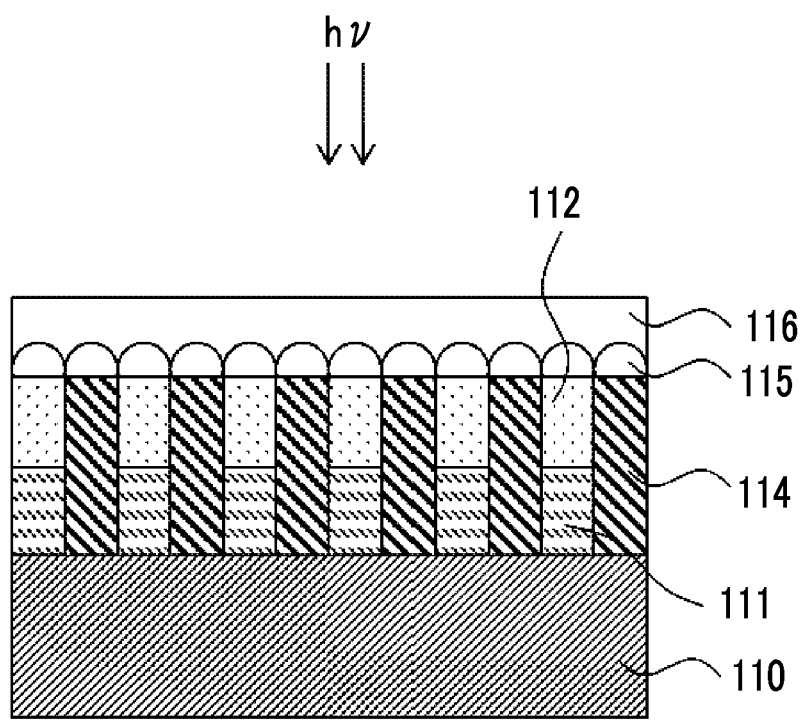

COMPOSITION, CURABLE COMPOSITION, CURED FILM, NEAR INFRARED CUT FILTER, INFRARED TRANSMITTING FILTER, SOLID IMAGE PICKUP ELEMENT, INFRARED SENSOR, AND CAMERA MODULE

CROSS-REFERENCE TO RELATED APPLICATIONS

This application is a Continuation of PCT International Application No. PCT/JP2017/006566 filed on Feb. 22, 2017, which claims priority under 35 U.S.C § 119(a) to Japanese Patent Application No. 2016-035022 filed on Feb. 26, 2016 and Japanese Patent Application No. 2016-146953 filed on Jul. 27, 2016, and Japanese Patent Application No. 2017-022240 filed on Feb. 9, 2017. Each of the above application(s) is hereby expressly incorporated by reference, in its entirety, into the present application.

BACKGROUND OF THE INVENTION

1. Field of the Invention

The present invention relates to a composition, a curable composition, a cured film, a near infrared cut filter, an infrared transmitting filter, a solid image pickup element, an infrared sensor, and a camera module.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to near infrared light is used. Therefore, it is necessary to correct visibility, and a near infrared cut filter or the like is used in many cases. The near infrared cut filter is manufactured, for example, using a composition including a near infrared absorber. As the near infrared absorber, for example, a pyrrolopyrrole pigment is known (for example, JP2009-263614A).

In addition, in order to improve pigment dispersibility in a composition, the use of a pigment derivative has been considered. For example, JP2011-246649A describes a pigment dispersion that includes a pigment and a pigment derivative having a diketo pyrrolo pyrrole skeleton.

SUMMARY OF THE INVENTION

According to the investigation by the present inventors, it was found that the pigment dispersibility is not sufficient in the pigment dispersion described in JP2011-246649A. In addition, the present inventors performed a further investigation on the pigment dispersion described in JP2011-246649A, and found that the color of a pigment (in particular, the color in a visible range) is affected by the pigment derivative and, in the obtained film, the color of the pigment in a visible range is likely to vary.

An object of JP2009-263614A is to provide a high-fastness near infrared absorbing compound and particles that have an absorption in a near infrared range and have excellent invisibility in a wavelength range of 400 to 700 nm without having an absorption. However, JP2009-263614A does not describe a configuration in which a pigment and a pigment derivative are used in combination. Further, JP2009-263614A neither describes nor implies a configuration in which the compound described in JP2009-263614A is used as a pigment derivative.

Accordingly, an object of the present invention is to provide a composition that has excellent pigment dispersibility without affecting the color of a pigment in a visible range, a curable composition, a cured film, a near infrared cut filter, an infrared transmitting filter; a solid image pickup element, an infrared sensor, and a camera module.

As a result of thorough investigation, the present inventors found that the object can be achieved by using a pigment derivative represented by Formula (1) described below, thereby completing the present invention. The present invention provides the following.

<1> A composition comprising:
a pigment;
a pigment derivative; and
a solvent,
in which the pigment derivative includes a compound represented by the following Formula (1),

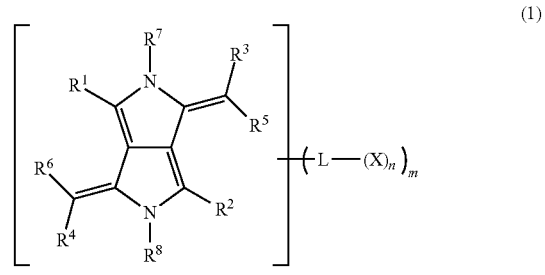

in Formula (1), $R^1$ and $R^2$ each independently represent an alkyl group, an aryl group, or a heteroaryl group, $R^3$, $R^4$, $R^5$, and $R^6$ each independently represent a cyano group, an acyl group, an alkoxycarbonyl group, an alkylsulfinyl group, an arylsulfinyl group, or a heteroaryl group, $R^7$ and $R^8$ each independently represent a hydrogen atom, an alkyl group, an aryl group, a heteroaryl group, —$BR^9R^{10}$, or a metal atom, $R^7$ may form a covalent bond or a coordinate bond with $R^1$, $R^3$, or $R^5$, $R^8$ may form a covalent bond or a coordinate bond with $R^2$, $R^4$, or $R^6$, $R^9$ and $R^{10}$ each independently represent a hydrogen atom, a halogen atom, an alkyl group, an alkenyl group, an aryl group, a heteroaryl group, an alkoxy group, an aryloxy group, or a heteroaryloxy group, $R^9$ and $R^{10}$ may be bonded to each other to form a ring, L represents a single bond, an alkylene group, an arylene group, a nitrogen-containing heterocyclic group, —O—, —S—, —NR'—, —CO—, —COO—, —OCO—, —$SO_2$—, or a linking group including a combination of an alkylene group, an arylene group, a nitrogen-containing heterocyclic group, —O—, —S—, —NR'—, —CO—, —COO—, —OCO—, and —$SO_2$—, R' represents a hydrogen atom, an alkyl group, or an aryl group, X represents an acidic group, a basic group, a group having a salt structure, or a phthalimido group, m represents an integer of 1 to 10, n represents an integer of 1 to 10, in a case where m represents 2 or more, a plurality of L's and a plurality of X's may be different from each other, and in a case where n represents 2 or more, a plurality of X's may be different from each other.

<2> The composition according to <1>, in which X in Formula (1) represents at least one selected from the group consisting of a carboxyl group, a sulfo group, a phthalimido group, and groups represented by the following Formulae (X-1) to (X-9),

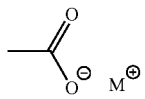
(X-1)

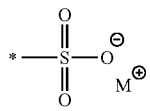
(X-2)

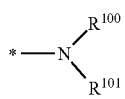
(X-3)

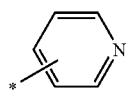
(X-4)

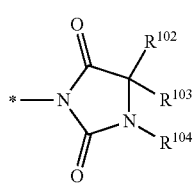
(X-5)

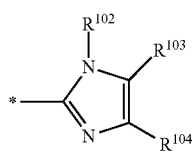
(X-6)

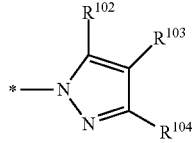
(X-7)

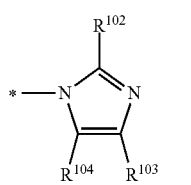
(X-8)

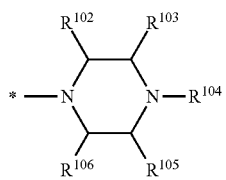
(X-9)

in Formulae (X-1) to (X-9), * represents a direct bond to L of Formula (1), $R^{100}$ to $R^{106}$ each independently represent a hydrogen atom, an alkyl group, an alkenyl group, or an aryl group, $R^{100}$ and $R^{101}$ may be linked to each other to form a ring, and M represents an atom or atomic group constituting an anion and a salt.

<3> The composition according to <2>, in which X in Formula (1) represents at least one selected from the group consisting of a carboxyl group, a sulfo group, and a group represented by Formula (X-3).

<4> The composition according to any one of <1> to <3>, in which the pigment is a compound having an absorption maximum in a wavelength range of 700 to 1200 nm.

<5> The composition according to any one of <1> to <4>, in which the pigment is a compound represented by the following Formula (PP),

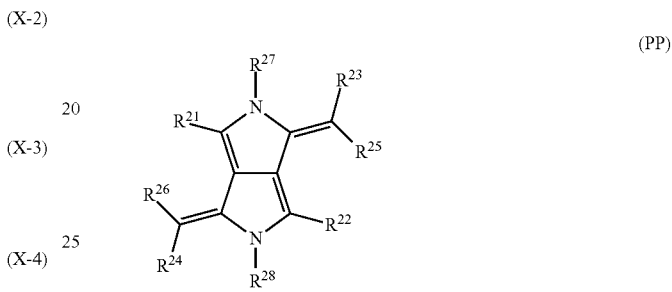
(PP)

in Formula (PP), $R^{21}$ and $R^{22}$ each independently represent an alkyl group, an aryl group, or a heteroaryl group, $R^{23}$, $R^{24}$, $R^{25}$, and $R^{26}$ each independently represent a cyano group, an acyl group, an alkoxycarbonyl group, an alkylsulfinyl group, an arylsulfinyl group, or a heteroaryl group, $R^{27}$ and $R^{28}$ each independently represent a hydrogen atom, an alkyl group, an aryl group, a heteroaryl group, $-BR^{29}R^{30}$, or a metal atom, $R^{27}$ may form a covalent bond or a coordinate bond with $R^{21}$, $R^{23}$, or $R^{25}$, $R^{28}$ may form a covalent bond or a coordinate bond with $R^{22}$, $R^{24}$, or $R^{26}$, $R^{29}$ and $R^{30}$ each independently represent a hydrogen atom, a halogen atom, an alkyl group, an alkenyl group, an aryl group, a heteroaryl group, an alkoxy group, an aryloxy group, or a heteroaryloxy group, and $R^{29}$ and $R^{30}$ may be bonded to each other to form a ring.

<6> The composition according to any one of <1> to <5>, in which a viscosity at 25° C. is 1 to 100 mPa·s.

<7> The composition according to any one of <1> to <6>, in which an average particle size of the pigment in the composition is 5 to 500 nm.

<8> The composition according to any one of <1> to <7>, in which a content of the pigment derivative is 1 to 50 parts by mass with respect to 100 parts by mass of the pigment.

<9> The composition according to any one of <1> to <8>, in which the pigment includes at least two pigments having different absorption maximums.

<10> The composition according to any one of <1> to <9>, in which a solubility of the pigment in the solvent at 25° C. is 0 to 0.1 g/L.

<11> The composition according to any one of <1> to <10>, in which a solubility of the compound represented by Formula (1) in the solvent at 25° C. is 0 to 0.1 g/L.

<12> The composition according to any one of <1> to <11>, further comprising:
a resin.
<13> The composition according to <12>,
in which the resin include a resin having a polycaprolactone structure.
<14> A curable composition comprising:
the composition according to any one of <1> to <13>; and
a curable compound.
<15> The curable composition according to <14>,
in which the curable compound is a polymerizable compound, and
the curable composition further comprises a photopolymerization initiator.
<16> The curable composition according to <14> or <15>, further comprising:
an alkali-soluble resin.
<17> The curable composition according to any one of <14> to <16>, further comprising:
a coloring material that allows transmission of at least a part of light in a near infrared range and shields light in a visible range.
<18> A cured film which is formed by curing the curable composition according to any one of <14> to <17>.
<19> A near infrared cut filter which is formed using the curable composition according to any one of <14> to <17>.
<20> An infrared transmitting filter which is formed using the curable composition according to any one of <14> to <17>.
<21> A solid image pickup element comprising:
the cured film according to <18>.
<22> An infrared sensor comprising:
the cured film according to <18>.
<23> A camera module comprising:
a solid image pickup element; and
the near infrared cut filter according to <19>.

According to the present invention, it is possible to provide a composition that has excellent pigment dispersibility without affecting the color of a pigment in a visible range, a curable composition, a cured film, a near infrared cut filter, an infrared transmitting filter; a solid image pickup element, an infrared sensor, and a camera module.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described. In this specification of the present application, numerical ranges represented by "to" include numerical values before and after "to" as lower limit values and upper limit values.

In this specification, "(meth)acrylate" denotes either or both of "acrylate" or "methacrylate", "(meth)allyl" denotes either or both of "allyl" and "methallyl", and "(meth)acryloyl" denotes either or both of "acryloyl" and "methacryl".

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, in a chemical formula, Me represents a methyl group, Et represents an ethyl group, Pr represents a propyl group, Bu represents a butyl group, and Ph represents a phenyl group.

In this specification, "near infrared light" denotes light (electromagnetic wave) in a wavelength range of 700 to 2500 nm.

In this specification, a total solid content denotes the total mass of all the components of the composition excluding a solvent.

In this specification, a weight-average molecular weight is defined as a value in terms of polystyrene obtained by gel permeation chromatography (GPC). In this specification, a weight-average molecular weight (Mw) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

<Composition>

A composition according to the present invention includes a pigment, a pigment derivative, and a solvent, in which the pigment derivative includes a compound represented by Formula (1) described below. The compound represented by Formula (1) has excellent visible transparency. In the composition, the pigment and a pyrrolopyrrole skeleton of the compound represented by Formula (1) interact with each other, and an acidic group, a basic group, a group having a salt structure, or a phthalimido group which is included in the compound represented by Formula (1) interacts with another component in the composition. As a result, the pigment dispersibility in the composition can be improved. Therefore, the composition according to the present invention can improve the pigment dispersibility without affecting the color of the pigment in a visible range. Thus, by using the composition according to the present invention, a cured film having an excellent color in a visible range can be formed. In addition, the composition according to the present invention has excellent pigment dispersibility, and thus the thixotropy of the composition can be suppressed to be low. Here, thixotropy refers to a phenomenon in which, when a shear force is applied to fluid, the viscosity of the liquid decreases along with an increase in shear force. In addition, in the present invention, "thixotropy being low" represents that, when a shear force applied to fluid increases, a change in the viscosity of the fluid is small.

It is preferable that a viscosity of the composition according to the present invention at 25° C. is 1 to 100 mPa·s. According to this aspect, the pigment dispersibility is excellent. The upper limit is preferably 50 mPa·s or lower and more preferably 20 mPa·s or lower.

In the composition according to the present invention, It is preferable that an average particle size of the pigment is 5 to 500 nm. According to this aspect, the pigment dispersibility is excellent. The upper limit is more preferably 400 nm or less and still more preferably 300 nm or less. The lower limit is more preferably 10 nm or more and still more preferably 20 nm or more. In this specification, "average particle size" of the pigment denotes the average particle size of secondary particles which are aggregates of primary particles (single crystals) of the pigment. The average particle size of the pigment is a value obtained using a method described below in Examples.

In the composition according to the present invention, it is preferable that the pigment is a pyrrolopyrrole pigment (preferably a compound represented by Formula (PP) described below). According to this aspect, the pigment dispersibility is higher. In addition, in a case where the pigment is the pyrrolopyrrole pigment (preferably the compound represented by Formula (PP) described below), it is preferable that the composition according to the present invention has a small absorption in a visible range. In addition, an average transmittance in a wavelength range of 400 to 650 nm is preferably 80% or higher, more preferably 85% or higher, and still more preferably 90% or higher. In addition, a minimum value of the transmittance in a wavelength range of 400 to 650 nm is preferably 85% or higher, more preferably 90% or higher, and still more preferably 95% or higher.

Hereinafter, each component of the composition according to the present invention will be described.

<<Pigment>>

In addition, the composition according to the present invention includes a pigment. The kind of the pigment is not particularly limited. The pigment may be a pigment having an absorption in a visible range (hereinafter, also referred to as "chromatic pigment") or a pigment having an absorption in a near infrared range (hereinafter, also referred to as "near infrared absorbing pigment").

The chromatic pigment is not particularly limited and for example, a compound having an absorption in a visible range (preferably in a wavelength range of 400 to 650 nm) can be used. Examples of the chromatic pigment include a diketo pyrrolo pyrrole compound, a phthalocyanine compound, a naphthalocyanine compound, an azo compound; an isoindoline compound, a quinophthalone compound, a benzimidazolone compound, and a perinone compound. Specific examples of the chromatic pigment are as follows.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214;

C.I. Pigment Orange 2, 5, 13, 16, 17:1, 31, 34, 36, 38, 43, 46, 48, 49, 51, 52, 55, 59, 60, 61, 62, 64, 71, and 73;

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279;

C.I. Pigment Green 7, 10, 36, 37, 58, and 59;

C.I. Pigment Violet 1, 19, 23, 27, 32, 37, and 42; and

C.I. Pigment Blue 1, 2, 15, 15:1, 15:2, 15:3, 15:4, 15:6, 16, 22, 60, 64, 66, 79, and 80.

As the near infrared absorbing pigment, a compound having an absorption maximum in a wavelength range of 700 to 1200 nm is preferable, and a compound having an absorption maximum in a wavelength range of 700 to 1000 nm is more preferable. In the present invention, it is preferable that the pigment is a near infrared absorbing pigment. The dispersibility of the near infrared absorbing pigment in the composition is likely to deteriorate in many cases, further improvement of the dispersibility is desired, and thus the effects of the present invention can be easily obtained.

Examples of the near infrared absorbing pigment include a pyrrolopyrrole compound, a phthalocyanine compound, a naphthalocyanine compound, a perylene compound, a cyanine compound, a dithiol metal complex compound, a naphthoquinone compound, an iminium compound, an azo compound, and a squarylium compound. Among these, a pyrrolopyrrole compound, a phthalocyanine compound, a naphthalocyanine compound, a cyanine compound, a squarylium compound, is preferable, and a pyrrolopyrrole compound is more preferable. It is preferable that the pyrrolopyrrole compound is a pyrrolopyrrole boron compound. The pyrrolopyrrole compound has excellent near infrared absorbing properties and invisibility. Therefore, a cured film such as a near infrared cut filter having excellent near infrared shielding properties and visible transparency can be easily obtained. In addition, the pyrrolopyrrole compound is a pigment having low dispersibility in the composition. However, according to the present invention, the pyrrolopyrrole compound can improve the pigment dispersibility in the composition such that the effects of the present invention can be more easily obtained. Examples of the pyrrolopyrrole compound include a compound described in paragraphs "0016" to "0058" of JP2009-263614A. As the phthalocyanine compound, the naphthalocyanine compound, the iminium compound, the cyanine compound, the squarylium compound, or the croconium compound, for example, one of compounds described in paragraphs "0010" to "0081" of JP2010-111750A may be used, the content of which are incorporated in this specification. In addition the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

It is preferable that the pigment is the same compound as a mother nucleus structure of the compound (pigment derivative) represented by Formula (1) described below.

In the present invention, it is preferable that at least two pigments having different absorption maximums are used as the pigment. In particular, in a case where the near infrared absorbing pigment is used as the pigment, it is preferable that at least two pigments having different absorption maximums are used. According to this aspect, the waveform of the absorption spectrum of the film is wider than that in a case where one near infrared absorbing pigment is used, and the film can shield infrared light in a wide wavelength range.

In a case where at least two pigments having different absorption maximums are used, it is preferable that the pigments include at least a first near infrared absorbing pigment having an absorption maximum in a wavelength range of 700 to 1200 nm, and a second near infrared absorbing pigment having an absorption maximum in a wavelength range of 700 to 1200 nm which is shorter than the absorption maximum of the first near infrared absorbing pigment, and a difference between the absorption maximum of the first near infrared absorbing pigment and the absorption maximum of the second near infrared absorbing pigment is 1 to 150 nm.

In a preferable aspect, a difference between the absorption maximum of the first near infrared absorbing pigment and the absorption maximum of the second near infrared absorbing pigment is preferably 5 to 100 nm and more preferably 30 to 90 nm. This aspect is suitable for forming a film or the like that can shield infrared light in a wide wavelength range. In addition, in another preferable aspect, a difference between the absorption maximum of the first near infrared absorbing pigment and the absorption maximum of the second near infrared absorbing pigment is preferably 5 to 100 nm and more preferably 20 to 60 nm. This aspect is suitable for forming a film or the like that can selectively shield infrared light in a specific wavelength range. The composition according to the present invention may include three or more near infrared absorbing pigments having an absorption maximum in the above-described wavelength range. In this case, a near infrared absorbing pigment having the longest absorption maximum in a wavelength range of 700 to 1200 nm is set as the first near infrared absorbing pigment, and all the near infrared absorbing pigments having an absorption maximum which is shorter than the absorption maximum of the first near infrared absorbing pigment are set as the second near infrared absorbing pigment. In addition, in a case where two or more near infrared absorbing pigments having the longest absorption maximum are present, these pigments can be considered as the first near infrared absorbing pigment.

A solubility of the pigment in the solvent (25° C.) included in the composition is preferably 0 to 0.1 g/L and more preferably 0 to 0.01 g/L.

In the composition according to the present invention, the content of the pigment is preferably 10 to 60 mass % with respect to the total solid content of the composition. The lower limit is preferably 20 mass % or higher and more preferably 25 mass % or higher. The upper limit is preferably 50 mass % or lower and more preferably 45 mass % or lower.

(Pyrrolopyrrole Compound)

In the present invention, as the pyrrolopyrrole compound, a compound represented by the following Formula (PP) is preferable. The absorption maximum of the colorant represented by Formula (PP) is present preferably in a wavelength range of 700 to 1200 nm, more preferably in a wavelength range of 700 to 1000 nm, still more preferably in a wavelength range of 730 to 980 nm, and even still more preferably in a wavelength range of 750 to 950 nm. The absorption maximum of the compound is designed according to required performance of an optical device such as a solid image pickup element or an infrared sensor described below.

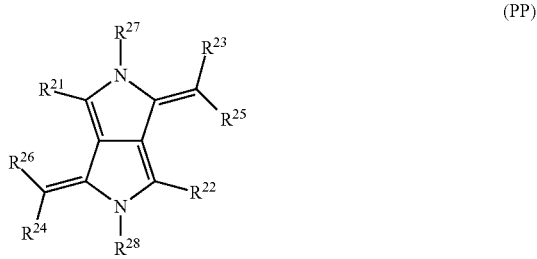

(PP)

In Formula (PP), $R^{21}$ and $R^{22}$ each independently represent an alkyl group, an aryl group, or a heteroaryl group.

$R^{23}$, $R^{24}$, $R^{25}$, and $R^{26}$ each independently represent a cyano group, an acyl group, an alkoxycarbonyl group, an alkylsulfinyl group, an arylsulfinyl group, or a heteroaryl group.

$R^{27}$ and $R^{28}$ each independently represent a hydrogen atom, an alkyl group, an aryl group, a heteroaryl group, —$BR^{29}R^{30}$, or a metal atom.

$R^{27}$ may form a covalent bond or a coordinate bond with $R^{21}$, $R^{23}$, or $R^{25}$.

$R^{28}$ may form a covalent bond or a coordinate bond with $R^{22}$, $R^{24}$, or $R^{26}$.

$R^{29}$ and $R^{30}$ each independently represent a hydrogen atom, a halogen atom, an alkyl group, an aryl group, a heteroaryl group, an alkoxy group, an aryloxy group, or a heteroaryloxy group, and $R^{29}$ and $R^{30}$ may be bonded to each other to form a ring.

In Formula (PP), $R^{21}$ and $R^{22}$ each independently represent an alkyl group, an aryl group, or a heteroaryl group, preferably an aryl group or a heteroaryl group, and more preferably an aryl group.

The number of carbon atoms in the alkyl group represented by $R^{21}$ and $R^{22}$ is preferably 1 to 30, more preferably 1 to 20, and still more preferably 1 to 10.

The number of carbon atoms in the aryl group represented by $R^{21}$ and $R^{22}$ is preferably 6 to 30, more preferably 6 to 20, and still more preferably 6 to 12.

The number of carbon atoms constituting the heteroaryl group represented by $R^{21}$ and $R^{22}$ is preferably 1 to 30 and more preferably 1 to 12. Examples of the kind of the heteroatom constituting the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocycle or a fused ring, more preferably a monocycle or a fused ring composed of 2 to 8 rings, and still more preferably a monocycle or a fused ring composed of 2 to 4 rings.

The alkyl group, the aryl group, and the heteroaryl group may have a substituent or may be unsubstituted. It is preferable that the groups have a substituent. Examples of the substituent include a hydrocarbon group which may have an oxygen atom, an amino group, an acylamino group, an alkoxycarbonylamino group, an aryloxycarbonylamino group, a heterocyclic oxy group, a heterocyclic carbonyloxy group, a heterocyclic oxycarbonyl group, a heterocyclic oxy carbonylamino group, a sulfonylamino group, a sulfamoyl group, a carbamoyl group, an alkylthio group, an arylthio group, a heterocyclic thio group, an alkylsulfonyl group, an arylsulfonyl group, a heterocyclic sulfonyl group, an alkylsulfinyl group, an arylsulfinyl group, a heterocyclic sulfinyl group, an ureido group, a phosphoric amide group, a mercapto group, an alkylsulfino group, an arylsulfino group, a hydrazino group, an imino group, a silyl group, a hydroxy group, a halogen atom, and a cyano group, Among these, a hydrocarbon group which may have an oxygen atom or a halogen atom is preferable. In addition, from the viewpoint of pigment dispersibility, it is preferable that the substituent is a group other than an acidic group, a basic group, or a group having a salt structure. The details of the acidic group, the basic group, and the group having a salt structure can be found in the description of groups represented by X in the compound (pigment derivative) represented by Formula (1) described below.

Examples of the halogen atom as the substituent include a fluorine atom, a chlorine atom, a bromine atom, and an iodine atom.

Examples of the hydrocarbon group as the substituent include an alkyl group, an alkenyl group, and an aryl group.

The number of carbon atoms in the alkyl group is preferably 1 to 40. The lower limit is more preferably 3 or more, still more preferably 5 or more, even still more preferably 8 or more, and even yet still more preferably 10 or more. The upper limit is more preferably 35 or less and still more preferably 30 or less. The alkyl group may be linear, branched, or cyclic and is preferably linear or branched and more preferably branched. The number of carbon atoms in the branched alkyl group is preferably 3 to 40. The lower limit is, for example, preferably 5 or more, more preferably 8 or more, and still more preferably 10 or more. The upper limit is more preferably 35 or less and still more preferably 30 or less. For example, the number of branches in the branched alkyl group is preferably 2 to 10 and more preferably 2 to 8.

The number of carbon atoms in the alkenyl group is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group may be linear, branched, or cyclic and is preferably linear or branched and more preferably branched. The number of carbon atoms in the branched alkenyl group is preferably 3 to 40. The lower limit is, for example, preferably 5 or more, more preferably 8 or more, and still more preferably 10 or more. The upper limit is more preferably 35 or less and still more preferably 30 or less. The number of branches in the branched alkenyl group is preferably 2 to 10 and more preferably 2 to 8.

The number of carbon atoms in the aryl group is preferably 6 to 30, more preferably 6 to 20, and still more preferably 6 to 12.

The number of heteroatoms constituting the heterocycle included in the heterocyclic oxy group, the heterocyclic carbonyloxy group, the heterocyclic oxycarbonyl group, the heterocyclic oxy carbonylamino group, the heterocyclic thio group, the heterocyclic sulfonyl group, and the heterocyclic sulfinyl group is preferably 1 to 3 and more preferably 1 or 2. The heterocycle is preferably a monocycle or a fused ring, more preferably a monocycle or a fused ring composed of 2 to 8 rings, and still more preferably a monocycle or a fused ring composed of 2 to 4 rings.

Examples of the hydrocarbon group having an oxygen atom include a group represented by -L-$R^{x1}$.

L represents —O—, —CO—, —COO—, —OCO—, —(O$R^{x2}$)$_m$—, or —($R^{x2}$O)$_m$—. $R^{x1}$ represents an alkyl group, an alkenyl group, or an aryl group. $R^{x2}$ represents an alkylene group or an arylene group. m represents an integer of 2 or more, and an m number of $R^{x2}$'s may be the same as or different from each other.

L represents preferably —O—, —(O$R^{x2}$)$_m$—, or —($R^{x2}$O)$_m$—, and more preferably —O—. It is also preferable that L represents —OCO—.

The alkyl group, the alkenyl group, and the aryl group represented by $R^{x1}$ have the same definitions and the same preferable ranges as described above. $R^{x1}$ represents preferably an alkyl group or an alkenyl group and more preferably an alkyl group. In a case where L represents —OCO—, it is also preferable $R^{x1}$ represents an aryl group.

The number of carbon atoms in the alkylene group represented by $R^{x2}$ is preferably 1 to 20, more preferably 1 to 10, and still more preferably 1 to 5. The alkylene group may be linear, branched, or cyclic and is preferably linear or branched. The number of carbon atoms in the arylene group represented by $R^{x2}$ is preferably 6 to 20 and more preferably 6 to 12. $R^{x2}$ represents preferably an alkylene group.

m represents an integer of 2 or more, preferably 2 to 20, and more preferably 2 to 10.

The substituent which may be included in the alkyl group, the aryl group, and the heteroaryl group is preferably a group having a branched alkyl structure. In addition, as the substituent, a hydrocarbon group which may have an oxygen atom is preferable, and a hydrocarbon group having an oxygen atom is more preferable. The hydrocarbon group having an oxygen atom is preferably a group represented by —O—$R^{x1}$. $R^{x1}$ represents preferably an alkyl group or an alkenyl group, more preferably an alkyl group, and still more preferably a branched alkyl group. That is, the substituent is more preferably an alkoxy group and still more preferably a branched alkoxy group. In a case where the substituent is an alkoxy group, a film having excellent heat resistance and light fastness can be easily obtained. The number of carbon atoms in the alkoxy group is preferably 1 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkoxy group may be linear, branched, or cyclic and is preferably linear or branched and more preferably branched. The number of carbon atoms in the branched alkoxy group is preferably 3 to 40. The lower limit is, for example, preferably 5 or more, more preferably 8 or more, and still more preferably 10 or more. The upper limit is more preferably 35 or less and still more preferably 30 or less. The number of branches in the branched alkoxy group is preferably 2 to 10 and more preferably 2 to 8.

In addition, it is also preferable that the substituent which may be included in the alkyl group, the aryl group, and the heteroaryl group is a heterocyclic carbonyloxy group or a heterocyclic oxycarbonyl group.

Specific examples of R21 and R22 include Ar-1 to Ar-7 and Ar-41 to Ar-57 representing the following groups and the following compounds represented by Formula (PP) described below. In the following formulae, Me represents a methyl group, and Bu represents a butyl group. * represents a binding site to Formula (PP).

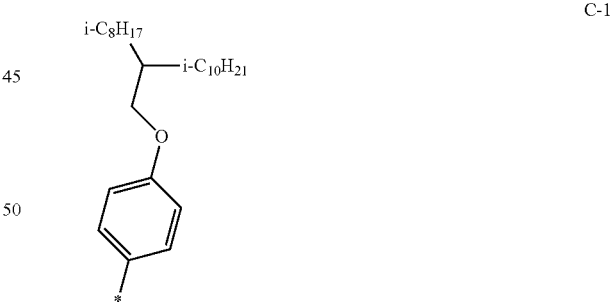

C-1

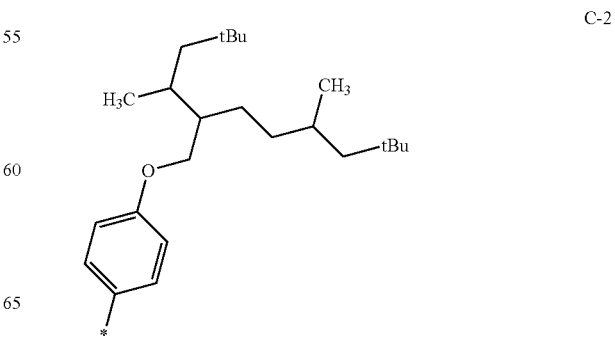

C-2

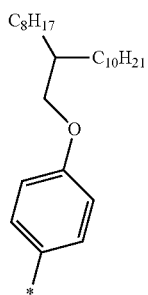 C-3
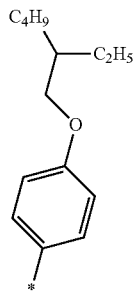 C-8
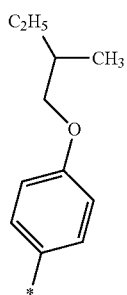 C-4
 C-9
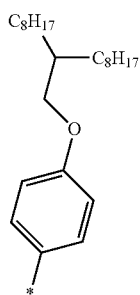 C-5
 C-10
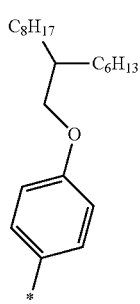 C-6
 C-11
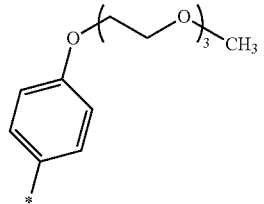 C-12
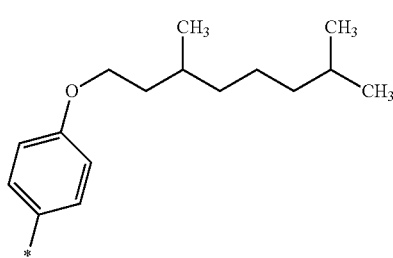 C-7
C-13

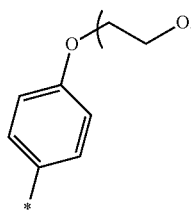
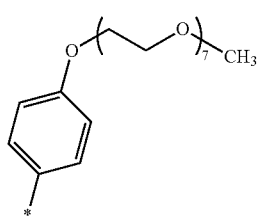
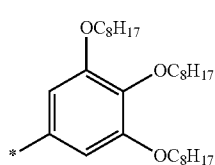
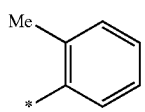
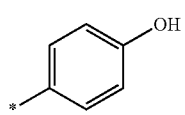
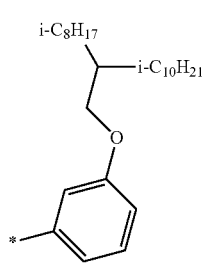
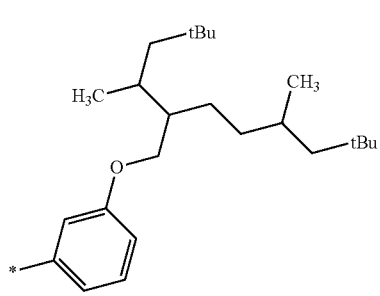
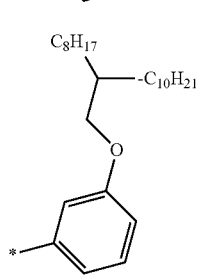
C-14
C-15
C-16
C-17
C-18
C-19
C-20
C-21
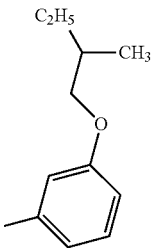
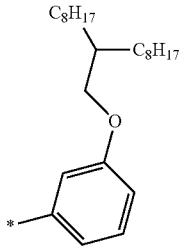
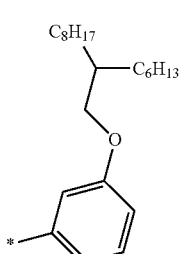
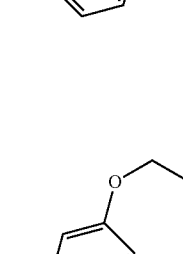
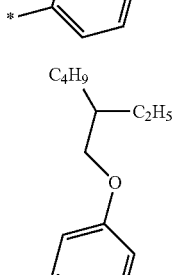
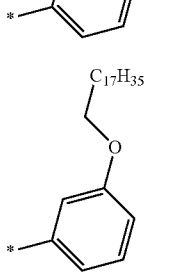
C-22
C-23
C-24
C-25
C-26
C-27

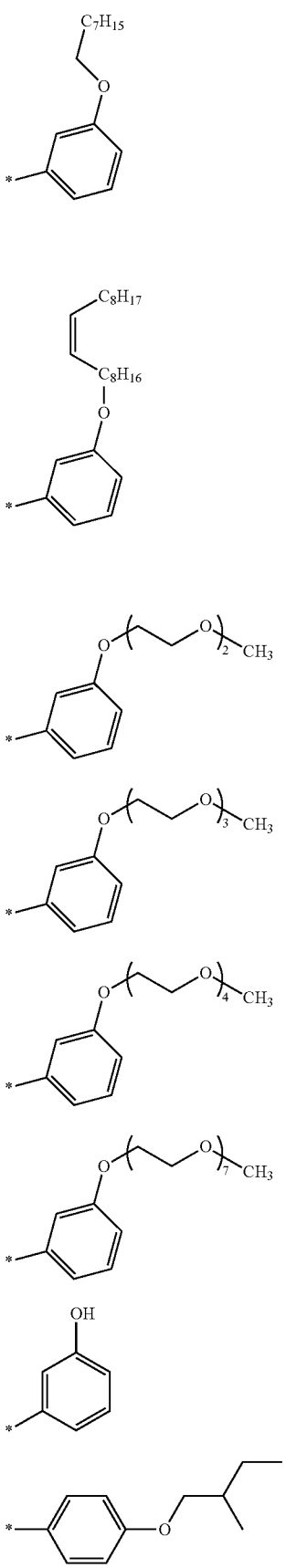
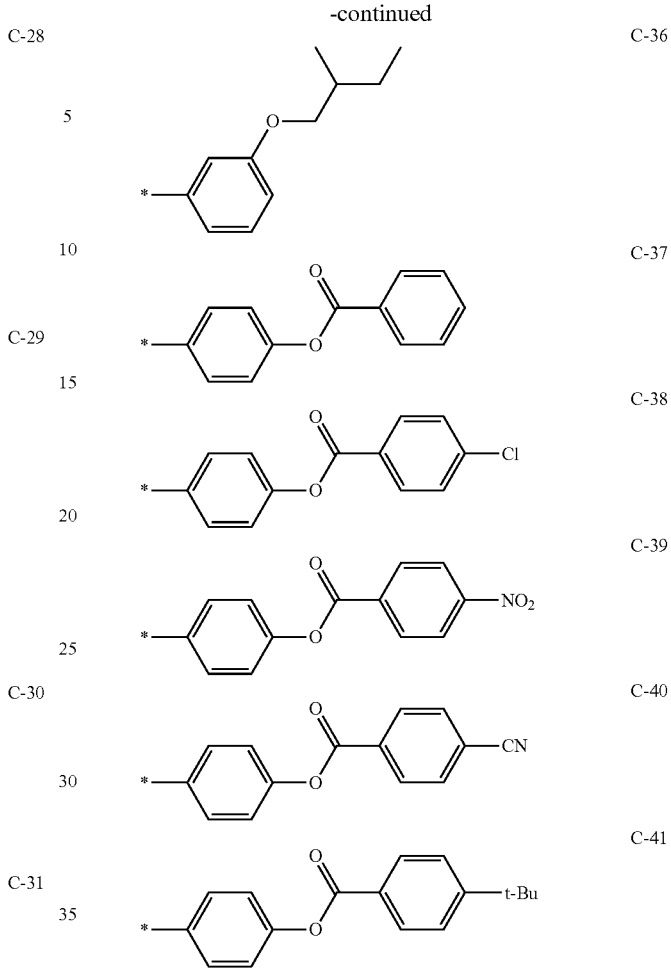

In Formula (PP), $R^{23}$, $R^{24}$, $R^{25}$, and $R^{26}$ each independently represent a cyano group, an acyl group, an alkoxycarbonyl group, an alkylsulfinyl group, an arylsulfinyl group, or a heteroaryl group.

It is preferable that one of $R^{23}$ and $R^{25}$ represents a cyano group, an acyl group, an alkoxycarbonyl group, an alkylsulfinyl group, or an arylsulfinyl group and the other one of $R^{23}$ and $R^{25}$ represents a heteroaryl group, and it is more preferable that one of $R^{23}$ and $R^{25}$ represents a cyano group and the other one of $R^{23}$ and $R^{25}$ represents a heteroaryl group.

It is preferable that one of $R^{24}$ and $R^{26}$ represents a cyano group, an acyl group, an alkoxycarbonyl group, an alkylsulfinyl group, or an arylsulfinyl group and the other one of $R^{24}$ and $R^{26}$ represents a heteroaryl group, and it is more preferable that one of $R^{24}$ and $R^{26}$ represents a cyano group and the other one of $R^{24}$ and $R^{26}$ represents a heteroaryl group.

It is preferable that the heteroaryl group is a 5-membered or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. The number of carbon atoms constituting the heteroaryl group is preferably 1 to 30 and more preferably 1 to 12. The heteroaryl group may have a substituent or may be unsubstituted. Examples of the substituent include groups described below regarding a substituent T. In addition, from the viewpoint of pigment dispersibility, it is preferable that the substituent is a group other than the groups represented by X in the compound (pigment derivative) represented by Formula (1) described below (that is, a group other than an acidic group, a basic group, a group having a salt structure, and a phthalimido group). The details of the acidic group, the basic group, and the group having a salt structure can be found in the description of the groups represented by X in the compound (pigment derivative) represented by Formula (1) described below.

(Substituent T)

The substituent T includes an alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group, an acyl group (preferably having an acyl group 1 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a phosphoric amide group (preferably having 1 to 30 carbon atoms), a hydroxy group, a mercapto group, a halogen atom, a cyano group, an alkylsulfino group, an arylsulfino group, a hydrazino group, an imino group, and a heteroaryl group (preferably having 1 to 30 carbon atoms). In a case where the above-described groups can be further substituted, the groups may further have a substituent. Examples of the substituent include the groups described regarding the substituent T.

It is preferable that the heteroaryl group represented by $R^{23}$ to $R^{26}$ is a group represented by the following Formula (A-1) or a group represented by the following Formula (A-2).

In Formula (A-1), $X^1$ represents O, S, $NR^{X1}$, or $CR^{X2}R^{X3}$, $R^{X1}$ to $R^{X3}$ each independently represent a hydrogen atom or a substituent, $R^{a1}$ and $R^{a2}$ each independently represent a hydrogen atom or a substituent, and $R^{a1}$ and $R^{a2}$ may be bonded to each other to form a ring. * represents a binding site to Formula (PP).

Examples of the substituent represented by $R^{a1}$, $R^{a2}$, and $R^{X1}$ to $R^{X3}$ include the substituent T. Among these, an alkyl group, an aryl group, or a halogen atom is preferable.

The ring which is formed by $R^{a1}$ and $R^{a2}$ being bonded to each other is preferably an aromatic ring. In a case where $R^{a1}$ and $R^{a2}$ are bonded to each other to form a ring, for example, (A-1) represents a group represented by the following (A-1-1) or a group represented by the following (A-1-2).

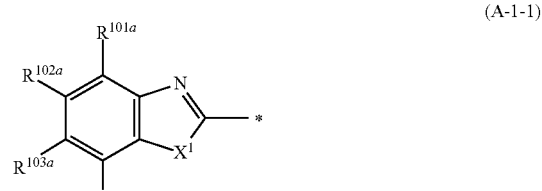

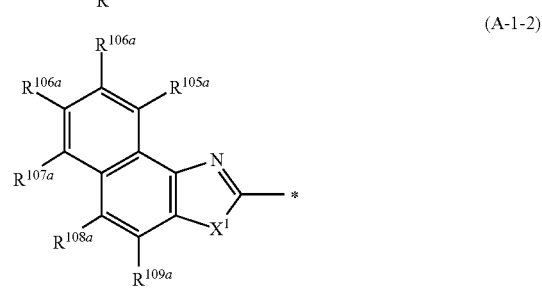

In the formula, $X^1$ represents O, S, $NR^{X1}$, or $CR^{X2}R^{X3}$, $R^{X1}$ to $R^{X3}$ each independently represent a hydrogen atom or a substituent, and $R^{101a}$ to $R^{109a}$ each independently represent a hydrogen atom or a substituent. * represents a binding site to Formula (PP). Examples of the substituent represented by $R^{101a}$ to $R^{109a}$ include the substituent T.

In Formula (A-2), $Y^1$ to $Y^4$ each independently represent N or $CR^{Y1}$, at least two of $Y^1$, $Y^2$, $Y^3$, or $Y^4$ represent $CR^{Y1}$, $R^{Y1}$ represents a hydrogen atom or a substituent, and adjacent $R^{Y1}$'s may be bonded to each other to form a ring. * represents a binding site to Formula (PP). Examples of the substituent represented by $R^{Y1}$ include the substituent T. Among these, an alkyl group, an aryl group, or a halogen atom is preferable.

At least two of $Y^1$, $Y^2$, $Y^3$, or $Y^4$ represent $CR^{Y1}$, and adjacent $R^{Y1}$'s may be bonded to each other to form a ring. The ring which is formed by adjacent $R^{Y1}$'s being bonded to each other is preferably an aromatic ring. In a case where adjacent $R^{Y1}$'s are bonded to each other to form a ring, examples of the group represented by (A-2) include a group represented by the following (A-2-1) and a group represented by the following (A-2-2).

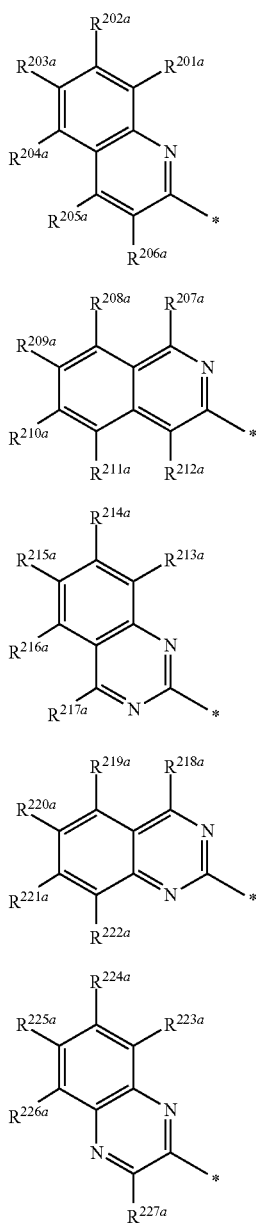

In the formulae, $R^{201a}$ to $R^{227a}$ each independently represent a hydrogen atom or a substituent, and * represents a binding site to Formula (PP). Examples of the substituent represented by $R^{201a}$ to $R^{227a}$ include the substituent T.

Specific examples of the heteroaryl group represented by $R^{23}$ to $R^{26}$ are as follows. In the following description, Bu represents a butyl group. It is preferable that the kind of the heteroaryl group is selected according to the kind of the pigment to be used in combination. For example in a case where the pyrrolopyrrole compound is used as the pigment, it is preferable that the heteroaryl group of the pigment derivative is a heteroaryl group having a structure common to the heteroaryl group in the portion of the pyrrolopyrrole compound corresponding to $R^{23}$ to $R^{26}$. The heteroaryl group having the common structure represents that, in a case where the heteroaryl groups have substituents, structures of portions excluding the substituents are the same. * represents a binding site to Formula (PP).

A-1

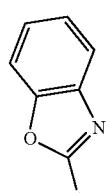

A-2

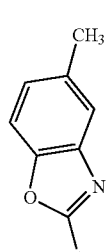

A-3

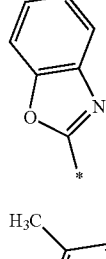

A-4

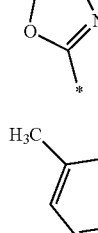

A-5

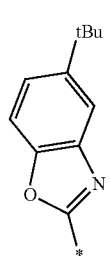

A-6

-continued
A-7 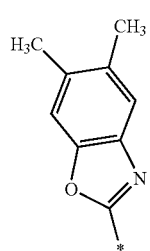
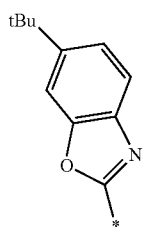
A-13
A-8 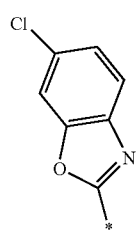
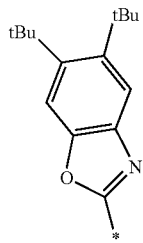
A-14
A-9 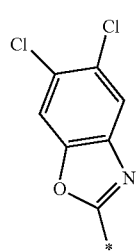
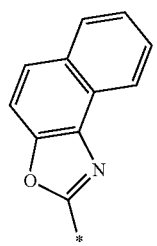
A-15
A-10 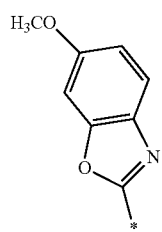
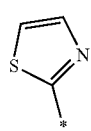
A-16
A-11 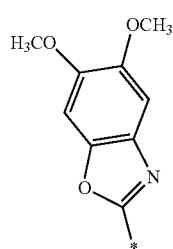
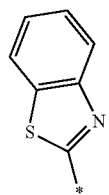
A-17
A-12 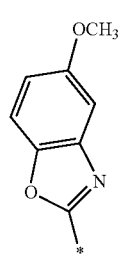
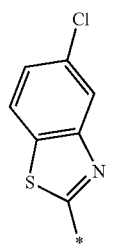
A-18
A-19

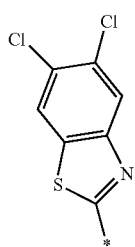 A-20
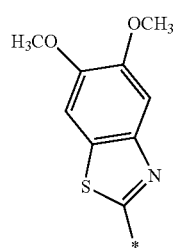 A-26
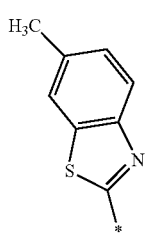 A-21
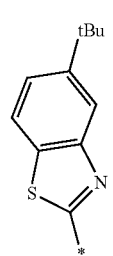 A-27
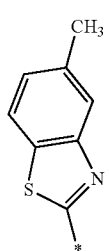 A-22
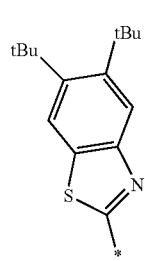 A-28
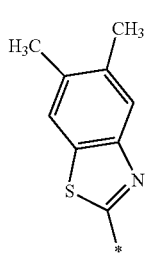 A-23
A-29
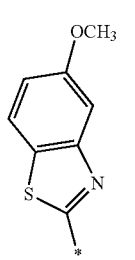 A-24
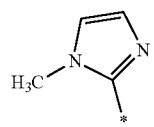 A-30
A-25
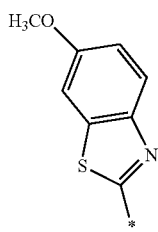
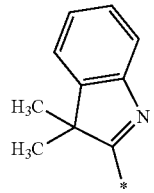 A-31
A-32

-continued
A-26 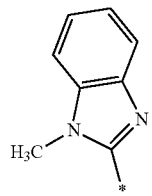
A-27 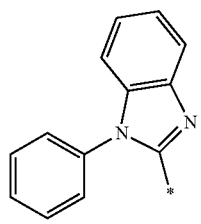
A-28 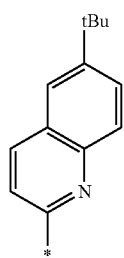
A-29 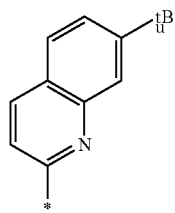
A-30 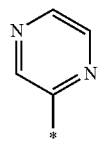
A-31 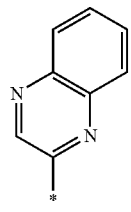
A-32 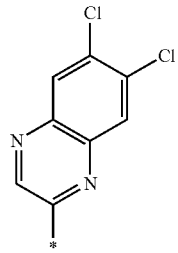
-continued
A-33 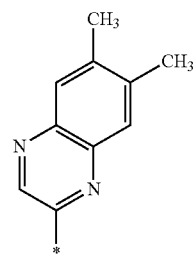
A-34 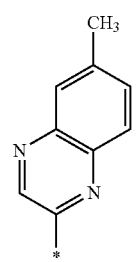
A-35 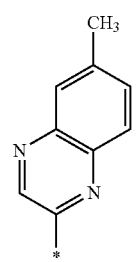
A-36 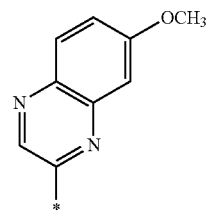
A-37 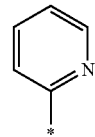
A-38 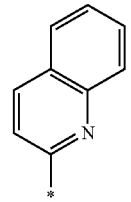
A-39 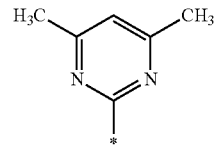
A-40
A-41
A-42
A-43
A-44
A-45 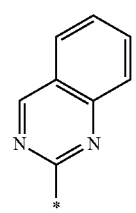
A-46

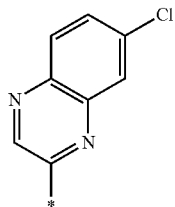 A-47

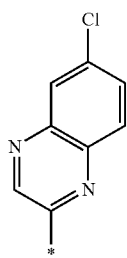 A-48

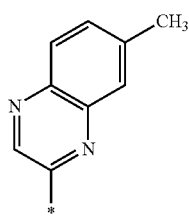 A-49

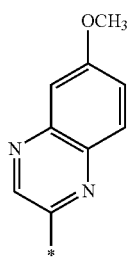 A-50

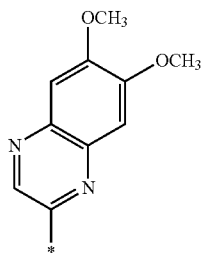 A-51

In Formula (PP), $R^{27}$ and $R^{28}$ each independently represent a hydrogen atom, an alkyl group, an aryl group, a heteroaryl group, —$BR^{29}R^{30}$, Or a metal atom and preferably —$BR^{29}R^{30}$.

In a case where $R^{27}$ and $R^{28}$ represent an alkyl group, an aryl group, or a heteroaryl group, the alkyl group, the aryl group, and the heteroaryl group have the same exemplary groups and the same preferable ranges as those described regarding $R^{21}$ and $R^{22}$.

In a case where $R^{27}$ and $R^{28}$ represent a metal atom, examples of the metal atom include magnesium, aluminum, calcium, barium, zinc, tin, vanadium, iron, cobalt, nickel, copper, palladium, iridium, platinum. In particular, aluminum, zinc, vanadium, iron, copper, palladium, iridium, or platinum is preferable.

In a case where $R^{27}$ and $R^{28}$ represent —$BR^{29}R^{30}$, $R^{29}$ and $R^{30}$ each independently represent a hydrogen atom, a halogen atom, an alkyl group, an alkenyl group, an aryl group, a heteroaryl group, an alkoxy group, an aryloxy group, or a heteroaryloxy group. Among these, a halogen atom, an alkyl group, an aryl group, or a heteroaryl group is preferable, a halogen atom, an alkyl group, or an aryl group is more preferable, and an aryl group is still more preferable. $R^{29}$ and $R^{30}$ may be bonded to each other to form a ring.

As the halogen atom represented by $R^{29}$ and $R^{30}$, a fluorine atom, a chlorine atom, a chlorine atom, a bromine atom, or an iodine atom is preferable, and a fluorine atom is more preferable.

The number of carbon atoms in the alkyl group and the alkoxy group represented by $R^{29}$ and $R^{30}$ is preferably 1 to 40. For example, the lower limit is more preferably 3 or more. For example, the upper limit is more preferably 30 or less and still more preferably 25 or less. The alkyl group and the alkoxy group may be linear, branched, or cyclic and is preferably linear or branched.

The number of carbon atoms in the alkenyl group represented by $R^{29}$ and $R^{30}$ is preferably 2 to 40. For example, the lower limit is more preferably 3 or more. For example, the upper limit is more preferably 30 or less and still more preferably 25 or less.

The number of carbon atoms in the aryl group and the aryloxy group represented by $R^{29}$ and $R^{30}$ is preferably 6 to 20 and more preferably 6 to 12. The aryl group and the aryloxy group may have a substituent or may be unsubstituted. Examples of the substituent include an alkyl group, an alkoxy group, and a halogen atom. The details of the groups are as described above.

The heteroaryl group and the heteroaryloxy group represented by $R^{29}$ and $R^{30}$ may be monocyclic or polycyclic. The number of heteroatoms constituting a heteroaryl ring in the heteroaryl group or the heteroaryloxy group is preferably 1 to 3. It is preferable that the heteroatoms constituting the heteroaryl ring are a nitrogen atom, an oxygen atom, or a sulfur atom. The number of carbon atoms constituting the heteroaryl ring is preferably 3 to 30, more preferably 3 to 18, still more preferably 3 to 12 and even still more preferably 3 to 5. It is preferable that the heteroaryl ring is a 5-membered or 6-membered ring. The heteroaryl group and the heteroaryloxy group may have a substituent or may be unsubstituted. Examples of the substituent include an alkyl group, an alkoxy group, and a halogen atom. The details of the groups are as described above.

$R^{29}$ and $R^{30}$ in —$BR^{29}R^{30}$ may be bonded to each other to form a ring. Examples of the ring include structures represented by the following (B-1) to (B-4). In the following formulae, R represents a substituent, $R^{a1}$ to $R^{a4}$ each independently represent a hydrogen atom or a substituent, m1 to m3 each independently represent an integer of 0 to 4, and * represents a binding site to Formula (PP). Examples of the substituent represented by R and $R^{a1}$ to $R^{a4}$ include the substituents described above regarding the substituent T. Among these, a halogen atom, an alkyl group, or an alkoxy group is preferable.

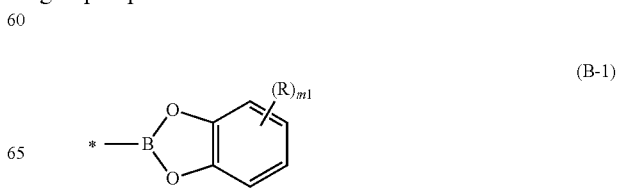 (B-1)

(B-2)
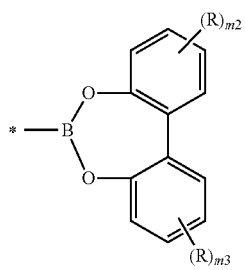
(B-3)
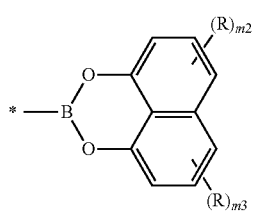
(B-4)
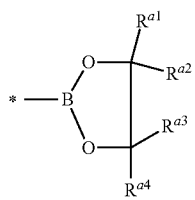
Specific examples of —BR$^{29}$R$^{30}$ are as follows. In the following formulae, Me represents a methyl group, and Bu represents a butyl group. * represents a binding site to Formula (PP).
B-1
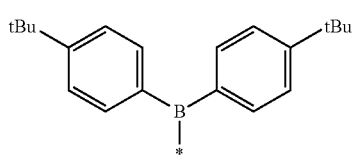
B-2
B-3
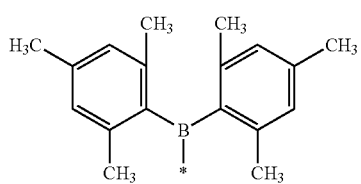
B-4
B-5
B-6
B-7
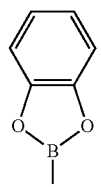
B-8
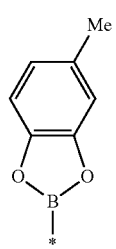
B-9
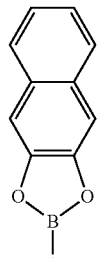
B-10
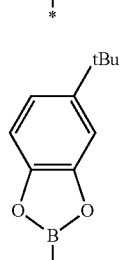
B-11
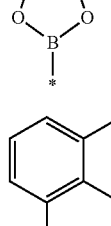
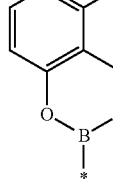

-continued

B-12

B-13
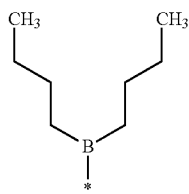

B-14
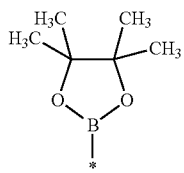

B-15
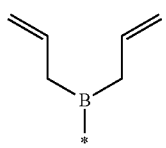

B-16
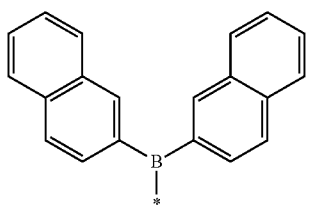

B-17
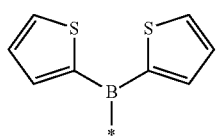

In Formula (PP), $R^{27}$ may form a covalent bond or a coordinate bond with $R^{21}$, $R^{23}$, or $R^{25}$, $R^{28}$ may form a covalent bond or a coordinate bond with $R^{22}$, $R^{24}$, or $R^{26}$.

In Formula (PP), it is preferable that one or more of $R^{21}$ to $R^{28}$ are the same as the substituent included in the compound represented by Formula (1) described below, and it is more preferable that four or more of $R^{21}$ to $R^{28}$ are the same as the substituent included in the compound represented by Formula (1) described below.

It is preferable that the pyrrolopyrrole compound is a compound represented by the following Formula (II) or a compound represented by the following Formula (III). According to this aspect, a film having excellent infrared shielding properties and light fastness can be easily formed.

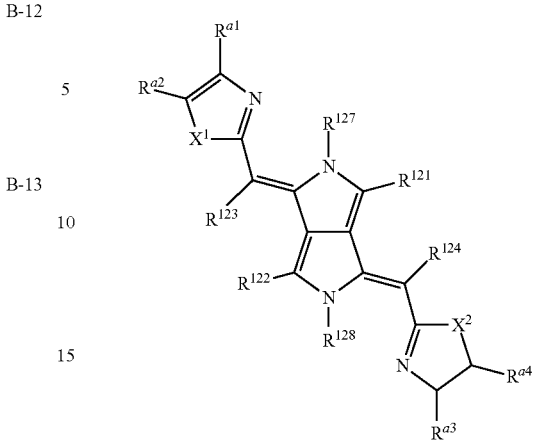

(II)

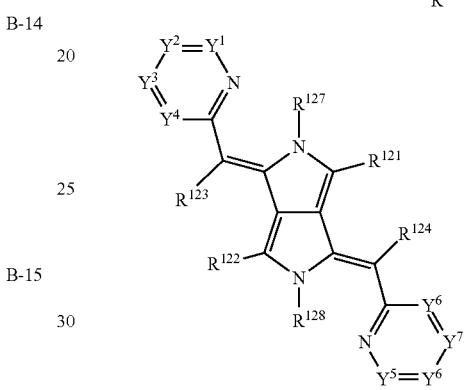

(III)

In Formula (II), $X^1$ and $X^2$ each independently represent O, S, $NR^{X1}$, or $CR^{X2}R^{X3}$, and $R^{X1}$ to $R^{X3}$ each independently represent a hydrogen atom or a substituent.

$R^{a1}$ and $R^4$ each independently represent a hydrogen atom or a substituent, and $R^a$ and $R^{a2}$, or $R^{a3}$ and $R^{a4}$ may be bonded to each other to form a ring.

$R^{121}$ and $R^{122}$ each independently represent an alkyl group, an aryl group, or a heteroaryl group.

$R^{123}$ and $R^{124}$ represent a cyano group.

$R^{127}$ and $R^{128}$ each independently represent —$BR^{29}R^{30}$.

$R^{29}$ and $R^{30}$ each independently represent a hydrogen atom, a halogen atom, an alkyl group, an aryl group, a heteroaryl group, an alkoxy group, an aryloxy group, or a heteroaryloxy group, and $R^{29}$ and $R^{30}$ may be bonded to each other to form a ring.

$R^{121}$ to $R^{122}$ in Formula (II) have the same definitions and the same preferable ranges as $R^{21}$ and $R^{22}$ in Formula (PP). $R^{127}$ to $R^{128}$ in Formula (II) have the same definitions and the same preferable ranges as —$BR^{29}R^{30}$ described regarding $R^{27}$ and $R^{28}$ in Formula (PP). $X^1$, $X^2$, and $R^{a1}$ to $R^{a4}$ in Formula (II) have the same definitions and the same preferable ranges as $X^1$, $R^{a1}$, and $R^{a2}$ in Formula (A-1).

In Formula (III), $Y^1$ to $Y^8$ each independently represent N or $CR^{Y1}$, at least two of $Y^1$, $Y^2$, $Y^3$, or $Y^4$ represent $CR^{Y1}$, at least two of $Y^5$, $Y^6$, $Y^7$, or $Y^8$ represent $CR^{Y1}$, $R^{Y1}$ represents a hydrogen atom or a substituent, and adjacent $R^{Y1}$'s may be bonded to each other to form a ring.

$R^{121}$ and $R^{122}$ each independently represent an alkyl group, an aryl group, or a heteroaryl group.

$R^{123}$ and $R^{124}$ represent a cyano group.

$R^{127}$ and $R^{128}$ each independently represent —$BR^{29}R^{30}$.

$R^{29}$ and $R^{30}$ each independently represent a hydrogen atom, a halogen atom, an alkyl group, an aryl group, a heteroaryl group, an alkoxy group, an aryloxy group, or a heteroaryloxy group, and $R^{29}$ and $R^{30}$ may be bonded to each other to form a ring.

$R^{121}$ to $R^{122}$ in Formula (III) have the same definitions and the same preferable ranges as $R^{21}$ and $R^{22}$ in Formula (PP). $R^{127}$ to $R^{128}$ in Formula (III) have the same definitions and the same preferable ranges as $-BR^{29}R^{30}$ described regarding $R^{27}$ and $R^{28}$ in Formula (PP). $Y^1$ to $Y^8$ in Formula (III) have the same definitions and the same preferable ranges as $Y^1$ to $Y^4$ in Formula (A-2).

Specific examples of the compound represented by Formula (PP) include the following compounds. In addition, the details can be found in paragraphs "0037" to "0052 of JP2011-68731A (corresponding to paragraphs "0070" of US2011/0070407A), the content of which is incorporated herein by reference. In the following structural formulae, Me represents a methyl group, Bu represents a butyl group, and Ph represents a phenyl group.

TABLE 1

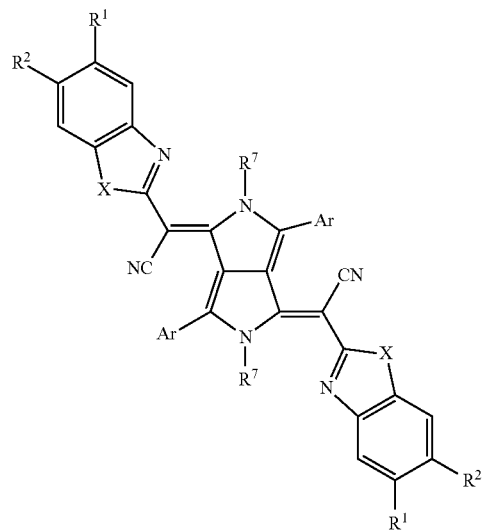

TABLE 1-continued

| | X | Ar | $R^1$ | $R^2$ | $R^7$ |
|---|---|---|---|---|---|
| A-1 | S | Ar-1 | H | H | R-1 |
| A-2 | S | Ar-1 | Cl | H | R-1 |
| A-3 | S | Ar-1 | H | Cl | R-1 |
| A-4 | S | Ar-1 | Me | H | R-1 |
| A-5 | S | Ar-1 | H | Me | R-1 |
| A-6 | S | Ar-1 | Me | Me | R-1 |
| A-7 | S | Ar-1 | OMe | H | R-1 |
| A-8 | S | Ar-1 | H | OMe | R-1 |
| A-9 | S | Ar-2 | H | H | R-1 |
| A-10 | S | Ar-2 | Cl | H | R-1 |
| A-11 | S | Ar-2 | H | Cl | R-1 |
| A-12 | S | Ar-2 | Me | H | R-1 |
| A-13 | S | Ar-2 | H | Me | R-1 |
| A-14 | S | Ar-2 | Me | Me | R-1 |
| A-15 | S | Ar-2 | OMe | H | R-1 |
| A-16 | S | Ar-2 | H | OMe | R-1 |
| A-17 | S | Ar-3 | H | H | R-1 |
| A-18 | S | Ar-3 | Cl | H | R-1 |
| A-19 | S | Ar-3 | H | Cl | R-1 |
| A-20 | S | Ar-3 | Me | H | R-1 |
| A-21 | S | Ar-3 | H | Me | R-1 |
| A-22 | S | Ar-3 | Me | Me | R-1 |
| A-23 | S | Ar-3 | OMe | H | R-1 |
| A-24 | S | Ar-3 | H | OMe | R-1 |
| A-25 | S | Ar-4 | H | H | R-1 |
| A-26 | S | Ar-4 | Cl | H | R-1 |
| A-27 | S | Ar-4 | H | Cl | R-1 |
| A-28 | S | Ar-4 | Me | H | R-1 |
| A-29 | S | Ar-4 | H | Me | R-1 |
| A-30 | S | Ar-4 | Me | Me | R-1 |
| A-31 | S | Ar-4 | OMe | H | R-1 |
| A-32 | S | Ar-4 | H | OMe | R-1 |
| A-33 | S | Ar-5 | H | H | R-1 |
| A-34 | S | Ar-5 | Cl | H | R-1 |
| A-35 | S | Ar-5 | H | Cl | R-1 |
| A-36 | S | Ar-5 | Me | H | R-1 |
| A-37 | S | Ar-5 | H | Me | R-1 |
| A-38 | S | Ar-5 | Me | Me | R-1 |
| A-39 | S | Ar-5 | OMe | H | R-1 |
| A-40 | S | Ar-5 | H | OMe | R-1 |
| A-41 | S | Ar-6 | H | H | R-1 |
| A-42 | S | Ar-6 | Cl | H | R-1 |
| A-43 | S | Ar-6 | H | Cl | R-1 |
| A-44 | S | Ar-6 | Me | H | R-1 |
| A-45 | S | Ar-6 | H | Me | R-1 |
| A-46 | S | Ar-6 | Me | Me | R-1 |
| A-47 | S | Ar-6 | OMe | H | R-1 |
| A-48 | S | Ar-6 | H | OMe | R-1 |
| A-49 | S | Ar-7 | H | H | R-1 |
| A-50 | S | Ar-7 | Cl | H | R-1 |
| A-51 | S | Ar-7 | H | Cl | R-1 |
| A-52 | S | Ar-7 | Me | H | R-1 |
| A-53 | S | Ar-7 | H | Me | R-1 |
| A-54 | S | Ar-7 | Me | Me | R-1 |
| A-55 | S | Ar-7 | OMe | H | R-1 |
| A-56 | S | Ar-7 | H | OMe | R-1 |
| A-57 | S | Ar-1 | H | H | R-2 |
| A-58 | S | Ar-1 | H | H | R-3 |
| A-59 | S | Ar-1 | H | H | R-4 |
| A-60 | S | Ar-1 | H | H | R-5 |
| A-61 | S | Ar-1 | H | H | R-6 |
| A-62 | S | Ar-1 | H | H | R-7 |
| A-71 | S | Ar-41 | H | H | R-1 |
| A-72 | S | Ar-42 | H | H | R-1 |
| A-73 | S | Ar-43 | H | H | R-1 |
| A-74 | S | Ar-44 | H | H | R-1 |
| A-75 | S | Ar-45 | H | H | R-1 |
| A-76 | S | Ar-41 | Cl | H | R-1 |
| A-77 | S | Ar-41 | H | Cl | R-1 |
| A-78 | S | Ar-41 | Me | H | R-1 |
| A-79 | S | Ar-41 | H | Me | R-1 |
| A-80 | S | Ar-41 | Me | Me | R-1 |
| A-81 | S | Ar-41 | OMe | H | R-1 |
| A-82 | S | Ar-41 | H | OMe | R-1 |

TABLE 2

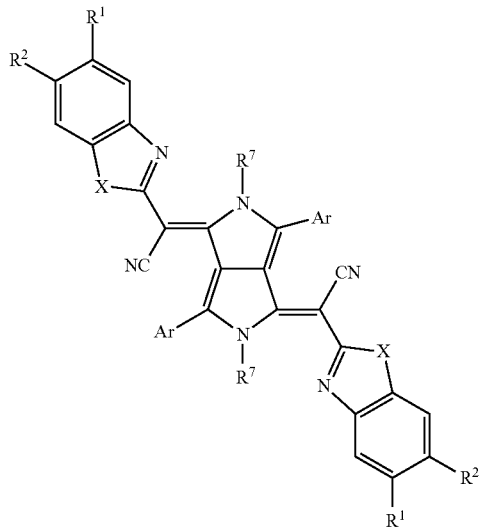

| | X | Ar | R¹ | R² | R⁷ |
|---|---|---|---|---|---|
| A-101 | O | Ar-1 | H | H | R-1 |
| A-102 | O | Ar-1 | Cl | H | R-1 |
| A-103 | O | Ar-1 | Me | H | R-1 |
| A-104 | O | Ar-1 | H | Me | R-1 |
| A-105 | O | Ar-1 | t-Bu | H | R-1 |
| A-106 | O | Ar-2 | H | H | R-1 |
| A-107 | O | Ar-2 | Cl | H | R-1 |
| A-108 | O | Ar-2 | Me | H | R-1 |
| A-109 | O | Ar-2 | H | Me | R-1 |
| A-110 | O | Ar-2 | t-Bu | H | R-1 |
| A-111 | O | Ar-3 | H | H | R-1 |
| A-112 | O | Ar-3 | Cl | H | R-1 |
| A-113 | O | Ar-3 | Me | H | R-1 |
| A-114 | O | Ar-3 | H | Me | R-1 |
| A-115 | O | Ar-3 | t-Bu | H | R-1 |
| A-116 | O | Ar-4 | H | H | R-1 |
| A-117 | O | Ar-4 | Cl | H | R-1 |
| A-118 | O | Ar-4 | Me | H | R-1 |
| A-119 | O | Ar-4 | H | Me | R-1 |
| A-120 | O | Ar-4 | t-Bu | H | R-1 |
| A-121 | O | Ar-5 | H | H | R-1 |
| A-122 | O | Ar-5 | Cl | H | R-1 |
| A-123 | O | Ar-5 | Me | H | R-1 |
| A-124 | O | Ar-5 | H | Me | R-1 |
| A-125 | O | Ar-5 | t-Bu | H | R-1 |
| A-126 | O | Ar-6 | H | H | R-1 |
| A-127 | O | Ar-6 | Cl | H | R-1 |
| A-128 | O | Ar-6 | Me | H | R-1 |
| A-129 | O | Ar-6 | H | Me | R-1 |
| A-130 | O | Ar-6 | t-Bu | H | R-1 |
| A-131 | O | Ar-7 | H | H | R-1 |
| A-132 | O | Ar-7 | Cl | H | R-1 |
| A-133 | O | Ar-7 | Me | H | R-1 |
| A-134 | O | Ar-7 | H | Me | R-1 |
| A-135 | O | Ar-7 | t-Bu | H | R-1 |
| A-142 | O | Ar-1 | H | H | R-2 |
| A-143 | O | Ar-1 | H | H | R-3 |
| A-144 | O | Ar-1 | H | H | R-4 |
| A-145 | O | Ar-1 | H | H | R-5 |
| A-146 | O | Ar-1 | H | H | R-6 |
| A-147 | O | Ar-1 | H | H | R-7 |
| A-151 | O | Ar-41 | H | H | R-1 |
| A-152 | O | Ar-42 | H | H | R-1 |
| A-153 | O | Ar-43 | H | H | R-1 |
| A-154 | O | Ar-44 | H | H | R-1 |
| A-155 | O | Ar-45 | H | H | R-1 |
| A-156 | O | Ar-41 | Cl | H | R-1 |
| A-157 | O | Ar-41 | Me | H | R-1 |
| A-158 | O | Ar-41 | H | Me | R-1 |
| A-159 | O | Ar-41 | t-Bu | H | R-1 |

TABLE 3

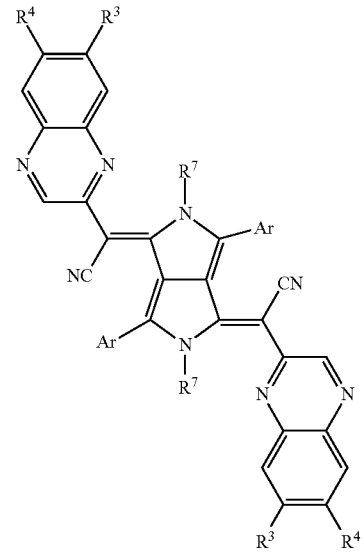

| | Ar | R³ | R⁴ | R⁷ |
|---|---|---|---|---|
| A-201 | Ar-1 | H | H | R-1 |
| A-202 | Ar-1 | H | Cl | R-1 |
| A-203 | Ar-1 | Cl | Cl | R-1 |
| A-204 | Ar-1 | H | Me | R-1 |
| A-205 | Ar-1 | Me | Me | R-1 |
| A-206 | Ar-1 | H | OMe | R-1 |
| A-207 | Ar-2 | H | H | R-1 |
| A-208 | Ar-2 | H | Cl | R-1 |
| A-209 | Ar-2 | Cl | Cl | R-1 |
| A-210 | Ar-2 | H | Me | R-1 |
| A-211 | Ar-2 | Me | Me | R-1 |
| A-212 | Ar-2 | H | OMe | R-1 |
| A-213 | Ar-3 | H | H | R-1 |
| A-214 | Ar-3 | H | Cl | R-1 |
| A-215 | Ar-3 | Cl | Cl | R-1 |
| A-216 | Ar-3 | H | Me | R-1 |
| A-217 | Ar-3 | Me | Me | R-1 |
| A-218 | Ar-3 | H | OMe | R-1 |
| A-219 | Ar-4 | H | H | R-1 |
| A-220 | Ar-4 | H | Cl | R-1 |
| A-221 | Ar-4 | Cl | Cl | R-1 |
| A-222 | Ar-4 | H | Me | R-1 |
| A-223 | Ar-4 | Me | Me | R-1 |
| A-224 | Ar-4 | H | OMe | R-1 |
| A-225 | Ar-5 | H | H | R-1 |
| A-226 | Ar-5 | H | Cl | R-1 |
| A-227 | Ar-5 | Cl | Cl | R-1 |
| A-228 | Ar-5 | H | Me | R-1 |
| A-229 | Ar-5 | Me | Me | R-1 |
| A-230 | Ar-5 | H | OMe | R-1 |
| A-231 | Ar-6 | H | H | R-1 |
| A-232 | Ar-6 | H | Cl | R-1 |
| A-233 | Ar-6 | Cl | Cl | R-1 |
| A-234 | Ar-6 | H | Me | R-1 |
| A-235 | Ar-6 | Me | Me | R-1 |
| A-236 | Ar-6 | H | OMe | R-1 |
| A-237 | Ar-7 | H | H | R-1 |
| A-238 | Ar-7 | H | Cl | R-1 |
| A-239 | Ar-7 | Cl | Cl | R-1 |
| A-240 | Ar-7 | H | Me | R-1 |
| A-241 | Ar-7 | Me | Me | R-1 |
| A-242 | Ar-7 | H | OMe | R-1 |
| A-243 | Ar-1 | H | H | R-2 |
| A-244 | Ar-1 | H | H | R-3 |
| A-245 | Ar-1 | H | H | R-4 |
| A-246 | Ar-1 | H | H | R-5 |
| A-247 | Ar-1 | H | H | R-6 |
| A-248 | Ar-1 | H | H | R-7 |
| A-251 | Ar-41 | H | H | R-1 |
| A-252 | Ar-42 | H | H | R-1 |
| A-253 | Ar-43 | H | H | R-1 |

TABLE 3-continued

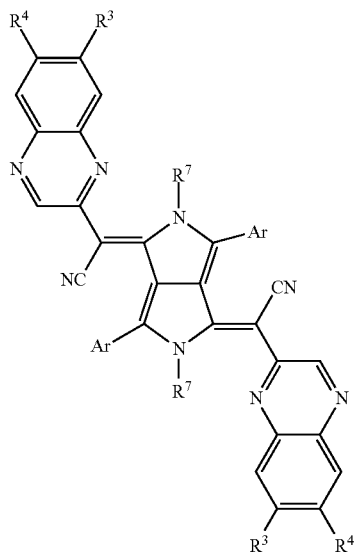

| | Ar | R³ | R⁴ | R⁷ |
|---|---|---|---|---|
| A-254 | Ar-44 | H | H | R-1 |
| A-255 | Ar-45 | H | H | R-1 |
| A-256 | Ar-41 | H | Cl | R-1 |
| A-257 | Ar-41 | Cl | Cl | R-1 |
| A-258 | Ar-41 | H | Me | R-1 |
| A-259 | Ar-41 | Me | Me | R-1 |
| A-260 | Ar-41 | H | OMe | R-1 |

TABLE 4

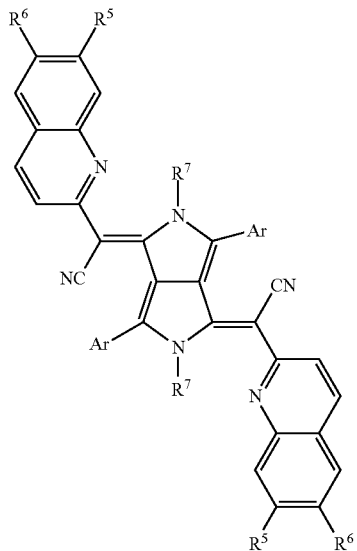

| | Ar | R⁵ | R⁶ | R⁷ |
|---|---|---|---|---|
| A-301 | Ar-1 | H | H | R-1 |
| A-302 | Ar-1 | H | t-Bu | R-1 |
| A-303 | Ar-2 | H | H | R-1 |
| A-304 | Ar-2 | H | t-Bu | R-1 |
| A-305 | Ar-3 | H | H | R-1 |
| A-306 | Ar-3 | H | t-Bu | R-1 |
| A-307 | Ar-4 | H | H | R-1 |
| A-308 | Ar-4 | H | t-Bu | R-1 |
| A-309 | Ar-5 | H | H | R-1 |
| A-310 | Ar-5 | H | t-Bu | R-1 |

TABLE 4-continued

| | Ar | R⁵ | R⁶ | R⁷ |
|---|---|---|---|---|
| A-311 | Ar-6 | H | H | R-1 |
| A-312 | Ar-6 | H | t-Bu | R-1 |
| A-313 | Ar-7 | H | H | R-1 |
| A-314 | Ar-7 | H | t-Bu | R-1 |
| A-315 | Ar-1 | H | H | R-2 |
| A-316 | Ar-1 | H | H | R-3 |
| A-317 | Ar-1 | H | H | R-4 |
| A-318 | Ar-1 | H | H | R-5 |
| A-319 | Ar-1 | H | H | R-6 |
| A-320 | Ar-1 | H | H | R-7 |
| A-321 | Ar-41 | H | H | R-1 |
| A-322 | Ar-42 | H | H | R-1 |
| A-323 | Ar-43 | H | H | R-1 |
| A-324 | Ar-44 | H | H | R-1 |
| A-325 | Ar-45 | H | H | R-1 |
| A-326 | Ar-41 | H | t-Bu | R-1 |

TABLE 5

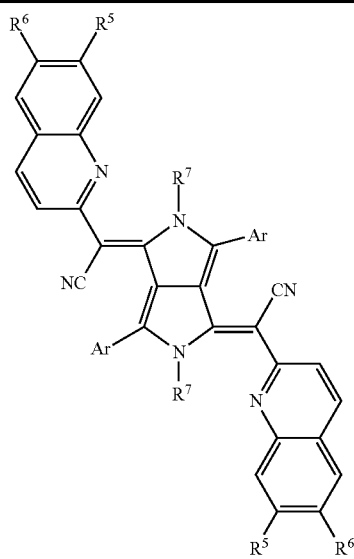

| | X | Ar | R¹ | R² | R⁷ |
|---|---|---|---|---|---|
| A-401 | O | Ar-46 | H | H | R-1 |
| A-402 | O | Ar-46 | Me | H | R-1 |

TABLE 5-continued

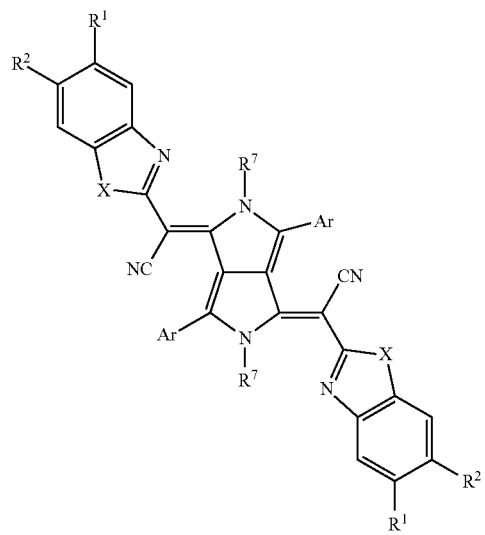

| | X | Ar | R¹ | R² | R⁷ |
|---|---|---|---|---|---|
| A-403 | O | Ar-46 | Cl | H | R-1 |
| A-404 | O | Ar-47 | H | H | R-1 |
| A-405 | O | Ar-47 | Me | H | R-1 |
| A-406 | O | Ar-47 | Cl | H | R-1 |
| A-407 | O | Ar-48 | H | H | R-1 |
| A-408 | O | Ar-48 | Me | H | R-1 |
| A-409 | O | Ar-48 | Cl | H | R-1 |
| A-410 | O | Ar-49 | H | H | R-1 |
| A-411 | O | Ar-49 | Me | H | R-1 |
| A-412 | O | Ar-49 | Cl | H | R-1 |
| A-413 | O | Ar-50 | H | H | R-1 |
| A-414 | O | Ar-50 | Me | H | R-1 |
| A-415 | O | Ar-50 | Cl | H | R-1 |
| A-416 | O | Ar-51 | H | H | R-1 |
| A-417 | O | Ar-51 | Me | H | R-1 |
| A-418 | O | Ar-51 | Cl | H | R-1 |
| A-419 | O | Ar-52 | H | H | R-1 |
| A-420 | O | Ar-52 | Me | H | R-1 |
| A-421 | O | Ar-52 | Cl | H | R-1 |
| A-422 | O | Ar-53 | H | H | R-1 |
| A-423 | O | Ar-53 | Me | H | R-1 |
| A-424 | O | Ar-53 | Cl | H | R-1 |
| A-425 | O | Ar-47 | H | H | R-2 |
| A-426 | O | Ar-47 | H | H | R-3 |
| A-427 | O | Ar-47 | H | H | R-4 |
| A-428 | O | Ar-47 | H | H | R-5 |
| A-429 | O | Ar-47 | H | H | R-6 |
| A-430 | O | Ar-47 | H | H | R-7 |
| A-431 | O | Ar-48 | H | H | R-2 |
| A-432 | O | Ar-48 | H | H | R-3 |
| A-433 | O | Ar-48 | H | H | R-4 |
| A-434 | O | Ar-48 | H | H | R-5 |
| A-435 | O | Ar-48 | H | H | R-6 |
| A-436 | O | Ar-48 | H | H | R-7 |
| A-437 | O | Ar-49 | H | H | R-2 |
| A-438 | O | Ar-49 | H | H | R-3 |
| A-439 | O | Ar-49 | H | H | R-4 |
| A-440 | O | Ar-49 | H | H | R-5 |
| A-441 | O | Ar-49 | H | H | R-6 |
| A-442 | O | Ar-49 | H | H | R-7 |

TABLE 5-continued

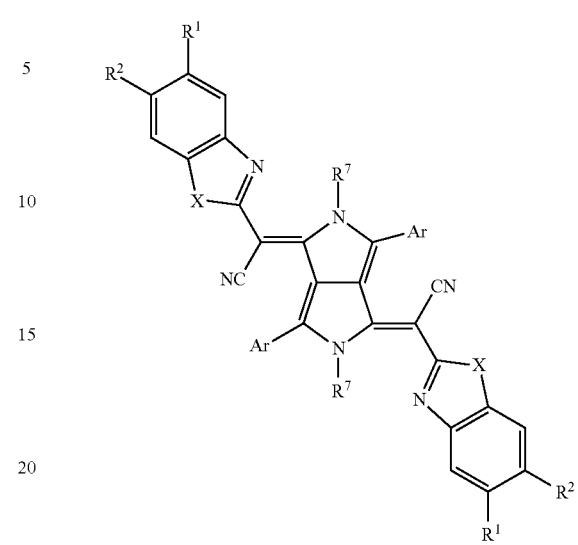

| | X | Ar | R¹ | R² | R⁷ |
|---|---|---|---|---|---|
| A-443 | O | Ar-50 | H | H | R-2 |
| A-444 | O | Ar-50 | H | H | R-3 |
| A-445 | O | Ar-50 | H | H | R-4 |
| A-446 | O | Ar-50 | H | H | R-5 |
| A-447 | O | Ar-50 | H | H | R-6 |
| A-448 | O | Ar-50 | H | H | R-7 |
| A-449 | O | Ar-53 | H | H | R-2 |
| A-450 | O | Ar-53 | H | H | R-3 |
| A-451 | O | Ar-53 | H | H | R-4 |
| A-452 | O | Ar-53 | H | H | R-5 |
| A-453 | O | Ar-53 | H | H | R-6 |
| A-454 | O | Ar-53 | H | H | R-7 |
| A-601 | S | Ar-4 | H | H | R-5 |
| A-602 | S | Ar-4 | Me | H | R-5 |
| A-603 | S | Ar-4 | Cl | H | R-5 |
| A-604 | S | Ar-48 | H | H | R-1 |
| A-605 | S | Ar-49 | H | H | R-1 |
| A-606 | S | Ar-50 | H | H | R-1 |
| A-607 | S | Ar-50 | Cl | H | R-1 |
| A-608 | S | Ar-50 | H | Cl | R-1 |
| A-609 | S | Ar-50 | Me | H | R-1 |
| A-610 | S | Ar-50 | H | Me | R-1 |
| A-611 | S | Ar-50 | Me | Me | R-1 |
| A-612 | S | Ar-50 | OMe | H | R-1 |
| A-613 | S | Ar-50 | H | OMe | R-1 |
| A-614 | S | Ar-51 | H | H | R-1 |
| A-615 | S | Ar-52 | H | H | R-1 |
| A-616 | S | Ar-53 | H | H | R-1 |
| A-617 | S | Ar-54 | H | H | R-1 |
| A-618 | S | Ar-55 | H | H | R-1 |
| A-619 | S | Ar-56 | H | H | R-1 |
| A-620 | S | Ar-57 | H | H | R-1 |

TABLE 6

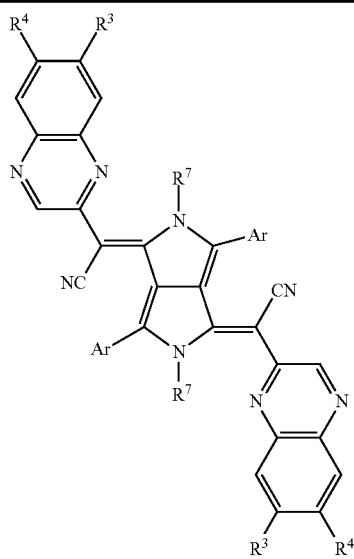

| | Ar | R³ | R⁴ | R⁷ |
|---|---|---|---|---|
| A-501 | Ar-48 | H | H | R-1 |
| A-502 | Ar-48 | Cl | H | R-1 |
| A-503 | Ar-48 | H | Cl | R-1 |
| A-504 | Ar-48 | Cl | Cl | R-1 |
| A-505 | Ar-48 | Me | Me | R-1 |
| A-506 | Ar-49 | H | H | R-1 |
| A-507 | Ar-49 | Cl | H | R-1 |
| A-508 | Ar-49 | H | Cl | R-1 |
| A-509 | Ar-49 | Cl | Cl | R-1 |
| A-510 | Ar-49 | Me | Me | R-1 |
| A-511 | Ar-50 | H | H | R-1 |
| A-512 | Ar-50 | Cl | H | R-1 |
| A-513 | Ar-50 | H | Cl | R-1 |
| A-514 | Ar-50 | Cl | Cl | R-1 |
| A-515 | Ar-50 | Me | H | R-1 |
| A-516 | Ar-50 | H | Me | R-1 |
| A-517 | Ar-50 | Me | Me | R-1 |
| A-518 | Ar-50 | OMe | H | R-1 |
| A-519 | Ar-50 | H | OMe | R-1 |
| A-520 | Ar-50 | OMe | OMe | R-1 |
| A-521 | Ar-51 | H | H | R-1 |
| A-522 | Ar-51 | Cl | H | R-1 |
| A-523 | Ar-51 | H | Cl | R-1 |
| A-524 | Ar-51 | Cl | Cl | R-1 |
| A-525 | Ar-51 | Me | Me | R-1 |
| A-526 | Ar-52 | H | H | R-1 |
| A-527 | Ar-52 | Cl | H | R-1 |
| A-528 | Ar-52 | H | Cl | R-1 |
| A-529 | Ar-52 | Cl | Cl | R-1 |
| A-530 | Ar-52 | Me | Me | R-1 |
| A-531 | Ar-53 | H | H | R-1 |
| A-532 | Ar-53 | Cl | H | R-1 |
| A-533 | Ar-53 | H | Cl | R-1 |
| A-534 | Ar-53 | Cl | Cl | R-1 |
| A-535 | Ar-53 | Me | Me | R-1 |
| A-536 | Ar-54 | H | H | R-1 |
| A-537 | Ar-54 | Cl | H | R-1 |
| A-538 | Ar-54 | H | Cl | R-1 |
| A-539 | Ar-54 | Cl | Cl | R-1 |
| A-540 | Ar-54 | Me | Me | R-1 |
| A-541 | Ar-55 | H | H | R-1 |
| A-542 | Ar-55 | Cl | H | R-1 |
| A-543 | Ar-55 | H | Cl | R-1 |
| A-544 | Ar-55 | Cl | Cl | R-1 |
| A-545 | Ar-55 | Me | Me | R-1 |
| A-546 | Ar-56 | H | H | R-1 |
| A-547 | Ar-56 | Cl | H | R-1 |
| A-548 | Ar-56 | H | Cl | R-1 |
| A-549 | Ar-56 | Cl | Cl | R-1 |
| A-550 | Ar-56 | Me | Me | R-1 |
| A-551 | Ar-57 | H | H | R-1 |

TABLE 6-continued

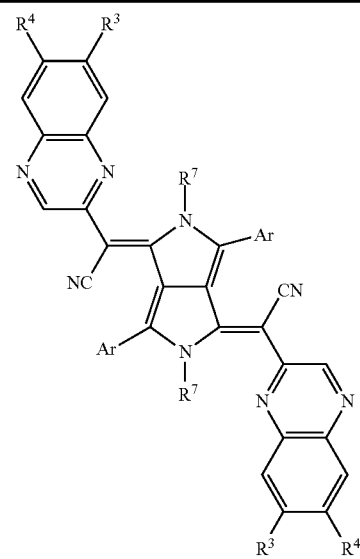

| | Ar | R³ | R⁴ | R⁷ |
|---|---|---|---|---|
| A-552 | Ar-57 | Cl | H | R-1 |
| A-553 | Ar-57 | H | Cl | R-1 |
| A-554 | Ar-57 | Cl | Cl | R-1 |
| A-555 | Ar-57 | Me | Me | R-1 |
| A-556 | Ar-50 | Cl | Cl | R-2 |
| A-557 | Ar-50 | Cl | Cl | R-3 |
| A-558 | Ar-50 | Cl | Cl | R-4 |
| A-559 | Ar-50 | Cl | Cl | R-5 |
| A-560 | Ar-50 | Cl | Cl | R-6 |
| A-561 | Ar-50 | Cl | Cl | R-7 |
| A-562 | Ar-53 | Cl | Cl | R-2 |
| A-563 | Ar-53 | Cl | Cl | R-3 |
| A-564 | Ar-53 | Cl | Cl | R-4 |
| A-565 | Ar-53 | Cl | Cl | R-5 |
| A-566 | Ar-53 | Cl | Cl | R-6 |
| A-567 | Ar-53 | Cl | Cl | R-7 |

In the tables, Ar-1 to Ar-7, Ar-41 to Ar-57, and R-1 to R-7 are as follows. In the following structures, "*" represents a direct bond.

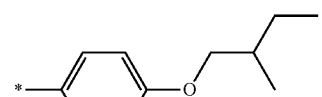

Ar-1

Ar-2

Ar-3

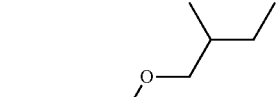

Ar-4

-continued
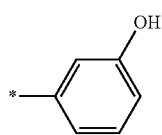 Ar-5
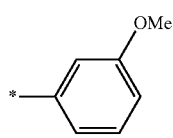 Ar-6
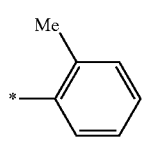 Ar-7
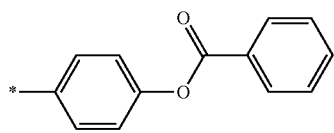 Ar-41
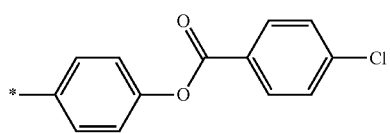 Ar-42
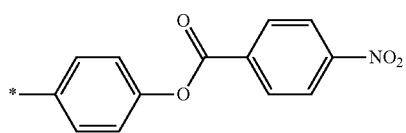 Ar-43
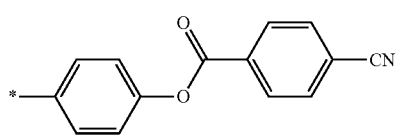 Ar-44
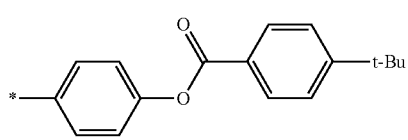 Ar-45
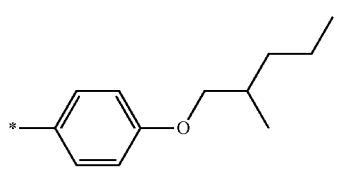 Ar-46
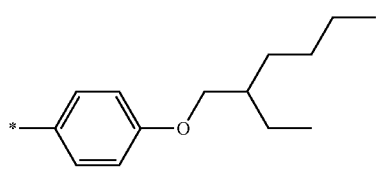 Ar-47
-continued
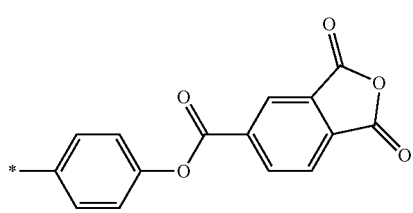 Ar-48
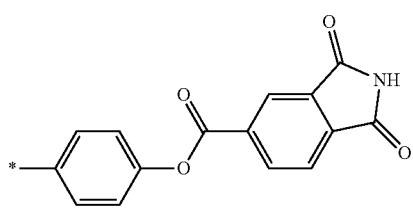 Ar-49
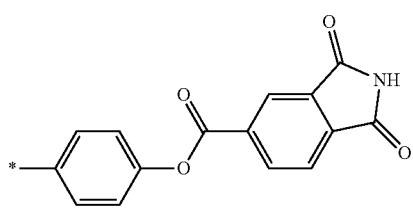 Ar-50
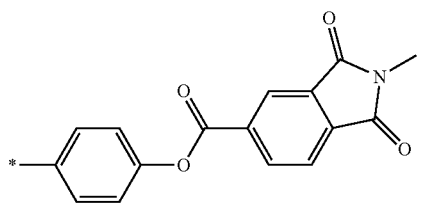 Ar-51
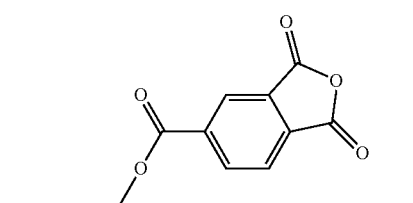 Ar-52
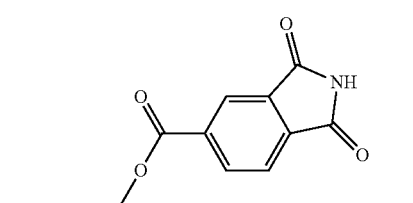 Ar-53

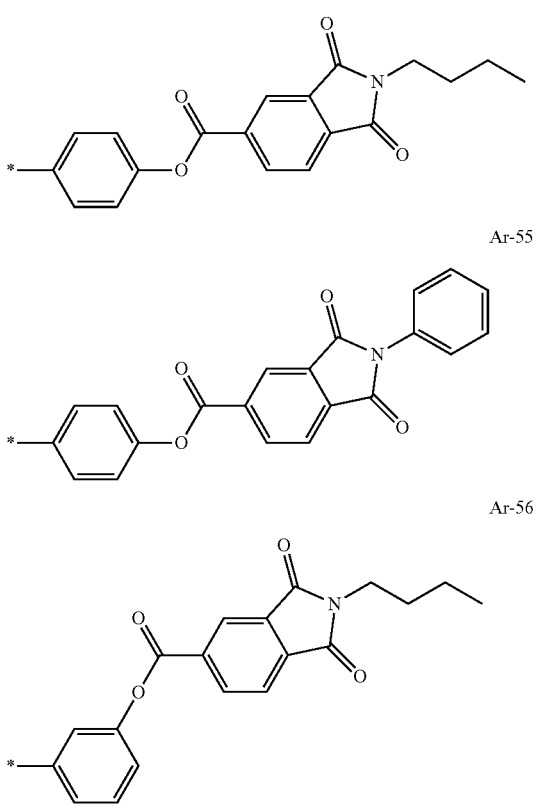
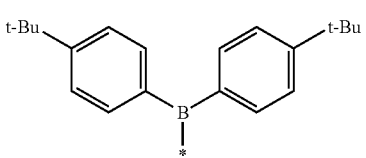
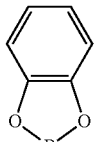
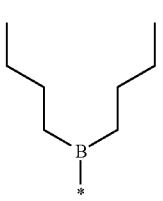

(Diketo Pyrrolo Pyrrole Compound)

In the present invention, examples of the diketo pyrrolo pyrrole compound include a compound represented by the following Formula (DP).

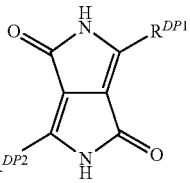

Formula (DP)

In the formula, $R^{DP1}$ and $R^{DP2}$ each independently represent an alkyl group, an aryl group, or a heteroaryl group.

$R^{DP1}$ and $R^{DP2}$ represent preferably an aryl group or a heteroaryl group and more preferably an aryl group.

The number of carbon atoms in the alkyl group is preferably 1 to 30, more preferably 1 to 20, and still more preferably 1 to 10.

The number of carbon atoms in the aryl group is preferably 6 to 30, more preferably 6 to 20, and still more preferably 6 to 12.

The number of carbon atoms constituting the heteroaryl group is preferably 1 to 30 and more preferably 1 to 12. Examples of the kind of the heteroatom constituting the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocycle or a fused ring, more preferably a monocycle or a fused ring composed of 2 to 8 rings, and still more preferably a monocycle or a fused ring composed of 2 to 4 rings.

The alkyl group, the aryl group, and the heteroaryl group may have a substituent or may be unsubstituted. Examples of the substituent include the above-described substituent T. For example, a halogen atom is preferable.

Specific examples of the compound represented by Formula (DP) include the following compounds.

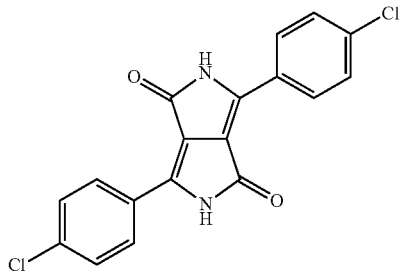

(DP-1)

(Phthalocyanine Compound)

In the present invention, examples of the phthalocyanine compound include a compound represented by the following Formula (PC).

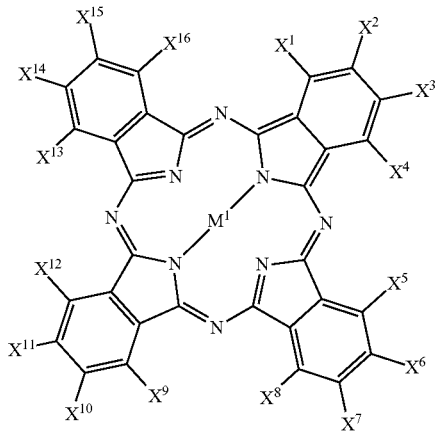

(PC)

In Formula (PC), $X^1$ to $X^{16}$ each independently represent a hydrogen atom or a substituent, and $M^1$ represents Cu Ti=O, or V=O.

Examples of the substituent represented by $X^1$ to $X^{16}$ include the groups described above regarding the substituent T. Among these, an alkyl group, a halogen atom, an alkoxy group, a phenoxy group, an alkylthio group, a phenylthio group, an alkylamino group, or an anilino group is preferable.

The number of substituents among $X^1$ to $X^{16}$ is preferably 0 to 16, more preferably 0 to 4, still more preferably 0 or 1, and even still more preferably 0. In addition, $M^1$ represents preferably Ti=O or V=O and more preferably Ti=O.

As the phthalocyanine compound, an oxytitaniumphthalocyanine (a compound in which $M^1$ in Formula (PC) represents Ti=O) is preferable. The oxytitaniumphthalocyanine can be preferably used as the near infrared absorbing pigment. Examples of the phthalocyanine compound include a compound described in a paragraph "0093" of JP2012-77153A, the content of which is incorporated herein by reference.

(Naphthalocyanine Compound)

In the present invention, examples of the naphthalocyanine compound include a compound represented by the following Formula (NPC).

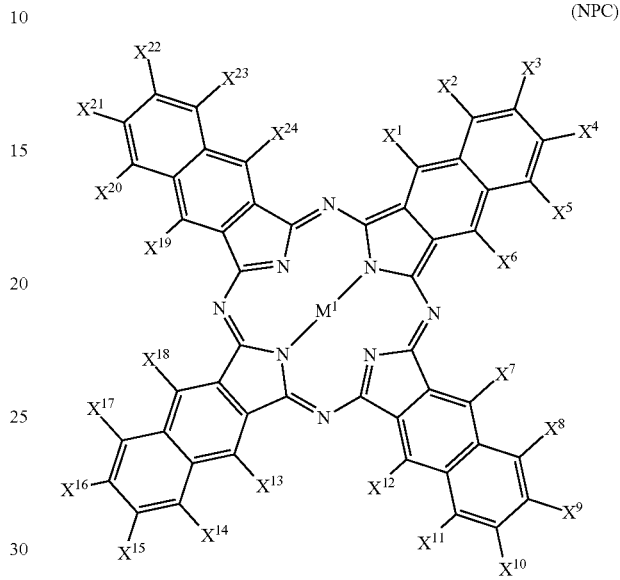

(NPC)

In Formula (NPC), $X^1$ to $X^{24}$ each independently represent a hydrogen atom or a substituent, and $M^1$ represents Cu or V=O. Examples of the substituent represented by $X^1$ to $X^{24}$ include the groups described above regarding the substituent T. Among these, an alkyl group, a halogen atom, an alkoxy group, a phenoxy group, an alkylthio group, a phenylthio group, an alkylamino group, or an anilino group is preferable. It is preferable that $M^1$ represents V=O. Examples of the naphthalocyanine compound include a compound described in a paragraph "0093" of JP2012-77153A, the content of which is incorporated herein by reference.

<<Pigment Derivative>>

In addition, the composition according to the present invention includes a pigment derivative. Examples of the pigment derivative include a compound having a structure in which a portion of a pigment is substituted with an acidic group, a basic group, a group having a salt structure, or a phthalimido group.

The pigment derivative includes a compound represented by Formula (1). In the pigment derivative represented by Formula (1), the pyrrolopyrrole skeleton portion interacts with the pigment so as to be adsorbed on the pigment surface. Therefore, the pigment dispersibility in the composition can be improved. In addition, another component (for example, in a case where the composition includes a resin, the resin) in the composition and the terminal portion X in the pigment derivative interact with each other such that the pigment dispersibility can be further improved. The pigment derivative represented by Formula (1) has excellent visible transparency, and thus can improve the pigment dispersibility without affecting the color of the pigment in a visible range.

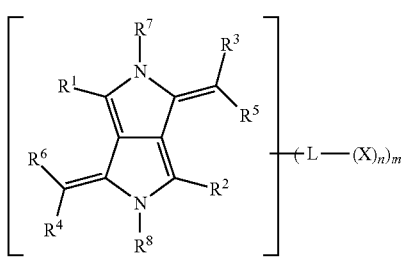

(1)

In Formula (1), $R^1$ and $R^2$ each independently represent an alkyl group, an aryl group, or a heteroaryl group.

$R^3$, $R^4$, $R^5$, and $R^6$ each independently represent a cyano group, an acyl group, an alkoxycarbonyl group, an alkylsulfinyl group, an arylsulfinyl group, or a heteroaryl group.

$R^7$ and $R^8$ each independently represent a hydrogen atom, an alkyl group, an aryl group, a heteroaryl group, —$BR^9R^{10}$, or a metal atom.

$R^7$ may form a covalent bond or a coordinate bond with $R^1$, $R^3$, or $R^5$.

$R^8$ may form a covalent bond or a coordinate bond with $R^2$, $R^4$, or $R^6$.

$R^9$ and $R^{10}$ each independently represent a hydrogen atom, a halogen atom, an alkyl group, an alkenyl group, an aryl group, a heteroaryl group, an alkoxy group, an aryloxy group, or a heteroaryloxy group, and $R^9$ and $R^{1'}$ may be bonded to each other to form a ring.

L represents a single bond, an alkylene group, an arylene group, a nitrogen-containing heterocyclic group, —O—, —S—, —NR'—, —CO—, —COO—, —OCO—, —$SO_2$—, or a linking group including a combination of an alkylene group, an arylene group, a nitrogen-containing heterocyclic group, —O—, —S—, —NR'—, —CO—, —COO—, —OCO—, and —$SO_2$—, and R' represents a hydrogen atom, an alkyl group, or an aryl group.

X represents an acidic group, a basic group, a group having a salt structure, or a phthalimido group.

m represents an integer of 1 to 10, n represents an integer of 1 to 10, in a case where m represents 2 or more, a plurality of L's and a plurality of X's may be different from each other, and in a case where n represents 2 or more, a plurality of X's may be different from each other.

In Formula (1), R and $R^2$ each independently represent an alkyl group, an aryl group, or a heteroaryl group, preferably an aryl group or a heteroaryl group, and more preferably an aryl group.

The number of carbon atoms in the alkyl group represented by $R^1$ and $R^2$ is preferably 1 to 30, more preferably 1 to 20, and still more preferably 1 to 10.

The number of carbon atoms in the aryl group represented by $R^1$ and $R^2$ is preferably 6 to 30, more preferably 6 to 20, and still more preferably 6 to 12.

The number of carbon atoms constituting the heteroaryl group represented by $R^1$ and $R^2$ is preferably 1 to 30 and more preferably 1 to 12. Examples of the kind of the heteroatom constituting the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocycle or a fused ring, more preferably a monocycle or a fused ring composed of 2 to 8 rings, and still more preferably a monocycle or a fused ring composed of 2 to 4 rings.

The alkyl group, the aryl group, and the heteroaryl group represented by $R^1$ to $R^2$ may be unsubstituted or may have a substituent. Examples of the substituent include the groups described regarding the substituent T. In addition, -L-$(X)_n$ in Formula (1) may be bonded, and it is preferable that -L-$(X)_n$ in Formula (1) is bonded.

In Formula (1), $R^3$, $R^4$, $R^5$, and $R^6$ each independently represent a cyano group, an acyl group, an alkoxycarbonyl group, an alkylsulfinyl group, an arylsulfinyl group, or a heteroaryl group.

It is preferable that one of $R^3$ and $R^5$ represents a cyano group, an acyl group, an alkoxycarbonyl group, an alkylsulfinyl group, or an arylsulfinyl group and the other one of $R^3$ and $R^5$ represents a heteroaryl group, and it is more preferable that one of $R^3$ and $R^5$ represents a cyano group and the other one of $R^3$ and $R^5$ represents a heteroaryl group.

It is preferable that one of $R^4$ and $R^6$ represents a cyano group, an acyl group, an alkoxycarbonyl group, an alkylsulfinyl group, or an arylsulfinyl group and the other one of $R^4$ and $R^6$ represents a heteroaryl group, and it is more preferable that one of $R^4$ and $R^6$ represents a cyano group and the other one of $R^4$ and $R^6$ represents a heteroaryl group.

Examples of the heteroaryl group represented by $R^3$ to $R^6$ include the heteroaryl group described above regarding $R^{23}$ to $R^{26}$ of the pyrrolopyrrole compound, and preferable ranges thereof are also the same. The heteroaryl group may have a substituent or may be unsubstituted. Examples of the substituent include the groups described regarding the substituent T. In addition, -L-$(X)_n$ in Formula (1) may be bonded.

It is preferable that the kind of the heteroaryl group represented by $R^3$ to $R^6$ is selected according to the kind of the pigment to be used in combination. For example, in a case where the pyrrolopyrrole compound (preferably the pyrrolopyrrole compound represented by Formula (PP)) is used as the pigment, it is preferable that the heteroaryl group represented by $R^3$ to $R^6$ is a heteroaryl group having a structure common to the heteroaryl group included in the pyrrolopyrrole compound used as the pigment. According to this aspect, the pigment dispersibility can be further improved without deterioration in the color of the pigment in a visible range. The heteroaryl group having the common structure represents that, in a case where substituents are bonded to the heteroaryl groups, structures (the structures of the heteroaryl rings) of portions excluding the substituents are the same.

In Formula (1), $R^7$ and $R^8$ each independently represent a hydrogen atom, an alkyl group, an aryl group, a heteroaryl group, —$BR^9R^{10}$, or a metal atom and preferably —$BR^9R^{10}$. $R^9$ and $R^{10}$ each independently represent a hydrogen atom, a halogen atom, an alkyl group, an alkenyl group, an aryl group, a heteroaryl group, an alkoxy group, an aryloxy group, or a heteroaryloxy group, preferably a halogen atom, an alkyl group, an aryl group, or a heteroaryl group, more preferably a halogen atom, an alkyl group, or an aryl group, and still more preferably an aryl group. $R^9$ and $R^{10}$ may be bonded to each other to form a ring. $R^7$ and $R^8$ have the same definitions and the preferable ranges as $R^{27}$ and $R^{28}$ of the pyrrolopyrrole compound represented by Formula (PP).

In Formula (1), L represents a single bond, an alkylene group, an arylene group, a nitrogen-containing heterocyclic group, —O—, —S—, —NR'—, —CO—, —COO—, —OCO—, —$SO_2$—, or a linking group including a combination thereof, and R' represents a hydrogen atom, an alkyl group, or an aryl group. A trivalent or higher linking group is a group obtained by removing one or more hydrogen atoms from the above-described linking group.

The number of carbon atoms in the alkylene group is preferably 1 to 30, more preferably 1 to 15, and still more preferably 1 to 10. The alkylene group may have a substituent. The alkylene group may be linear, branched, or cyclic. In addition, the cyclic alkylene group may be monocyclic or polycyclic.

As the arylene group, an arylene group having 6 to 18 carbon atoms is preferable, an arylene group having 6 to 14 carbon atoms is more preferable, an arylene group having 6 to 10 carbon atoms is still more preferable, and a phenylene group is even still more preferable.

It is preferable that the nitrogen-containing heterocyclic group is a 5-membered or 6-membered ring. In addition, the nitrogen-containing heterocyclic group is preferably a monocycle or a fused ring, more preferably a monocycle or a fused ring composed of 2 to 8 rings, and still more preferably a monocycle or a fused ring composed of 2 to 4 rings. The number of nitrogen atoms in the nitrogen-containing heterocyclic group is preferably 1 to 3 and more preferably 1 or 2. The nitrogen-containing heterocyclic group may include a heteroatom other than a nitrogen atom. Examples of the heteroatom other than a nitrogen atom include an oxygen atom and a sulfur atom. The number of heteroatoms other than a nitrogen atom is preferably 0 to 3 and more preferably 0 or 1. Examples of the nitrogen-containing heterocyclic group include a piperazine ring group, a pyrrolidine ring group, a pyrrole ring group, a piperidine ring group, a pyridine ring group, an imidazole ring group, a pyrazole ring group, an oxazole ring group, a thiazole ring group, a pyrazine ring group, a morpholine ring group, a thiazine ring group, an indole ring group, an isoindole ring group, a benzimidazole ring group, a purine ring group, a quinoline ring group, an isoquinoline ring group, a quinoxaline ring group, a cinnoline ring group, a carbazole ring group, and groups represented by the following Formulae (L-1) to (L-7).

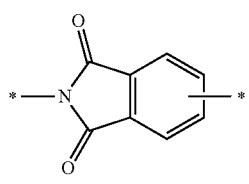
(L-1)

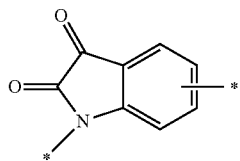
(L-2)

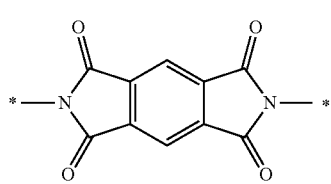
(L-3)

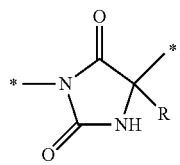
(L-4)

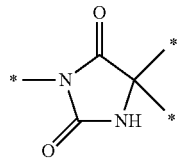
(L-5)

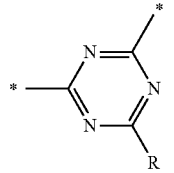
(L-6)

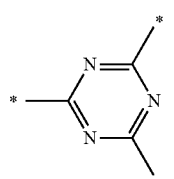
(L-7)

In the formulae, * represents a direct bond to P, L, or X. R represents a hydrogen atom or a substituent. Examples of the substituent include the substituent T described above regarding the Formula (1).

Specific examples of the linking group are as follows:
(1) an alkylene group;
(2) —COO—;
(3) —OCO—;
(4) —NR'—;
(5) a group including a combination of —O— and an alkylene group (for example, —O-alkylene group-);
(6) a group including a combination of —O— and an arylene group (for example, —O-arylene group-);
(7) a group including a combination of —O—, an alkylene group, and —S— (for example, —O-alkylene group-S—);
(8) a group including a combination of —O—, an arylene group, and —S— (for example, —O-arylene group-S—);
(9) a group including a combination of —COO— and an alkylene group (for example, —COO-alkylene group-);
(10) a group including a combination of —COO— and an arylene group (for example, —COO-arylene group-);
(11) a group including a combination of —COO—, an arylene group, and an alkylene group (for example, —COO-arylene group-alkylene group- or —COO-alkylene group-arylene group-);
(12) a group including a combination of —OCO— and an alkylene group (for example, —OCO-alkylene group-);
(13) a group including a combination of —OCO— and an arylene group (for example, —OCO-arylene group-);
(14) a group including a combination of —OCO—, an arylene group, and an alkylene group (for example, —OCO-arylene group-alkylene group- or —OCO-alkylene group-arylene group-);

(15) a group including a combination of —NR'— and an alkylene group (for example, —NR'-alkylene group);

(16) a group including a combination of —NR'— and an arylene group (for example, —NR'-arylene group-);

(17) a group including a combination of —NR'—, an arylene group, and an alkylene group (for example, —NR'-arylene group-alkylene group- or —NR'-alkylene group-arylene group-);

(18) a group including a combination of —NR'—, and —CO— (for example, —NR'—CO— or —NR'—CO—NR'—);

(19) a group including a combination of —NR'—, —CO—, and an alkylene group (for example, —NR'—CO-alkylene group-);

(20) a group including a combination of —NR'—, —CO—, and an arylene group (for example, —NR'—CO-arylene group-);

(21) a group including a combination of —NR'—, —CO—, an alkylene group, and an arylene group (for example, —NR'—CO-alkylene group-arylene group-);

(22) —SO$_2$—;

(23) the group represented by (L-1);

(24) the group represented by (L-5);

(25) a group including a combination of —NR'—, and —SO$_2$— (for example, —NR'—SO$_2$—);

(26) a group including a combination of —NR'—, —SO$_2$—, and an alkylene group (for example, —NR'—SO$_2$-alkylene group-);

(27) a group including a combination of —NR'—, —SO$_2$—, and an arylene group (for example, —NR'—SO$_2$-arylene group-);

(28) a group including a combination of —NR'—, —SO$_2$—, an alkylene group, and an arylene group (for example, —NR'—SO$_2$-alkylene group-arylene group- or —NR'—SO$_2$-arylene group-alkylene group-);

(29) a group including a combination of the group represented by (L-1) and an alkylene group;

(30) a group including a combination of the group represented by (L-1) and an arylene group;

(31) a group including a combination of the group represented by (L-1), —SO$_2$—, and an alkylene group;

(32) a group including a combination of the group represented by (L-1), —S—, and an alkylene group;

(33) a group including a combination of the group represented by (L-1), —O—, and an arylene group;

(34) a group including a combination of the group represented by (L-1), —NR'—, —CO—, and an arylene group;

(35) a group including a combination of the group represented by (L-1) and —COO—;

(36) a group including a combination of the group represented by (L-1) and —OCO—;

(37) a group including a combination of the group represented by (L-1), —COO—, and an alkylene group;

(38) a group including a combination of the group represented by (L-1), —OCO—, and an alkylene group;

(39) a group including a combination of the group represented by (L-3) and an arylene group;

(40) a group including a combination of —OCO—, an arylene group, —CO—, and —NR'—; and

(41) a group including a combination of —COO—, an arylene group, —CO—, and —NR'—.

It is preferable that L represents a linking group. In addition, the linking group is preferably (1) to (21), (29) to (38), (40), or (41), more preferably (1) to (21), still more preferably (2), (3), or (5) to (14), even still more preferably (5) to (14), yet even still more preferably (5) or (14), and most preferably (5). The compound in which L represents (5) to (14) has higher pigment dispersibility. In particular, in a case where X represents a sulfo group, it is preferable that L represents the linking group (5) or (29) to (38). In addition, in a case where X represents a group represented by Formula (X-3) described below, it is preferable that L represents the linking group (14), (29) to (38), (40), or (41).

In Formula (1), X represents an acidic group, a basic group, a group having a salt structure, or a phthalimido group.

Examples of the acidic group include a carboxyl group and a sulfo group.

Examples of the basic group include groups represented by Formulae (X-3) to (X-9) described below.

Examples of the group having a salt structure include salts of the above-described acidic groups and salts of the above-described basic groups. Examples of an atom or an atomic group constituting the salts include a metal atom and tetrabutylammonium. As the metal atom, an alkali metal atom or an alkali earth metal atom is more preferable. Examples of the alkali metal atom include lithium, sodium, and potassium. Examples of the alkali earth metal atom include calcium and magnesium.

The phthalimido group may be unsubstituted or may have a substituent. Examples of the substituent include the above-described acidic groups, the above-described basic groups, and the above-described groups having a salt structure In addition, the substituent T described above regarding Formula (1) may also be used. The substituent T may be further substituted with another substituent.

X represents preferably at least one selected from the group consisting of a carboxyl group, a sulfo group, a phthalimido group, and groups represented by the following Formulae (X-1) to (X-9), more preferably a carboxyl group, a sulfo group, or a group represented by Formula (X-3), still more preferably a sulfo group or a group represented by Formula (X-3), and even still more preferably a sulfo group. A compound in which X represents a sulfo group can more effectively improve the pigment dispersibility. In addition, a compound in which X represents a group represented by Formula (X-3) has higher basicity than other basic groups, and thus the interaction with the resin can be improved and the pigment dispersibility can be improved.

(X-1)

(X-2)

(X-3)

(X-4)

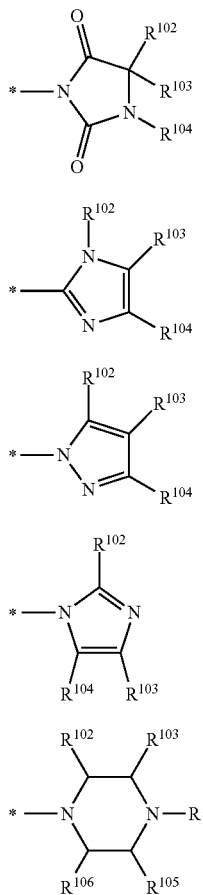

(X-5)

(X-6)

(X-7)

(X-8)

(X-9)

In Formulae (X-1) to (X-9), * represents a direct bond to L of Formula (1), $R^{100}$ to $R^{106}$ each independently represent a hydrogen atom, an alkyl group, an alkenyl group, or an aryl group, $R^{100}$ and $R^{101}$ may be linked to each other to form a ring, and M represents an atom or atomic group constituting an anion and a salt.

The alkyl group represented by $R^{100}$ to $R^{106}$ may be linear, branched, or cyclic. The number of carbon atoms in the linear alkyl group is preferably 1 to 20, more preferably 1 to 12, and still more preferably 1 to 8. The number of carbon atoms in the branched alkyl group is preferably 3 to 20, more preferably 3 to 12, and still more preferably 3 to 8. The cyclic alkyl group may be monocyclic or polycyclic. The number of carbon atoms in the cyclic alkyl group is preferably 3 to 20, more preferably 4 to 10, and still more preferably 6 to 10.

The number of carbon atoms in the alkenyl group represented by $R^{100}$ to $R^{106}$ is preferably 2 to 10, more preferably 2 to 8, and still more preferably 2 to 4.

The number of carbon atoms in the aryl group represented by $R^{100}$ to $R^{106}$ is preferably 6 to 18, more preferably 6 to 14, and still more preferably 6 to 10.

$R^{100}$ and $R^{101}$ may be linked to each other to form a ring. The ring may be an alicyclic ring or an aromatic ring. The ring may be a monocycle or a fused ring. In a case where $R^{100}$ and $R^{101}$ are bonded to each other to form a ring through a linking group, for example, the linking group may be a divalent linking group selected from the group consisting of —CO—, —O—, —NH—, a divalent aliphatic group, a divalent aromatic group, and a combination thereof. Specific examples of the ring include a piperazine ring, a pyrrolidine ring, a pyrrole ring, a piperidine ring; a pyridine ring, an imidazole ring, a pyrazole ring, an oxazole ring, a thiazole ring, a pyrazine ring, a morpholine ring, a thiazine ring, an indole ring, an isoindole ring, a benzimidazole ring, a purine ring, a quinoline ring, an isoquinoline ring, a quinoxaline ring, a cinnoline ring, and a carbazole ring. It is preferable that $R^{100}$ and $R^{101}$ do not form a ring.

M represents an atom or an atomic group constituting an anion and a salt. M has the same exemplary groups and the same preferable ranges as described above.

$R^{100}$ and $R^{101}$ each independently represent preferably an alkyl group, or an aryl group and more preferably an alkyl group. The alkyl group is preferably a linear or branched alkyl group and more preferably a linear alkyl group.

In Formula (1), m represents an integer of 1 to 10, preferably 1 to 4, more preferably 1 to 3, still more preferably 1 or 2, and even still more preferably 2.

In Formula (1), n represents an integer of 1 to 10, preferably 1 to 4, more preferably 1 to 3, still more preferably 1 or 2, and even still more preferably 1.

In Formula (1), it is preferable that at least one of $R^1$, ..., or $R^8$ includes a structure represented by "-L-(X)$_n$", it is more preferable that at least one of $R^1$ or $R^8$ includes a structure represented by "-L-(X)$_n$", and it is still more preferable that $R^1$ and $R^8$ include a structure represented by "-L-(X)$_n$".

It is preferable that the compound represented by Formula (1) is a compound represented by the following Formula (1a).

(1a)

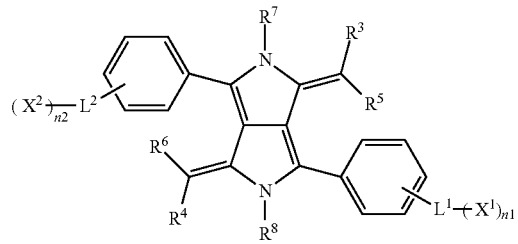

In Formula (1a), $R^3$, $R^4$, $R^5$, and $R^6$ each independently represent a cyano group, an acyl group, an alkoxycarbonyl group, an alkylsulfinyl group, an arylsulfinyl group, or a heteroaryl group.

$R^7$ and $R^8$ each independently represent a hydrogen atom, an alkyl group, an aryl group, a heteroaryl group, —BR$^9$R$^{1'}$, or a metal atom.

$R^8$ may form a covalent bond or $R^7$ may form a covalent bond or a coordinate bond with $R^3$ or $R^5$.

$R^8$ may form a covalent bond or a coordinate bond with $R^4$ or $R^6$.

$R^9$ and $R^{1'}$ each independently represent a hydrogen atom, a halogen atom, an alkyl group, an alkenyl group, an aryl group, a heteroaryl group, an alkoxy group, an aryloxy group, or a heteroaryloxy group, and $R^9$ and $R^{10}$ may be bonded to each other to form a ring.

$L^1$ and $L^2$ each independently represent a single bond, an alkylene group, an arylene group, a nitrogen-containing heterocyclic group, —O—, —S—, —NR$^{1'}$—, —CO—, —SO$_2$—, or a linking group including a combination of an alkylene group, an arylene group, a nitrogen-containing heterocyclic group, —O—, —S—, —NR$^{1'}$—, —CO—, —COO—, —OCO—, and —SO$_2$—, and R' represents a hydrogen atom, an alkyl group, or an aryl group.

$X^1$ and $X^2$ each independently represent an acidic group, a basic group, a group having a salt structure, or a phthalimido group.

n1 and n2 each independently represent 0 to 4, and at least one of n1 or n2 represents 1 or more.

$R^3$ to $R^8$ in Formula (1a) has the same definitions and the same preferable ranges as $R^3$ to $R^8$ in Formula (1).

$X^1$ and $X^2$ in Formula (1a) have the same definition and the same preferable range as of X in Formula (1).

In Formula (1a), $L^1$ and $L^2$ each independently represent a single bond, an alkylene group, an arylene group, a nitrogen-containing heterocyclic group, —O—, —S—, —NR'—, —CO—, —SO$_2$—, or a linking group including a combination of an alkylene group, an arylene group, a nitrogen-containing heterocyclic group, —O—, —S—, —NR'—, —CO—, —COO—, —OCO—, and —SO$_2$—, and R' represents a hydrogen atom, an alkyl group, or an aryl group. It is preferable that $L^1$ and $L^2$ each independently represent a linking group. Specific examples of the linking group include the linking groups (1) to (41) described above regarding L of Formula (1). The linking group is preferably (1) to (21), (29) to (38), (40), or (41), more preferably (1) to (21), still more preferably (2), (3), or (5) to (14), even still more preferably (5) to (14), yet even still more preferably (5) or (14), and most preferably (5). In addition, in a case where $X^1$ ($X^2$) represents a sulfo group, it is preferable that $L^1$ ($L^2$) represents the linking group (5) or (29) to (38). In addition, in a case where $X^1$ ($X^2$) represents the group represented by Formula (X-3), it is preferable that $L^1$ ($L^2$) represents the linking group (14), (29) to (38), (40), or (41).

In addition, in $L^1$, the number of atoms constituting a chain through which a benzene ring directly linked to a pyrrolopyrrole structure as the mother nucleus structure of the pigment derivative is linked to $X^1$ is preferably 1 to 20. The lower limit is preferably 2 or more and more preferably 3 or more. The upper limit is preferably 15 or less and more preferably 10 or less. In addition, in $L^2$, the number of atoms constituting a chain through which a benzene ring directly linked to a pyrrolopyrrole structure as the mother nucleus structure of the pigment derivative is linked to $X^2$ is preferably 1 to 20. The lower limit is preferably 2 or more and more preferably 3 or more. The upper limit is preferably 15 or less and more preferably 10 or less. According to this aspect, the pigment dispersibility can be further improved. The detailed reason is not clear but is presumed to be that, by increasing the distance from the pyrrolopyrrole structure as the mother nucleus structure of the pigment derivative to $X^1$ and $X^2$, $X^1$ and $X^2$ is not likely to undergo steric hindrance, the interaction with the resin or the like is likely to occur, and thus the pigment dispersibility can be improved.

For example, in the case of the following compound (B-1), the number of atoms constituting a chain through which a benzene ring directly linked to a pyrrolopyrrole structure is linked to $X^1$ is 5, and the number of atoms constituting a chain through which a benzene ring directly linked to a pyrrolopyrrole structure is linked to $X^2$ is also 5. The compound (B-1) is a compound in which, in Formula (1a), n1 and n2 represent 1 and $X^1$ and $X^2$ represent a sulfo group (SO$_3$H).

In addition, in the case of the following compound (B-27), the number of atoms constituting a chain through which a benzene ring directly linked to a pyrrolopyrrole structure is linked to $X^1$ is 10, and the number of atoms constituting a chain through which a benzene ring directly linked to a pyrrolopyrrole structure is linked to $X^2$ is also 10. In the compound (B-27), n1 represents 2 and n2 represents 2. The compound (B-27) is a compound in which, in Formula (1a), n1 and n2 represent 2 and $X^1$ and $X^2$ represent —N(C$_2$H$_5$)$_2$.

A numerical value added to a structural formula is the number of atoms constituting a chain through which $X^1$ or $X^2$ is linked to a benzene ring directly linked to a pyrrolopyrrole structure.

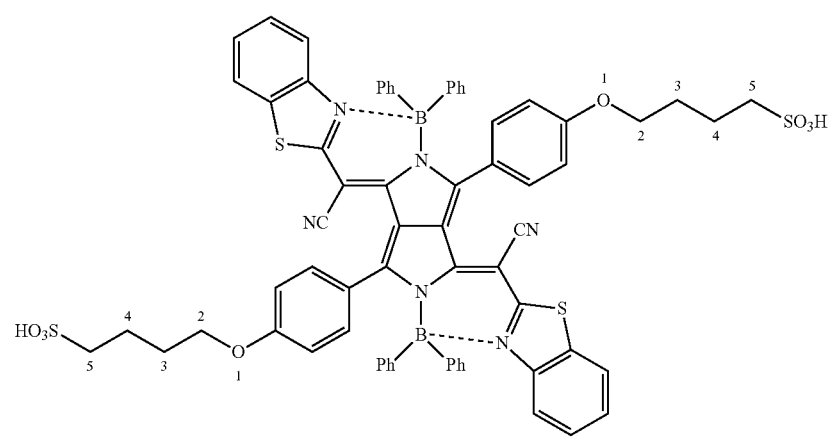

(B-1)

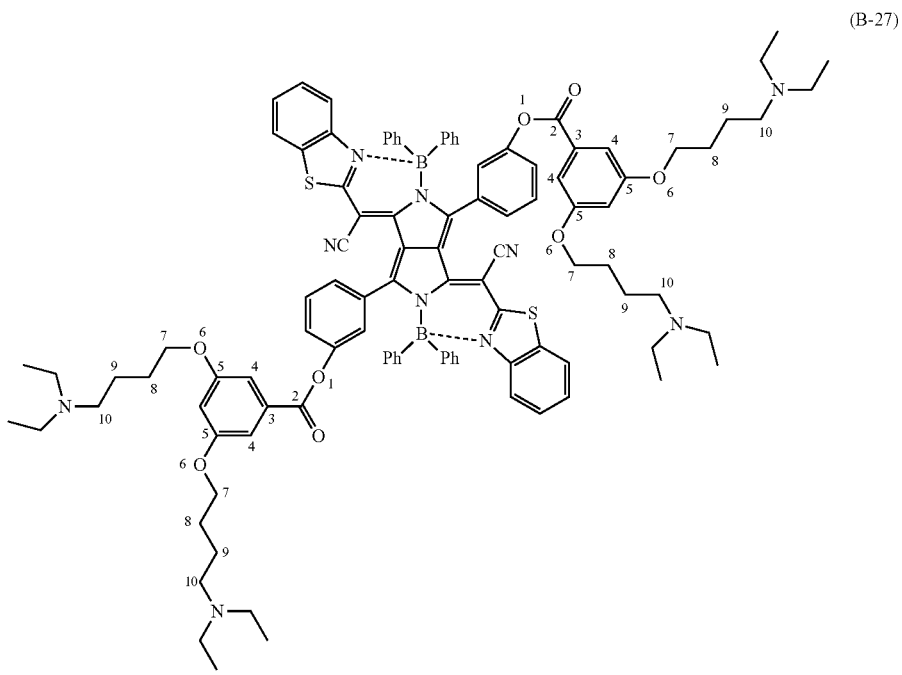

(B-27)

In Formula (1a), n1 and n2 each independently represent 0 to 4, and at least one of n1 or n2 represents 1 or more. n1 and n2 each independently preferably represent 1 to 4, more preferably 1 or 2, and still more preferably 1.

A solubility of the compound represented by Formula (1) in the solvent (25° C.) included in the composition is preferably 0 to 0.1 g/L and more preferably 0 to 0.01 g/L. According to this aspect, the pigment dispersibility can be further improved.

It is preferable that the compound represented by Formula (1) is a compound having an absorption maximum in a wavelength range of 700 to 1200 nm. In addition, a ratio A1/A2 of an absorbance A1 at a wavelength of 500 nm to an absorbance A2 at the absorption maximum is preferably 0.1 or lower and more preferably 0.05 or lower. The absorbance of the compound is a value obtained from the absorption spectrum of the compound in the solution. Examples of a measurement solvent used for the measurement of the absorption spectrum of the compound represented by Formula (1) in the solution include chloroform, dimethyl sulfoxide, and tetrahydrofuran. In a case where the compound represented by Formula (1) is soluble in chloroform, chloroform is used as the measurement solvent. In addition, in a case where the compound represented by Formula (1) is not soluble in chloroform and is soluble in dimethyl sulfoxide or tetrahydrofuran, dimethyl sulfoxide or tetrahydrofuran is used as the measurement solvent.

Specific examples of the compound represented by Formula (1) include the following compounds. In the following structural formulae, Me represents a methyl group, Bu represents a butyl group, and Ph represents a phenyl group. Ar-11 to Ar-34, Ar-61 to Ar-77, and R-1 to R-7 in the following tables are as follows. In the following structures, "*" represents a direct bond.

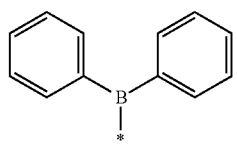

R-1

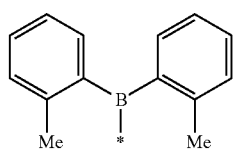

R-2

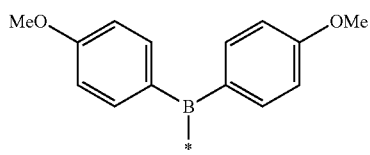

R-3

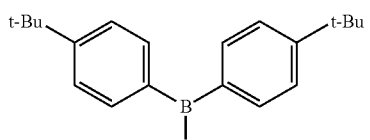

R-4

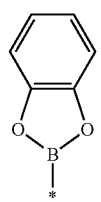

R-5

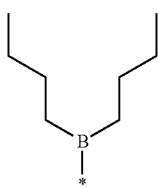
R-6
R-7
Ar-11
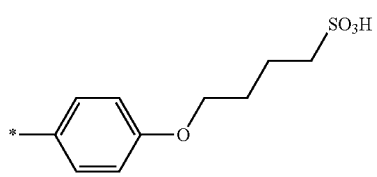
Ar-12
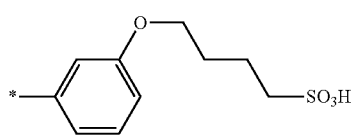
Ar-13
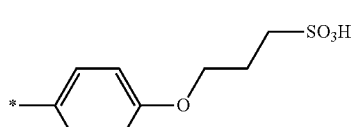
Ar-14
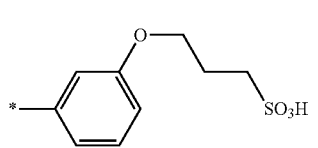
Ar-15
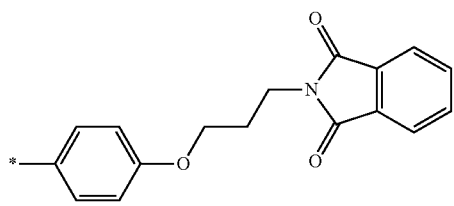
Ar-16
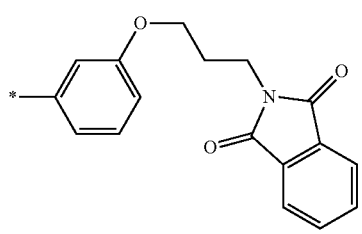
Ar-17
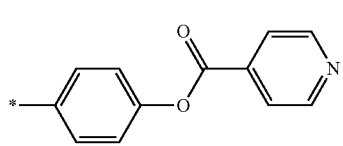
Ar-18
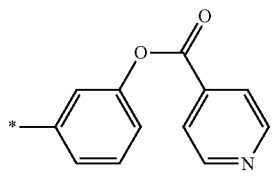
Ar-19
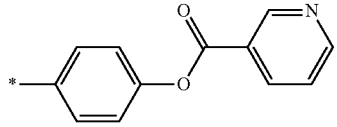
Ar-20
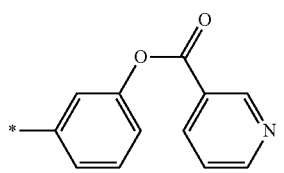
Ar-21
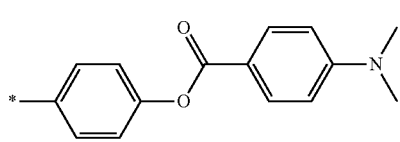
Ar-22
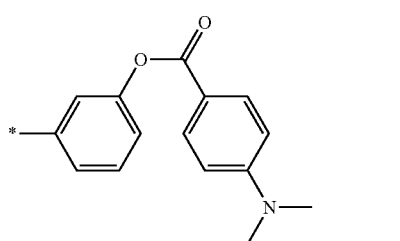
Ar-23
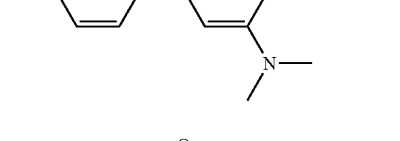
Ar-24
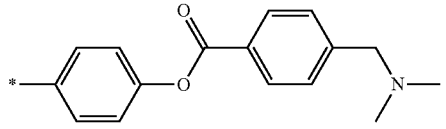
Ar-25
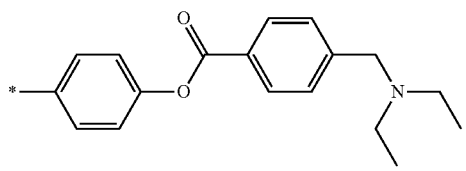

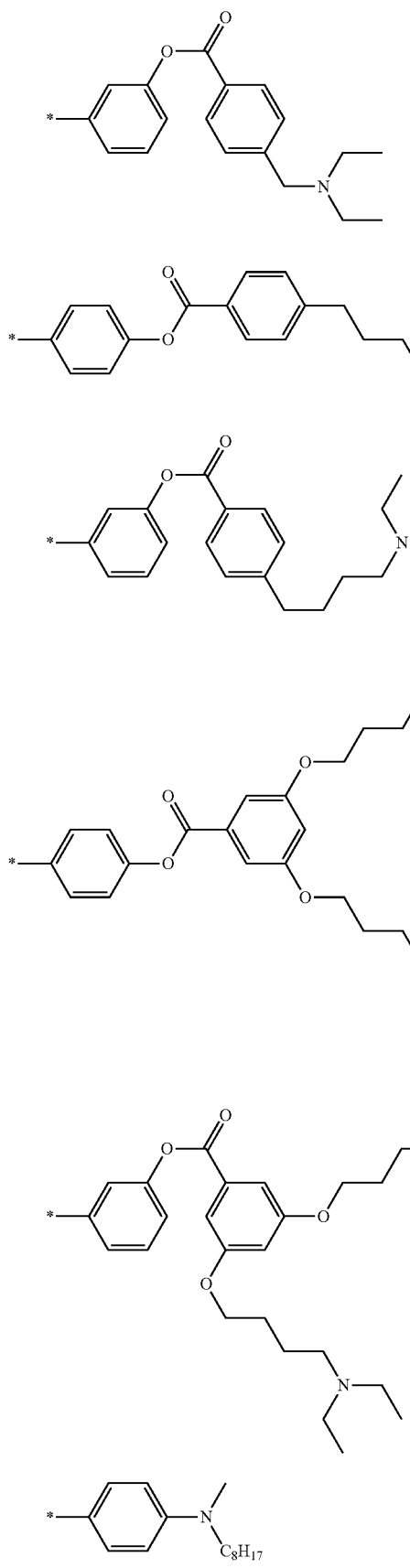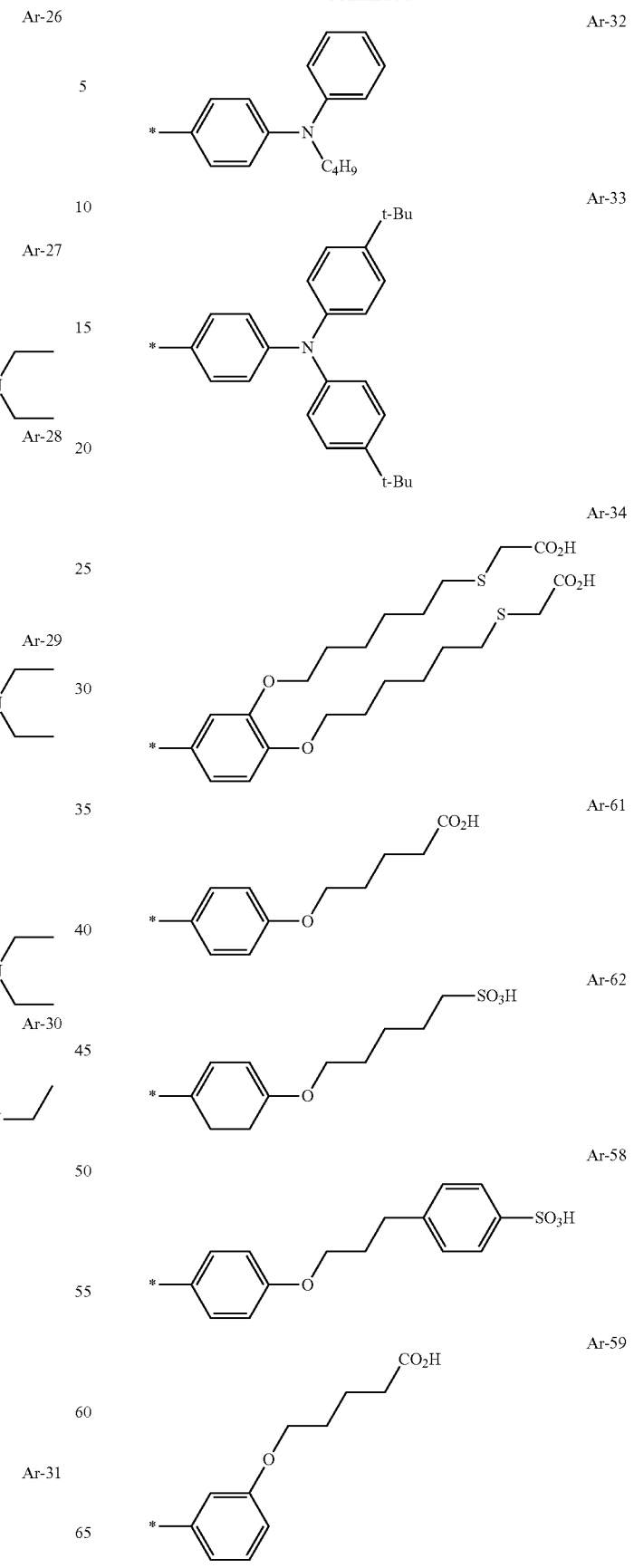

-continued
Ar-60
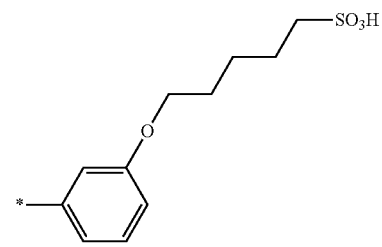
Ar-63
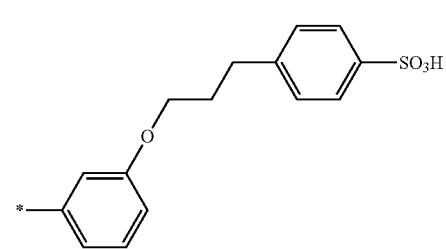
Ar-64
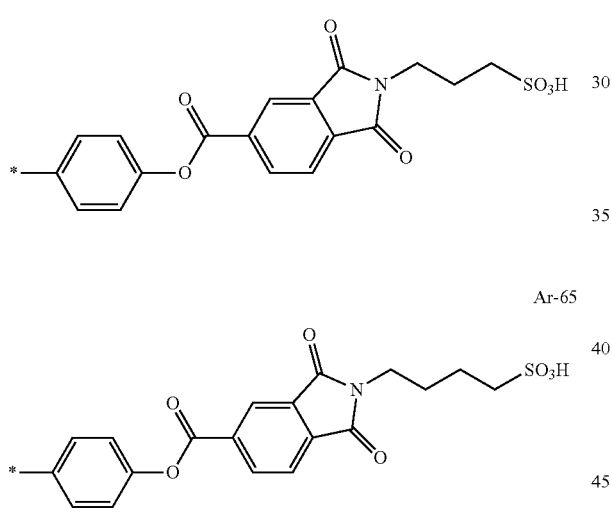
Ar-65
Ar-66
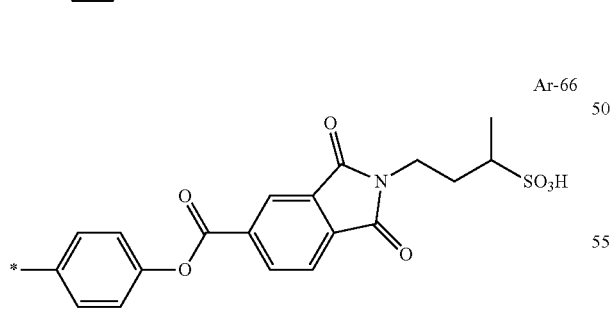
Ar-67
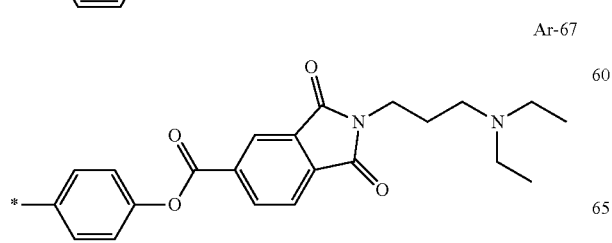
-continued
Ar-68
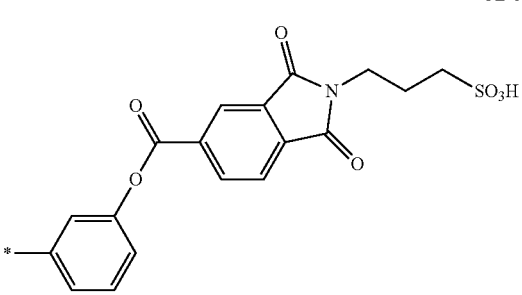
Ar-69
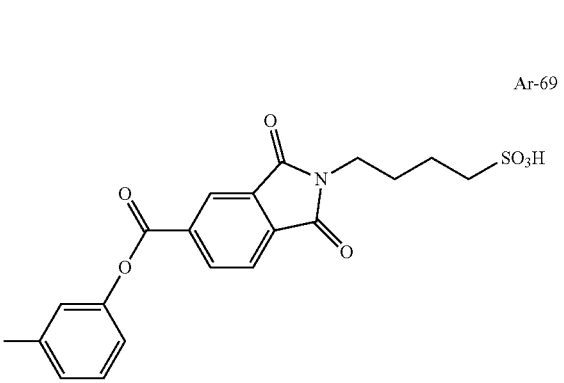
Ar-70
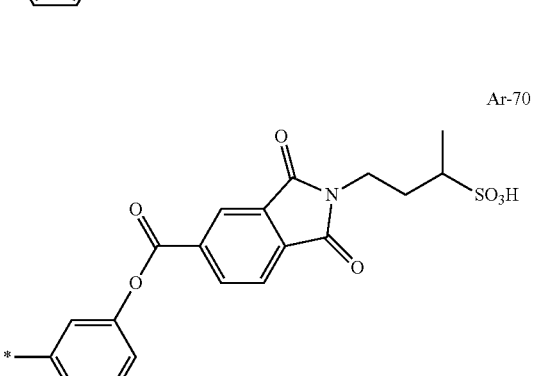
Ar-71
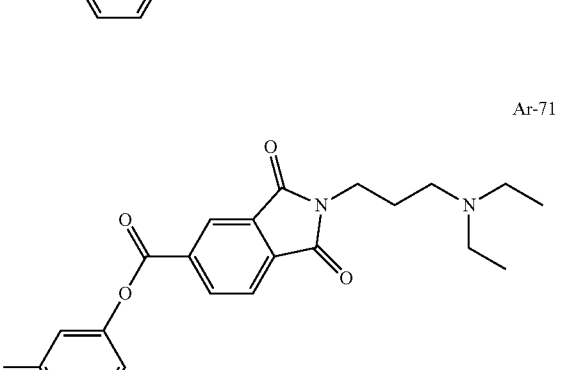
Ar-72
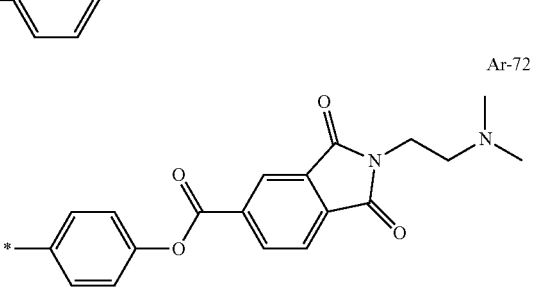

-continued

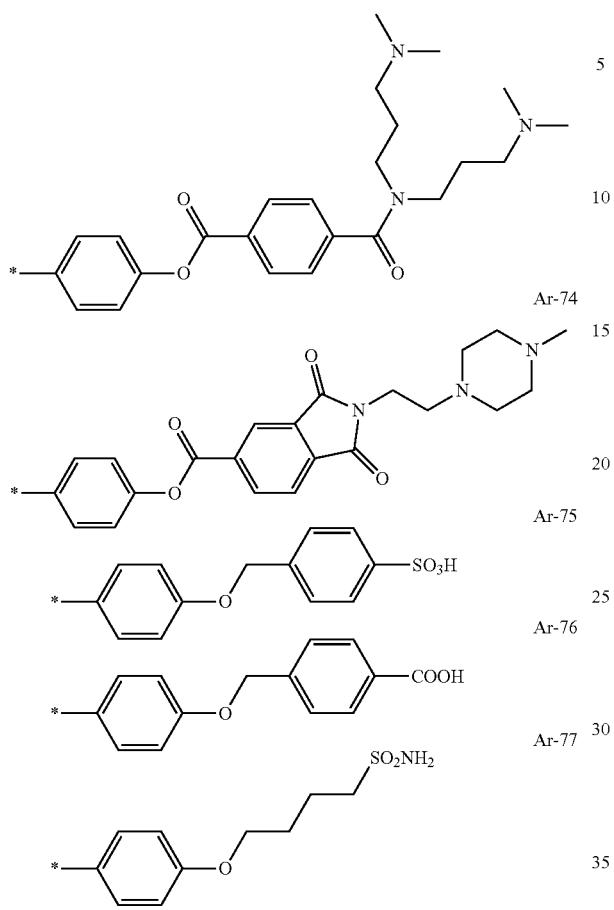

TABLE 7

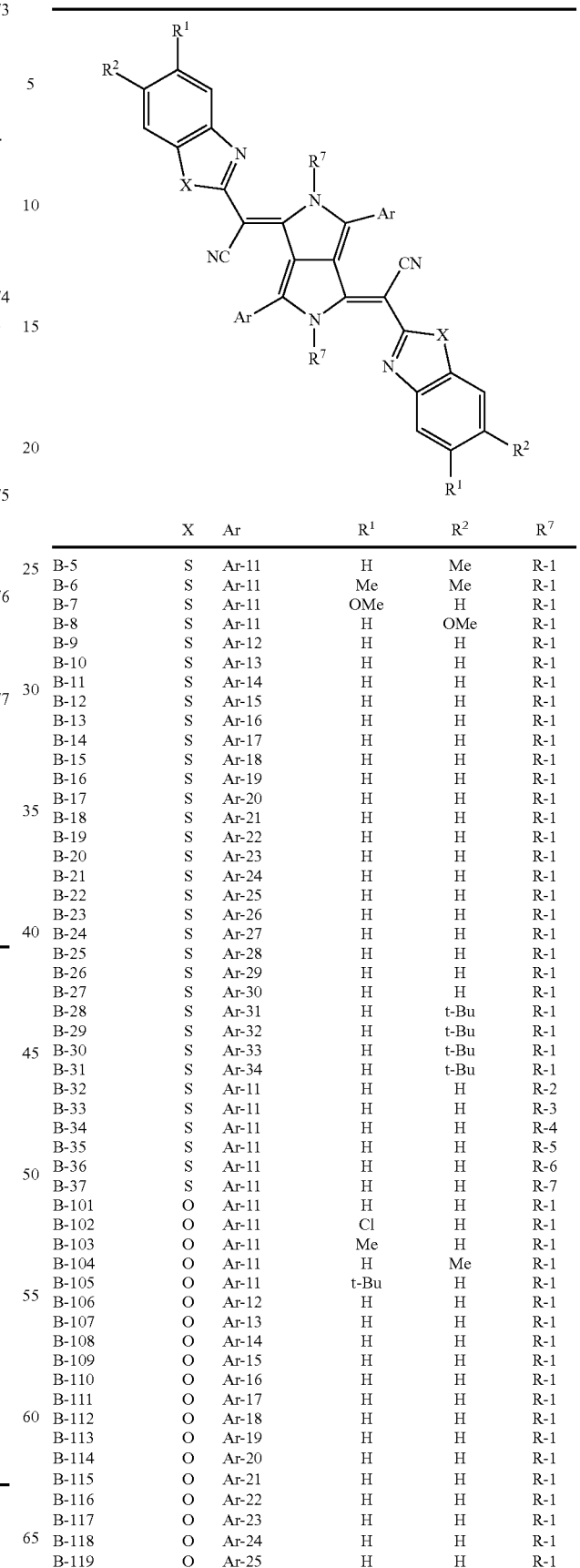

TABLE 7-continued

| | X | Ar | R¹ | R² | R⁷ |
|---|---|---|---|---|---|
| B-1 | S | Ar-11 | H | H | R-1 |
| B-2 | S | Ar-11 | Cl | H | R-1 |
| B-3 | S | Ar-11 | H | Cl | R-1 |
| B-4 | S | Ar-11 | Me | H | R-1 |
| B-5 | S | Ar-11 | H | Me | R-1 |
| B-6 | S | Ar-11 | Me | Me | R-1 |
| B-7 | S | Ar-11 | OMe | H | R-1 |
| B-8 | S | Ar-11 | H | OMe | R-1 |
| B-9 | S | Ar-12 | H | H | R-1 |
| B-10 | S | Ar-13 | H | H | R-1 |
| B-11 | S | Ar-14 | H | H | R-1 |
| B-12 | S | Ar-15 | H | H | R-1 |
| B-13 | S | Ar-16 | H | H | R-1 |
| B-14 | S | Ar-17 | H | H | R-1 |
| B-15 | S | Ar-18 | H | H | R-1 |
| B-16 | S | Ar-19 | H | H | R-1 |
| B-17 | S | Ar-20 | H | H | R-1 |
| B-18 | S | Ar-21 | H | H | R-1 |
| B-19 | S | Ar-22 | H | H | R-1 |
| B-20 | S | Ar-23 | H | H | R-1 |
| B-21 | S | Ar-24 | H | H | R-1 |
| B-22 | S | Ar-25 | H | H | R-1 |
| B-23 | S | Ar-26 | H | H | R-1 |
| B-24 | S | Ar-27 | H | H | R-1 |
| B-25 | S | Ar-28 | H | H | R-1 |
| B-26 | S | Ar-29 | H | H | R-1 |
| B-27 | S | Ar-30 | H | H | R-1 |
| B-28 | S | Ar-31 | H | t-Bu | R-1 |
| B-29 | S | Ar-32 | H | t-Bu | R-1 |
| B-30 | S | Ar-33 | H | t-Bu | R-1 |
| B-31 | S | Ar-34 | H | t-Bu | R-1 |
| B-32 | S | Ar-11 | H | H | R-2 |
| B-33 | S | Ar-11 | H | H | R-3 |
| B-34 | S | Ar-11 | H | H | R-4 |
| B-35 | S | Ar-11 | H | H | R-5 |
| B-36 | S | Ar-11 | H | H | R-6 |
| B-37 | S | Ar-11 | H | H | R-7 |
| B-101 | O | Ar-11 | H | H | R-1 |
| B-102 | O | Ar-11 | Cl | H | R-1 |
| B-103 | O | Ar-11 | Me | H | R-1 |
| B-104 | O | Ar-11 | H | Me | R-1 |
| B-105 | O | Ar-11 | t-Bu | H | R-1 |
| B-106 | O | Ar-12 | H | H | R-1 |
| B-107 | O | Ar-13 | H | H | R-1 |
| B-108 | O | Ar-14 | H | H | R-1 |
| B-109 | O | Ar-15 | H | H | R-1 |
| B-110 | O | Ar-16 | H | H | R-1 |
| B-111 | O | Ar-17 | H | H | R-1 |
| B-112 | O | Ar-18 | H | H | R-1 |
| B-113 | O | Ar-19 | H | H | R-1 |
| B-114 | O | Ar-20 | H | H | R-1 |
| B-115 | O | Ar-21 | H | H | R-1 |
| B-116 | O | Ar-22 | H | H | R-1 |
| B-117 | O | Ar-23 | H | H | R-1 |
| B-118 | O | Ar-24 | H | H | R-1 |
| B-119 | O | Ar-25 | H | H | R-1 |

TABLE 7-continued

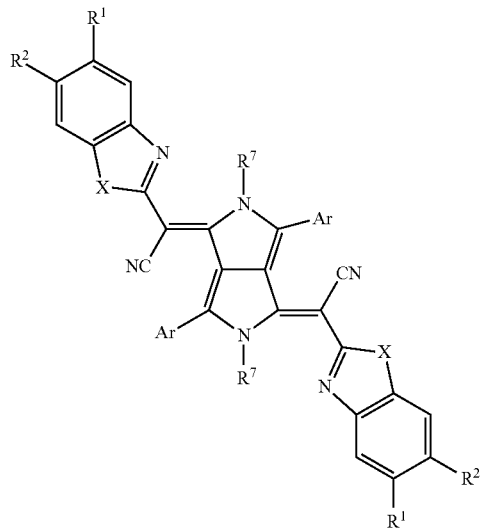

| | X | Ar | R¹ | R² | R⁷ |
|---|---|---|---|---|---|
| B-120 | O | Ar-26 | H | H | R-1 |
| B-121 | O | Ar-27 | H | H | R-1 |
| B-122 | O | Ar-28 | H | H | R-1 |
| B-123 | O | Ar-29 | H | H | R-1 |
| B-124 | O | Ar-30 | H | H | R-1 |
| B-125 | O | Ar-31 | H | H | R-1 |
| B-126 | O | Ar-32 | H | H | R-1 |
| B-127 | O | Ar-33 | H | H | R-1 |
| B-128 | O | Ar-34 | H | H | R-1 |
| B-129 | O | Ar-11 | H | H | R-2 |
| B-130 | O | Ar-11 | H | H | R-3 |
| B-131 | O | Ar-11 | H | H | R-4 |
| B-132 | O | Ar-11 | H | H | R-5 |
| B-133 | O | Ar-11 | H | H | R-6 |
| B-134 | O | Ar-11 | H | H | R-7 |

TABLE 8

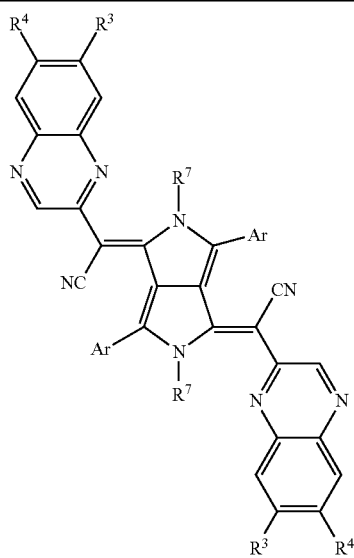

| | Ar | R³ | R⁴ | R⁷ |
|---|---|---|---|---|
| B-201 | Ar-11 | H | H | R-1 |
| B-202 | Ar-11 | H | Cl | R-1 |
| B-203 | Ar-11 | Cl | Cl | R-1 |

TABLE 8-continued

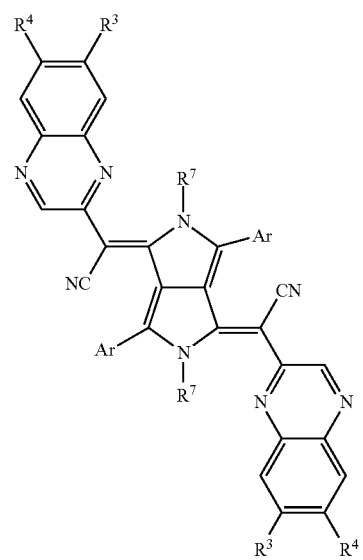

| | Ar | R³ | R⁴ | R⁷ |
|---|---|---|---|---|
| B-204 | Ar-11 | H | Me | R-1 |
| B-205 | Ar-11 | Me | Me | R-1 |
| B-206 | Ar-11 | H | OMe | R-1 |
| B-207 | Ar-12 | H | H | R-1 |
| B-208 | Ar-13 | H | H | R-1 |
| B-209 | Ar-14 | H | H | R-1 |
| B-210 | Ar-15 | H | H | R-1 |
| B-211 | Ar-16 | H | H | R-1 |
| B-212 | Ar-17 | H | H | R-1 |
| B-213 | Ar-18 | H | H | R-1 |
| B-214 | Ar-19 | H | H | R-1 |
| B-215 | Ar-20 | H | H | R-1 |
| B-216 | Ar-21 | H | H | R-1 |
| B-217 | Ar-22 | H | H | R-1 |
| B-218 | Ar-23 | H | H | R-1 |
| B-219 | Ar-24 | H | H | R-1 |
| B-220 | Ar-25 | H | H | R-1 |
| B-221 | Ar-26 | H | H | R-1 |
| B-222 | Ar-27 | H | H | R-1 |
| B-223 | Ar-28 | H | H | R-1 |
| B-224 | Ar-29 | H | H | R-1 |
| B-225 | Ar-30 | H | H | R-1 |
| B-226 | Ar-31 | H | H | R-1 |
| B-227 | Ar-32 | H | H | R-1 |
| B-228 | Ar-33 | H | H | R-1 |
| B-229 | Ar-34 | H | H | R-1 |
| B-230 | Ar-11 | H | H | R-2 |
| B-231 | Ar-11 | H | H | R-3 |
| B-232 | Ar-11 | H | H | R-4 |
| B-233 | Ar-11 | H | H | R-5 |
| B-234 | Ar-11 | H | H | R-6 |
| B-235 | Ar-11 | H | H | R-7 |

TABLE 9

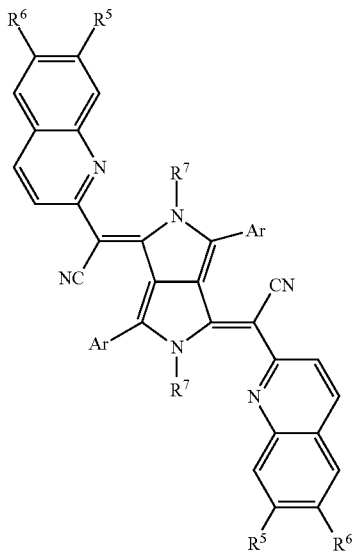

| | Ar | R⁵ | R⁶ | R⁷ |
|---|---|---|---|---|
| B-301 | Ar-11 | H | H | R-1 |
| B-302 | Ar-11 | H | t-Bu | R-1 |
| B-303 | Ar-12 | H | H | R-1 |
| B-304 | Ar-13 | H | H | R-1 |
| B-305 | Ar-14 | H | H | R-1 |
| B-306 | Ar-15 | H | H | R-1 |
| B-307 | Ar-16 | H | H | R-1 |
| B-308 | Ar-17 | H | H | R-1 |
| B-309 | Ar-18 | H | H | R-1 |
| B-310 | Ar-19 | H | H | R-1 |
| B-311 | Ar-20 | H | H | R-1 |
| B-312 | Ar-21 | H | H | R-1 |
| B-313 | Ar-22 | H | H | R-1 |
| B-314 | Ar-23 | H | H | R-1 |
| B-315 | Ar-24 | H | H | R-1 |
| B-316 | Ar-25 | H | H | R-1 |
| B-317 | Ar-26 | H | H | R-1 |
| B-318 | Ar-27 | H | H | R-1 |
| B-319 | Ar-28 | H | H | R-1 |
| B-320 | Ar-29 | H | H | R-1 |
| B-321 | Ar-30 | H | H | R-1 |
| B-322 | Ar-31 | H | t-Bu | R-1 |
| B-323 | Ar-32 | H | t-Bu | R-1 |
| B-324 | Ar-33 | H | t-Bu | R-1 |
| B-325 | Ar-34 | H | t-Bu | R-1 |
| B-326 | Ar-11 | H | H | R-2 |
| B-327 | Ar-11 | H | H | R-3 |
| B-328 | Ar-11 | H | H | R-4 |
| B-329 | Ar-11 | H | H | R-5 |
| B-330 | Ar-11 | H | H | R-6 |
| B-331 | Ar-11 | H | H | R-7 |

TABLE 10

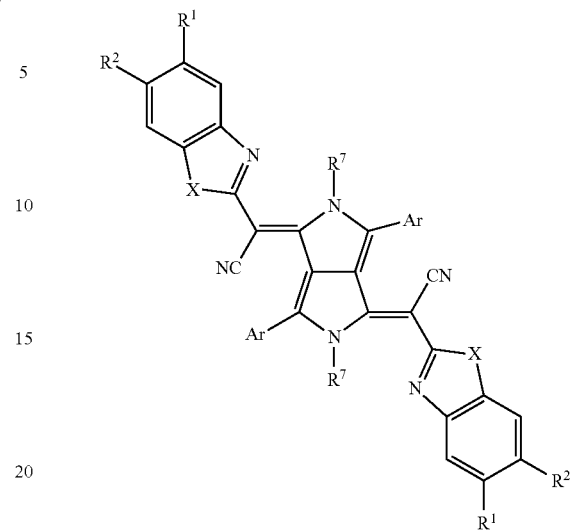

| | X | Ar | R¹ | R² | R⁷ |
|---|---|---|---|---|---|
| B-401 | S | Ar-61 | H | H | R-5 |
| B-402 | S | Ar-61 | Me | H | R-5 |
| B-403 | S | Ar-61 | Cl | H | R-5 |
| B-404 | S | Ar-61 | OMe | H | R-5 |
| B-405 | S | Ar-62 | H | H | R-5 |
| B-406 | S | Ar-62 | Me | H | R-5 |
| B-407 | S | Ar-62 | Cl | H | R-5 |
| B-408 | S | Ar-62 | OMe | H | R-5 |
| B-409 | S | Ar-58 | H | H | R-5 |
| B-410 | S | Ar-58 | Me | H | R-5 |
| B-411 | S | Ar-58 | Cl | H | R-5 |
| B-412 | S | Ar-58 | OMe | H | R-5 |
| B-413 | S | Ar-59 | H | H | R-5 |
| B-414 | S | Ar-60 | H | H | R-5 |
| B-415 | S | Ar-63 | H | H | R-5 |
| B-416 | S | Ar-64 | H | H | R-5 |
| B-417 | S | Ar-64 | Me | H | R-5 |
| B-418 | S | Ar-64 | Cl | H | R-5 |
| B-419 | S | Ar-64 | OMe | H | R-5 |
| B-420 | S | Ar-65 | H | H | R-5 |
| B-421 | S | Ar-65 | Me | H | R-5 |
| B-422 | S | Ar-65 | Cl | H | R-5 |
| B-423 | S | Ar-65 | OMe | H | R-5 |
| B-424 | S | Ar-66 | H | H | R-5 |
| B-425 | S | Ar-66 | Me | H | R-5 |
| B-426 | S | Ar-66 | Cl | H | R-5 |
| B-427 | S | Ar-66 | OMe | H | R-5 |
| B-428 | S | Ar-67 | H | H | R-5 |
| B-429 | S | Ar-67 | Me | H | R-5 |
| B-430 | S | Ar-67 | Cl | H | R-5 |
| B-431 | S | Ar-67 | OMe | H | R-5 |
| B-432 | S | Ar-68 | H | H | R-5 |
| B-433 | S | Ar-69 | H | H | R-5 |
| B-434 | S | Ar-70 | H | H | R-5 |
| B-435 | S | Ar-71 | H | H | R-5 |
| B-436 | O | Ar-61 | H | H | R-1 |
| B-437 | O | Ar-61 | Me | H | R-1 |
| B-438 | O | Ar-61 | Cl | H | R-1 |
| B-439 | O | Ar-61 | OMe | H | R-1 |
| B-440 | O | Ar-62 | H | H | R-1 |
| B-441 | O | Ar-62 | Me | H | R-1 |
| B-442 | O | Ar-62 | Cl | H | R-1 |
| B-443 | O | Ar-62 | OMe | H | R-1 |
| B-444 | O | Ar-58 | H | H | R-1 |
| B-445 | O | Ar-58 | Me | H | R-1 |

TABLE 10-continued

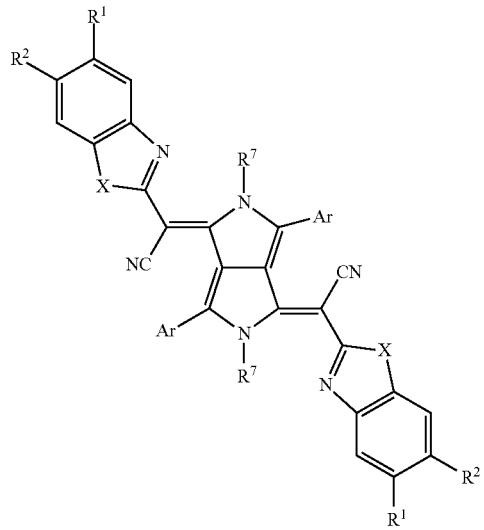

| | X | Ar | R¹ | R² | R⁷ |
|---|---|---|---|---|---|
| B-446 | O | Ar-58 | Cl | H | R-1 |
| B-447 | O | Ar-58 | OMe | H | R-1 |
| B-448 | O | Ar-59 | H | H | R-1 |
| B-449 | O | Ar-60 | H | H | R-1 |
| B-450 | O | Ar-63 | H | H | R-1 |
| B-451 | O | Ar-64 | H | H | R-1 |
| B-452 | O | Ar-64 | Me | H | R-1 |
| B-453 | O | Ar-64 | Cl | H | R-1 |
| B-454 | O | Ar-64 | OMe | H | R-1 |
| B-455 | O | Ar-65 | H | H | R-1 |
| B-456 | O | Ar-65 | Me | H | R-1 |
| B-457 | O | Ar-65 | Cl | H | R-1 |
| B-458 | O | Ar-65 | OMe | H | R-1 |
| B-459 | O | Ar-66 | H | H | R-1 |
| B-460 | O | Ar-66 | Me | H | R-1 |
| B-461 | O | Ar-66 | Cl | H | R-1 |
| B-462 | O | Ar-66 | OMe | H | R-1 |
| B-463 | O | Ar-67 | H | H | R-1 |
| B-464 | O | Ar-67 | Me | H | R-1 |
| B-465 | O | Ar-67 | Cl | H | R-1 |
| B-466 | O | Ar-67 | OMe | H | R-1 |
| B-467 | O | Ar-68 | H | H | R-1 |
| B-468 | O | Ar-69 | H | H | R-1 |
| B-469 | O | Ar-70 | H | H | R-1 |
| B-470 | O | Ar-71 | H | H | R-1 |
| B-471 | O | Ar-62 | H | H | R-2 |
| B-472 | O | Ar-62 | H | H | R-3 |
| B-473 | O | Ar-62 | H | H | R-4 |
| B-474 | O | Ar-62 | H | H | R-5 |
| B-475 | O | Ar-62 | H | H | R-6 |
| B-476 | O | Ar-62 | H | H | R-7 |
| B-477 | O | Ar-58 | H | H | R-2 |
| B-478 | O | Ar-58 | H | H | R-3 |

TABLE 11

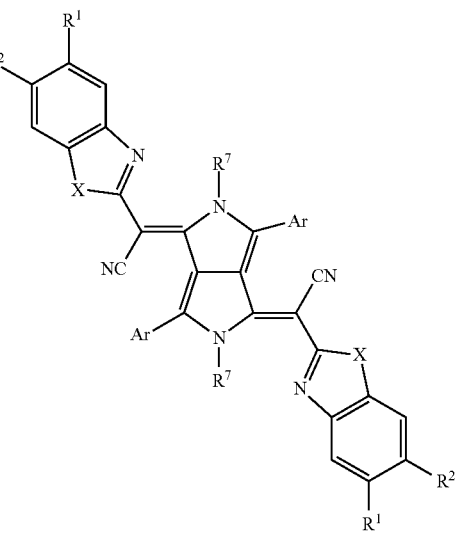

| | X | Ar | R¹ | R² | R⁷ |
|---|---|---|---|---|---|
| B-479 | O | Ar-58 | H | H | R-4 |
| B-480 | O | Ar-58 | H | H | R-5 |
| B-481 | O | Ar-58 | H | H | R-6 |
| B-482 | O | Ar-58 | H | H | R-7 |
| B-483 | O | Ar-60 | H | H | R-2 |
| B-484 | O | Ar-60 | H | H | R-3 |
| B-485 | O | Ar-60 | H | H | R-4 |
| B-486 | O | Ar-60 | H | H | R-5 |
| B-487 | O | Ar-60 | H | H | R-6 |
| B-488 | O | Ar-60 | H | H | R-7 |
| B-489 | O | Ar-63 | H | H | R-2 |
| B-490 | O | Ar-63 | H | H | R-3 |
| B-491 | O | Ar-63 | H | H | R-4 |
| B-492 | O | Ar-63 | H | H | R-5 |
| B-493 | O | Ar-63 | H | H | R-6 |
| B-494 | O | Ar-63 | H | H | R-7 |
| B-495 | O | Ar-64 | H | H | R-2 |
| B-496 | O | Ar-64 | H | H | R-3 |
| B-497 | O | Ar-64 | H | H | R-4 |
| B-498 | O | Ar-64 | H | H | R-5 |
| B-499 | O | Ar-64 | H | H | R-6 |
| B-500 | O | Ar-64 | H | H | R-7 |
| B-501 | O | Ar-67 | H | H | R-2 |
| B-502 | O | Ar-67 | H | H | R-3 |
| B-503 | O | Ar-67 | H | H | R-4 |
| B-504 | O | Ar-67 | H | H | R-5 |
| B-505 | O | Ar-67 | H | H | R-6 |
| B-506 | O | Ar-67 | H | H | R-7 |
| B-507 | O | Ar-68 | H | H | R-2 |
| B-508 | O | Ar-68 | H | H | R-3 |
| B-509 | O | Ar-68 | H | H | R-4 |
| B-510 | O | Ar-68 | H | H | R-5 |
| B-511 | O | Ar-68 | H | H | R-6 |
| B-512 | O | Ar-68 | H | H | R-7 |
| B-513 | O | Ar-71 | H | H | R-2 |
| B-514 | O | Ar-71 | H | H | R-3 |
| B-515 | O | Ar-71 | H | H | R-4 |
| B-516 | O | Ar-71 | H | H | R-5 |
| B-517 | O | Ar-71 | H | H | R-6 |
| B-518 | O | Ar-71 | H | H | R-7 |
| B-519 | S | Ar-61 | H | H | R-1 |
| B-520 | S | Ar-61 | Me | H | R-1 |
| B-521 | S | Ar-61 | Cl | H | R-1 |
| B-522 | S | Ar-61 | OMe | H | R-1 |
| B-523 | S | Ar-61 | Me | Me | R-1 |
| B-524 | S | Ar-62 | H | H | R-1 |
| B-525 | S | Ar-62 | Me | H | R-1 |
| B-526 | S | Ar-62 | Cl | H | R-1 |
| B-527 | S | Ar-62 | OMe | H | R-1 |
| B-528 | S | Ar-62 | Me | Me | R-1 |
| B-529 | S | Ar-58 | H | H | R-1 |
| B-530 | S | Ar-58 | Me | H | R-1 |

TABLE 11-continued

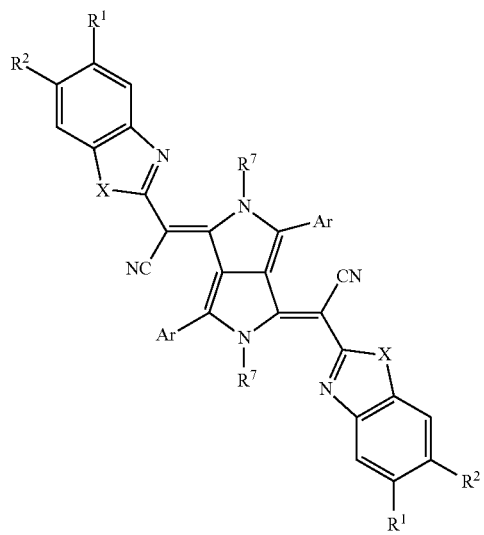

| | X | Ar | R¹ | R² | R⁷ |
|---|---|---|---|---|---|
| B-531 | S | Ar-58 | Cl | H | R-1 |
| B-532 | S | Ar-58 | OMe | H | R-1 |
| B-533 | S | Ar-58 | Me | Me | R-1 |
| B-534 | S | Ar-59 | H | H | R-1 |
| B-535 | S | Ar-59 | OMe | H | R-1 |
| B-536 | S | Ar-60 | H | H | R-1 |
| B-537 | S | Ar-60 | OMe | H | R-1 |
| B-538 | S | Ar-63 | H | H | R-1 |
| B-539 | S | Ar-63 | OMe | H | R-1 |
| B-540 | S | Ar-64 | H | H | R-1 |
| B-541 | S | Ar-64 | OMe | H | R-1 |
| B-542 | S | Ar-65 | H | H | R-1 |
| B-543 | S | Ar-65 | OMe | H | R-1 |
| B-544 | S | Ar-66 | H | H | R-1 |
| B-545 | S | Ar-66 | OMe | H | R-1 |
| B-546 | S | Ar-67 | H | H | R-1 |
| B-547 | S | Ar-67 | OMe | H | R-1 |
| B-548 | S | Ar-68 | H | H | R-1 |
| B-549 | S | Ar-68 | OMe | H | R-1 |
| B-550 | S | Ar-69 | H | H | R-1 |
| B-551 | S | Ar-69 | OMe | H | R-1 |
| B-552 | S | Ar-70 | H | H | R-1 |
| B-553 | S | Ar-70 | OMe | H | R-1 |
| B-554 | S | Ar-71 | H | H | R-1 |
| B-555 | S | Ar-71 | OMe | H | R-1 |
| B-556 | S | Ar-72 | H | H | R-1 |
| B-557 | S | Ar-72 | OMe | H | R-1 |
| B-558 | S | Ar-73 | H | H | R-1 |
| B-559 | S | Ar-73 | OMe | H | R-1 |
| B-560 | S | Ar-74 | H | H | R-1 |
| B-561 | S | Ar-74 | OMe | H | R-1 |
| B-562 | S | Ar-75 | H | H | R-1 |
| B-563 | S | Ar-75 | OMe | H | R-1 |
| B-564 | S | Ar-76 | H | H | R-1 |
| B-565 | S | Ar-76 | OMe | H | R-1 |
| B-566 | S | Ar-77 | H | H | R-1 |
| B-567 | S | Ar-77 | OMe | H | R-1 |
| B-568 | S | Ar-61 | H | H | R-2 |
| B-569 | S | Ar-61 | H | H | R-3 |
| B-570 | S | Ar-61 | H | H | R-4 |

TABLE 12

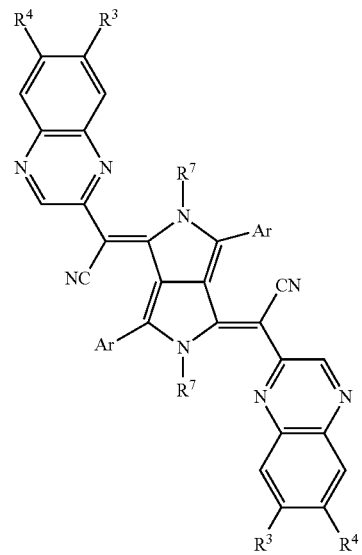

| | Ar | R³ | R⁴ | R⁷ |
|---|---|---|---|---|
| B-601 | Ar-61 | H | H | R-1 |
| B-602 | Ar-61 | Cl | H | R-1 |
| B-603 | Ar-61 | H | Cl | R-1 |
| B-604 | Ar-61 | Cl | Cl | R-1 |
| B-605 | Ar-61 | Me | Me | R-1 |
| B-606 | Ar-62 | H | H | R-1 |
| B-607 | Ar-62 | Cl | H | R-1 |
| B-608 | Ar-62 | H | Cl | R-1 |
| B-609 | Ar-62 | Cl | Cl | R-1 |
| B-610 | Ar-62 | Me | Me | R-1 |
| B-611 | Ar-58 | H | H | R-1 |
| B-612 | Ar-58 | Cl | H | R-1 |
| B-613 | Ar-58 | H | Cl | R-1 |
| B-614 | Ar-58 | Cl | Cl | R-1 |
| B-615 | Ar-58 | Me | Me | R-1 |
| B-616 | Ar-59 | H | H | R-1 |
| B-617 | Ar-59 | Cl | H | R-1 |
| B-618 | Ar-59 | H | Cl | R-1 |
| B-619 | Ar-59 | Cl | Cl | R-1 |
| B-620 | Ar-59 | Me | Me | R-1 |
| B-621 | Ar-60 | H | H | R-1 |
| B-622 | Ar-60 | Cl | H | R-1 |
| B-623 | Ar-60 | H | Cl | R-1 |
| B-624 | Ar-60 | Cl | Cl | R-1 |
| B-625 | Ar-60 | Me | Me | R-1 |
| B-626 | Ar-63 | H | H | R-1 |
| B-627 | Ar-63 | Cl | H | R-1 |
| B-628 | Ar-63 | H | Cl | R-1 |
| B-629 | Ar-63 | Cl | Cl | R-1 |
| B-630 | Ar-63 | Me | Me | R-1 |
| B-631 | Ar-64 | H | H | R-1 |
| B-632 | Ar-64 | Cl | H | R-1 |
| B-633 | Ar-64 | H | Cl | R-1 |
| B-634 | Ar-64 | Cl | Cl | R-1 |
| B-635 | Ar-64 | Me | Me | R-1 |
| B-636 | Ar-65 | OMe | H | R-1 |
| B-637 | Ar-65 | Cl | H | R-1 |
| B-638 | Ar-65 | Cl | Cl | R-1 |
| B-639 | Ar-66 | Cl | H | R-1 |
| B-640 | Ar-66 | Cl | Cl | R-1 |
| B-641 | Ar-67 | H | H | R-1 |
| B-642 | Ar-67 | Cl | H | R-1 |
| B-643 | Ar-67 | H | Cl | R-1 |
| B-644 | Ar-67 | Cl | Cl | R-1 |
| B-645 | Ar-67 | Me | Me | R-1 |
| B-646 | Ar-68 | H | H | R-1 |
| B-647 | Ar-68 | Cl | H | R-1 |
| B-648 | Ar-68 | H | Cl | R-1 |
| B-649 | Ar-68 | Cl | Cl | R-1 |

TABLE 12-continued
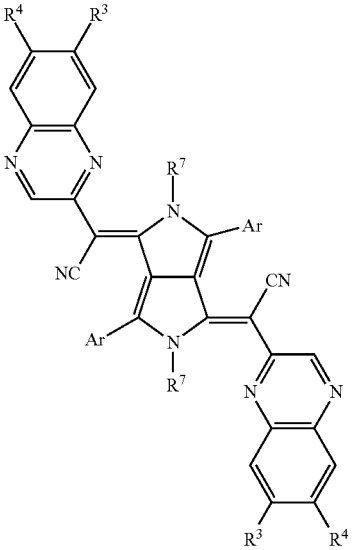
| | Ar | R³ | R⁴ | R⁷ |
|---|---|---|---|---|
| B-650 | Ar-68 | Me | Me | R-1 |
| B-651 | Ar-69 | H | H | R-1 |
| B-652 | Ar-69 | Cl | H | R-1 |
| B-653 | Ar-69 | H | Cl | R-1 |
| B-654 | Ar-69 | Cl | Cl | R-1 |
| B-655 | Ar-69 | Me | Me | R-1 |
| B-656 | Ar-70 | H | H | R-1 |
| B-657 | Ar-70 | Cl | H | R-1 |
| B-658 | Ar-70 | H | Cl | R-1 |
| B-659 | Ar-70 | Cl | Cl | R-1 |
| B-660 | Ar-70 | Me | Me | R-1 |
| B-661 | Ar-71 | H | H | R-1 |
| B-662 | Ar-71 | Cl | H | R-1 |
| B-663 | Ar-71 | H | Cl | R-1 |
| B-664 | Ar-71 | Cl | Cl | R-1 |
| B-665 | Ar-71 | Me | Me | R-1 |
TABLE 12-continued
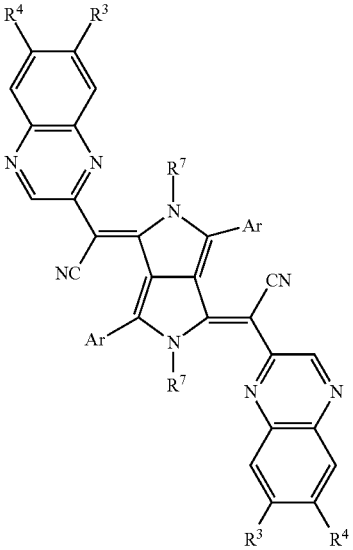
| | Ar | R³ | R⁴ | R⁷ |
|---|---|---|---|---|
| B-666 | Ar-72 | H | H | R-1 |
| B-667 | Ar-72 | Cl | H | R-1 |
| B-668 | Ar-72 | H | Cl | R-1 |
| B-669 | Ar-72 | Cl | Cl | R-1 |
| B-670 | Ar-72 | Me | Me | R-1 |
| B-671 | Ar-73 | H | H | R-1 |
| B-672 | Ar-73 | Cl | H | R-1 |
| B-673 | Ar-73 | H | Cl | R-1 |
| B-674 | Ar-73 | Cl | Cl | R-1 |
| B-675 | Ar-73 | Me | Me | R-1 |
| B-676 | Ar-74 | H | H | R-1 |
| B-677 | Ar-74 | Cl | H | R-1 |
| B-678 | Ar-74 | H | Cl | R-1 |
| B-679 | Ar-74 | Cl | Cl | R-1 |
| B-680 | Ar-74 | Me | Me | R-1 |
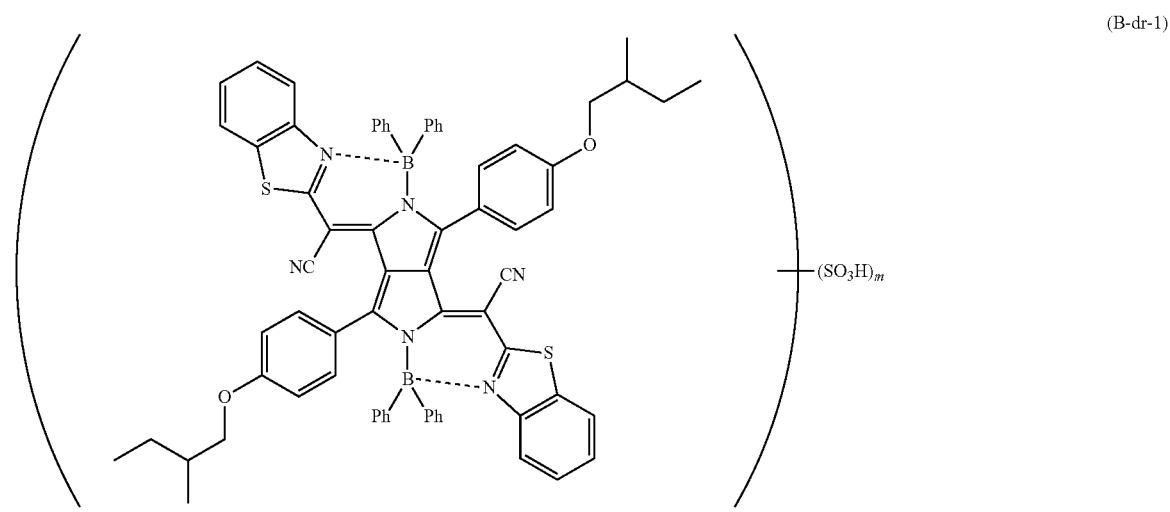
(B-dr-1)

(B-dr-2)
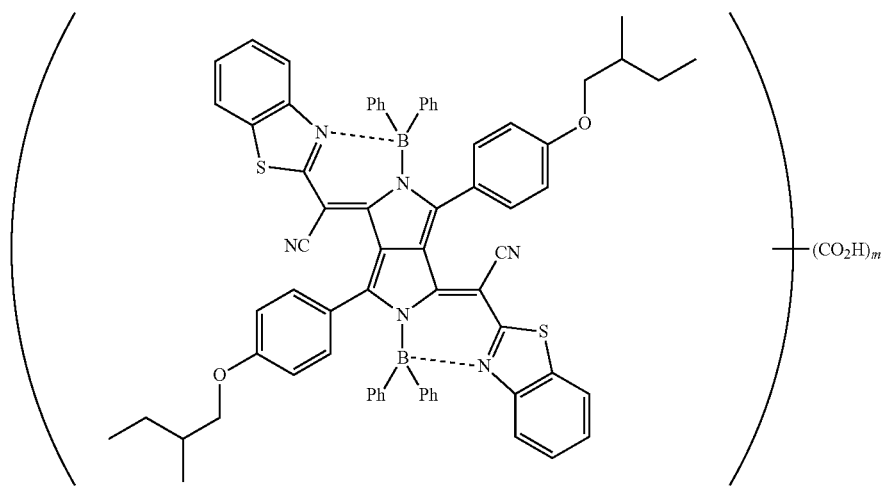
(B-dr-3)
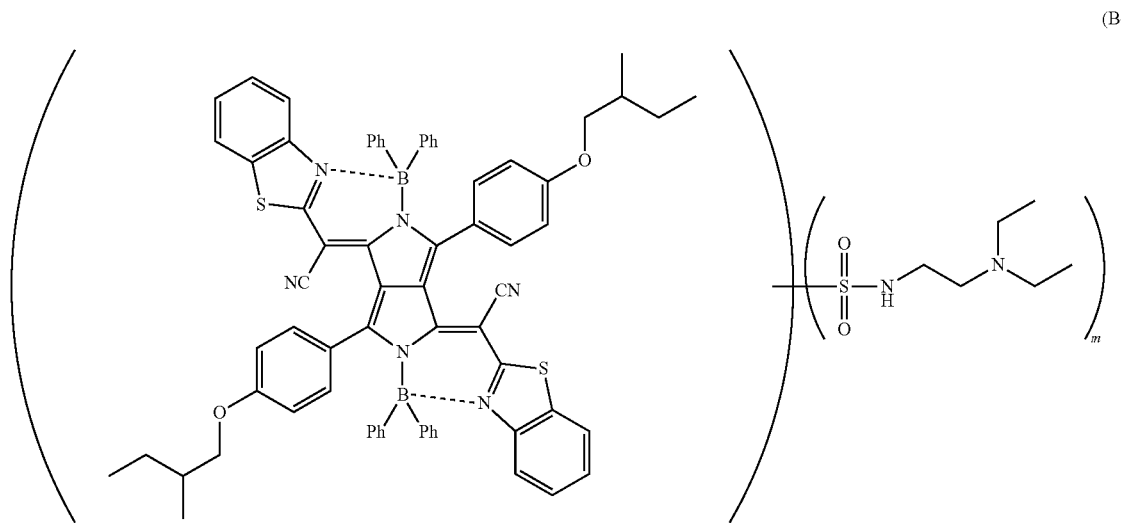
(B-dr-4)
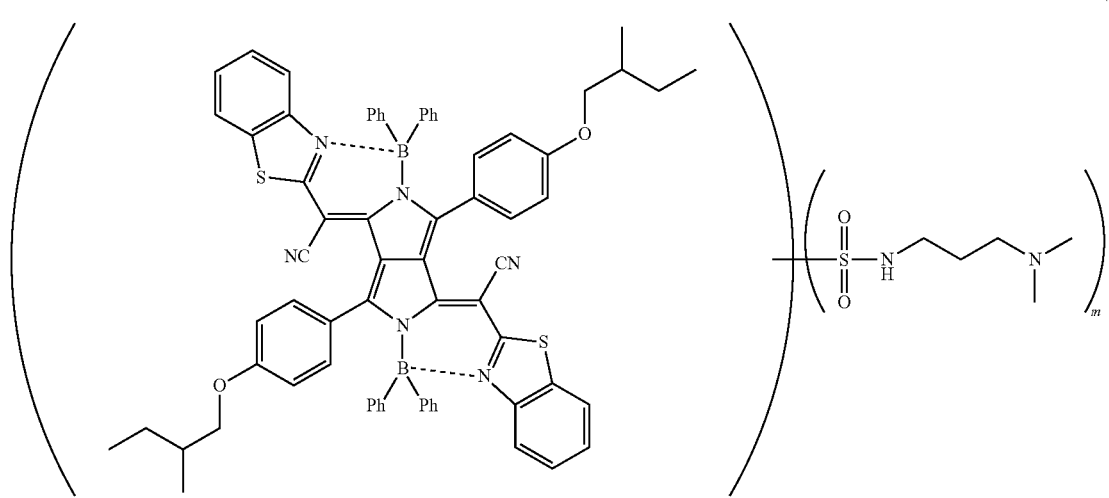

(B-dr-5)
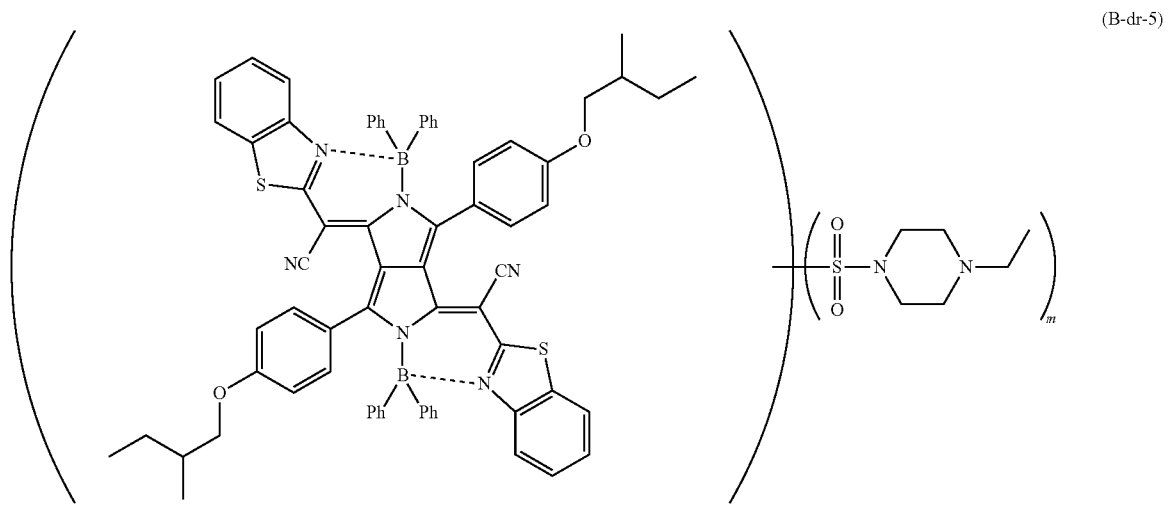
(B-dr-6)
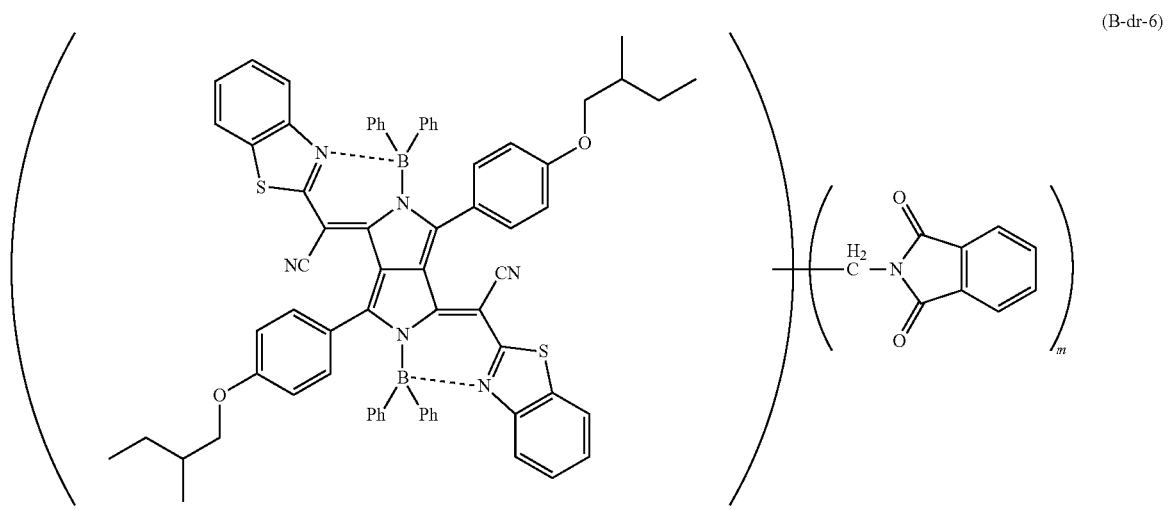
(B-dr-7)
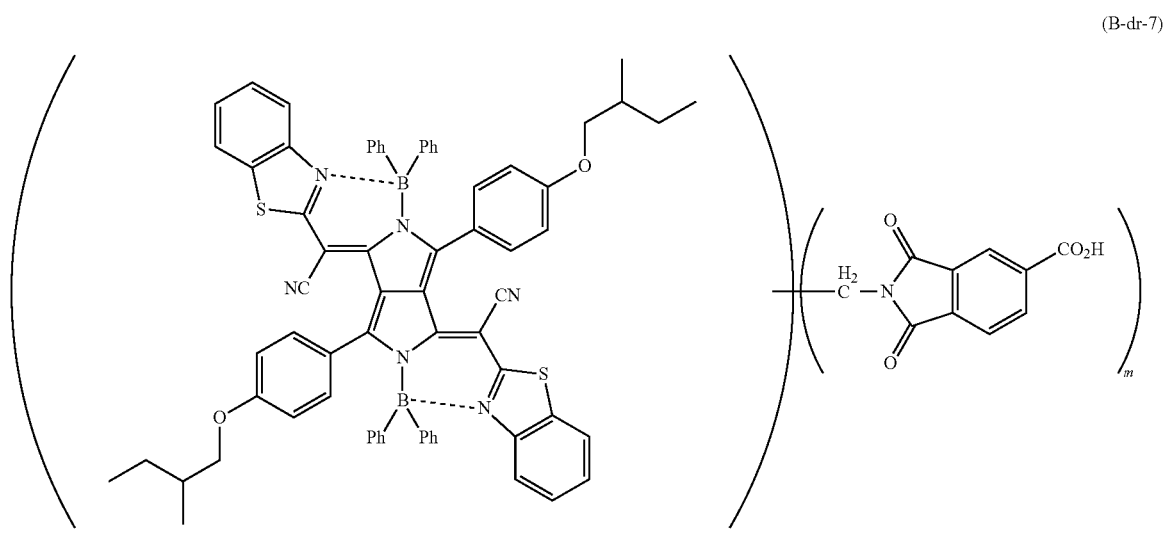

(B-dr-8)
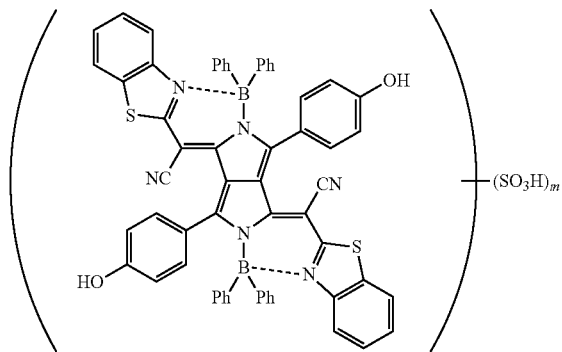
(B-dr-9)
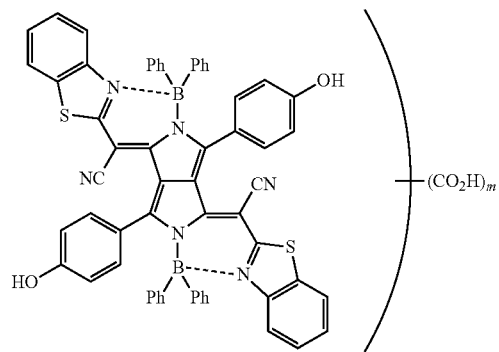
(B-dr-10)
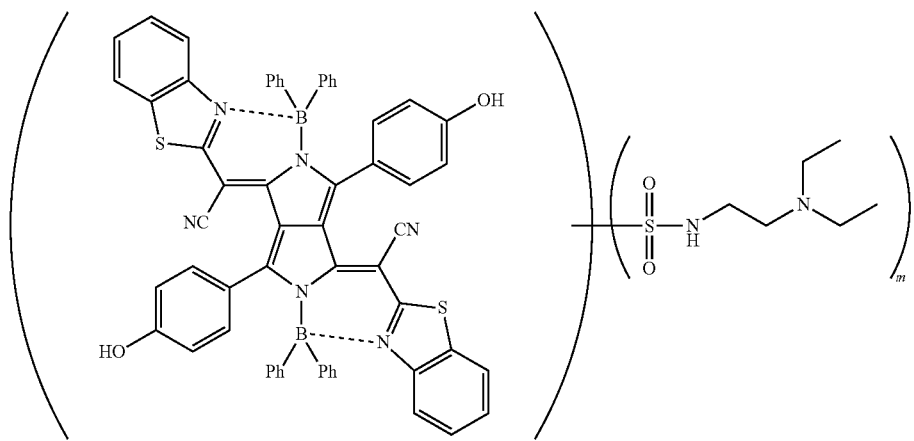
(B-dr-11)
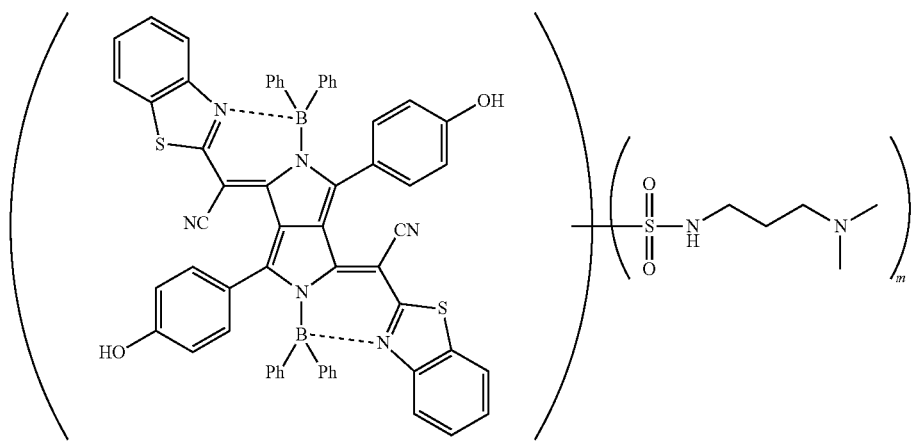

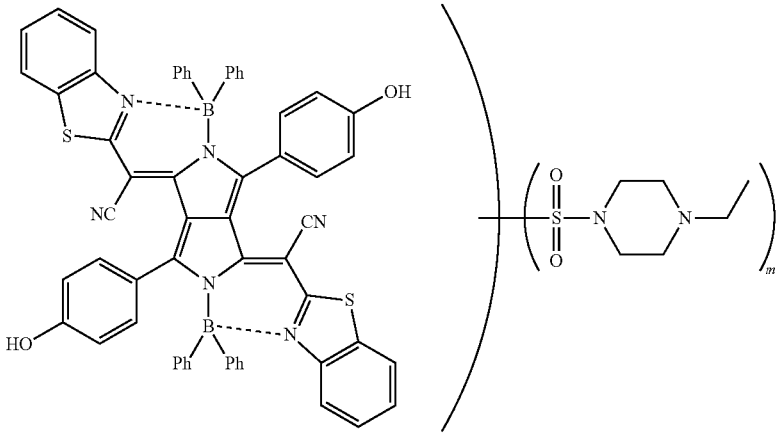

(B-dr-12)

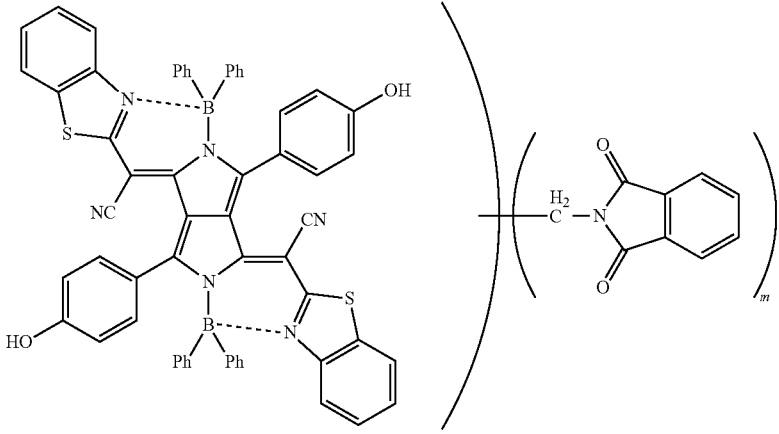

(B-dr-13)

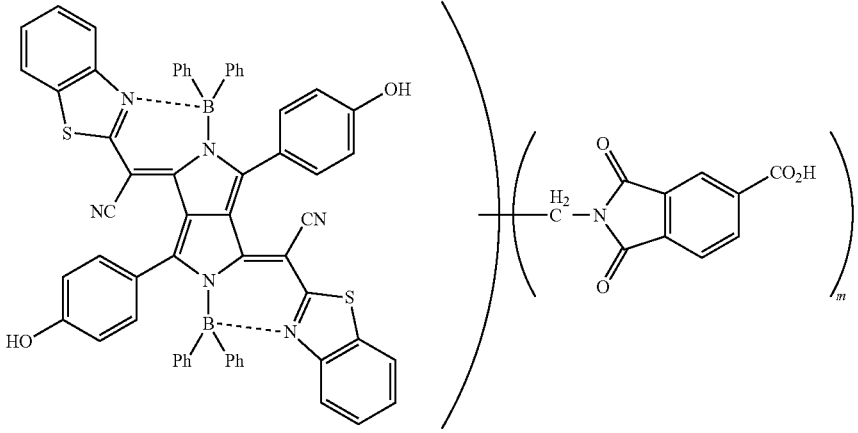

(B-dr-14)

(Other Pigment Deriviatives)

The composition according to the present invention may include pigment derivatives other than the compound represented by Formula (1) (also referred to as "other pigment derivatives"). Examples of the other pigment derivatives include a compound represented by the following Formula (A).

(A)

In Formula (A), P represents a structure having at least one skeleton selected from the group consisting of a diketo pyrrolo pyrrole skeleton, a quinacridone skeleton, an anthraquinone skeleton, a dianthraquinone skeleton, a benzoisoindole skeleton, a thiazine indigo skeleton, an azo skeleton, a quinophthalone skeleton, a phthalocyanine skeleton, a dioxazine skeleton, a perylene skeleton, a perinone skeleton, and a benzimidazolinone skeleton, L represents a single bond or a linking group, X represents an acidic group, a basic group, a group having a salt structure, or a phthalimido group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

L and X in Formula (A) have the same exemplary groups and the same preferable ranges as L and X in Formula (1). Examples of the other pigment derivatives include compounds described in JP1981-118462A (JP-S56-118462A), JP1988-264674A (JP-S63-264674A), JP1989-217077A (JP-H1-217077A), JP1991-9961A (JP-H3-9961A), JP1991-26767A (JP-H3-26767A), JP1991-153780A (JP-H3-153780A), JP1991-45662A (JP-H3-45662A), JP1992-285669A (JP-H4-285669A), JP1994-145546A (JP-H6-145546A), JP1994-212088A (JP-H6-212088A), JP1994-240158A (JP-H6-240158A), JP1998-30063A (JP-H10-30063A), JP1998-195326A (JP-H10-195326A), paragraphs "0086" to "0098" of WO2011/024896A, and paragraphs "0063" to "0094" of WO2012/102399A, the contents of which are incorporated herein by reference.

In the composition according to the present invention, the content of the pigment derivative is preferably 1 to 50 parts by mass with respect to 100 parts by mass of the pigment. The lower limit value is more preferably 3 parts by mass or more and still more preferably 5 parts by mass or more. The upper limit value is more preferably 40 parts by mass or less and still more preferably 30 parts by mass or less.

The content of the compound represented by Formula (1) in the pigment derivative is preferably 3 mass % or higher, more preferably 5 mass % or higher, and still more preferably 10 mass % or higher, and it is even still more preferable that the pigment derivative substantially consists of only the compound represented by Formula (1). The pigment derivative substantially consisting of only the compound represented by Formula (1) represent that the content of the compound represented by Formula (1) is preferably 99 mass % or higher, more preferably 99.5 mass % or higher, and still more preferably 100 mass % with respect to the total mass of the pigment derivative.

In the composition according to the present invention, the content of the compound represented by Formula (1) is preferably 1 to 50 parts by mass with respect to 100 parts by mass of the pigment. The lower limit value is more preferably 3 parts by mass or more and still more preferably 5 parts by mass or more. The upper limit value is more preferably 40 parts by mass or less and still more preferably 30 parts by mass or less. In a case where the content of the compound represented by Formula (1) is in the above-described range, the pigment dispersibility is excellent. As the compound represented by Formula (1), one kind or two or more kinds may be used. In a case where two or more pigment derivatives are used, it is preferable that the total content of the two or more compounds represented by Formula (1) is in the above-described range.

<<Solvent>>

The composition according to the present invention includes a solvent. Examples of the solvent include an organic solvent. Basically, the solvent is not particularly limited as long as it satisfies the solubility of each component and the coating properties of the composition. However, it is preferable that the organic solvent is selected in consideration of the coating properties and safety of the composition.

Preferable examples of the organic solvent are as follows:
an alcohol, for example, 2-butanol;
an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkoxyacetate (for example, methyl alkoxyacetate, ethyl alkoxyacetate, or butyl alkoxyacetate (for example, methyl methoxyacetate, ethyl methoxyacetate, butyl methoxyacetate, methyl ethoxyacetate, or ethyl ethoxyacetate)), alkyl 3-alkoxypropionate (for example, methyl 3-alkoxypropionate or ethyl 3-alkoxypropionate (for example, 3-methyl methoxypropionate, 3-ethyl methoxypropionate, 3-methyl ethoxypropionate, or 3-ethyl ethoxypropionate)), alkyl 2-alkoxypropionate (for example, methyl 2-alkoxypropionate, ethyl 2-alkoxypropionate, or propyl 2-alkoxypropionate, (for example, methyl 2-methoxypropionate, ethyl 2-methoxypropionate, propyl 2-methoxypropionate, methyl 2-ethoxypropionate, or 2-ethyl ethoxypropionate)), methyl 2-alkoxy-2-methylpropionate, ethyl 2-alkoxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate, or ethyl 2-oxobutanoate;
an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, diethylene glycol monobutyl ether acetate, propylene glycol monomethyl ether, propylene glycol monomethyl ether acetate, propylene glycol monoethyl ether acetate, or propylene glycol monopropyl ether acetate;
a ketone, for example, methyl ethyl ketone, cyclohexanone, cyclopentanone, 2-heptanone, or 3-heptanone; and
an aromatic hydrocarbon, for example, toluene or xylene.

In this case, it may be preferable that the content of the aromatic hydrocarbon (for example, benzene, toluene, xylene, or ethylbenzene) as the solvent is low (for example, 50 mass ppm or lower, 10 mass ppm or lower, or 1 mass ppm or lower with respect to the total mass of the organic solvent) in consideration of environmental aspects and the like.

Among these organic solvents, one kind may be used alone, or two or more kinds may be used in combination. In a case where two or more organic solvents are used in combination, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, a solvent having a low metal content is preferable. For example, the metal content in the solvent is preferably 10 mass ppb or lower. Optionally, a solvent having a metal content at a mass ppt level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. During the filtering using a filter, the pore size of a filter is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

In the composition according to the present invention, the content of the solvent is preferably 5 to 60 mass % and more preferably 10 to 40 mass % with respect to the total solid content of the composition. As the solvent, one kind or two or more kinds may be used. In a case where two or more solvents are used, it is preferable that the total content of the two or more solvents is in the above-described range.

<<Resin>>

It is preferable that the composition according to the present invention further includes a resin. The resin is mixed, for example, in order to disperse the pigment and the like in the composition and to be added as a binder. The resin which is mainly used to disperse the pigments and the like will also be called a dispersant. However, the above-described uses of the resin are merely exemplary, and the resin can be used for purposes other than the uses.

In the present invention, it is preferable that a resin having an acid group is used as the resin. Examples of the acid group include a carboxyl group, a phosphate group, a sulfonate group, and a phenolic hydroxyl group. Among these, a carboxyl group is preferable.

The weight-average molecular weight (Mw) of the resin is preferably 2000 to 2000000. The upper limit is more preferably 1000000 or lower and still more preferably 500000 or lower. The lower limit is more preferably 3000 or higher and still more preferably 5000 or higher.

(Dispersant)

It is preferable that a dispersant as a resin includes one or more kinds selected from the group consisting of an acidic resin, a basic resin, and an amphoteric resin, and it is more preferable that the dispersant includes one or more kinds selected from the group consisting of an acidic resin and an amphoteric resin.

In the present invention, the acidic resin refers to a resin having an acid group which has an acid value of 5 mgKOH/g or higher and an amine value of lower than 5 mgKOH/g. It is preferable that the acidic resin does not have a basic group. Examples of the acid group included in the acidic resin include a carboxyl group, a phosphate group, a sulfo group, and a phenolic hydroxy group. Among these, a carboxyl group is preferable. The acid value of the acidic resin is preferably 5 to 200 mgKOH/g. The lower limit is more preferably 10 mgKOH/g or higher and still more preferably 20 mgKOH/g or higher. The upper limit is more preferably 100 mgKOH/g or lower and still more preferably 60 mgKOH/g or lower. In addition, the amine value of the acidic resin is preferably 2 mgKOH/g or lower and more preferably 1 mgKOH/g or lower.

In the present invention, the basic resin refers to a resin having a basic group which has an amine value of 5 mgKOH/g or higher and an acid value of lower than 5 mgKOH/g. It is preferable that the basic resin does not have an acid group. As the basic group in the basic resin, an amino group is preferable. The amine value of the basic resin is preferably 5 to 200 mgKOH/g, more preferably 5 to 150 mgKOH/g, and still more preferably 5 to 100 mgKOH/g.

In the present invention, the amphoteric resin refers to a resin having an acid group and a basic group which has an acid value of 5 mgKOH/g or higher and an amine value of 5 mgKOH/g or higher. Examples of the acid group include the above-described groups. Among these, a carboxyl group is preferable. As the basic group, an amino group is preferable. It is preferable that the amphoteric resin has an acid value of 5 mgKOH/g or higher and an amine value of 5 mgKOH/g or higher. The acid value is more preferably 5 to 200 mgKOH/g. The lower limit is more preferably 10 mgKOH/g or higher and still more preferably 20 mgKOH/g or higher. The upper limit is more preferably 150 mgKOH/g or lower and still more preferably 100 mgKOH/g or lower. In addition, the amine value is preferably 5 to 200 mgKOH/g. The lower limit is more preferably 10 mgKOH/g or higher and still more preferably 20 mgKOH/g or higher. The upper limit is more preferably 150 mgKOH/g or lower and still more preferably 100 mgKOH/g or lower. A ratio (acid value:amine value) of the acid value of the amphoteric resin to the amine value of the amphoteric resin is preferably 1:4 to 4:1 and more preferably 1:3 to 3:1.

It is preferable that the resin further includes a repeating unit having an acid group. By the resin including the repeating unit having an acid group, in a case where a pattern is formed by photolithography, the amount of residues formed in an underlayer of a pixel can be reduced.

In terms of a structure, the resin can be further classified into a linear polymer, a terminal-modified polymer, a graft polymer, and a block polymer.

Examples of the terminal-modified polymer include a polymer having a phosphate group at a terminal thereof described in JP1991-112992A (JP-H3-112992A) or JP2003-533455A, a polymer having a sulfonate group at a terminal thereof described in JP2002-273191A, and a polymer having a partial skeleton or a heterocycle of an organic colorant described in JP1997-77994A (JP-H9-77994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-37082A (JP-S54-37082A), JP1996-507960A (JP-H8-507960A), or JP2009-258668A, a reaction product of polyallylamine and polyester described in JP1997-169821A (JP-H9-169821A), a copolymer of a macromonomer and a monomer having a nitrogen atom described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A. Examples of the macromonomers include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLAKCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A).

As the block polymer, a block polymer described in JP2003-49110A or JP2009-52010A is preferable.

In the present invention, it is preferable that the resin is a resin having a polycaprolactone structure. According to this aspect, the pigment dispersibility can be further improved. Further, developability can also be improved. Examples of the resin having a polycaprolactone structure include a resin having at least one structure selected from the group consisting of a structure represented by Formula (a) and a structure represented by Formula (b) in a molecule. In the formula, m and n each independently represent an integer of 2 to 8, and p and 1 each independently represent an integer of 1 to 100.

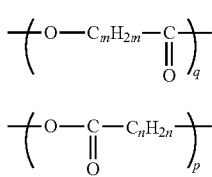

It is preferable that the resin having a polycaprolactone structure is a resin including a repeating unit represented by any one of Formula (I) and Formula (II).

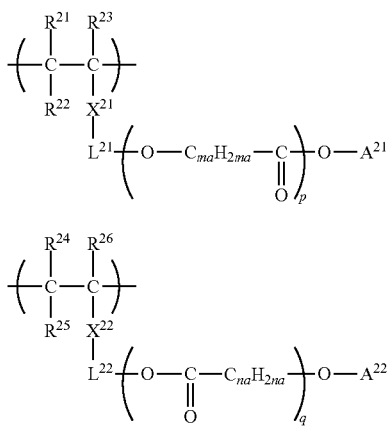

In Formula (I) and Formula (II), $R^{21}$ to $R^{26}$ each independently represent a hydrogen atom or a monovalent organic group, $X^{21}$ and $X^{22}$ each independently represent —CO—, —C(=O)O—, —CONH—, —OC(=O)—, or a phenylene group, $L^{21}$ and $L^{22}$ each independently represent a single bond or a divalent organic linking group, $A^{21}$ and $A^{22}$ each independently represent a monovalent organic group, ma and na each independently represent an integer of 2 to 8, and p and q each independently represent an integer of 1 to 100.

$R^{21}$ to $R^{26}$ each independently represent a hydrogen atom or a monovalent organic group. As the monovalent organic group, a substituted or unsubstituted alkyl group is preferable. As the alkyl group, an alkyl group having 1 to 12 carbon atoms is preferable, an alkyl group having 1 to 8 carbon atoms is more preferable, and an alkyl group having 1 to 4 carbon atoms is still more preferable. In a case where the alkyl group has a substituent, examples of the substituent include a hydroxy group and an alkoxy group (preferably an alkoxy group having 1 to 5 carbon atoms and 1 to and more preferably an alkoxy group having 1 to 3 carbon atoms). It is preferable that $R^{21}$, $R^{22}$, $R^{24}$, and $R^{25}$ represent a hydrogen atom, and it is more preferable that $R^{23}$ and $R^{26}$ represent a hydrogen atom or a methyl group.

$X^{21}$ and $X^{22}$ each independently represent —CO—, —C(=O)O—, —CONH—, —OC(=O)—, or a phenylene group. Among these, —C(=O)O—, —CONH—, or a phenylene group is preferable from the viewpoint of adsorption on the pigment, and —C(=O)O— is most preferable.

$L^{21}$ and $L^{22}$ each independently represent a single bond or a divalent organic linking group. As the divalent organic linking group, a substituted or unsubstituted alkylene group, an alkylene group, or a divalent organic linking group having a heteroatom or a partial structure including a heteroatom is preferable. As the alkylene group, an alkylene group having 1 to 12 carbon atoms is preferable, an alkylene group having 1 to 8 carbon atoms is more preferable, and an alkylene group having 1 to 4 carbon atoms is still more preferable. In addition, examples of the heteroatom of the partial structure including a heteroatom include an oxygen atom, a nitrogen atom, and a sulfur atom. Among these, an oxygen atom or a nitrogen atom is preferable. Specific preferable examples of the alkylene group include a methylene group, an ethylene group, a propylene group, a trimethylene group, and a tetramethylene group. In a case where the alkylene group has a substituent, examples of the substituent include a hydroxy group. From the viewpoint of adsorption on the pigment, it is preferable that the divalent organic linking group has a heteroatom or a partial structure including a heteroatom at a terminal of the alkylene group and is linked to an adjacent oxygen atom through the heteroatom or the partial structure including a heteroatom, the partial structure including a heteroatom being selected from the group consisting of —C(=O)—, —OC(=O)—, and —NHC(=O)—. Here, the adjacent oxygen atom refers to an oxygen atom bonded to a side chain terminal side in $L^{21}$ of Formula (I) and $L^{22}$ of Formula (II).

From the viewpoints of dispersion stability and developability, $A^{21}$ and $A^{22}$ represent preferably a linear alkyl group having 1 to 20 carbon atoms, a branched alkyl group having 3 to 20 carbon atoms, or a cyclic alkyl group having 5 to 20 carbon atoms, more preferably a linear alkyl group having 4 to 15 carbon atoms, a branched alkyl group having 4 to 15 carbon atoms, or a cyclic alkyl group having 6 to 10 carbon atoms, and still more preferably a linear alkyl group having 6 to 10 carbon atoms or a branched alkyl group having 6 to 12 carbon atoms.

ma and na each independently represent an integer of 2 to 8. From the viewpoints of dispersion stability and developability, ma and na each independently represent preferably 4 to 6 and more preferably 5.

p and q each independently represent an integer of 1 to 100. Two or more kinds having different p's and two or more kinds having different q's may be mixed with each other. From the viewpoints of dispersion stability and developability, it is preferable that p and q represent 5 to 80.

It is also preferable that the resin including a repeating unit represented by any one of Formula (I) and Formula (II) further includes a repeating unit represented by Formula (P1).

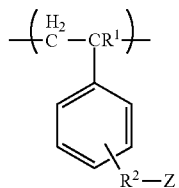

In Formula (P1), $R^1$ represents a hydrogen atom or a methyl group, $R^2$ represents an alkylene group, and Z represents a nitrogen-containing heterocyclic structure.

The alkylene group represented by $R^2$ is not particularly limited, and examples thereof include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, and a methylenethio group. Among these, a methylene group, a methyleneoxy group, a methyleneoxycarbonyl group, or a methylenethio group is more preferable.

Examples of the nitrogen-containing heterocyclic structure represented by Z include a structure including a pyridine ring, a pyrazine ring, a pyrimidine ring, a pyrrole ring, an imidazole ring, a triazole ring, a tetrazole ring, an indole ring, a quinoline ring, an acridine ring, a phenothiazine ring, a phenoxazine ring, an acridone ring, an anthraquinone ring, a benzimidazole structure, a benzotriazole structure, a benzothiazole structure, a cyclic amide structure, a cyclic urea structure, or a cyclic imide structure. Among these, as the nitrogen-containing heterocyclic structure represented by Z, a structure represented by the following Formula (P2) or (P3) is preferable.

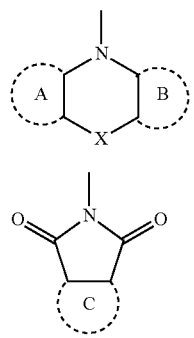

In the formula, X represents one selected from the group consisting of a single bond, an alkylene group (for example, a methylene group, an ethylene group, a propylene group, a trimethylene group, or a tetramethylene group), —O—, —S—, —NR—, and —C(=O)—. Here, R represents a hydrogen atom or an alkyl group. X represents preferably a single bond, a methylene group, —O—, or —C(=O)— and more preferably —C(=O)—.

In the formula, a ring A, a ring B, and a ring C each independently represent an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring. Among these, a benzene ring, a naphthalene ring, an anthracene ring, a pyridine ring, a phenoxazine ring, an acridine ring, a phenothiazine ring, a phenoxazine ring, an acridone ring, or an anthraquinone ring is preferable, and a benzene ring, a naphthalene ring, or a pyridine ring is more preferable.

Specific examples of the repeating unit represented by Formula (P1) are as follows. In addition, specific examples of the structural unit can be found in paragraph "0023" of JP2008-009426A, the content of which is incorporated herein by reference.

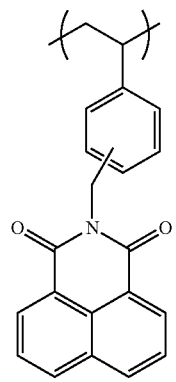

The details of the resin including a repeating unit represented by any one of Formula (I) and Formula (II) can be found in the description of paragraphs "0025" to "0069" of JP2012-255128A, the content of which is incorporated herein by reference. Specific examples of the resin are as follows. In addition, a resin described in paragraphs "0072" to "0094" of JP2012-255128A can be used.

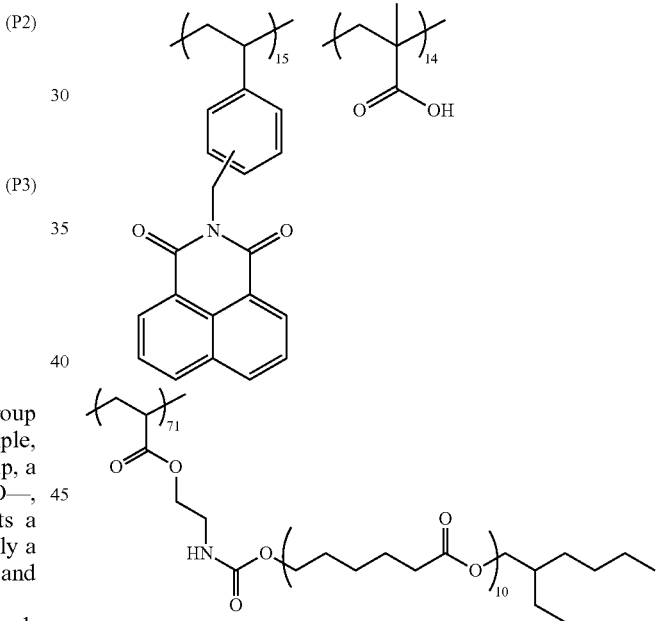

As the resin, a graft copolymer can also be used. It is preferable that the graft copolymer is a resin having a graft chain in which the number of atoms excluding hydrogen atoms is in a range of 40 to 10000. In addition, the number of atoms excluding hydrogen atoms per graft chain is preferably 40 to 10000, more preferably 50 to 2000, and still more preferably 60 to 500.

Examples of a main chain structure of the graft copolymer include a (meth)acrylic resin, a polyester resin, a polyurethane resin, a polyurea resin, a polyamide resin, and a polyether resin. Among these, a (meth)acrylic resin is preferable. In order to improve the interaction between the graft site and the solvent to improve dispersibility, the graft chain of the graft copolymer is preferably a graft chain having poly(meth)acryl, polyester, or polyether and more preferably a graft chain having polyester or polyether.

It is preferable that the graft copolymer includes a repeating unit represented by any one of the following Formulae (1) to (4). The resin including a repeating unit represented by Formula (1) or Formula (2) is also a resin having a polycaprolactone structure.

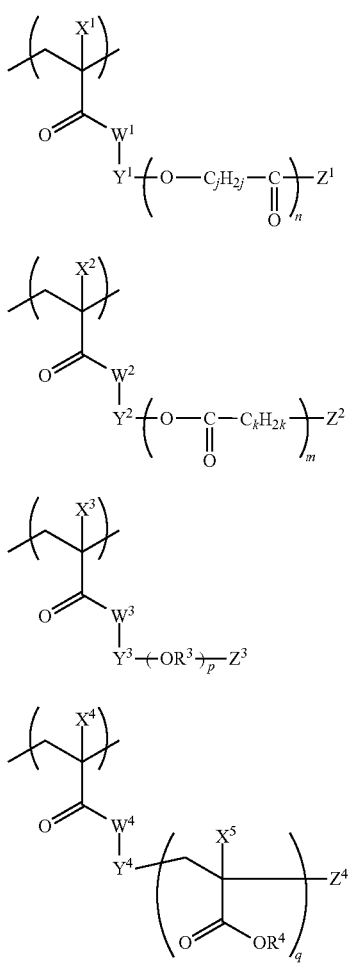

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (3), in a case where p represents 2 to 500, a plurality of $R^3$'s may be the same as or different from each other. In Formula (4), in a case where q represents 2 to 500, a plurality of $X^5$'s and a plurality of $R^4$'s may be the same as or different from each other.

It is preferable that $W^1$, $W^2$, $W^3$, and $W^4$ represent an oxygen atom.

$X^1$, $X^2$, $X^3$, $X^4$, and $X^5$ each independently represent preferably a hydrogen atom or an alkyl group having 1 to 12 carbon atoms, more preferably a hydrogen atom or a methyl group, and still more preferably a methyl group.

$Y^1$, $Y^2$, $Y^3$, and $Y^4$ each independently represent a divalent linking group. Examples of the divalent linking group include —CO—, —O—, —NH—, an alkylene group, an arylene group, and a combination thereof.

A structure of the monovalent group represented by $Z^1$, $Z^2$, $Z^3$, and $Z^4$ is not particularly limited. Examples of the structure of the monovalent group include an alkyl group, a hydroxy group, an alkoxy group, an aryloxy group, a heteroaryloxy group, an alkylthioether group, an arylthioether group, a heteroarylthioether group, and an amino group.

In Formulae (1) to (4), n, m, p, and q each independently represent an integer of 1 to 500. In addition, in Formulae (1) and (2), j and k each independently represent an integer of 2 to 8. In Formulae (1) and (2), j and k represent preferably an integer of 4 to 6 and most preferably 5 from the viewpoints of dispersion stability and developability.

In Formula (3), R3 represents an alkylene group, preferably an alkylene group having 1 to 10 carbon atoms, and more preferably an alkylene group having 2 or 3 carbon atoms. In a case where p represents 2 to 500, a plurality of $R^3$'s may be the same as or different from each other.

In Formula (4), $R^4$ represents a hydrogen atom or a monovalent group. $R^4$ represents preferably a hydrogen atom, an alkyl group, an aryl group, or a heteroaryl group and more preferably a hydrogen atom or an alkyl group. In Formula (4), in a case where q represents 2 to 500, a plurality of $X^5$'s and a plurality of $R^4$'s may be the same as or different from each other.

The details of the formula can be found in the description of paragraphs "0025" to "0069 of JP2012-255128A, the content of which is incorporated herein by reference.

As the resin, an oligoimine resin having a nitrogen atom at at least either a main chain or a side chain can be used. As the oligoimine resin, a resin, which includes a repeating unit including a group X having a partial structure with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity. It is preferable that the side chain is a polymer chain having a polycaprolactone structure Examples of the polycaprolactone structure include structures represented by Formula (a) and Formula (b).

Examples of the oligoimine resin include a resin including at least one of a repeating unit represented by the following Formula (I-1), a repeating unit represented by the following Formula (I-2), or a repeating unit represented by the following Formula (I-2a).

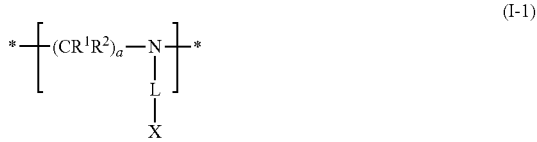

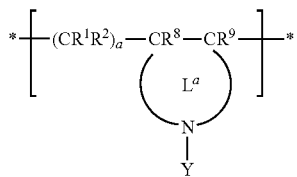
(I-2a)

$R^1$ and $R^2$ each independently represent a hydrogen atom, a halogen atom, or an alkyl group (having preferably 1 to 6 carbon atoms). a's each independently represent an integer of 1 to 5. * represents a linking portion between repeating units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is a structure which forms a ring structure with $CR^8CR^9$ and N, preferably a structure which forms a nonaromatic heterocycle having 3 to 7 carbon atoms with a carbon atom of $CR^8CR^9$, more preferably a structure which forms a nonaromatic 5- to 7-membered heterocycle with a carbon atom of $CR^8CR^9$ and N (nitrogen atom), still more preferably a structure which forms a nonaromatic 5-membered heterocycle with a carbon atom of $CR^8CR^9$ and N, and even still more preferably a structure which forms pyrrolidine with a carbon atom of $CR^8CR^9$ and N. This structure may have a substituent such as an alkyl group.

X represents a group having a functional group (pKa: 14 or lower).

Y represents a side chain having 40 to 10000 atoms. The side chain is preferably a polymer chain having a polycaprolactone structure and more preferably a polymer chain having a structure represented by Formula (a) or Formula (b).

The resin (oligoimine resin) may further include one or more copolymerization components selected from the group consisting of the repeating units represented by Formulae (I-3), (I-4), and (I-5). By the resin containing the above-described repeating units, the dispersion performance of the pigment can be further improved.

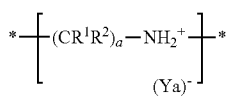
(I-3)

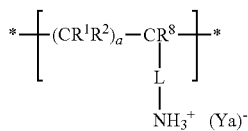
(I-4)

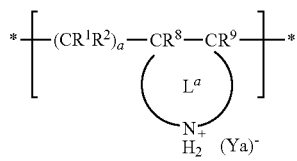
(I-5)

$R^1$, $R^2$, $R^8$, $R^9$, L, La, a, and * have the same definitions as those in Formulae (I-1), (I-2), and (I-2a).

Ya represents a side chain having 40 to 10000 atoms which has an anionic group. The repeating unit represented by Formula (I-3) can be formed by adding an oligomer or a polymer having a group, which reacts with amine to form a salt, to a resin having a primary or secondary amino group at a main chain such that they react with each other. Ya represents preferably a polymer chain having a polycaprolactone structure and more preferably a polymer chain having a structure represented by Formula (a) or Formula (b).

The oligoimine resin can be found in the description of paragraphs "0102" to "0166" of JP2012-255128A, the content of which is incorporated herein by reference. Specific examples of the oligoimine resin are as follows. In addition, a resin described in paragraphs "0168" to "0174" of JP2012-255128A can be used.

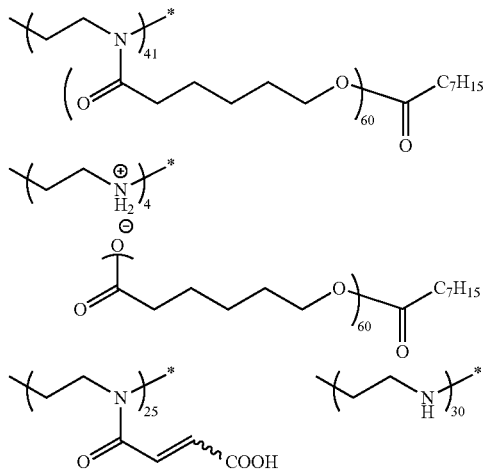

The resin used as the dispersant is available as a commercially available product, and specific examples thereof include products described in paragraph "0046" of JP2014-130338A.

Among these resins, one kind may be used alone, or two or more kinds may be used in combination. In addition, an alkali-soluble resin may be used as the resin.

(Alkali-Soluble Resin)

The alkali-soluble resin can be appropriately selected from alkali-soluble resins having at least one group for promoting alkali solubility in a molecule. As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as the acid group) include a carboxyl group, a phosphate group, a sulfonate group, and a phenolic hydroxyl group. Among these, a carboxyl group is preferable. Among these acid groups, one kind may be used alone, or two or more kinds may be used in combination.

As the alkali-soluble resin, a polymer having a carboxyl group at a side chain thereof is preferable, and examples thereof include a methacrylic acid copolymer, an acrylic acid copolymer, an itaconic acid copolymer, a crotonic acid copolymer, a maleic acid copolymer, a partially esterified maleic acid copolymer, a novolac type resin, an acidic cellulose derivative having a carboxyl group at a side chain thereof, and a polymer obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the other monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyl toluene, acrylonitrile, vinyl acetate, N-vinylpyrrolidone, a polystyrene macromonomer, and a polymethyl methacrylate macromonomer. In addition, as the other monomers, a N-position-substituted maleimide monomer may also be used. In addition, examples of the N-position-substituted maleimide monomer include an N-position-substituted maleimide monomer described in JP1998-300922A (H10-300922). Specific examples of the N-position-substituted maleimide monomer include N-phenylmaleimide and N-cyclohexylmaleimide. As the other monomer which is copolymerizable with the (meth)acrylic acid, one kind may be used alone, or two or more kinds may be used in combination.

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth)acrylate can be preferably used, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid. In addition, as a commercially available product, for example, ACRYBASE FF-426 and FFS-6752 (manufactured by Nippon Shokubai Co., Ltd.) can also be used.

As the alkali-soluble resin, an alkali-soluble resin having a polymerizable group may be used. Examples of the polymerizable group include a (meth)allyl group and a (meth)acryloyl group. As the alkali-soluble resin having a polymerizable group, an alkali-soluble resin having a polymerizable group at a side chain thereof is preferable. Examples of the alkali-soluble resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRY-CURE RD-F8 (manufactured by Nippon Shokubai Co., Ltd.).

As the alkali-soluble resin, a polymer obtained by polymerization of monomer components including at least one of a compound represented by the following Formula (ED1), or a compound represented by the following Formula (ED2) (hereinafter, these compounds will also be referred to as "ether dimer") is also preferable.

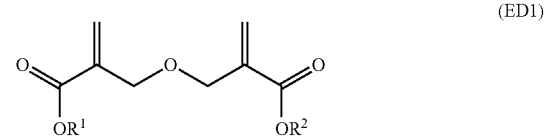

(ED1)

In Formula (ED1), $R^1$ and $R^2$ each independently represent a hydrogen atom or a hydrocarbon group having 1 to 25 carbon atoms which may have a substituent.

(ED2)

In Formula (ED2), R represents a hydrogen atom or an organic group having 1 to 30 carbon atoms. Specific examples of Formula (ED2) can be found in the description of JP2010-168539A.

The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-29760A, the content of which is incorporated herein by reference. Among these ether dimers, one kind may be used alone, or two or more kinds may be used in combination.

The alkali-soluble resin may include a repeating unit which is derived from a compound represented by the following Formula (X).

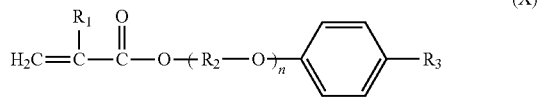

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

In Formula (X), the number of carbon atoms in the alkylene group of $R_2$ is preferably 2 to 3. In addition, the number of carbon atoms in the alkyl group of $R_3$ is 1 to 20 and preferably 1 to 10, and the alkyl group of $R_3$ may have a benzene ring. Examples of the alkyl group having a benzene ring represented by $R_3$ include a benzyl group and a 2-phenyl(iso)propyl group.

The acid value of the alkali-soluble resin is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

The weight-average molecular weight (Mw) of the alkali-soluble resin is preferably 2000 to 50000. The lower limit is preferably 5000 or higher and more preferably 7000 or higher. The upper limit is preferably 30000 or lower and more preferably 20000 or lower.

In the composition according to the present invention, the content of the resin is preferably 0.1 to 100 parts by mass with respect to 100 parts by mass of the pigment. The upper limit is more preferably 80 parts by mass or less, still more preferably 60 parts by mass or less, and even still more preferably 40 parts by mass or less. The lower limit is more preferably 0.5 parts by mass or more and still more preferably 1 part by mass or more. In a case where the content of the resin is in the above-described range, the pigment dispersibility is excellent.

<Preparation of Composition>

The composition according to the present invention can be prepared by mixing the above-described various components. During the preparation of the composition, the respective components constituting the composition may be mixed with each other collectively, or may be mixed with each other sequentially after dissolved or dispersed in an organic solvent. In addition, during mixing, the order of addition or working conditions are not particularly limited. In addition, examples of a mechanical force used for dispersing the pigment in the process of dispersing the pigment include compression, squeezing, impact, shearing, and cavitation. Specific examples of the process include a beads mill, a sand mill, a roll mill, a high-speed impeller, a sand grinder, a project mixer, high-pressure wet atomization, and ultrasonic dispersion. In addition, a process and a disperser described in "Complete Works of Dispersion Technology, Johokiko Co., Ltd., Jul. 15, 2005", and "Dispersion Technique focusing on Suspension (Solid/Liquid Dispersion) and Practical Industrial Application, Comprehensive Reference List, Publishing Department of Management Development Center, Oct. 10, 1978" can be suitably used. In addition, in the process of dispersing the pigment, the pigment may be refined in a salt milling step. A material, a device, process conditions, and the like used in the salt milling step can be found in, for example, JP2015-194521A and JP2012-046629A.

It is preferable that a method of manufacturing the composition according to the present invention includes a step (dispersing step) of dispersing the pigment in the presence of at least the pigment derivative and the solvent (preferably in the presence of the pigment derivative, the solvent, and the resin).

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In the above-described range, fine foreign matter can be reliably removed. In addition, it is preferable that a fibrous filter material is used. Examples of the fibrous filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, only the dispersion is filtered using the first filter, and the second filtering may be performed on a mixture of the dispersion and other components.

<Curable Composition>

A curable composition according to the present invention includes the above-described composition and a curable compound.

In the curable composition according to the present invention, the content of the pigment can be optionally adjusted. For example, the content of the pigment is preferably 0.01 to 50 mass % with respect to the total solid content of the curable composition. The lower limit is more preferably 0.1 mass % or higher and still more preferably 0.5 mass % or higher. The upper limit is more preferably 30 mass % or lower and still more preferably 15 mass % or lower. In a case where the curable composition according to the present invention includes two or more pigments, it is preferable that the total content of the two or more pigments is in the above-described range.

<<Curable Compound>>

The curable composition according to the present invention includes a curable compound. As the curable compound, a well-known compound which is crosslinkable by a radical, an acid, or heat can be used. Examples of the crosslinking compound include a compound which has a group having an ethylenically unsaturated bond, a compound having an epoxy group, and a compound having a methylol group. Among these, a compound which has a group having an ethylenically unsaturated bond is preferable. Examples of the group having an ethylenically unsaturated bond include a vinyl group, a (meth)allyl group, and a (meth)acryloyl group.

In the present invention, the curable compound is preferably a polymerizable compound and more preferably a radically polymerizable compound. Examples of the radically polymerizable compound include a compound which has a group having an ethylenically unsaturated bond. As the polymerizable compound, a compound which has one or more groups having an ethylenically unsaturated bond is preferable, a compound which has two or more groups having an ethylenically unsaturated bond is more preferable, and a compound which has three or more groups having an ethylenically unsaturated bond is still more preferable. The upper limit is, for example, preferably 15 or less and more preferably 6 or less.

(Polymerizable Compound)

The polymerizable compound may be in the form of a monomer or a polymer and is preferably a monomer. The molecular weight of the monomer type polymerizable compound is preferably 200 to 3000. The upper limit of the molecular weight is more preferably 2500 or lower and still more preferably 2000 or lower. The lower limit of the molecular weight is more preferably 250 or higher and still more preferably 300 or higher.

Examples of the polymerizable compound can be found in paragraphs "0033" and "0034" of JP2013-253224A, the content of which is incorporated herein by reference. As the compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a compound having a structure in which the (meth)acryloyl group is bonded through an ethylene glycol or a propylene glycol residue is preferable. In addition, oligomers of the above-described examples can be used. In addition, the compound having an ethylenically unsaturated bond can be found in the description of a polymerizable compound in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the content of which is incorporated herein by reference.

In addition, as the polymerizable compound, diglycerin ethylene oxide (EO)-modified (meth)acrylate (as a commercially available product, M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The polymerizable compound may have an acid group such as a carboxyl group, a sulfonate group, or a phosphate group. The polymerizable compound having an acid group can be obtained, for example, using a method of (meth)acrylating some hydroxy groups of a polyfunctional alcohol and adding an acid anhydride to the remaining hydroxy group to obtain a carboxyl group. In addition, an acid group may be introduced into the polymerizable compound by causing a nonaromatic carboxylic anhydride or the like to react with the hydroxy group. Specific examples of the nonaromatic carboxylic anhydride include tetrahydrophthalic anhydride, alkylated tetrahydrophthalic anhydride, hexahydrophthalic anhydride, alkylated hexahydrophthalic anhydride, succinic anhydride, and maleic anhydride.

As the polymerizable compound having an acid group, an ester of an aliphatic polyhydroxy compound and an unsaturated carboxylic acid is preferable, a polymerizable compound to which an acid group is added by causing a nonaromatic carboxylic anhydride to react with an unreacted hydroxy group of an aliphatic polyhydroxy compound is more preferable, and a compound in which the aliphatic polyhydroxy compound in the above-described ester is at least one of pentaerythritol or dipentaerythritol is still more preferable. Examples of a commercially available product of the polymerizable compound having an acid group include: ARONIX M-510 and M-520 (manufactured by Toagosei Co., Ltd.); and CBX-0 and CBX-1 (manufactured by Shin-Nakamura Chemical Co., Ltd.). The acid value of the polymerizable compound having an acid group is preferably 0.1 to 40 mgKOH/g. The lower limit is more preferably 5 mgKOH/g or higher. The upper limit is more preferably 30 mgKOH/g or lower.

In addition, a compound having a caprolactone structure is also preferable as the polymerizable compound. The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARAD DPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the polymerizable compound, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having an ethylene oxide skeleton described in JP1983-49860B (JP-S58-49860B), JP1981-17654B (JP- S56-17654B), JP1987-39417B (JP-S62-39417B), or JP1987-39418B (JP-S62-39418B) is also preferable. In addition, the compound which has a group having an ethylenically unsaturated bond can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, AI-600, and LIGHT ACRYLATE DCP-A (manufactured by Kyoeisha Chemical Co., Ltd.).

In addition, as the polymerizable compound, an isocyanuric acid ethylene oxide (EO)-modified monomer such as ARONIX M-215, M-305, M-313, M-315, and TO-2349 (manufactured by Toagosei Co., Ltd.), SR-368 (manufactured by Sartomer), or A-9300 (manufactured by Shin-Nakamura Chemical Co., Ltd.) can be preferably used.

(Compound Having Epoxy Group)

The compound having an epoxy group is a compound having one or more epoxy groups in one molecule and preferably a compound having two or more epoxy groups in one molecule. A compound having 1 to 100 epoxy groups in one molecule is preferable. The upper limit of the number of epoxy groups is, for example, 10 or less or 5 or less. The lower limit of the number of epoxy groups is preferably 2 or more.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

As the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference. Regarding the commercially available product, examples of the bisphenol An epoxy resin include jER825, jER827, jER828, jER834, jER1001, jER1002, jER1003, jER1055, jER1007, jER1009, and jER1010 (all of which are manufactured by Mitsubishi Chemical Corporation) and EPICLON860, EPICLON1050, EPICLON1051, and EPICLON1055 (all of which are manufactured by DIC Corporation). Examples of the bisphenol F epoxy resin include jER806, jER807, jER4004, jER4005, jER4007, and jER4010 (all of which are manufactured by Mitsubishi Chemical Corporation), EPICLON830 and EPICLON835 (all of which are manufactured by DIC Corporation), and LCE-21 and RE-602S (all of which are manufactured by Nippon Kayaku Co., Ltd.). Examples of the phenol novolac epoxy resin include jER152, jER154, jER157S70, and jER157S65 (all of which are manufactured by Mitsubishi Chemical Corporation) and EPICLON N-740, EPICLON N-770, and EPICLON N-775 (all of which are manufactured by DIC Corporation). Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.). Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPO-LEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), jER1031S (manufactured by Mitsubishi Chemical Corporation), and OXT-221 (manufactured by Toagosei Co., Ltd.).

As the compound having an epoxy group, for example, a compound described in paragraph "0045" of JP2009-265518A can also be used. In addition, it is also preferable that MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) is used as the compound having an epoxy group.

In the composition according to the present invention, the content of the curable compound is preferably 1 to 90 mass % with respect to the total solid content of the curable composition according to the present invention. The lower limit is more preferably 5 mass % or higher, still more preferably 10 mass % or higher, and even still more preferably 20 mass % or higher. The upper limit is more preferably 80 mass % or lower and still more preferably 75 mass % or lower. As the curable compound, one kind may be used alone, or two or more kinds may be used. In a case where two or more curable compounds are used in combination, it is preferable that the total content of the two or more curable compounds is in the above-described range.

In addition, the content of the polymerizable compound is preferably 1 to 90 mass % with respect to the total solid content of the curable composition. The lower limit is more preferably 5 mass % or higher, still more preferably 10 mass % or higher, and even still more preferably 20 mass % or higher. The upper limit is more preferably 80 mass % or lower and still more preferably 75 mass % or lower. As the polymerizable compound, one kind may be used alone, or two or more kinds may be used. In a case where two or more polymerizable compounds are used in combination, it is preferable that the total content of the two or more polymerizable compounds is in the above-described range.

In addition, in the curable composition according to the present invention, the content of the polymerizable compound is preferably 10 to 35 mass % with respect to the total solid content of the curable composition. The lower limit is preferably 12 mass % or higher and more preferably 14 mass % or higher. The upper limit is preferably 33 mass % or lower and more preferably 30 mass % or lower.

<<Photopolymerization Initiator>>

It is preferable that the curable composition according to the present invention includes a photopolymerization initiator. The photopolymerization initiator is not particularly limited and can be appropriately selected from well-known photopolymerization initiators. For example, a photopolymerization initiator having photosensitivity to light in a range from the ultraviolet range to the visible range is preferable. It is preferable that the photopolymerization initiator is a photoradical polymerization initiator. In addition, it is preferable that the photopolymerization initiator is at least one compound having a molar absorption coefficient of at least 50 in a wavelength range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayashi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-H5-34920A), and a compound described in U.S. Pat. No. 4,212,976A.

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

Examples of the α-aminoketone compound include 2-methyl-1-phenyl-2-morpholinopropan-1-one, 2-methyl-1-[4-(hexyl)phenyl]-2-morpholinopropan-1-one, 2-ethyl-2-dimethylamino-1-(4-morpholinophenyl)-butanone-1, 2-benzyl-2-dimethylamino-1-(4-morpholinophenyl)-butanone-1, and 2-(dimethylamino)-2-[(4-methylphenyl)methyl]-1-[4-(4-morpholinyl)phenyl]-1-butanone. Examples of a commercially available product of the α-aminoketone compound include IRGACURE 907, IRGACURE 369, and IRGACURE 379 (trade name, all of which are manufactured by BASF SE).

As the photopolymerization initiator, an α-hydroxyketone compound or an acylphosphine compound can also be preferably used. As the α-hydroxyketone compound, for example, IRGACURE-184, DAROCUR-1173, IRGACURE-500, IRGACURE-2959, or IRGACURE-127 (trade name, all of which are manufactured by BASF SE) can be used. As the acylphosphine compound, IRGACURE 819, or IRGACURE TPO (trade name, all of which are manufactured by BASF SE) which is a commercially available product can be used.

As the photopolymerization initiator, an oxime compound can also be preferably used. Specific examples of the oxime compound include a compound described in JP2001-233842A, a compound described in JP2000-80068A, a compound described in JP2006-342166A, and a compound described in JP2016-21012A.

Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one. In addition, examples of the oxime compound include a compound described in J. C. S. Perkin II (1979), pp. 1653-1660, J. C. S. Perkin II (1979), pp. 156-162 and Journal of Photopolymer Science and Technology (1995), pp. 202-232; and a compound described in JP2000-66385A, JP2000-80068A, JP2004-534797A, or JP2006-342166A. As a commercially available product of the oxime compound, IRGACURE-OXE01 (manufactured by BASF SE), IRGACURE-OXE02 (manufactured by BASF SE), IRGACURE-OXE03 or IRGACURE-OXE04 (all of which are manufactured by BASF SE) can also be preferably used. In addition, TR-PBG-304 (manufactured by Changzhou Tronly New Electronic Materials Co., Ltd.), and ADEKA ARKLS NCI-930 (manufactured by Adeka Corporation) can be used.

In addition, in addition to the above-described oxime compounds, for example, a compound described in JP2009-519904A in which oxime is linked to a N-position of a carbazole ring, a compound described in U.S. Pat. No. 7,626,957B in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays, or a compound described in paragraphs "0076" to "0079" of JP2014-137466A may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

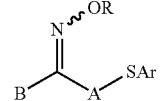

(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may be further substituted with another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

In the present invention, an oxime compound having a fluorene ring can also be used as the photopolymerization initiator. Specific examples of the oxime compound having a fluorene ring include a compound described in JP2014-137466A. The content is incorporated herein by reference.

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

In the present invention, as the photopolymerization initiator, an oxime compound having a nitro group can be used. It is also preferable that the oxime compound having a nitro group is used as a dimer. Specific examples of the oxime compound having a nitro group include compounds described in paragraphs "0031" to "0047" of JP2013-114249A and paragraphs "0008" to "0012" and "0070" to "0079" of JP2014-137466A, compounds described in paragraphs "0007" to 0025" of JP4223071B, and ADEKA ARKLS NCI-831 (manufactured by Adeka Corporation).

In the present invention, as the photopolymerization initiator, an oxime compound having a benzofuran skeleton can also be used. Specific examples include compounds OE-01 to OE-75 described in WO2015/036910A.

Hereinafter, specific examples of the oxime compound which are preferably used in the present invention are shown below, but the present invention is not limited thereto.

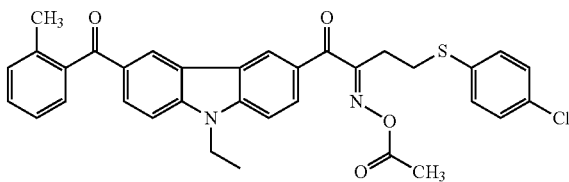

(C-2)

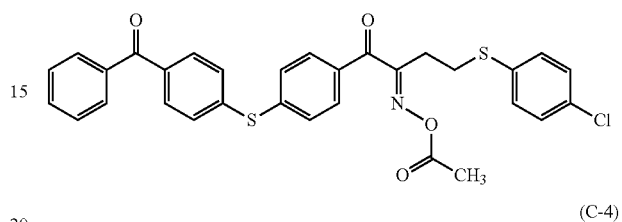

(C-3)

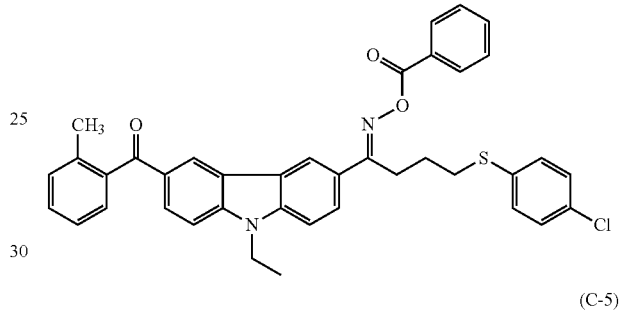

(C-4)

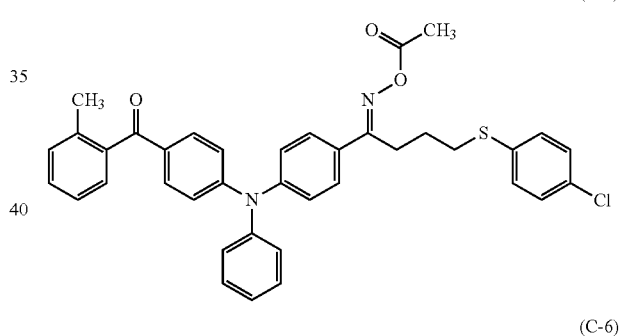

(C-5)

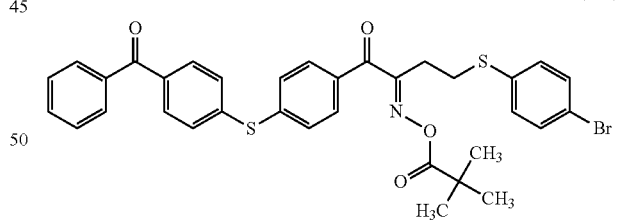

(C-6)

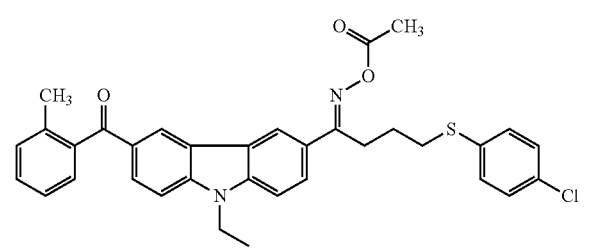

(C-1)

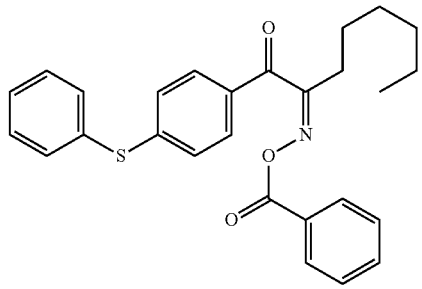

(C-7)

-continued (C-8) 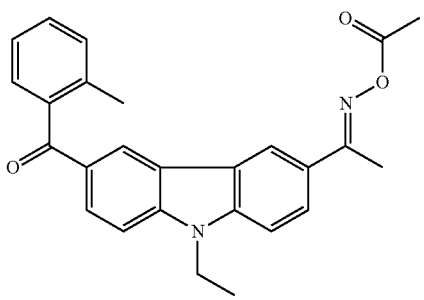

(C-9) 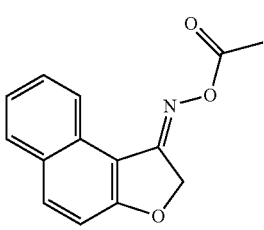

(C-10) 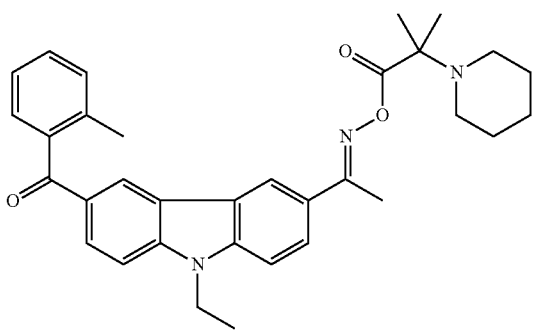

(C-11) 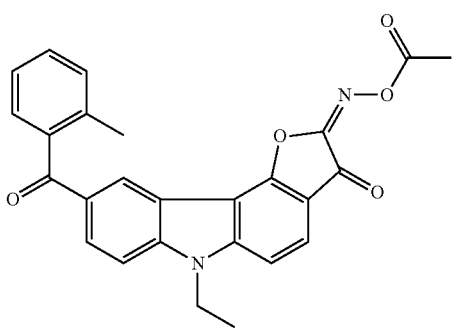

(C-12) 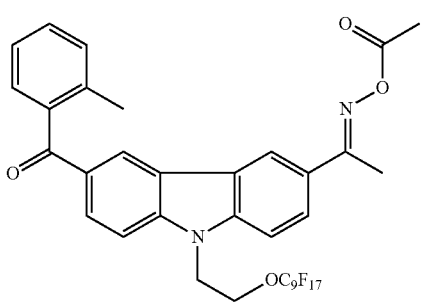

-continued (C-13) 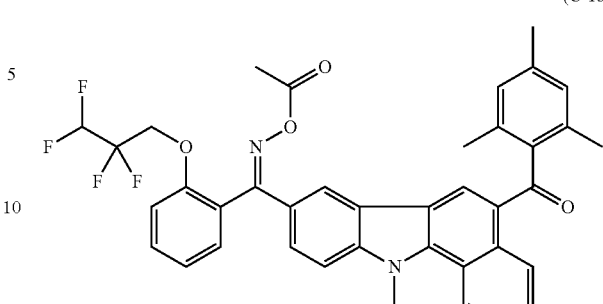

(C-14) 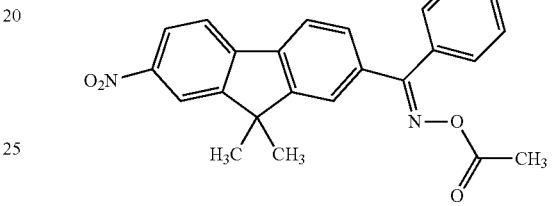

As the oxime compound, a compound having an absorption maximum in a wavelength range of 350 nm to 500 nm is preferable, a compound having an absorption wavelength in a wavelength range of 360 nm to 480 nm is more preferable, and a compound having a high absorbance at 365 nm and 405 nm is still more preferable.

The molar absorption coefficient of the oxime compound at 365 nm or 405 nm is preferably 1000 to 300000, more preferably 2000 to 300000, and still more preferably 5000 to 200000 from the viewpoint of sensitivity. The molar absorption coefficient of the compound can be measured using a well-known method. Specifically, for example, it is preferable that the molar absorption coefficient of the compound is measured using an ultraviolet-visible spectrophotometer (Cary-5 spectrophotometer, manufactured by Varian Medical Systems, Inc.) and an ethyl acetate solvent at a concentration of 0.01 g/L.

It is preferable that the photopolymerization initiator includes an oxime compound and an α-aminoketone compound. By using the oxime compound and the α-aminoketone compound in combination, the developability is improved, and a pattern having excellent rectangularity can be easily formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the curable composition according to the present invention. In the above-described range, excellent sensitivity and pattern formability can be obtained. The curable composition according to the present invention may include one photopolymerization initiator or two or more photopolymerization initiators. In a case where the composition includes two or more photopolymerization initiators, it is preferable that the total content of the two or more photopolymerization initiators is in the above-described range.

<<Alkali-Soluble Resin>>

The curable composition according to the present invention may include an alkali-soluble resin. By the curable composition including the alkali-soluble resin, a desired pattern can be formed by alkali development. Examples of the alkali-soluble resin include the alkali-soluble resins and the resins having an acid group described above regarding the composition, and a preferable range thereof is also the same.

In a case where the curable composition according to the present invention includes the alkali-soluble resin, the content of the alkali-soluble resin is preferably 1 mass % or higher and may be 2 mass % or higher, 5 mass % or higher, or 10 mass % or higher with respect to the total solid content of the curable composition according to the present invention. In addition, the content of the alkali-soluble resin may be 80 mass % or lower, 65 mass % or lower, 60 mass % or lower, or 15 mass % or lower with respect to the total solid content of the curable composition according to the present invention. In a case where the curable composition according to the present invention is used and a pattern is not formed by alkali development, it is needless to say that an aspect where the curable composition does not include the alkali-soluble resin may also be adopted.

In addition, in the curable composition according to the present invention, the content of the resin is preferably 14 to 70 mass % with respect to the total solid content of the curable composition according to the present invention. The lower limit is more preferably 17 mass % or higher and still more preferably 20 mass % or higher. The upper limit is more preferably 56 mass % or lower and still more preferably 42 mass % or lower.

In the curable composition according to the present invention, the content of the resin having an acid group is preferably 14 to 70 mass % with respect to the total solid content of the curable composition according to the present invention. The lower limit is more preferably 17 mass % or higher and still more preferably 20 mass % or higher. The upper limit is more preferably 56 mass % or lower and still more preferably 42 mass % or lower.

In addition, a mass ratio (polymerizable compound/resin) of the polymerizable compound to the resin is preferably 0.3 to 0.7. The lower limit of the mass ratio is more preferably 0.35 or higher and still more preferably 0.4. The upper limit of the mass ratio is more preferably 0.65 or lower and still more preferably 0.6 or lower. In a case where the mass ratio is in the above-described range, a pattern having excellent rectangularity can be formed.

In addition, a mass ratio (polymerizable compound/resin having an acid group) of the polymerizable compound to the resin having an acid group is 0.3 to 0.7. The lower limit of the mass ratio is more preferably 0.35 or higher and still more preferably 0.4. The upper limit of the mass ratio is more preferably 0.65 or lower and still more preferably 0.6 or lower. In a case where the mass ratio is in the above-described range, a pattern having excellent rectangularity can be formed.

In addition, a mass ratio (polymerizable compound/alkali-soluble resin) of the polymerizable compound to the alkali-soluble resin is 0.3 to 0.7. The lower limit of the mass ratio is more preferably 0.35 or higher and still more preferably 0.4. The upper limit of the mass ratio is more preferably 0.65 or lower and still more preferably 0.6 or lower. In a case where the mass ratio is in the above-described range, a pattern having excellent rectangularity can be formed.

<<Dye>>

The curable composition according to the present invention may include a dye. The kind of the dye is not particularly limited. The dye may be a dye (chromatic dye) having an absorption in a visible range or a dye (near infrared absorbing dye) having an absorption in a near infrared range.

Examples of a well-known chemical structure of the dye include a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a squarylium dye, a phenothiazine dye, a pyrrolopyrazole azomethine dye, a xanthene dye, a phthalocyanine dye, a benzopyran dye, an indigo dye, and a pyrromethene dye. These dyes can be used in the present invention. In addition, a polymer of the above-described dyes may be used. In addition, dyes described in JP2015-028144A and JP2015-34966A can also be used.

The content of the dye is preferably 1 to 50 mass % with respect to the total solid content of the curable composition according to the present invention. The lower limit is more preferably 3 mass % or higher and still more preferably 5 mass % or higher. The upper limit is more preferably 30 mass % or lower and still more preferably 20 mass % or lower.

<<Coloring Material that Allows Transmission of at Least Part of Light in Near Infrared Range and Shields Light in Visible Range (Coloring Material that Shields Visible Light)>>

The curable composition according to the present invention may also include a coloring material that allows transmission of at least a part of light in a near infrared range and shields light in a visible range (hereinafter, also referred to as "coloring material that shields visible light"). In a case where the curable composition according to the present invention includes the coloring material that shields visible light, the content of the pigment in the curable composition according to the present invention is preferably 90 mass % or higher, more preferably 95 mass % or higher, and still more preferably 99 mass % or higher with respect to the total mass of coloring material that shields visible light. In addition, it is preferable that black, gray, or a color similar to black or gray is exhibited using a combination of a plurality of coloring materials that shields visible light. In addition, it is preferable that the coloring material that shields visible light is a material that absorbs light in a wavelength range of violet to red. In addition, it is preferable that the coloring material that shields visible light is a material that shields light in a wavelength range of 450 to 650 nm.

It is preferable that the coloring material that shields visible light satisfies at least one of the following requirement (1) or (2), and it is more preferable that the coloring material that shields visible light satisfies the requirement (1).

(1): An aspect in which the coloring material that shields visible light includes two or more chromatic colorants (2): An aspect in which the coloring material that shields visible light includes an organic black colorant In addition, in the present invention, the organic black colorant as the coloring material that shields visible light denotes a material that absorbs light in a visible range and allows transmission of at least a part of light in a near infrared range. Accordingly, in the present invention, the organic black colorant as the coloring material that shields visible light does not denote a black colorant that absorbs both light in a near infrared range and light in a visible range, for example, carbon black or titanium black. In addition, "chromatic colorant" denotes a colorant other than a white colorant and a black colorant. It is preferable that the chromatic colorant is a colorant having an absorption in a wavelength range of 400 to 650 nm. In the present invention, the chromatic colorant may be a pigment (chromatic pigment) or a dye (chromatic dye).

Examples of the chromatic pigment include the chromatic pigments described above regarding the composition. As the chromatic dye, well-known chromatic dyes can be used without any particular limitation. Examples of the organic black colorant include a bisbenzofuranone compound, an azomethine compound, a perylene compound, and an azo compound. Among these, a bisbenzofuranone compound or a perylene compound is preferable. Examples of the bisbenzofuranone compound include compounds described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available.

In the present invention, it is preferable that the coloring material that shields visible light is a material in which a ratio A/B of a minimum value A of an absorbance in a wavelength range of 450 to 650 nm to a minimum value B of an absorbance in a wavelength range of 900 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the coloring material that shields visible light includes two or more chromatic colorants, it is preferable that the chromatic colorants are selected from the group consisting of a red colorant, a green colorant, a blue colorant, a yellow colorant, a violet colorant, and an orange colorant.

In a case where the coloring material that shields visible light is formed using a combination of two or more chromatic colorants, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields visible light includes a green colorant and a red colorant For example, ratios (mass ratios) between the respective colorants are as follows.

TABLE 13

| No. | Yellow Pigment | Green Pigment | Blue Pigment | Violet Pigment | Red Pigment | Orange Pigment |
| --- | --- | --- | --- | --- | --- | --- |
| 1 | 0.1~0.4 |  | 0.1~0.6 | 0.01~0.3 | 0.1~0.6 |  |
| 2 | 0.1~0.4 |  | 0.1~0.6 |  | 0.2~0.7 |  |
| 3 | 0.1~0.6 |  |  | 0.1~0.6 | 0.1~0.6 |  |
| 4 | 0.2~0.8 |  |  | 0.2~0.8 |  |  |
| 5 |  | 0.1~0.4 | 0.1~0.4 | 0.1~0.4 | 0.1~0.4 |  |
| 6 |  |  |  | 0.2~0.6 |  | 0.4~0.8 |
| 7 |  | 0.1~0.5 |  | 0.2~0.7 | 0.1~0.4 |  |
| 8 |  | 0.5~0.8 |  |  | 0.2~0.5 |  |

In a case where the curable composition according to the present invention includes the coloring material that shields visible light, the content of the coloring material that shields visible light is preferably 30 mass % or lower, more preferably 20 mass % or lower, and still more preferably 15 mass % or lower with respect to the total solid content of the curable composition. The lower limit is, for example, 0.01 mass % or higher or 0.5 mass % or higher.

In addition, the curable composition according to the present invention may not substantially include the coloring material that shields visible light. The curable composition substantially not including the coloring material that shields visible light represents that the content of the coloring material that shields visible light is preferably 0.005 mass % or lower, more preferably 0.001 mass % or lower, and still more preferably 0% with respect to the total solid content of the composition according to the present invention.

<<Silane Coupling Agent>>

The curable composition according to the present invention may further include a silane coupling agent. In the present invention, the silane coupling agent is a different component from the curable compound. In the present invention, the silane coupling agent refers to a silane compound having a functional group other than a hydrolyzable group. The hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. In addition, it is preferable that the functional group other than a hydrolyzable group has a group which interacts with the resin or forms a bond with the resin to exhibit affinity. Examples of the functional group other than a hydrolyzable group include a (meth)acryloyl group, a phenyl group, a mercapto group, an epoxy group, and an oxetanyl group. Among these, a (meth)acryloyl group or an epoxy group is preferable. That is, it is preferable that the silane coupling agent is a compound having an alkoxysilyl group and at least one of a (meth)acryloyl group or an epoxy group.

Specific examples of the silane coupling agent include phenyl trimethoxysilane, methyl trimethoxysilane, dimethyl dimethoxysilane, methyltriethoxysilane, and dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl)hexane, trifluoropropyltrimethoxysilane, hexamethyldisilazane, vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, and 3-isocyanatepropyltriethoxysilane. In addition to the above-described examples, an alkoxy oligomer can be used. In addition, the following compounds can also be used.

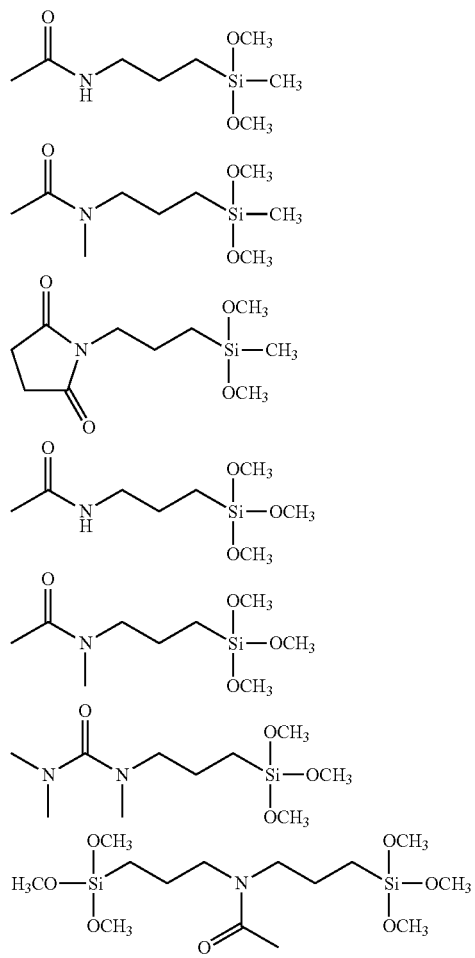

Examples of a commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.). In addition, examples of the silane coupling agent include a compound described in paragraphs "0018" to "0036" of JP2009-288703A and a compound described in paragraphs "0056" to "0066" of JP2009-242604A, the content of which is incorporated herein by reference.

In addition, as the silane coupling agent, the following compounds can also be used. In the formula, Et represents an ethyl group.

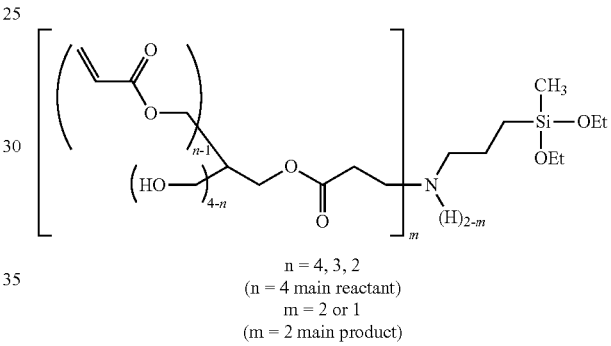

n = 4, 3, 2
(n = 4 main reactant)
m = 2 or 1
(m = 2 main product)

The content of the silane coupling agent is preferably 0.01 to 15.0 mass % and more preferably 0.05 to 10.0 mass % with respect to the total solid content of the curable composition. As the silane coupling agent, one kind may be used alone, or two or more kinds may be used. In a case where two or more silane coupling agents are used in combination, it is preferable that the total content of the silane coupling agents is in the above-described range.

<<Surfactant>>

The curable composition according to the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the curable composition including a fluorine surfactant, liquid characteristics (for example, fluidity) of a coating solution prepared from the composition are further improved, and the uniformity in coating thickness and liquid saving properties can be further improved. That is, in a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-41318A (paragraphs "0060" to "0064" of corresponding WO2014/17669) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC1068, SC-381, SC-383, S393, and KH-40 (all of which are manufactured by Asahi Glass Co., Ltd.); and PolyFox, PF636, PF656, PF6320, PF6520, and PF7002 (all of which are manufactured by OMNOVA Solutions Inc.).

As the fluorine surfactant, a block polymer can also be used. Examples of the block polymer include a compound described in JP2011-89090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

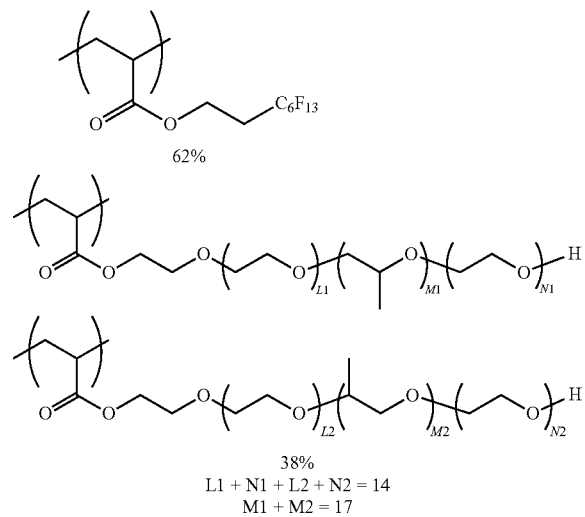

The weight-average molecular weight of the compound is preferably 3000 to 50000 and, for example, 14000. In the compound, "%" representing the proportion of a repeating unit is mass %.

In addition, as the fluorine surfactant, a fluorine-containing polymer which has a group having an ethylenically unsaturated bond at a side chain can also be preferably used. Specific examples include compounds described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

In addition, as the fluorine surfactant, an acrylic compound in which, when heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 (manufactured by BASF SE) and TETRONIC 304, 701, 704, 901, 904, and 150R1 (manufactured by BASF SE)); SOLSPERSE 20000 (manufactured by Lubrication Technology Inc.); NCW-101, NCW-1001, and NCW-1002 (all of which are manufactured by Wako Pure Chemical Industries, Ltd.); PIONIN D-6112, D-6112-W, and D-6315 (all of which are manufactured by Takemoto Oil&Fat Co., Ltd.); and OLFINE E1010, SURFYNOL 104, 400, and 440 (all of which are manufactured by Nissin Chemical Co., Ltd.).

Examples of the cationic surfactant include an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total solid content of the curable composition.

<<Ultraviolet Absorber>>

It is preferable that the curable composition according to the present invention includes an ultraviolet absorber. Examples of the ultraviolet absorber include conjugated diene compound and a diketone compound. Among these, a conjugated diene compound is preferable. As the conjugated diene compound, a compound represented by the following Formula (UV-1) is more preferable.

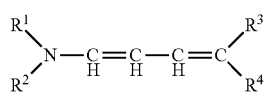
(UV-1)

In Formula (UV-1), $R^1$ and $R^2$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^1$ and $R^2$ may form a cyclic amino group with a nitrogen atom bonded to $R^1$ and $R^2$. Examples of the cyclic amino group include a piperidino group, a morpholino group, a pyrrolidino group, a hexahydroazepino group, and a piperazino group.

$R^1$ and $R^2$ each independently represent preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ represent an electron-withdrawing group. Here, the electron-withdrawing group is an electron-withdrawing group having a Hammett substituent constant $\sigma_p$ value (hereinafter, simply referred to as "$\sigma_p$ value") of 0.20 to 1.0. The $\sigma_p$ value in the electron-withdrawing group is preferably 0.30 to 0.8.

It is preferable that $R^3$ represent a group selected from a cyano group, —COOR$^5$, —CONHR$^5$, —COR$^5$, and —SO$_2$R$^5$. It is preferable that $R^4$ represent a group selected from a cyano group, —COOR$^6$, —CONHR$^6$, —COR$^6$, and —SO$_2$R$^6$. $R^5$ and $R^6$ each independently represent an alkyl group having 1 to 20 carbon atoms or an aryl group having 6 to 20 carbon atoms.

$R^3$ and $R^4$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. In addition, $R^3$ and $R^4$ may be bonded to each other to form a cyclic electron-withdrawing group. Examples of the cyclic electron-withdrawing group which is formed by $R^3$ and $R^4$ being bonded to each other include a 6-membered ring having two carbonyl groups.

At least one of $R^1$, $R^2$, $R^3$, or $R^4$ may represent a polymer obtained from a monomer which is bonded to a vinyl group through a linking group. At least one of $R^1$, $R^2$, $R^3$, or $R^4$ may represent a copolymer obtained from the above polymer and another monomer.

Specific examples of the ultraviolet absorber represented by Formula (UV-1) include the following compounds. The description of a substituent of the ultraviolet absorber represented by Formula (UV-1) can be found in paragraphs "0024" to "0033" of WO2009/123109A (corresponding to paragraphs "0040" to "0059" of US2011/0039195A), the content of which is incorporated herein by reference. Specific preferable examples of the compound represented by Formula (UV-1) can be found in the description of Exemplary Compounds (1) to (14) in paragraphs "0034" to "0037" of WO2009/123109A (corresponding to paragraph "0060" of US2011/0039195A), the content of which is incorporated herein by reference. Examples of a commercially available product of the ultraviolet absorber represented by Formula (UV-1) include UV503 (manufactured by Daito Chemical Co., Ltd.).

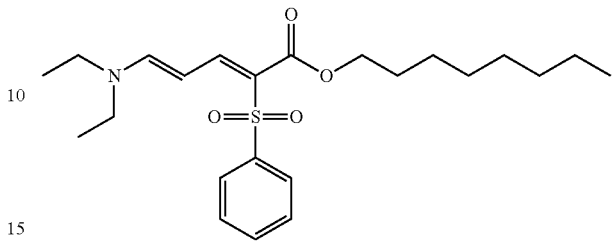

As the diketone compound used as the ultraviolet absorber, a compound represented by the following Formula (UV-2) is preferable.

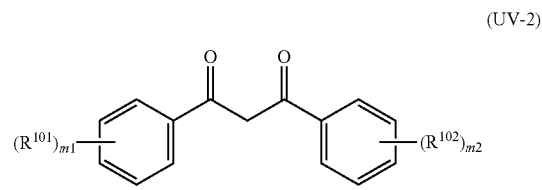
(UV-2)

In Formula (UV-2), $R^{101}$ and $R^{102}$ each independently represent a substituent, and m1 and m2 each independently represent 0 to 4. Examples of the substituent include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxy group, a halogen atom, and a cyano group. Among these, an alkyl group or an alkoxy group is preferable.

The number of carbon atoms in the alkyl group is preferably 1 to 20. The alkyl group is, for example, linear, branched, or cyclic, and is preferably linear or branched and more preferably branched.

The number of carbon atoms in the alkoxy group is preferably 1 to 20. The alkoxy group is, for example, linear, branched, or cyclic, and is preferably linear or branched and more preferably branched.

It is preferable that one of $R^{101}$ and $R^{102}$ represent an alkyl group and the other one of $R^{101}$ and $R^{102}$ represent an alkoxy group.

m1 and m2 each independently represent 0 to 4. m1 and m2 each independently represent preferably an integer of 0 to 2, more preferably 0 or 1, and still more preferably 1.

Examples of the compound represented by Formula (UV-2) include the following compound.

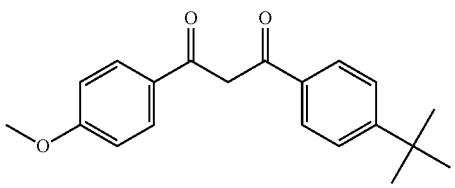 [SMILES: COc1ccc(C(=O)CC(=O)c2ccc(C(C)(C)C)cc2)cc1]

As the ultraviolet absorber, UVINUL A (manufactured by BASF SE) can also be used. In addition, as the ultraviolet absorber, an ultraviolet absorber such as an amino diene compound, a salicylate compound, a benzophenone compound, a benzotriazole compound, an acrylonitrile compound, or a triazine compound can be preferably used. Specifically, a compound described in JP2013-68814A can be used. As the benzotriazole compound, MYUA series (manufactured by Miyoshi Oil&Fat Co., Ltd.; The Chemical Daily, Feb. 1, 2016) may be used.

The content of the ultraviolet absorber is preferably 0.01 to 10 mass % and more preferably 0.01 to 5 mass % with respect to the total solid content of the curable composition according to the present invention.

<<Polymerization Inhibitor>>

The curable composition according to the present invention may include a polymerization inhibitor in order to prevent unnecessary thermal polymerization of the polymerizable compound during the manufacturing or storage of the curable composition. Examples of the polymerization inhibitor include a phenol hydroxyl group-containing compound, a N-oxide compound, a piperidine 1-oxyl free-radical compound, a pyrrolidine 1-oxyl free-radical compound, a N-nitrosophenylhydroxyamine, a diazonium compound, a cationic dye, a sulfide group-containing compound, a nitro group-containing compound, a phosphorus compound, a lactone compound, and a transition metal compound (for example, $FeCl_3$ or $CuCl_2$). In addition, the polymerization inhibitor may be a composite compound in which a plurality of structures which exhibit a polymerization inhibition function such as a phenol skeleton or a phosphorus-containing skeleton are present in the same molecule. For example, a compound described in JP1998-46035A (JP-H10-46035A) is also preferably used. Specific examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable.

The content of the polymerization inhibitor is preferably 0.01 to 5 mass % with respect to the total solid content of the curable composition.

<<Solvent>>

The curable composition according to the present invention includes a solvent. Examples of the solvent include the solvents described above regarding the composition, and a preferable range thereof is also the same.

The content of the solvent in the curable composition according to the present invention is preferably 5 to 90 mass %, more preferably 10 to 80 mass %, and still more preferably 20 to 75 mass % with respect to the total solid content of the curable composition according to the present invention.

<<Other Components>>

Optionally, the curable composition according to the present invention may further include a sensitizer, a curing accelerator, a filler, a thermal curing accelerator, a thermal polymerization inhibitor, a plasticizer, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). By the curable composition appropriately including the components, desired stability, film properties, and the like of an optical filter such as a near infrared cut filter can be adjusted. The details of the components can be found in, for example, paragraph "0183" of JP2012-003225A (corresponding to "0237" of US2013/0034812A) and paragraphs "0101" to "0104" and "0107" to "0109" of JP2008-250074A, the content of which is incorporated herein by reference. In addition, examples of the antioxidant include a phenol compound, a phosphite compound, and a thioether compound. For example, a phenol compound having a molecular weight of 500 or higher, a phosphite compound having a molecular weight of 500 or higher, or a thioether compound having a molecular weight of 500 or higher is preferable. Among these compounds, a mixture of two or more kinds may be used. As the phenol compound, any phenol compound which is known as a phenol antioxidant can be used. As the phenol compound, for example, a hindered phenol compound is preferable. In particular, a compound having a substituent at a position (ortho position) adjacent to a phenolic hydroxyl group is preferable. As the substituent, a substituted or unsubstituted alkyl group having 1 to 22 carbon atoms is preferable, and a methyl group, an ethyl group, a propyl group, an isopropyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. In addition, a compound having a phenol group and a phosphite group in the same molecule is also preferable. In addition, as the antioxidant, a phosphorus antioxidant can also be preferably used. Examples of the phosphorus antioxidant include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl]amine, and ethyl bis(2,4-di-t-butyl-6-methylphenyl)phosphite. The phosphorus antioxidant is easily commercially available, and examples of the commercially available product include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). The content of the antioxidant is preferably 0.01 to 20 mass % and more preferably 0.3 to 15 mass % with respect to the mass of the total solid content of the curable composition. As the antioxidant, one kind may be used alone, or two or more kinds may be used. In a case where two or more silane coupling agents are used in combination, it is preferable that the total content of the silane coupling agents is in the above-described range.

<Preparation of Curable Composition>

The curable composition according to the present invention can be prepared by mixing the above-described various components. In addition, It is preferable that the curable composition is filtered through a filter, for example, in order to remove foreign matter or to reduce defects. The kind of the filter and a filtering method are the same as described above regarding the composition, and a preferable range thereof is also the same.

<Use of Curable Composition>

The curable composition according to the present invention can be made liquid. Therefore, a cured film can be easily formed, for example, by applying the curable composition according to the present invention to a substrate or the like and drying the curable composition.

For example, in a case where a cured film is formed by coating, the viscosity of the curable composition according to the present invention is preferably in a range of 1 to 100 mPa·s. The lower limit is preferably 2 mPa·s or higher and more preferably 3 mPa·s or higher. The upper limit is preferably 50 mPa·s or lower, more preferably 30 mPa·s or lower, and still more preferably 15 mPa·s or lower.

The total solid content of the curable composition according to the present invention changes depending on a coating method and, for example, is preferably 1 to 50 mass %. The lower limit is more preferably 10 mass % or higher. The upper limit is more preferably 30 mass % or lower.

The use of the curable composition according to the present invention is not particularly limited. For example, by using the curable composition including the near infrared absorbing pigment, the curable composition can be preferably used for forming a near infrared cut filter or the like. For example, the curable composition can be preferably used, for example, for a near infrared cut filter (for example, a near infrared cut filter for a wafer level lens) on a light receiving side of a solid image pickup element or as a near infrared cut filter on a back surface side (opposite to the light receiving side) of a solid image pickup element In particular, the curable composition can be preferably used as a near infrared cut filter on a light receiving side of a solid image pickup element. In addition, the curable composition can be used as a near infrared cut filter of an infrared sensor that detects an object by detecting light in a wavelength range of 700 to 1000 nm.

In addition, by using the curable composition including the coloring material that shields visible light, the curable composition can also be used for forming an infrared transmitting filter that can allow transmission of only near infrared light at a specific wavelength or higher. For example, an infrared transmitting filter that shields light in a wavelength of 400 to 900 nm and can allow transmission of near infrared light in a wavelength range of 900 nm or longer can also be formed. In this case, it is preferable that the coloring material that shields visible light and the near infrared absorbing pigment are used in combination. In the infrared transmitting filter, a maximum value of a light transmittance in a thickness direction of the film in a wavelength range of 400 to 830 nm is preferably 20% or lower and more preferably 10% or lower. In addition, a minimum value of a light transmittance in the thickness direction of the film in a wavelength range of 1000 to 1300 nm is preferably 65% or higher and more preferably 70% or higher. In addition, a ratio A/B of a minimum value A of an absorbance in a wavelength range of 400 to 830 nm to a maximum value B of an absorbance in a wavelength range of 1000 to 1300 nm is preferably 4.5 or higher and more preferably 8 or higher.

<Cured Film, Near Infrared Cut Filter, Infrared Transmitting Filter>

Next, a cured film, a near infrared cut filter, and an infrared transmitting filter according to the present invention will be described.

The cured film according to the present invention is formed using the above-described curable composition according to the present invention. The cured film according to the present invention can be preferably used as a near infrared cut filter, an infrared transmitting filter, or the like. The cured film may be used in a state where it is laminated on a support, or may be peeled off from a support.

The thickness of the cured film according to the present invention can be adjusted according to the purpose. The thickness is preferably 20 μm or less, more preferably 10 μm or less, and still more preferably 5 μm or less. For example, the lower limit of the thickness is preferably 0.1 μm or more, more preferably 0.2 μm or more, and still more preferably 0.3 m or more.

In addition, the near infrared cut filter and the infrared transmitting filter according to the present invention are formed using the above-described curable composition according to the present invention.

It is preferable that the near infrared cut filter has an absorption maximum in a wavelength range of 700 to 1200 nm. In addition, an average transmittance in a wavelength range of 400 to 550 nm is preferably 70% or higher, more preferably 80% or higher, still more preferably 85% or higher, and even still more preferably 90% or higher. In addition, a transmittance of in the entire wavelength range of 400 to 550 nm is preferably 70% or higher, more preferably 80% or higher, and still more preferably 90% or higher. In addition, a transmittance at at least one point in a wavelength range of 700 to 1000 nm is preferably 20% or lower, more preferably 15% or lower, and still more preferably 10% or lower.

examples of the infrared transmitting filter include a filter that shields visible light and allows transmission of light in a wavelength range of 900 nm or longer. In a case where the cured film according to the present invention is used as an infrared transmitting filter, it is preferable that infrared transmitting filter is a filter that is formed of a curable composition including the near infrared absorbing pigment and the coloring material that shields visible light (preferably a coloring material including two or more chromatic colorants or a coloring material including at least an organic black colorant), or is a filter in which a layer including the coloring material that shields visible light is separately present in addition to a layer including the near infrared absorbing pigment. It is preferable that the infrared transmitting filter has spectral characteristics in which a maximum value of a light transmittance of the film in a thickness direction in a wavelength range of 400 to 830 nm is 20% or lower and in which a minimum value of a light transmittance of the film in the thickness direction in a wavelength range of 1000 to 1300 nm is 80% or higher.

The near infrared cut filter and the infrared transmitting filter according to the present invention may further include an antireflection film and an ultraviolet absorbing film in addition to the film formed of the curable composition according to the present invention. The details of the ultraviolet absorbing film can be found in the description of an absorbing layer described in paragraphs "0040" to "0070" and paragraphs "0119" of "0145" of WO2015/099060, the content of which is incorporated herein by reference. Examples of the antireflection film include a laminate (for example, a dielectric multi-layer film) in which a high refractive index layer and a low refractive index layer are alternately laminated. The spectral characteristics of the antireflection film can be appropriately selected depending on the wavelength of a light source, the spectral characteristics of the optical filter, and the like. By using the near infrared cut filter according to the present invention and the antireflection film in combination, a wide range of infrared light can also be shielded. The details of the antireflection film can be found in paragraphs "0255" to "0259" of JP2014-41318A, the content of which is incorporated herein by reference.

The cured film, the near infrared cut filter, and the infrared transmitting filter according to the present invention can be used in various devices including a solid image pickup element such as a charge coupled device (CCD) or a complementary metal-oxide semiconductor (CMOS), an infrared sensor, or an image display device. In addition, the optical filter according to the present invention can be used, for example, as a lens that has a function to absorb or cut near infrared light (a camera lens for a digital camera, a mobile phone, or a vehicle-mounted camera, or an optical lens such as an f-θ lens or a pickup lens), an optical filter for a semiconductor light-receiving element, a near infrared absorbing film or a near infrared absorbing plate that shields heat rays for energy saving, an agricultural coating film for selective use of sunlight, a recording medium using heat absorbed from near infrared light, a near infrared filter for an electronic apparatus or a picture, an eye protector, sunglasses, a heat ray shielding filter, a filter for reading and recording an optical character, a filter for preventing classified documents from being copied, or an electrophotographic photoreceptor. In addition, the near infrared cut filter according to the present invention is also useful as a noise cut filter for a CCD camera or a filter for a CMOS image sensor.

<Laminate>

A laminate according to the present invention may be obtained by laminating a near infrared cut filter that is formed using the curable composition according to the present invention and a color filter that includes a chromatic colorant. In the laminate, the near infrared cut filter and the color filter may be or may not be adjacent to the color filter in the thickness direction. In a case where the near infrared cut filter is not adjacent to the color filter in the thickness direction, the near infrared cut filter may be formed on another substrate other than a substrate on which the color filter is formed, or another member (for example, a microlens or a planarizing layer) constituting a solid image pickup element may be interposed between the near infrared cut filter and the color filter.

In the present invention, "near infrared cut filter" refers to a filter that allows transmission of light (visible light) in the visible range and shields at least a part of light (near infrared light) in the near infrared range. The near infrared cut filter may be a filter that allows transmission of light in the entire wavelength range of the visible range, or may be a filter that allows transmission of light in a specific wavelength range of the visible range and shields light in another specific wavelength range of the visible range. In addition, in the present invention, "color filter" refers to a filter that allows transmission of light in a specific wavelength range of the visible range and shields light in another specific wavelength range of the visible range. In addition, "infrared transmitting filter" refers to a filter that shields light (visible light) in the visible range and allows transmission of at least a part of light (near infrared light) in the near infrared range.

<Pattern Forming Method>

Next, a pattern forming method will be described. A pattern forming method includes: a step of forming a curable composition layer on a support using the curable composition according to the present invention; and a step of forming a pattern on the curable composition layer using a photolithography method or a dry etching method.

For example, in a case where a laminate in which a near infrared cut filter and a color filter are laminated is manufactured, pattern formation on the near infrared cut filter and pattern formation on the color filter may be separately performed. In addition, pattern formation may be performed on the laminate in which the near infrared cut filter and the color filter are laminated (that is, pattern formation on the near infrared cut filter and pattern formation on the color filter may be simultaneously performed).

The case where pattern formation on the near infrared cut filter and pattern formation on the color filter are separately performed denotes the following aspect. Pattern formation is performed on any one of the near infrared cut filter and the color filter. Next, the other filter layer is formed on the filter layer on which the pattern is formed. Next, pattern formation is performed on the filter layer on which a pattern is not formed.

A pattern forming method may be a pattern forming method using photolithography or a pattern forming method using dry etching. The curable composition according to the present invention has pattern formability of photolithography. Therefore, in a case where a pattern is formed using the curable composition according to the present invention, the pattern forming method using photolithography is suitable.

In a case where the pattern formation on the near infrared cut filter and the pattern formation on the color filter are separately performed, the pattern formations on the respective filter layers may be performed using only the photolithography method or only the dry etching method. In addition, after performing the pattern formation on one filter layer using the photolithography method, the pattern formation may be performed on the other filter layer using the dry etching method. In a case where the pattern formation is performed using a combination of the dry etching method and the photolithography method, it is preferable that a pattern is formed on a first layer using the dry etching method and a pattern is formed on a second or subsequent layer using the photolithography method.

It is preferable that the pattern formation using the photolithography method includes: a step of forming a composition layer on a support using each composition; a step of exposing the composition layer in a pattern shape; and a step of forming a pattern by removing a non-exposed portion by development. Optionally, the pattern formation further includes: a step (pre-baking step) of baking the composition layer; and a step (post-baking step) of baking the developed pattern.

In addition, It is preferable that the pattern formation using the dry etching method includes: a step of forming a composition layer on a support using each composition and curing the cured composition layer; a step of forming a photoresist layer on the cured composition layer; a step of obtaining a resist pattern by patterning the photoresist layer by exposure and development; and a step of forming a pattern by dry-etching the cured composition layer by using the resist pattern as an etching mask. Hereinafter, the respective steps will be described.

<<Step of Forming Composition Layer>>

In the step of forming a composition layer, a composition layer is formed on a support using each of the compositions.

Examples of the support include substrates formed of materials such as glass, silicon, polycarbonate, polyester, aromatic polyamide, polyamide imide, or polyimide. In addition, a support for a solid image pickup element in which a solid image pickup element (light-receiving element) such as CCD or CMOS is provided on a substrate can be used.

The pattern may be formed on a solid image pickup element-formed surface (front surface) of the substrate for a solid image pickup element, or may be formed on a solid image pickup element non-formed surface (back surface) thereof. Optionally, an undercoat layer may be provided on the support to improve adhesion with a layer above the support, to prevent diffusion of materials, or to make a surface of the substrate flat.

As a method of applying the composition to the support, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using metal or the like; and a nanoimprint lithography method. The application method using an ink jet method is not particularly limited, and examples thereof include a method (in particular, pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A.

The composition layer formed on the support may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. The pre-baking time is preferably 10 to 300 seconds, more preferably 40 to 250 seconds, and still more preferably 80 to 220 seconds. Drying can be performed using a hot plate, an oven, or the like.

(Case where Pattern is Formed using Photolithography Method)

<<Exposure Step>>

Next, the composition layer is exposed in a pattern shape (exposure step). For example, the composition layer is exposed in a pattern shape using an exposure device such as a stepper through a mask having a predetermined mask pattern, thereby exposing a pattern. As a result, an exposed portion can be cured.

As radiation (light) used during the exposure, ultraviolet rays such as g-rays or i-rays are preferably used (i-rays are more preferably used). The irradiation dose (exposure dose) is preferably 0.03 to 2.5 J/cm$^2$, more preferably 0.05 to 1.0 J/cm$^2$, and most preferably 0.08 to 0.5 J/cm$^2$.

The oxygen concentration during exposure can be appropriately selected. For example, instead of being performed in the atmosphere, exposure may be performed in a low oxygen atmosphere having an oxygen concentration of 19 vol % or lower (preferably 15 vol % or lower, more preferably 5 vol % or lower, and still more preferably 0 vol %), or exposure may be performed in a high oxygen atmosphere having an oxygen concentration of higher than 21 vol % (preferably 22 vol % or higher, more preferably 30 vol % or higher, and still more preferably 50 vol % or higher). In addition, typically, the exposure illuminance can be appropriately set, and typically can be selected in a range of 1000 W/m$^2$ to 100000 W/m$^2$ (preferably 5000 W/m$^2$ or higher, more preferably 15000 W/m$^2$ or higher, and still more preferably 35000 W/m$^2$ or higher). Conditions of the oxygen concentration and conditions of the exposure illuminance may be appropriately combined. For example, conditions are oxygen concentration: 10 vol % and illuminance: 10000 W/m$^2$, or oxygen concentration: 35 vol % and illuminance: 20000 W/m$^2$.

<<Development Step>>

Next, a pattern is formed by removing a non-exposed portion by development. The non-exposed portion can be removed by development using a developer. As a result, a non-exposed portion of the composition layer in the exposure step is eluted into the developer, and only the photo-cured portion remains.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of the alkaline agent used as the developer include an organic alkaline agent such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo[5,4,0]-7-undecene. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %. In addition, an inorganic alkaline agent may be used as the developer. Preferable examples of the inorganic alkaline agent include sodium hydroxide, potassium hydroxide, sodium carbonate, sodium bicarbonate, sodium silicate, and sodium metasilicate. In addition, a surfactant may be used as the developer. Examples of the surfactant include the surfactants described above regarding the composition. Among these, a nonionic surfactant is preferable. In a case where a developer including the alkaline aqueous solution is used, in general, it is preferable that the film is rinsed with pure water after development.

After the development, it is preferable that the film is dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher. The film after the development is post-baked continuously or batch-wise using heating means such as a hot plate, a convection oven (hot air circulation dryer), a high-frequency heater under the above-described conditions.

(Case where Pattern is Formed using Dry Etching Method)

The pattern formation using the dry etching method can be performed by curing the composition layer formed on the support to form a cured composition layer, forming a photoresist layer on the cured composition layer, patterning the photoresist layer to form a mask, and dry-etching the cured composition layer with etching gas by using the patterned photoresist layer as a mask. It is preferable that pre-baking is performed in order to form the photoresist layer. In particular, in a preferable aspect, as a process of forming the photoresist, baking after exposure or baking after development (post-baking) is performed. The details of the pattern formation using the dry etching method can be found in paragraphs "0010" to "0067" of JP2013-064993A, the content of which is incorporated herein by reference.

<Solid Image Pickup Element and Camera Module>

A solid image pickup element according to the present invention includes the cured film according to the present invention. In addition, a camera module according to the present invention includes a solid image pickup element and the near infrared cut filter according to the present invention. The solid image pickup element is configured to include the cured film according to the present invention. The configuration of the solid image pickup element is not particularly limited as long as the solid image pickup element functions. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the cured film according to the present invention is formed on the device protective film. In addition, in the solid image pickup element, the color filter may have a structure in which a cured film which forms each color pixel is embedded in a space which is partitioned in, for example, a lattice shape by a partition wall. In this case, it is preferable that the partition wall has a low refractive index with respect to each color pixel. Examples of an imaging device having such a structure include a device described in JP2012-227478A and JP2014-179577A.

<Infrared Sensor>

An infrared sensor according to the present invention includes the cured film according to the present invention. The configuration of the infrared sensor according to the present invention is not particularly limited as long as it includes the cured film according to the present invention and functions as an infrared sensor.

Hereinafter, an embodiment of the infrared sensor according to the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115.

Characteristics of the near infrared cut filters 111 can be selected depending on the emission wavelength of an infrared light emitting diode (infrared LED) described below. The near infrared cut filter 111 is a filter that allows transmission of visible light (for example, light in a wavelength range of 400 to 650 nm) and shields at least a part of near infrared light (for example, light in a wavelength range of longer than 700 nm). The near infrared cut filter 111 can be formed using the curable composition according to the present invention.

The color filters 112 is not particularly limited as long as pixels which allow transmission of light having a specific wavelength in the visible range and absorbs the light are formed therein, and well-known color filters of the related art for forming a pixel can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected depending on the emission wavelength of the infrared LED described below.

For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 0.1% or lower. It is preferable that the transmittance satisfies the above-described conditions in the entire wavelength range of 400 to 650 nm. The maximum value of the light transmittance in a wavelength range of 400 to 650 nm is typically 0.1% or higher.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED. The minimum value of the light transmittance in a wavelength range of 900 to 1300 nm is typically 99.9% or lower.

The thickness of the infrared transmitting filter 114 is preferably 100 μm or less, more preferably 15 μm or less, still more preferably 5 μm or less, and even still more preferably 1 μm or less. The lower limit value is preferably 0.1 µm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using a spectrophotometer (U-4100, manufactured by Hitachi High-Technologies Corporation).

The infrared transmitting filter 114 having the above-described spectral characteristics can be formed using a composition including the coloring material that shields visible light. The details of the coloring material that shields visible light are the same as the range described above regarding the curable composition according to the present invention.

In addition, for example, in a case where the emission wavelength of the infrared LED is 940 nm, it is preferable that the infrared transmitting filter 114 has spectral characteristics in which a maximum value of a light transmittance of the film in a thickness direction in a wavelength range of 400 to 830 nm is 20% or lower and in which a minimum value of a light transmittance of the film in the thickness direction in a wavelength range of 1000 to 1300 nm is 80% or higher.

The infrared transmitting filter 114 having the above-described spectral characteristics can be manufactured using the curable composition including the coloring material that shields visible light and the near infrared absorbing pigment.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "%" and "part(s)" represent "mass %" and "part(s) by mass".

<Method of Measuring Acid Value>

The acid value indicates the mass of potassium hydroxide required to neutralize an acidic component per 1 g of solid content. A measurement sample was dissolved in a mixed solvent including tetrahydrofuran and water at a ratio (mass ratio; tetrahydrofuran/water) of 9/1, and the obtained solution was neutralized and titrated with a 0.1 mol/L sodium hydroxide aqueous solution at 25° C. using a potentiometric titrator (trade name: AT-510, manufactured by Kyoto Electronics Manufacturing Co., Ltd.). An inflection point of a titration pH curve was set as a titration end point, and the acid value was calculated from the following expression.

$$A = 56.11 \times Vs \times 0.5 \times f/w$$

A: the acid value (mgKOH/g)

Vs: the amount (mL) of the 0.1 mol/L sodium hydroxide aqueous solution used for the titration f: the titer of the 0.1 mol/L sodium hydroxide aqueous solution w: the mass (g) of the measurement sample (in terms of solid content)

<Measurement of Amine Value>

The amine value indicates the mass of potassium hydroxide (KOH) equivalent to a basic component per 1 g of solid content. A measurement sample was dissolved in acetic acid, and the obtained solution was neutralized and titrated with a 0.1 mol/L perchloric acid/acetic acid solution at 25° C. using a potentiometric titrator (trade name: AT-510, manufactured by Kyoto Electronics Manufacturing Co., Ltd.). An inflection point of a titration pH curve was set as a titration end point, and the amine value was calculated from the following expression.

$$B = 56.11 \times Vs \times 0.1 \times f/w$$

B: amine value (mgKOH/g)

Vs: the amount (mL) of the 0.1 mol/L perchloric acid/acetic acid solution used for the titration f: the titer of the 0.1 mol/L perchloric acid/acetic acid solution w: the mass (g) of the measurement sample (in terms of solid content)

<Measurement of Solubility>

A measurement sample was added to a solvent at 25° C. under the atmospheric pressure, the solution was stirred for 1 hour, and the solubility of the measurement sample in the solvent was obtained.

<Synthesis of Compound (A-1)>

A compound (A-1) was synthesized according to the following scheme.

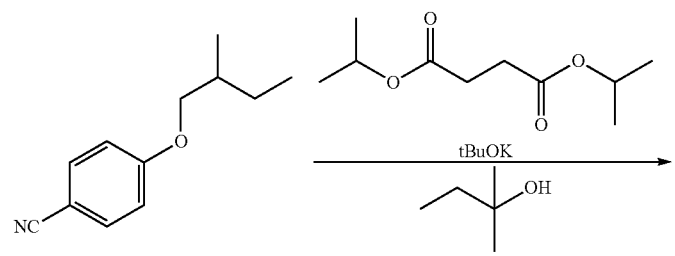

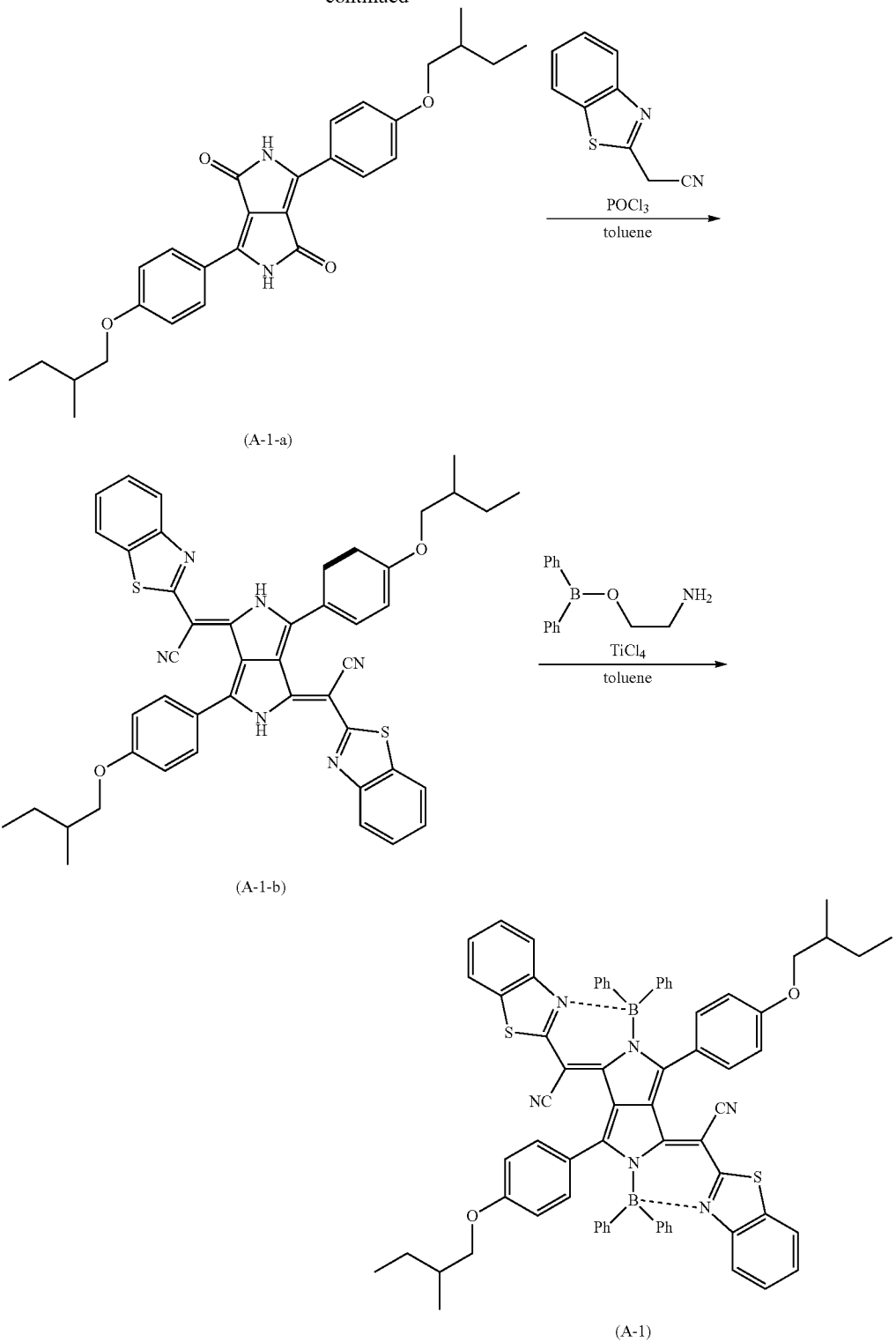

(A-1-a)

(A-1-b)

(A-1)

A compound (A-1-a) was synthesized from 4-(2-methylbutoxy)benzonitrile using a method described in U.S. Pat. No. 5,969,154A.

$^1$H-NMR (mixed solution of dimethyl sulfoxide (DMSO)/tetrahydrofuran (THF): δ0.95 (t, 3H), 1.02 (d, 3H), 1.58 (m, 1H), 1.87 (m, 1H), 3.92 (m, 2H), 7.66 (d, 2H), 8.54 (d, 2H)

179 parts by mass of (A-1-a) and 162.5 parts by mass of 2-(2-benzothiazolyl)acetonitrile were stirred in 1840 parts by mass of toluene, 476.74 parts by mass of phosphorus oxychloride was added dropwise, and the solution was heated to reflux for 3.5 hours. After completion of the reaction, the solution was cooled to an internal temperature of 25° C., and 1800 parts by mass of methanol was added dropwise for 90 minutes while maintaining the internal temperature at 30° C. or lower. After completion of the dropwise addition, the solution was stirred at room temperature for 30 minutes. Precipitated crystals were separated by filtration and were washed with 450 parts by mass of methanol. 2300 parts by mass of methanol was added to the obtained crystals, the solution was heated to reflux for 30 minutes and was allowed to cool to 30° C., and crystals were separated by filtration. The obtained crystals were dried by blowing air at 40° C. for 12 hours. As a result, 240 parts by mass of a compound (A-1-b) was obtained.

$^1$H-NMR (CDCl$_3$): δ0.99 (t, 3H), 1.07 (d, 3H), 1.58 (m, 1H), 1.93 (m, 1H), 3.93 (m, 2H), 7.15 (d, 2H), 7.66 (d, 2H), 8.54 (d, 2H)

119 parts by mass of diphenylborinic acid 2-aminoethyl ester and 170 parts by mass of the compound (A-1-b) were stirred in 2840 parts by mass of toluene, 167 parts by mass of titanium tetrachloride was added dropwise for 30 minutes at an outside temperature of 40° C., and the solution was stirred for 30 minutes. The solution was heated to an outside temperature of 130° C. and was heated to reflux for 3 hours. The solution was allowed to cool to an internal temperature of 30° C., and 1620 parts by mass of methanol was added dropwise while maintaining the internal temperature at 30° C. or lower. After the dropwise addition, the solution was stirred for 30 minutes, and precipitated crystals were separated by filtration and were washed with 150 parts by mass of methanol. 1500 parts by mass of methanol was added to the obtained crystals, the solution was stirred at room temperature for 10 minutes, and crystals were separated by filtration. This operation was repeated twice. 2000 parts by mass of tetrahydrofuran (THF) was added to the obtained crystals, the solution was heated to reflux for 30 minutes and was allowed to cool to 30° C. or lower, and crystals were separated by filtration. The obtained crystals were dried by blowing air at 40° C. for 12 hours. As a result, 234 parts by mass of a pigment (A-1) was obtained. A peak of molecular weight of 1100.5 was observed by time-of-flight mass spectrometry (MALDI-MS), and the obtained compound was identified as the compound (A-1). An absorption maximum (λmax) of the compound (A-1) in chloroform was 780 nm.

<Synthesis of Compound (A-9)>

A compound (A-9) was synthesized according to the following scheme.

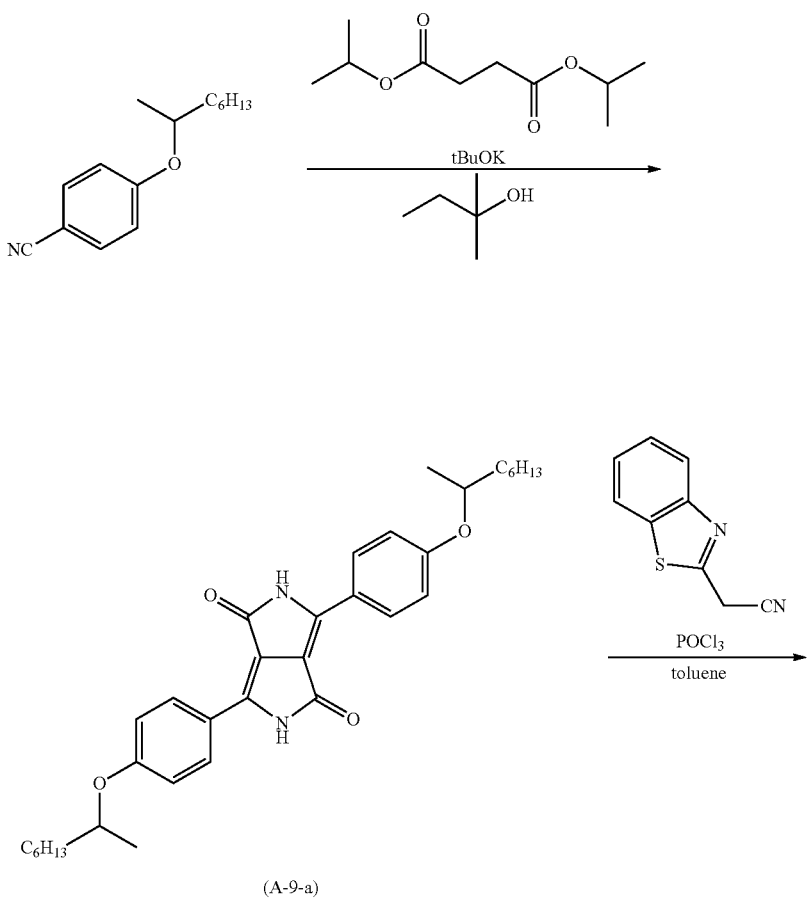

(A-9-a)

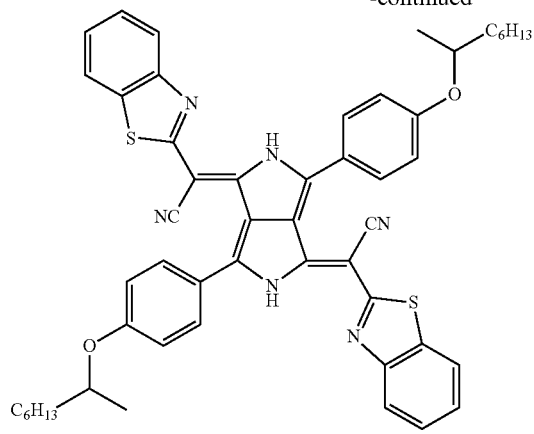
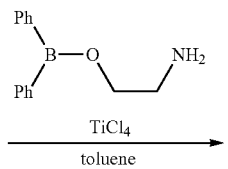

(A-9-b)

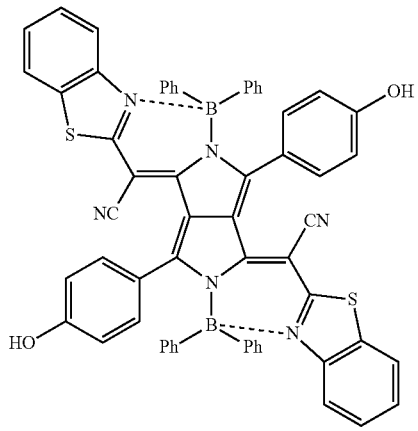

(A-9)

A compound (A-9-a) was synthesized from 4-(1-methylheptoxy)benzonitrile using a method described in U.S. Pat. No. 5,969,154A.

$^1$H-NMR (mixed solution as a 28 mass % methanol solution including dimethyl sulfoxide (DMSO) and sodium methoxide at a mass ratio of 95:5 (DMSO:sodium methoxide)): δ0.82 (t, 6H), 1.15-1.70 (m, 26H), 4.40 (m, 2H), 6.78 (d, 4H), 8.48 (d, 2H)

20.0 parts by mass of the compound (A-9-a) and 15.4 parts by mass of 2-(2-benzothiazolyl)acetonitrile were stirred in 230 parts by mass of toluene, 45.0 parts by mass of phosphorus oxychloride was added dropwise, and the solution was heated to reflux for 3.5 hours. After completion of the reaction, the solution was cooled to an internal temperature of 25° C., and 200 parts by mass of methanol was added dropwise for 60 minutes while maintaining the internal temperature at 30° C. or lower. After completion of the dropwise addition, the solution was stirred at room temperature for 30 minutes. Precipitated crystals were separated by filtration and were washed with 100 parts by mass of methanol. 200 parts by mass of methanol was added to the obtained crystals, the solution was heated to reflux for 30 minutes and was allowed to cool to 30° C., and crystals were separated by filtration. The obtained crystals were dried by blowing air at 40° C. for 12 hours. As a result, 8.8 parts by mass of a compound (A-9-b) was obtained.

$^1$H-NMR (CDCl$_3$): δ0.90-1.90 (m, 32H), 4.54 (m, 2H), 7.12 (d, 4H), 7.20-7.40 (m, 2H), 7.43 (t, 2H), 7.75 (d, 4H), 7.81 (t, 4H)

3.9 parts by mass of diphenylborinic acid 2-aminoethyl ester and 6.0 parts by mass of the compound (A-9-b) were stirred in 60 parts by mass of toluene, 10.6 parts by mass of titanium tetrachloride was added dropwise for 10 minutes at an outside temperature of 40° C., and the solution was stirred for 30 minutes. The solution was heated to an outside temperature of 130° C. and was heated to reflux for 3 hours. The solution was allowed to cool to an internal temperature of 30° C., and 40 parts by mass of methanol was added dropwise while maintaining the internal temperature at 30° C. or lower. After the dropwise addition, the solution was stirred for 30 minutes, and precipitated crystals were separated by filtration and were washed with 35 parts by mass of methanol. 50 parts by mass of methanol was added to the obtained crystals, the solution was heated to reflux for 30 minutes and was allowed to cool to 30° C., and crystals were separated by filtration. This operation was repeated twice. The obtained crystals were dried by blowing air at 40° C. for 12 hours. As a result, 4.6 parts by mass of a compound (A-9) was obtained.

$^1$H-NMR (DMSO): δ6.20-6.30 (dd, 8H), 6.91 (d, 2H), 7.12-7.21 (m, 24H), 7.92 (d, 2H), 9.54 (s, 2H) A peak of molecular weight of 1090.9 was observed by MALDI-MS, and the obtained compound was identified as the compound (A-9). λmax of the compound (A-9) in dimethyl sulfoxide (DMSO) was 782 nm.

<Synthesis of Compound (A-8)>
A compound (A-8) was synthesized according to the following scheme.
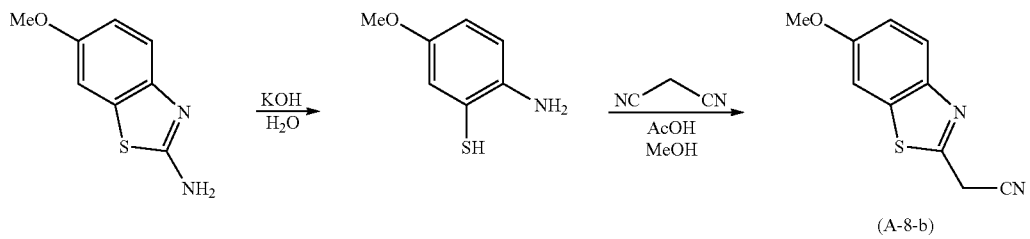
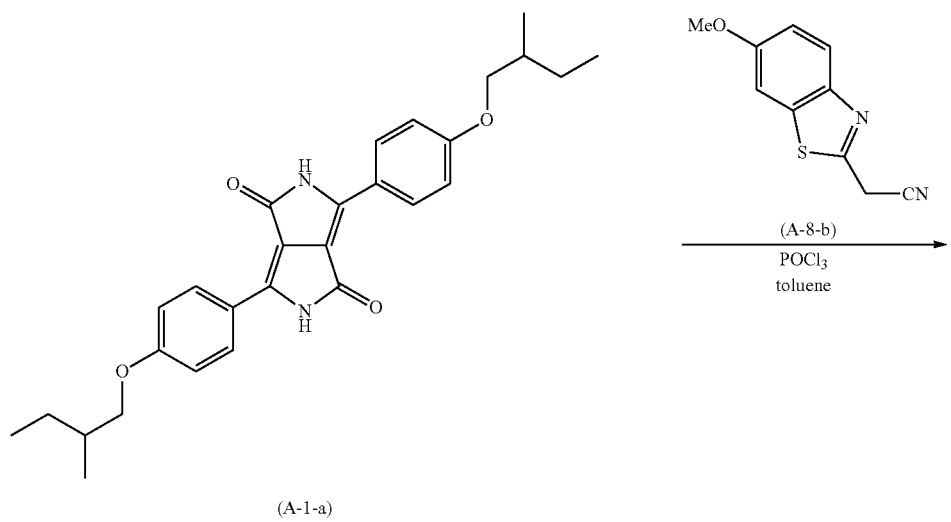
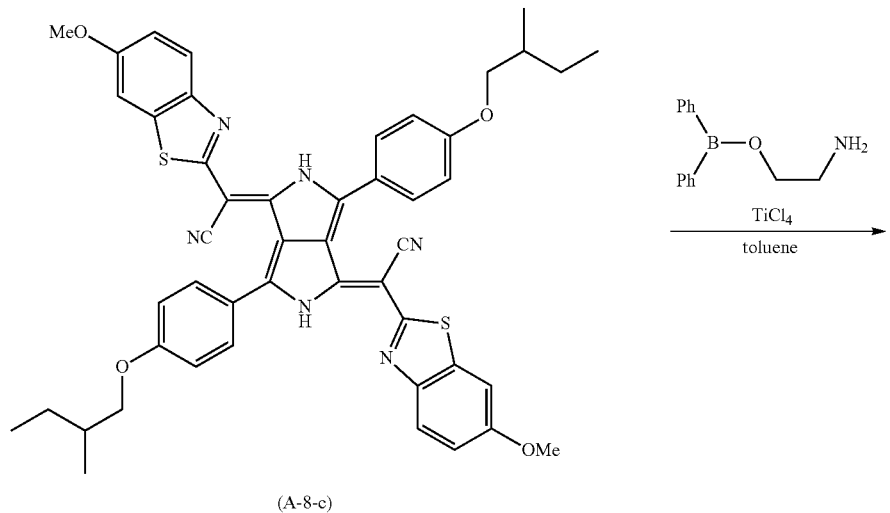

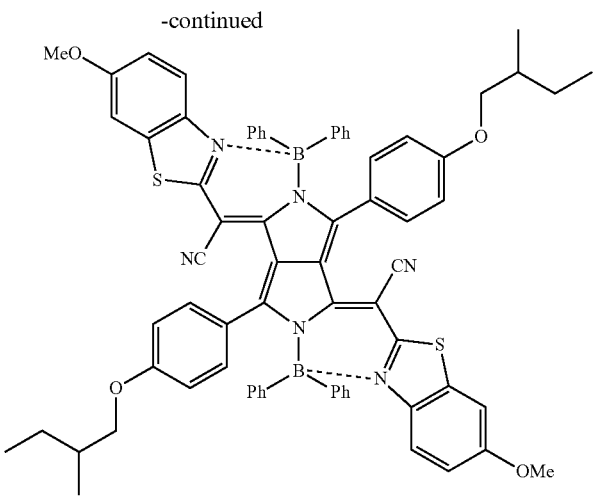

(A-8)

50.0 parts by mass of 2-amino-6-methoxybenzothiazole and 93.4 parts by mass of potassium hydroxide were heated to reflux in 200 parts by mass of water for 24 hours, and the solution was cooled to 10° C. or lower. While maintaining the temperature at 10° C. or lower, 6 mol/L hydrochloric acid and acetic acid were added such that the pH of the reaction solution was 6. Precipitated crystals were separated by filtration and were washed with 200 parts by mass of water. The entire amount of the obtained crystals, 18.3 parts by mass of malononitrile, and 19.3 parts by mass of acetic acid were stirred in 172 parts by mass of methanol at 60° C. for 1 hour, and the solution was cooled to 10° C. or lower. Precipitated crystals were separated by filtration and were washed with 200 parts by mass of cold methanol. The obtained crystals were dried by blowing air at 40° C. for 12 hours. As a result, 38.7 parts by mass of a compound (A-8-b) was obtained.

$^1$H-NMR (CDCl$_3$): δ3.85 (s, 3H), 4.22 (s, 2H), 7.16 (d, 1H), 7.38 (s, 1H), 7.97 (d, 1H) (A-8-c) was synthesized from (A-1-a) and (A-8-b) using the same synthesis method as that of (A-1-b).

$^1$H-NMR (mixed solution as a 28 mass % methanol solution including dimethyl sulfoxide (DMSO) and sodium methoxide at a mass ratio of 95:5 (DMSO:sodium methoxide)): δ0.98 (t, 6H), 1.12 (d, 6H), 1.30 (m, 2H), 1.63 (m, 2H), 1.95 (m, 2H), 3.89 (m, 4H), 6.88 (d, 2H), 6.98 (d, 4H), 7.42 (m, 4H), 7.67 (s, 2H), 7.85 (d, 4H)

A compound (A-8) was synthesized from the compound (A-8-c) using the same synthesis method as that of the compound (A-1). A peak of molecular weight of 1161.1 was observed by MALDI-MS, and the obtained compound was identified as the compound (A-8). λmax of the compound (A-8) in chloroform was 802 nm.

$^1$H-NMR (CDCl$_3$): δ1.00 (t, 6H), 1.05 (d, 6H), 1.33 (m, 2H), 1.63 (m, 2H), 1.95 (m, 2H), 3.74 (m, 4H), 6.46 (s, 8H), 6.57 (d, 2H), 6.85 (d, 2H), 6.98 (s, 2H), 7.20 (m, 12H), 7.25 (m, 8H)

<Synthesis of Compounds (A-2) to (A-7)>

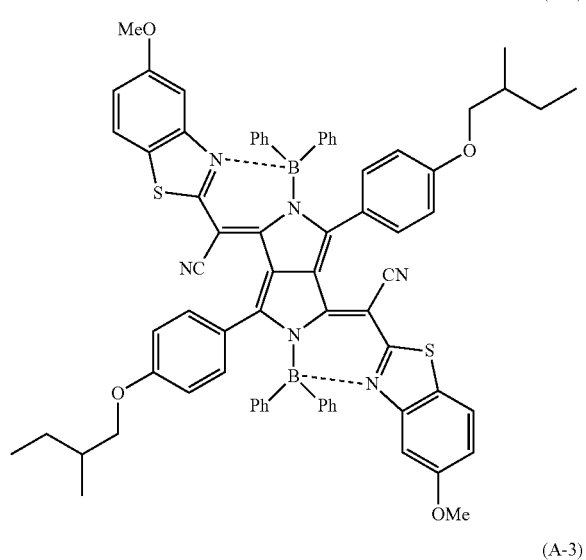

(A-7)

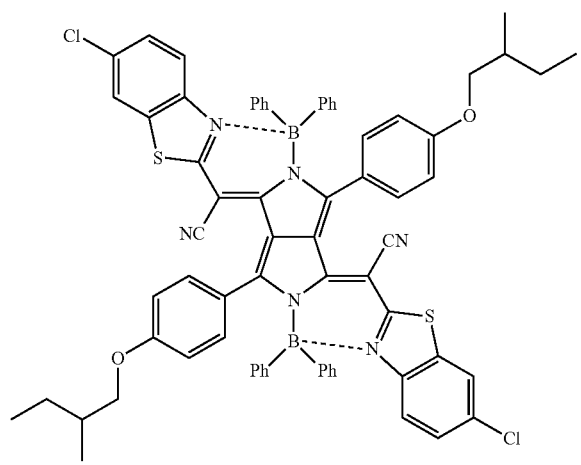

(A-3)

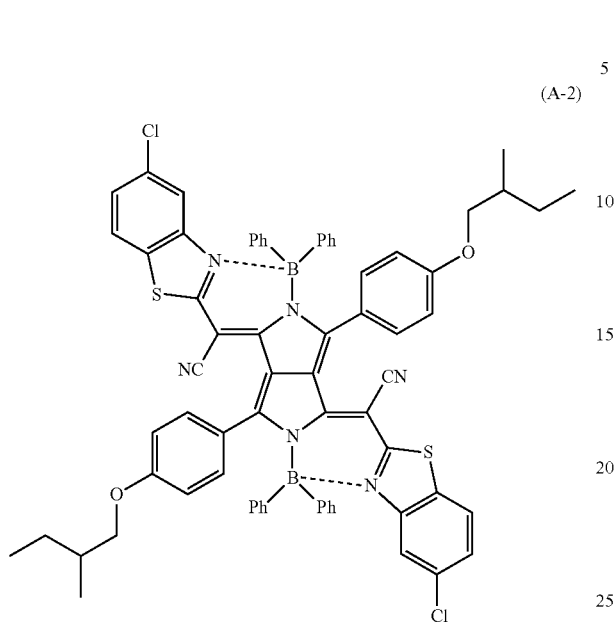

(A-2)

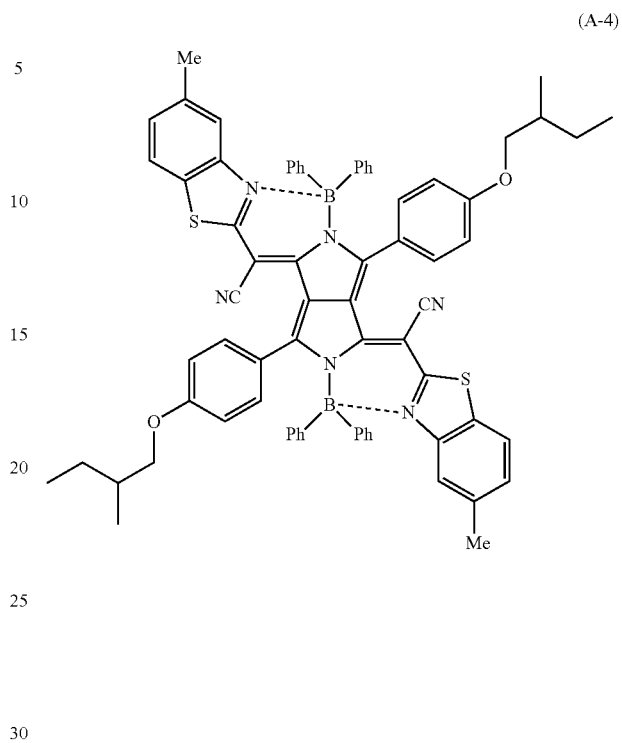

(A-4)

(A-6)

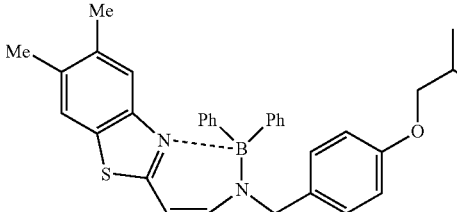

(A-5)

Compounds (A-2) to (A-7) were synthesized using the same synthesis method as that of the compound (A-8). It was found by MALDI-MS that the molecular weights were the same as theoretical values, and all the obtained compounds were identified as the target compounds. λmax of the compound (A-7) in chloroform was 794 nm, λmax of the compound (A-3) in chloroform was 786 nm, λmax of the compound (A-2) in chloroform was 782 nm, λmax of the compound (A-5) in chloroform was 788 nm, λmax of the compound (A-4) in chloroform was 785 nm, and λmax of the compound (A-6) in chloroform was 794 nm.

<Synthesis of Compound (A-201)>
A compound (A-201) was synthesized according to the following scheme.
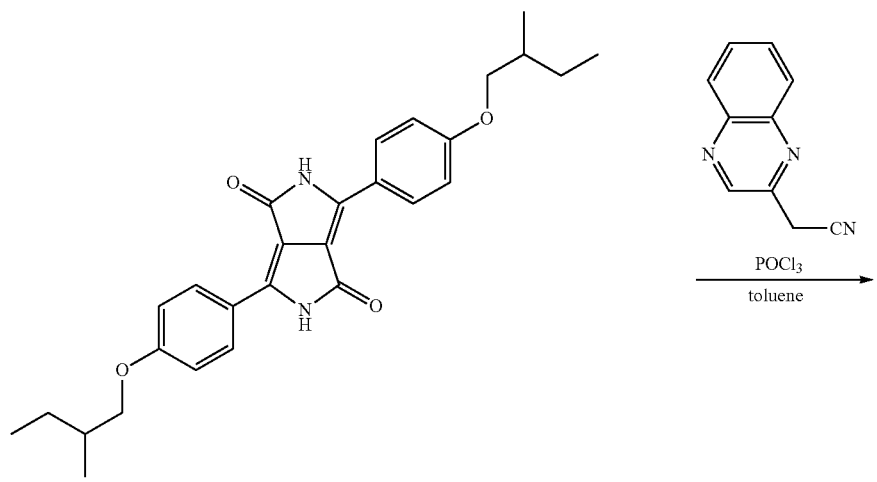
(A-201-a)
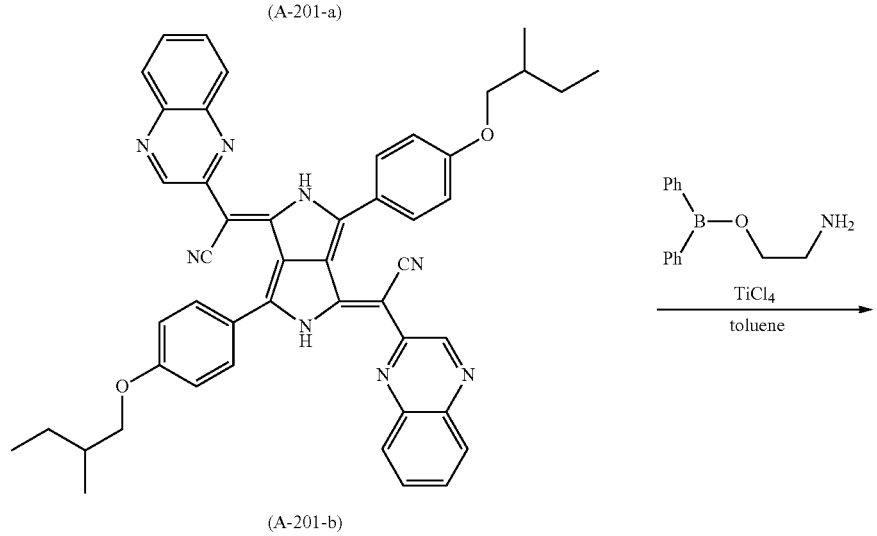
(A-201-b)
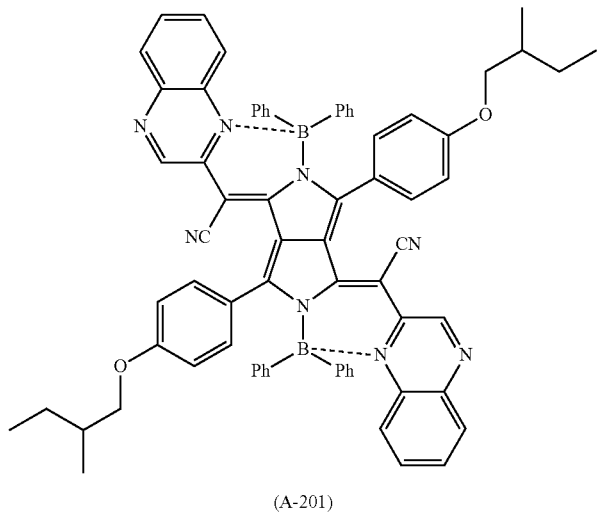
(A-201)

179 parts by mass of (A-201-a) and 7.1 parts by mass of 2-(2-quinoxalinyl)acetonitrile were stirred in 90.5 parts by mass of toluene, 21.3 parts by mass of phosphorus oxychloride was added dropwise, and the solution was heated to reflux for 3.5 hours. After completion of the reaction, the solution was cooled to an internal temperature of 25° C., and 80 parts by mass of methanol was added dropwise for 60 minutes while maintaining the internal temperature at 30° C. or lower. After completion of the dropwise addition, the solution was stirred at room temperature for 30 minutes. Precipitated crystals were separated by filtration and were washed with 80 parts by mass of methanol. 100 parts by mass of methanol was added to the obtained crystals, the solution was heated to reflux for 30 minutes and was allowed to cool to 30° C., and crystals were separated by filtration. The obtained crystals were dried by blowing air at 40° C. for 12 hours. As a result, 3.6 parts by mass of a compound (A-201-b) was obtained.

$^1$H-NMR (CDCl$_3$): δ0.87 (t, 6H), 0.99 (d, 6H), 1.30-2.00 (m, 6H), 3.99 (m, 4H), 7.20 (d, 4H), 7.60-7.80 (m, 10H), 8.03 (d, 2H), 9.10 (s, 2H), 14.07 (s, 2H)

5.6 parts by mass of diphenylborinic acid 2-aminoethyl ester and 2.0 parts by mass of the compound (A-201-b) were stirred in 40 parts by mass of toluene, 7.8 parts by mass of titanium tetrachloride was added dropwise for 10 minutes at an outside temperature of 40° C., and the solution was stirred for 30 minutes. The solution was heated to an outside temperature of 130° C. and was heated to reflux for 1.5 hours. The solution was allowed to cool to an internal temperature of 30° C., and 40 parts by mass of methanol was added dropwise while maintaining the internal temperature at 30° C. or lower. After the dropwise addition, the solution was stirred for 30 minutes, and precipitated crystals were separated by filtration and were washed with 80 parts by mass of methanol. 60 parts by mass of methanol was added to the obtained crystals, the solution was heated to reflux for 30 minutes and was allowed to cool to 30° C., and crystals were separated by filtration. This operation was repeated twice. The obtained crystals were dried by blowing air at 40° C. for 12 hours. As a result, 1.9 parts by mass of a compound (A-201) was obtained. A peak of molecular weight of 1090.9 was observed by MALDI-MS, and the obtained compound was identified as the compound (A-201). λmax of the compound (A-201) in chloroform was 862 nm.

$^1$H-NMR (CDCl$_3$): δ1.02 (t, 6H), 1.10 (d, 6H), 1.34 (m, 2H), 1.57 (m, 2H), 2.00 (m, 2H), 3.85 (m, 4H), 6.19 (d, 4H), 6.59 (d, 4H), 7.10-7.32 (m, 24H), 7.72 (d, 2H), 8.00 (d, 2H), 9.06 (s, 2H)

<Synthesis of Compound (A-15)>

A compound (A-15) was synthesized according to the following scheme.

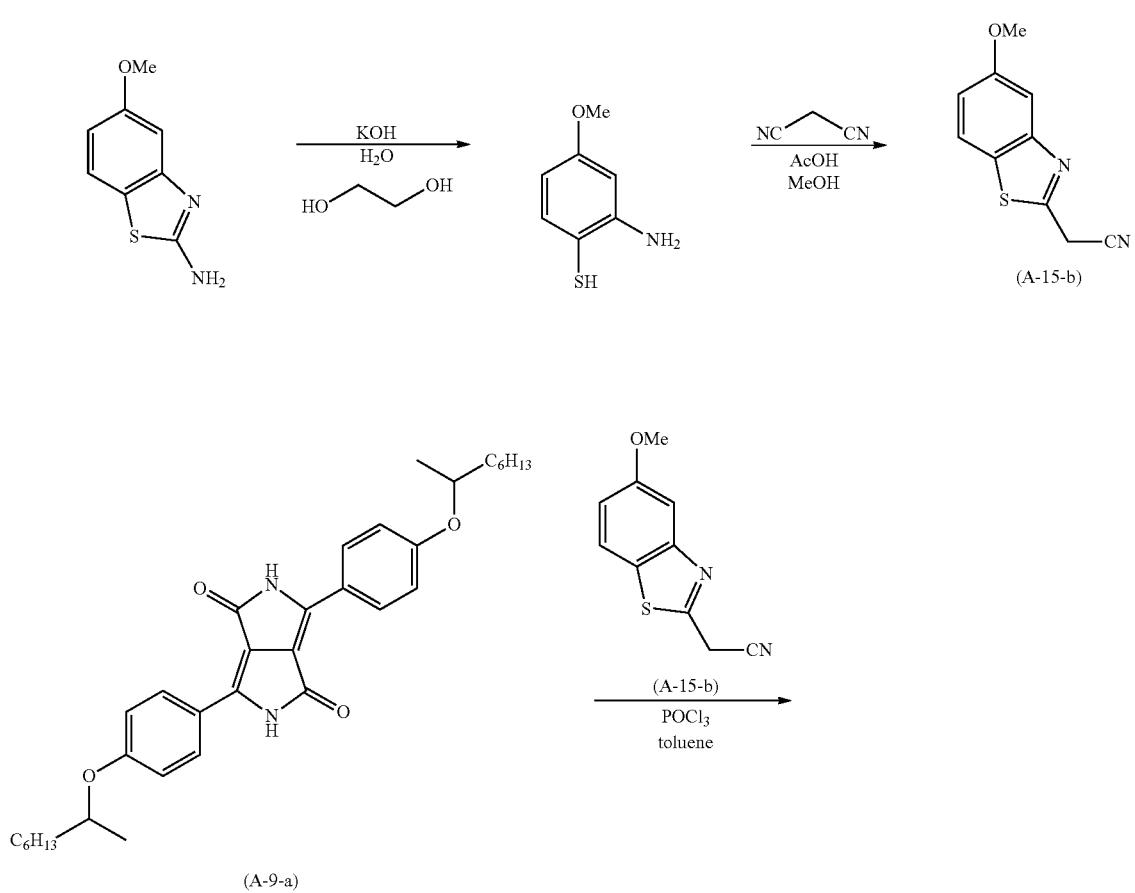

-continued

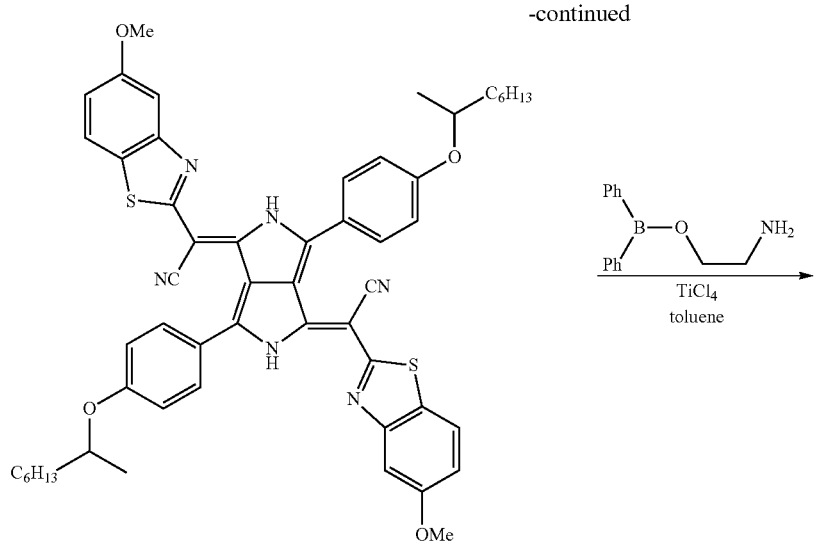

(A-15-c)

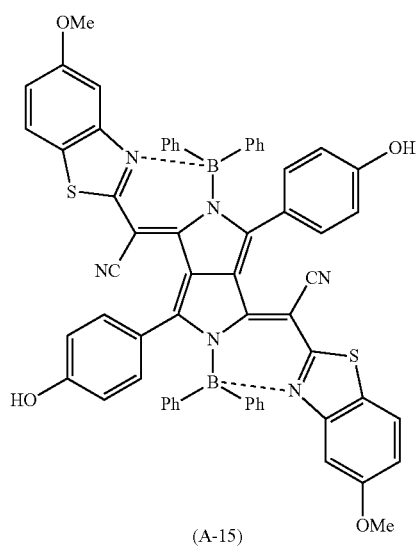

(A-15)

125.0 parts by mass of 5-methoxy-2-methylbenzothiazole and 234.8 parts by mass of potassium hydroxide were heated to reflux in 468 parts by mass of water and 468 parts by mass of ethylene glycol for 21 hours, and the solution was cooled to 10° C. or lower. While maintaining the temperature at 10° C. or lower, 6 mol/L hydrochloric acid was added such that the pH of the reaction solution was 6. Precipitated crystals were separated by filtration and were washed with 500 parts by mass of water. The entire amount of the obtained crystals, 46.1 parts by mass of malononitrile, and 49 parts by mass of acetic acid were stirred in 780 parts by mass of methanol at 60° C. for 1 hour, the solution was diluted with 250 parts by mass of methanol, and then the dilute solution was filtered while hot. The obtained filtrate was cooled to 10° C. or lower, and precipitated crystals were separated by filtration and were washed with 375 parts by mass of cold methanol. The obtained crystals were dried by blowing air at 50° C. for 12 hours. As a result, 117.2 parts by mass of a compound (A-15-b) was obtained.

125.0 parts by mass of the compound (A-9-a) and 112.5 parts by mass of the compound (A-15-b) were stirred in 1400 parts by mass of toluene, 281.5 parts by mass of phosphorus oxychloride was added dropwise at 95° C., and the solution was stirred at 95° C. for 1 hour. After completion of the reaction, the solution was cooled to an internal temperature of 25° C., and 2500 parts by mass of methanol was added dropwise for 30 minutes while maintaining the internal temperature at 30° C. or lower. After completion of the dropwise addition, the solution was stirred at 25° C. for 30 minutes. Precipitated crystals were separated by filtration and were washed with 1250 parts by mass of methanol. 1250 parts by mass of methanol was added to the obtained crystals, the solution was heated to reflux for 30 minutes and was allowed to cool to 30° C., and crystals were separated by filtration. This operation was repeated twice. The obtained crystals were dried by blowing air at 50° C. for 12 hours. As a result, 140.2 parts by mass of a compound (A-15-c) was obtained.

116.0 parts by mass of diphenylborinic acid 2-aminoethyl ester and 135.0 parts by mass of the compound (A-15-c) were stirred in 2160 parts by mass of toluene, and 251.3 parts by mass of titanium tetrachloride was added dropwise for 15 minutes at an outside temperature of 95° C. The solution was heated to an outside temperature of 130° C. and was heated to reflux for 1 hour. The solution was allowed to cool to an internal temperature of 30° C., and 2160 parts by mass of methanol was added dropwise while maintaining the internal temperature at 30° C. or lower. After the dropwise addition, the solution was stirred for 30 minutes, and precipitated crystals were separated by filtration and were washed with 1080 parts by mass of methanol. 2160 parts by mass of methanol was added to the obtained crystals, the solution was heated to reflux for 30 minutes and was allowed to cool to 30° C., and crystals were separated by filtration. The obtained crystals were dried by blowing air at 50° C. for 12 hours, 2025 parts by mass of N-methylpyrrolidone was added, the solution was stirred at 120° C. for 2 hours and was allowed to cool to 30° C., and crystals were separated by filtration and were sequentially washed with 675 parts by mass of N-methylpyrrolidone and 1350 parts by mass of methanol. 2025 parts by mass of dimethylacetamide were added to the obtained crystals, the solution was stirred at 85° C. for 1 hour and was allowed to cool to 30° C., and crystals were separated by filtration and were sequentially washed with 675 parts by mass of dimethylacetamide and 1350 parts by mass of methanol. 2025 parts by mass of methanol was added to the obtained crystals, the solution was heated to reflux for 30 minutes and was allowed to cool to 30° C., and crystals were separated by filtration. The obtained crystals were dried by blowing air at 50° C. for 12 hours. As a result, 130.0 parts by mass of a compound (A-15) was obtained. A peak of molecular weight of 1020.3 was observed by MALDI-MS, and the obtained compound was identified as the compound (A-15). λmax of the compound (A-15) in dimethyl sulfoxide (DMSO) was 795 nm.

In the compound (A-15), a molar absorption coefficient was 185000 L/(mol·cm) and a gram absorption coefficient was 200 L/(g·cm). A high-performance liquid chromatography (HPLC) purity of the compound (A-15) was 96.6%, a HPLC purity of (A-15-d) having the following structure as a by-product was 0.8%, a HPLC purity of (A-15-e) having the following structure as a by-product was 0.5%, a HPLC purity of (A-15-f) having the following structure as a by-product was 0.9%, and a HPLC purity of all the other components having unidentified structures was 1.2%. In addition, the compound (A-15) included 160 mass ppm of titanium and 20 mass ppm of chlorine.

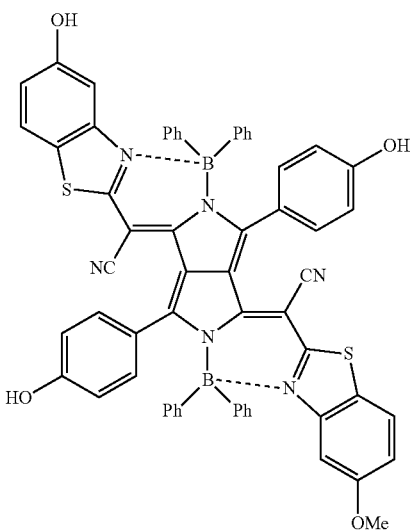
(A-15-d)

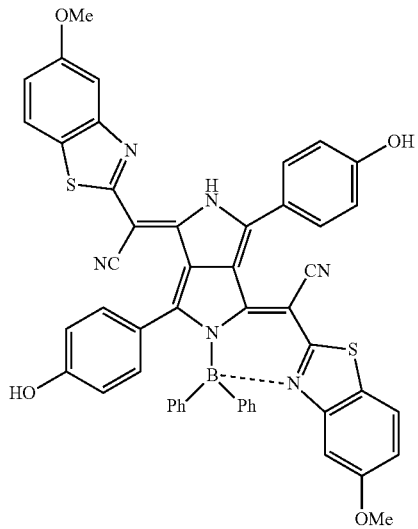
(A-15-e)

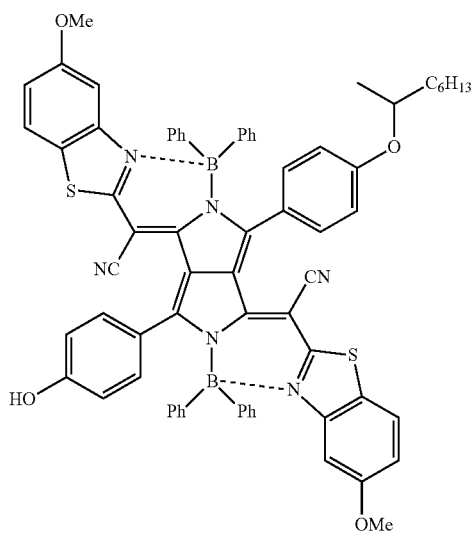
(A-15-f)

Regarding peak positions in a powder X-ray diffraction spectrum of the compound (A-15), diffraction angles 2θ were 7.3°, 10.1°, 12.5°, 13.5°, 14.0°, 14.4°, 14.6°, 16.3°, 17.2°, 18.0°, 19.3°, 19.9°, 20.9°, 21.8°, 22.9°, 23.7°, 25.2°, 26.6°, 28.2°, and 31.1°, and a full width at half maximum of a peak at 7.30 at which the peak intensity was the maximum was 0.24°.

(Measurement of HPLC Purity)

The measurement was performed under the following conditions to obtain a peak surface area %.

Measuring device: 1200, manufactured by Agilent Technologies Inc.

Column: kinetex 5 μC18100A (250 mm×diameter 4.60 mm), manufactured by Phenomenex Inc.

Eluent: acetic acid 0.1 vol % tetrahydrofuran (THF) solution/acetic acid 0.1 vol % ion exchange water=60/40 (volume ratio)

Flow rate: 1.0 mL/min
Column temperature: 40° C.
Detection wavelength: 254 nm (Measurement of Titanium Content)

As a measuring device, Optima 7300DV (manufactured by PerkinElmer Co., Ltd.) was used. 5 mL of nitric acid and 0.5 mL of sulfuric acid were added to about 50 mg of a sample, the solution was ashed by microwave at 260° C., and the ash was diluted with 40 mL of water. The dilute solution was analyzed by inductively coupled plasma atomic emission spectroscopy to calculate the titanium content in the sample.

(Measurement of Chlorine Content)

About 2 mg of a sample was precisely weighed and placed on a quartz board, and the sample was combusted at 900° C. using a combustion type halogen analyzer (AQF-100, manufactured by Dia Instruments Co., Ltd.) such that an absorbent absorbed vaporized gas, and the chlorine content was determined by ion chromatography. As the absorbent, 3 mL of about 300 mass ppm hydrogen peroxide solution+about 3.6 mass ppm tartaric acid was used. The ion chromatography was performed under the following conditions.

Column: AS12A, manufactured by Thermo Fisher Scientific Inc.

Eluent: 2.7 mmol/L sodium carbonate+0.3 mmol/L sodium bicarbonate

Flow rate: 1.5 mL/min

Column temperature: 35° C.

(Measurement of Powder X-Ray Diffraction Spectrum)

Using A horizontal sample stage type strong X-ray diffractometer RINT-TTR III (manufactured by Rigaku Corporation) as a measuring device, a powder X-ray diffraction spectrum was measured under the following conditions of diffraction angles 2θ: 5° to 55°, voltage: 50 kV, current: 300 mA, scanning speed: 4°/min, step interval: 0.1, divergence slit: 0.05 mm, scattering slit: 10 mm, and light receiving slit: 0.15 mm. In the obtained powder X-ray diffraction spectrum, a maximum peak of diffraction intensity at a diffraction angle 2θ of 5° to 10° was fitted to the Lorentz function [y=A/(1+((x−x0)/w)2)+h] to obtain a full width at half maximum of the same peak. Here, y represents an intensity, A represents a peak height, x represents 2θ, x0 represents a peak position, w represents a peak width (half width at half maximum), and h represents a baseline.

<Synthesis of Compounds (A-10), (A-14), (A-16), (A-33), (A-34), (A-38), (A-39), (A-106), and (A-209)>

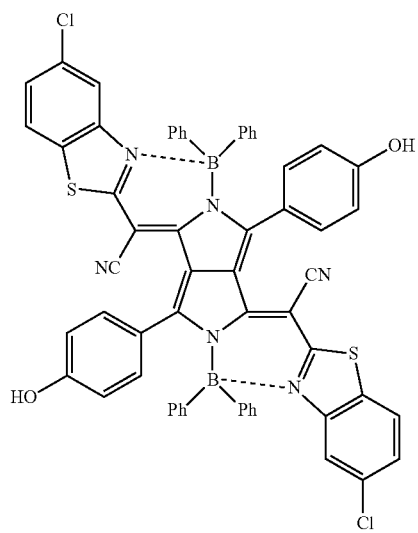

(A-10)

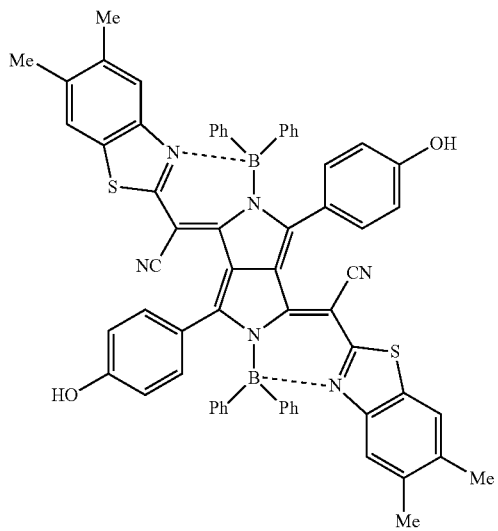

(A-14)

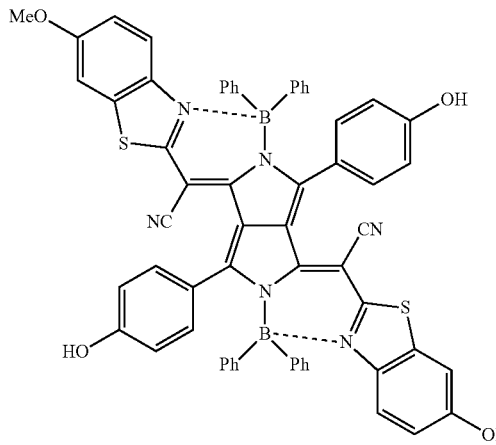

(A-16)

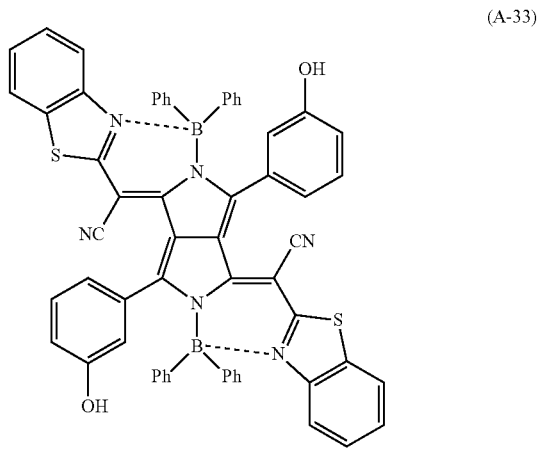

(A-33)

(A-34)

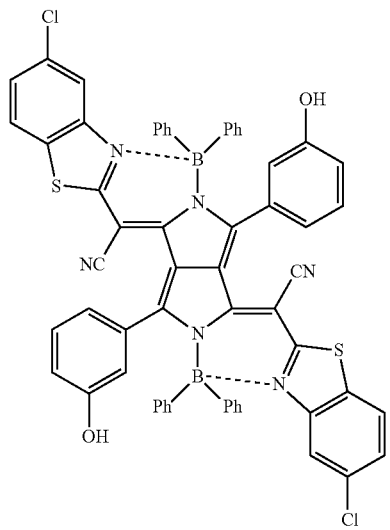

(A-106)

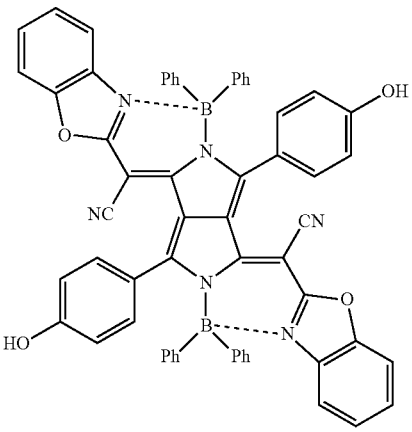

(A-38)

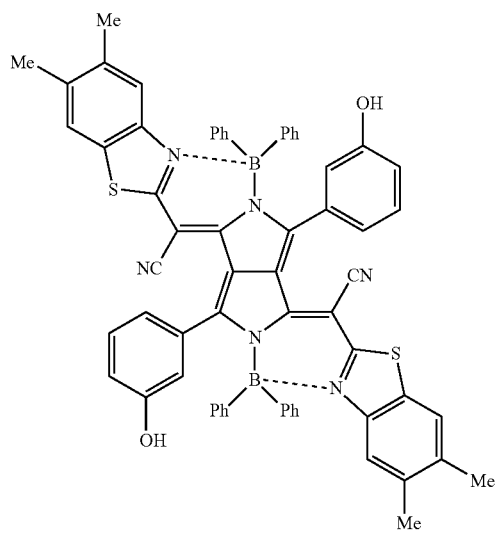

(A-209)

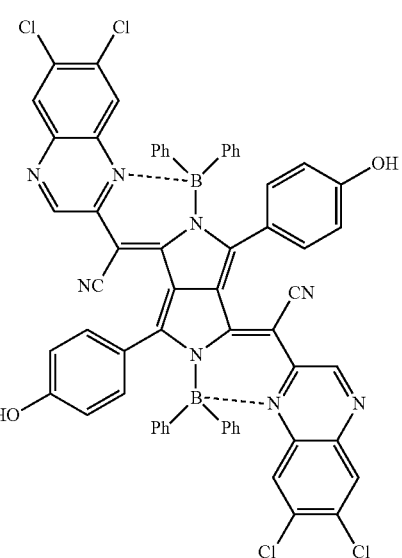

(A-39)

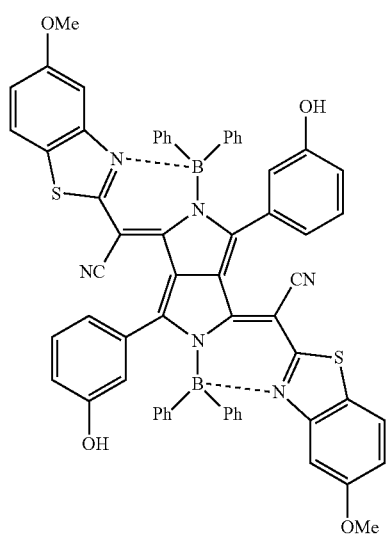

Compounds (A-10), (A-14), (A-16), (A-33), (A-34), (A-38), (A-39), (A-106), and (A-209) were synthesized using the same method as that of the compound (A-15). It was found by MALDI-MS that the molecular weights were the same as theoretical values, and all the obtained compounds were identified as the target compounds. λmax of the compound (A-10) in dimethyl sulfoxide (DMSO) was 782 nm, λmax of the compound (A-14) in dimethyl sulfoxide (DMSO) was 795 nm, λmax of the compound (A-16) in dimethyl sulfoxide (DMSO) was 806 nm, λmax of the compound (A-33) in dimethyl sulfoxide (DMSO) was 781 nm, λmax of the compound (A-34) in dimethyl sulfoxide (DMSO) was 782 nm, λmax of the compound (A-38) in dimethyl sulfoxide (DMSO) was 795 nm, λmax of the compound (A-39) in dimethyl sulfoxide (DMSO) was 795 nm, λmax of the compound (A-106) in dimethyl sulfoxide (DMSO) was 743 nm, and λmax of the compound (A-209) in dimethyl sulfoxide (DMSO) was 883 nm.

<Synthesis of Compounds (A-25), (A-30), (A-60), (A-101), (A-145), and (A-301)>

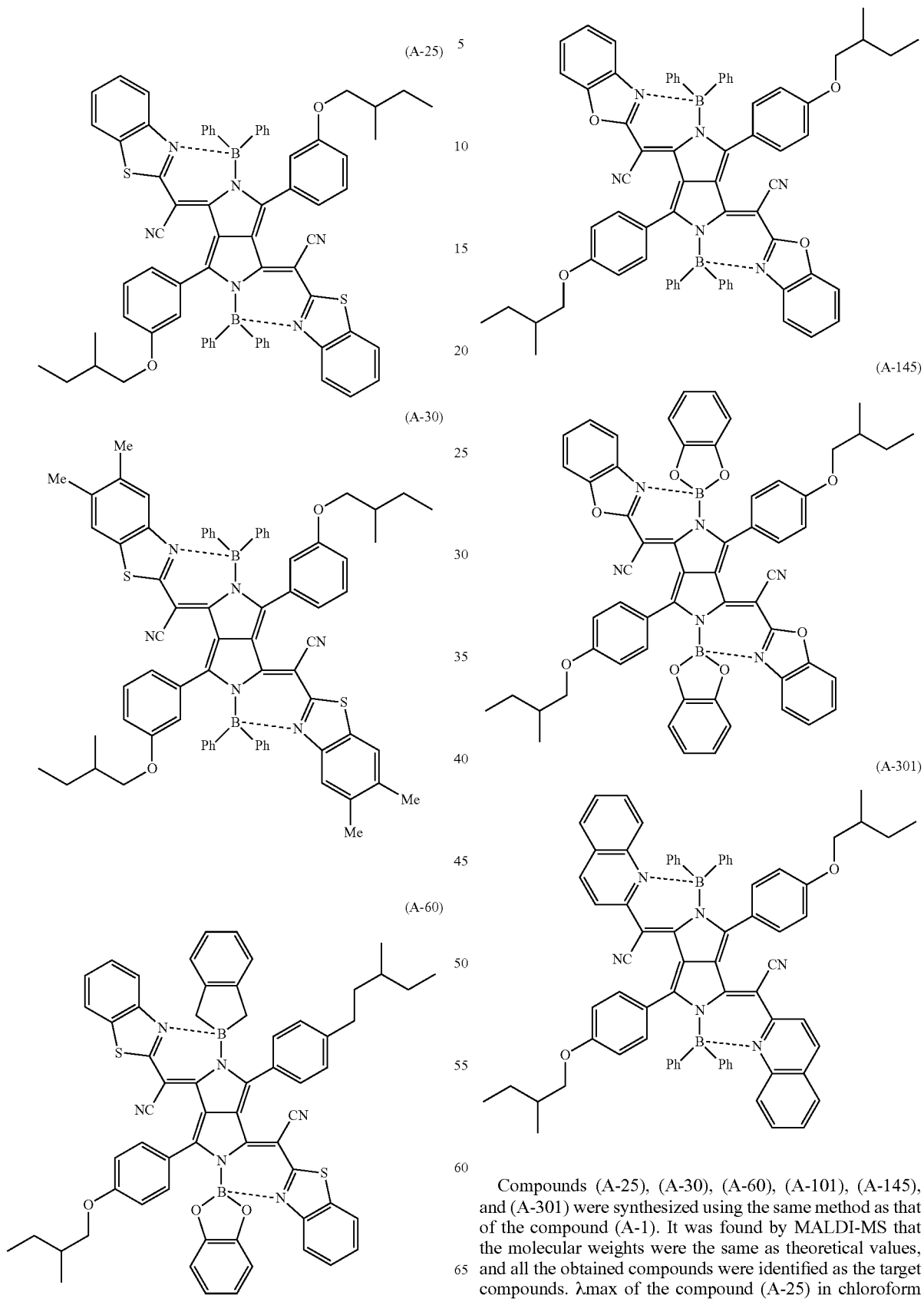

Compounds (A-25), (A-30), (A-60), (A-101), (A-145), and (A-301) were synthesized using the same method as that of the compound (A-1). It was found by MALDI-MS that the molecular weights were the same as theoretical values, and all the obtained compounds were identified as the target compounds. λmax of the compound (A-25) in chloroform was 782 nm, λmax of the compound (A-30) in chloroform was 795 nm, k max of the compound (A-60) in chloroform was 717 nm, λmax of the compound (A-101) in chloroform was 740 nm, λmax of the compound (A-145) in chloroform was 677 nm, and k max of the compound (A-301) in chloroform was 814 nm.

<Synthesis of Compound (A-81)>

A compound (A-81) was synthesized according to the following scheme. A peak of molecular weight of 1228.3 was as observed by MALDI-MS, and the obtained compound was molecular weight of 1228.3 was observed by MALDI-MS, and the obtained compound was identified as the compound (A-81). λmax of the compound (A-81) in chloroform was 800 nm.

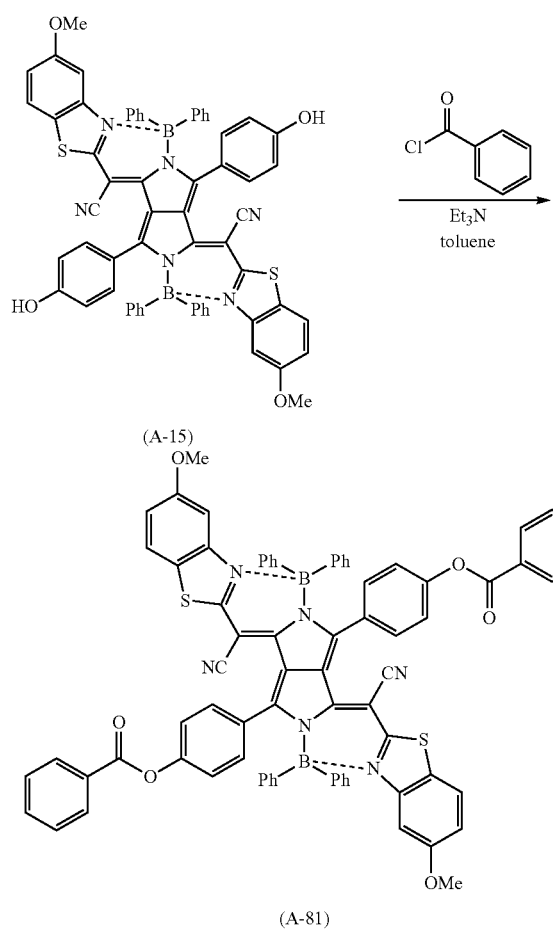

<Synthesis of Compounds (A-76) and (A-257)>

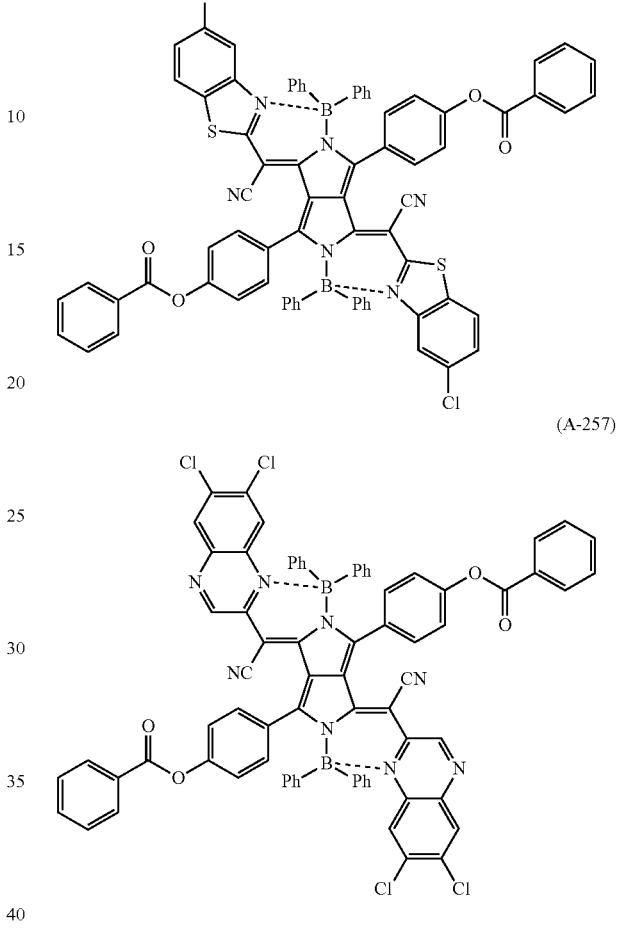

Compounds (A-76) to (A-257) were synthesized using the same synthesis method as that of the compound (A-81). It was found by MALDI-MS that the molecular weights were the same as theoretical values, and all the obtained compounds were identified as the target compounds. λmax of the compound (A-76) in chloroform was 786 nm, and λmax of the compound (A-257) in chloroform was 883 nm.

<Synthesis of Compound (A-514)>

A compound (A-514) was synthesized according to the following scheme.

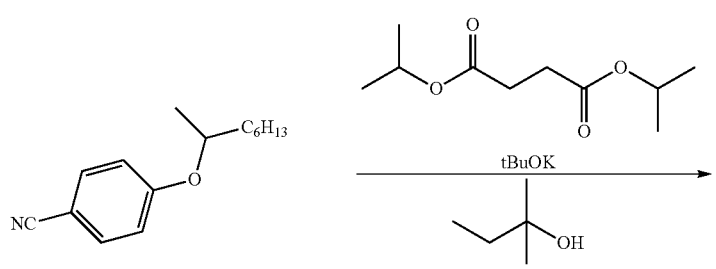

-continued
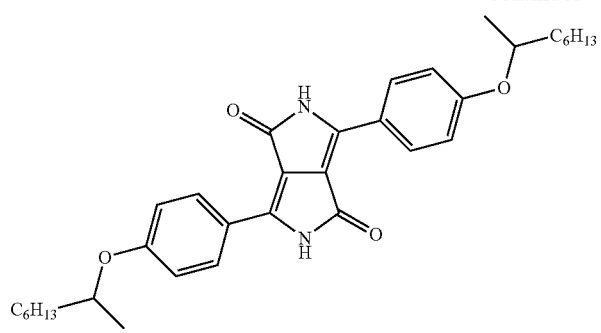
(A-a)
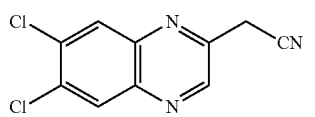
(Intermediate C-0)
POCl₃
toluene
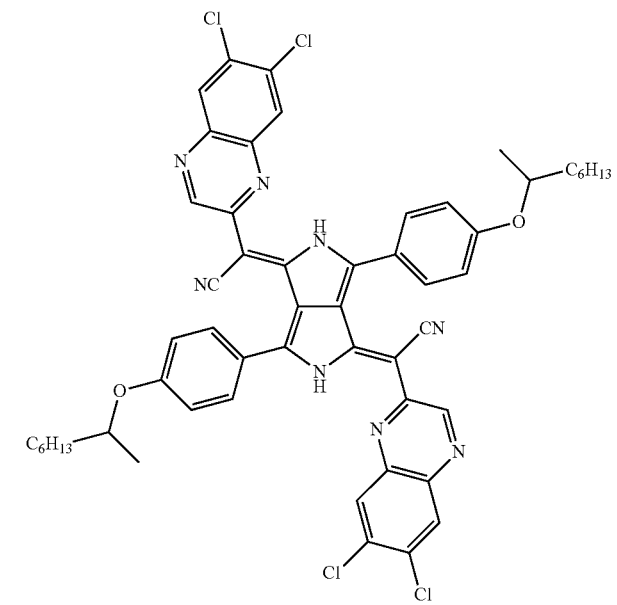
(A-b)
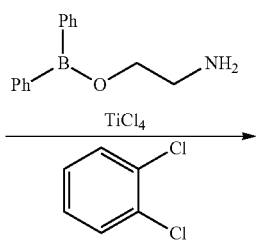
TiCl₄
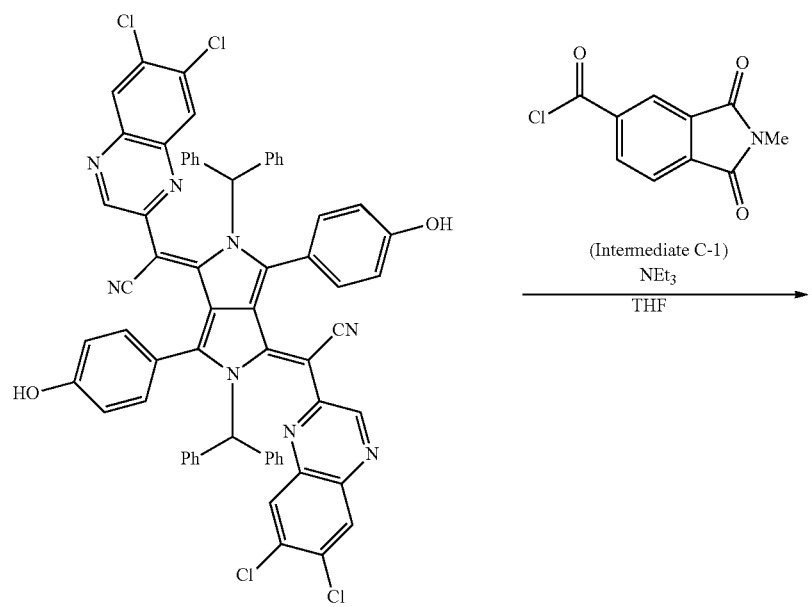
(A-c)
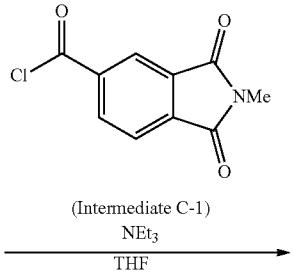
(Intermediate C-1)
NEt₃
THF

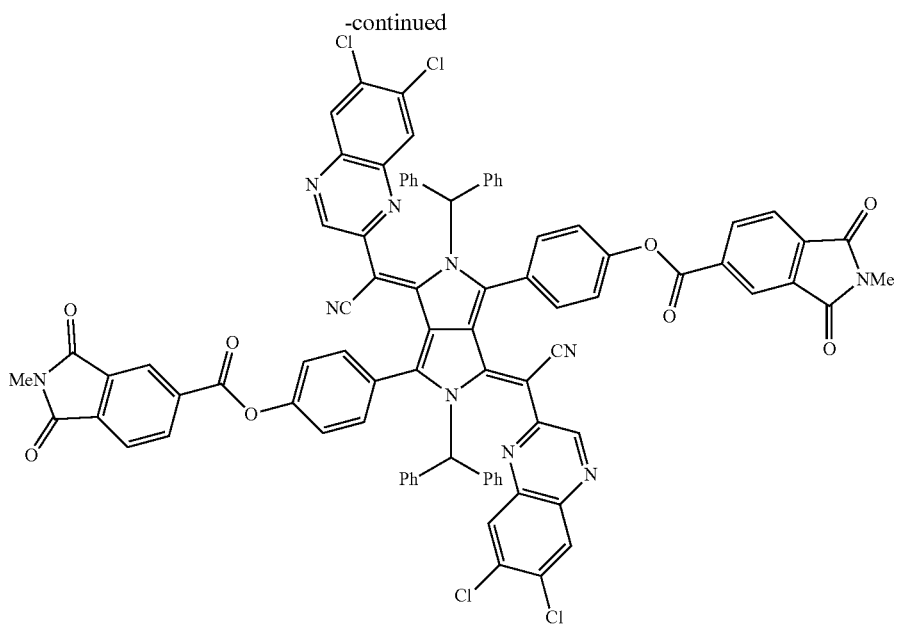

(A-514)

A compound (A-a) was synthesized from 4-(1-methylheptoxy)benzonitrile using a method described in U.S. Pat. No. 5,969,154A.

Intermediate C-0 was synthesized according to the following scheme.

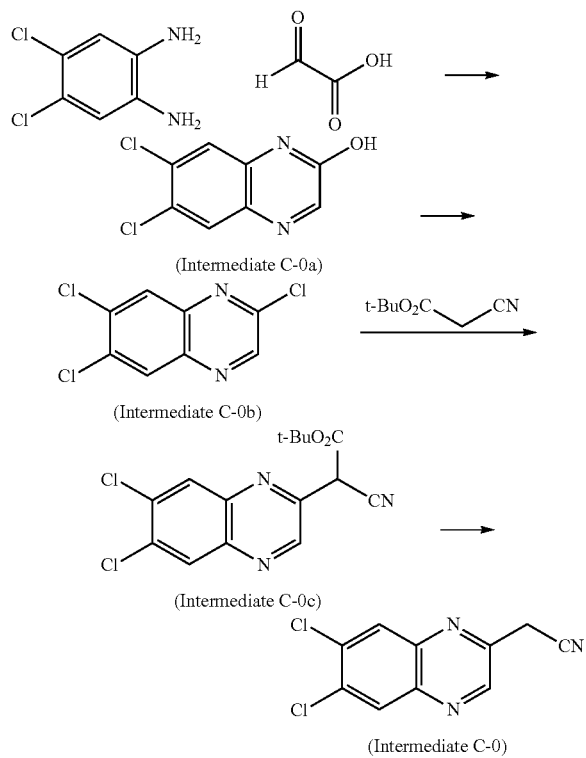

5.0 parts by mass of 4,5-dichloro-1,2-phenylenediamine, 2.9 parts by mass of glyoxylic acid monohydrate, and 120 parts by mass of ethanol were put into a flask and were stirred under heating reflux conditions for 12 hours. After the reaction, precipitates were separated by filtration. The crystals were dried by blowing air at 50° C. As a result, 5.5 parts by mass of an intermediate C-0a was obtained.

5.0 parts by mass of the intermediate C-0a and 30 parts by mass of phosphorus oxychloride were put into a flask and were stirred under heating reflux conditions for 2 hours. After the reaction, the reaction solution was poured into 300 parts by mass of water, and precipitates were separated by filtration. The crystals were dried by blowing air. As a result, 5.0 parts by mass of an intermediate C-0b was obtained.

1.3 parts by mass of 60 mass % sodium hydride and 10 parts by mass of tetrahydrofuran were put into a flask, and 4.0 parts by mass of tert-butyl cyanoacetate was added dropwise in an ice bath. The solution was stirred at room temperature for 1 hour, 5.0 parts by mass of the intermediate C-0b was added, and the solution was stirred for 12 hours. The reaction solution was poured into 75 parts by mass of water, 3 parts by mass of acetic acid was added, and precipitates were separated by filtration. The crystals were dried by blowing air at 50° C. As a result, 4.6 parts by mass of an intermediate C-0c was obtained.

4.0 parts by mass of the intermediate C-0c, 12 parts by mass of trifluoroacetic acid, and 24 parts by mass of dichloromethane were put into a flask and were stirred at 60° C. for 1 hour. After the reaction, a sodium carbonate aqueous solution was added, and the organic layer was extracted with chloroform. The solvent was removed under reduced pressure, and the obtained crystals were purified by recrystallization from ethyl acetate. The crystals were dried by blowing air at 50° C. As a result, 2.0 parts by mass of an intermediate C-0 was obtained.

50 parts by mass of the compound (A-a) and 52.4 parts by mass of the intermediate C-0 were stirred in 1000 parts by mass of toluene, and 127 parts by mass of phosphorus oxychloride was added dropwise, and the solution was heated to reflux for 3.5 hours. After completion of the reaction, the solution was cooled to an internal temperature of 25° C., and 1000 parts by mass of methanol was added dropwise for 60 minutes while maintaining the internal temperature at 30° C. or lower. After completion of the dropwise addition, the solution was stirred at room temperature for 30 minutes. Precipitated crystals were separated by filtration and were washed with 500 parts by mass of methanol. 500 parts by mass of methanol was added to the obtained crystals, the solution was heated to reflux for 30 minutes and was allowed to cool to 30° C., and crystals were separated by filtration. The obtained crystals were dried by blowing air at 40° C. for 12 hours. As a result, 56.6 parts by mass of a compound (A-b) was obtained.

51 parts by mass of diphenylborinic acid 2-aminoethyl ester was stirred in 500 parts by mass of 1,2-dichlorobenzene, 72.2 parts by mass of titanium tetrachloride was added dropwise for 10 minutes at an outside temperature of 40° C., and the solution was stirred for 30 minutes. 25 parts by mass of A-b was added, and the solution was heated to an outside temperature of 130° C. to reflux for 90 minutes. The solution was allowed to cool to an internal temperature of 30° C., and 1000 parts by mass of methanol was added dropwise while maintaining the internal temperature at 30° C. or lower. After the dropwise addition, the solution was stirred for 30 minutes, and crystals were separated by filtration and were washed with 500 parts by mass of methanol. 250 parts by mass of methanol was added to the obtained crystals, the solution was heated to reflux for 30 minutes and was allowed to cool to 30° C., and crystals were separated by filtration. The obtained crystals were dried by blowing air at 40° C. for 12 hours. As a result, 25 parts by mass of a compound (A-c) was obtained.

An intermediate C-1 was synthesized according to the following scheme.

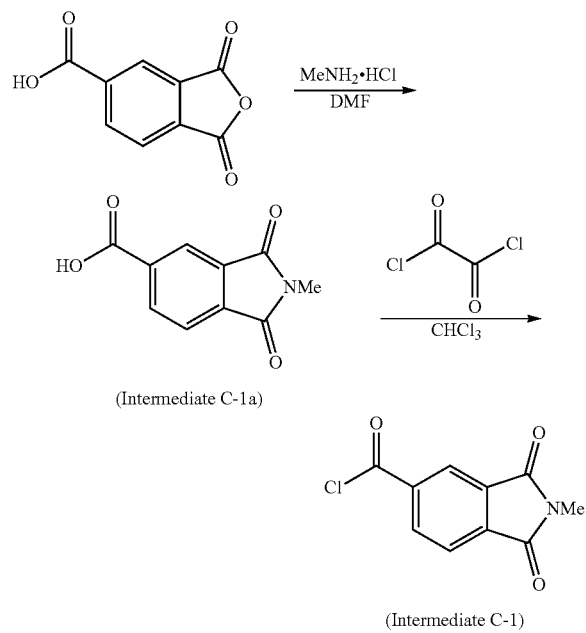

60 parts by mass of trimellitic anhydride was stirred in 400 parts by mass of dimethylformamide (DMF), and 23.2 parts by mass of methylamine hydrochloride was added. 34.7 parts by mass of triethylamine was added dropwise while maintaining the internal temperature at 35° C. or lower. After the dropwise addition, the solution was stirred for 30 minutes and was heated to an outside temperature of 160° C. and was heated to reflux for 3 hours. The reaction solution was cooled to an internal temperature of 30° C., 200 parts by mass of water and 200 parts by mass of ethyl acetate were added, and the organic layer was extracted by liquid separation operation. The organic layer was washed with 100 parts by mass of 1 mol/L hydrochloric acid aqueous solution, and then the solvent was removed by distillation under reduced pressure. As a result, 62 parts by mass of an intermediate C-1a was obtained.

50 parts by mass of the intermediate C-1a was stirred in 500 parts by mass of chloroform, and 0.1 parts by mass of dimethylformamide (DMF) and 46 parts by mass of oxalyl chloride were added. The solution was stirred at room temperature for 3 hours, and then the solvent was removed by distillation under reduced pressure. As a result, 54 parts by mass of an intermediate C-1 was obtained.

20 parts by mass of the compound (A-c) was stirred in 400 parts by mass of tetrahydrofuran, 22.3 parts by mass of triethylamine and 32.9 parts by mass of the intermediate C-1 were added dropwise in this order, and the solution was heated to an outside temperature of 75° C. and was heated to reflux for 1 hour. The solution was allowed to cool to an internal temperature of 30° C., and crystals were separated by filtration and were washed with 200 parts by mass of tetrahydrofuran. 200 parts by mass of methanol was added to the obtained crystals, the solution was heated to reflux for 1 hour and was allowed to cool to 30° C., and crystals were separated by filtration. The obtained crystals were dried by blowing air at 40° C. for 12 hours. As a result, 24 parts by mass of a compound (A-514) was obtained.

$^1$H-NMR (CDCl$_3$): δ3.27 (s, 6H), 6.39 (d, 4H), 7.00 (d, 4H), 7.20-7.40 (m, 20H), 7.81 (s, 2H), 8.05 (s, 2H), 8.29 (s, 2H), 8.65 (s, 2H), 8.76 (s, 2H), 9.05 (s, 2H)

λmax of the compound (A-514) in chloroform was 883 nm.

<Synthesis of Compounds (A-102), (A-103), (A-116), (A-117), (A-118), (A-601), (A-602), and (A-603)>

Compounds (A-102), (A-103), (A-116), (A-117), (A-118), (A-601), (A-602), and (A-603) were synthesized using the same method as that of the compound (A-1). It was found by matrix-assisted laser desorption/ionization-mass spectrometry (MALDI-MS) that the molecular weights were the same as theoretical values, and all the obtained compounds were identified as the target compounds. λmax of the compound (A-102) in chloroform was 742 nm, λmax of the compound (A-103) in chloroform was 745 nm, λmax of the compound (A-116) in chloroform was 740 nm, λmax of the compound (A-117) in chloroform was 742 nm, λmax of the compound (A-118) in chloroform was 745 nm, λmax of the compound (A-601) in chloroform was 718 nm, λmax of the compound (A-602) in chloroform was 723 nm, and λmax of the compound (A-603) in chloroform was 720 nm.

<Synthesis of Compounds (A-401), (A-407), (A-413), (A-416), (A-419), and (A-422)>

Compounds (A-401), (A-407), (A-413), (A-416), (A-419), and (A-422) were synthesized using the same method as that of the compound (A-514). It was found by MALDI-MS that the molecular weights were the same as theoretical values, and all the obtained compounds were identified as the target compounds. λmax of the compound (A-401) in chloroform was 740 nm, λmax of the compound (A-407) in chloroform was 746 nm, λmax of the compound (A-413) in chloroform was 746 nm, λmax of the compound (A-416) in chloroform was 746 nm, λmax of the compound (A-419) in chloroform was 746 nm, and λmax of the compound (A-422) in chloroform was 746 nm.

<Synthesis of Compound (B-1)>

A compound (B-1) was synthesized according to the following scheme.

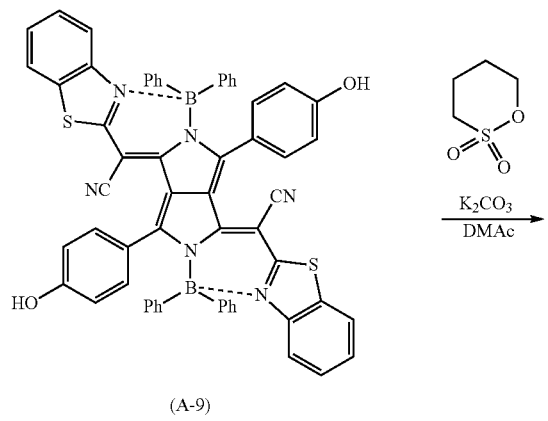

(A-9)

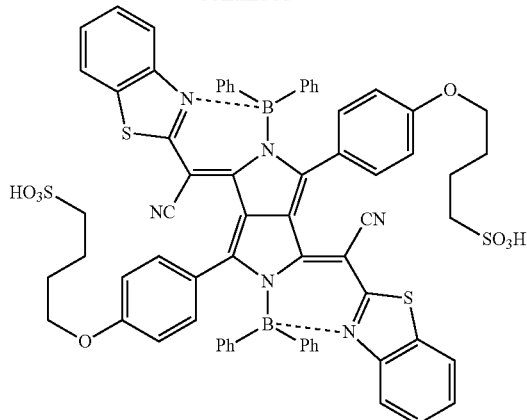

(B-1)

3.0 parts by mass of the compound (A-9) and 3.45 parts by mass of potassium carbonate were stirred in 28.2 parts by mass of dimethylacetamide (DMAc), 3.40 parts by mass of butanesultone and 5.6 parts by mass of DMAc were added, and the solution was stirred at room temperature for 10 minutes. The solution was heated to an outside temperature of 105° C. and was heated for 4 hours. Next, the solution was allowed to cool to an internal temperature of 30° C., and precipitated crystals were separated by filtration. While maintaining the internal temperature at 30° C. or lower, a small amount of the obtained crystals were added to 30 parts by mass of 4 mol/L hydrochloric acid aqueous solution, the solution was stirred at room temperature for 30 minutes, and precipitated crystals were separated by filtration. This operation was repeated twice. 60 parts by mass of ethyl acetate was added to the obtained crystals, the solution was heated to reflux for 30 minutes and was allowed to cool to 30° C., and crystals were separated by filtration. This operation was repeated three times. The obtained crystals were dried by blowing air at 50° C. for 24 hours. As a result, 2.74 parts by mass of a compound (B-1) was obtained.

$^1$H-NMR (dimethyl sulfoxide): δ1.76 (m, 8H), 3.42 (m, 4H), 3.93 (m, 4H), 6.34-6.47 (dd, 8H), 6.89 (d, 2H), 7.12-7.21 (m, 24H), 7.93 (d, 2H)

Synthesis of Compound (B-22)

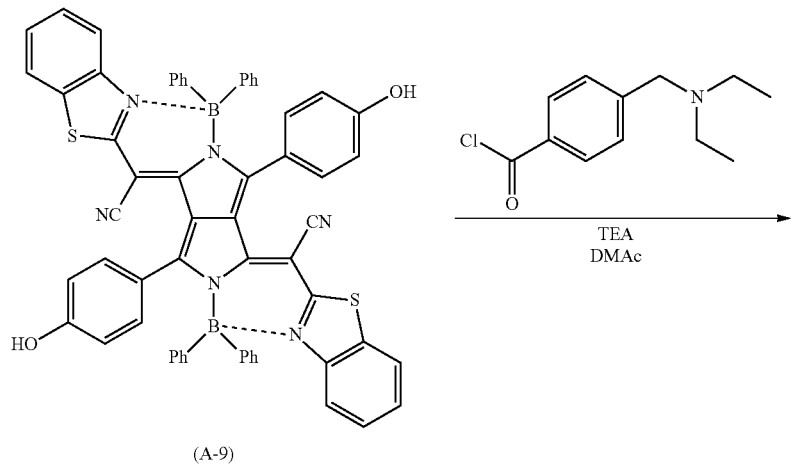

(A-9)

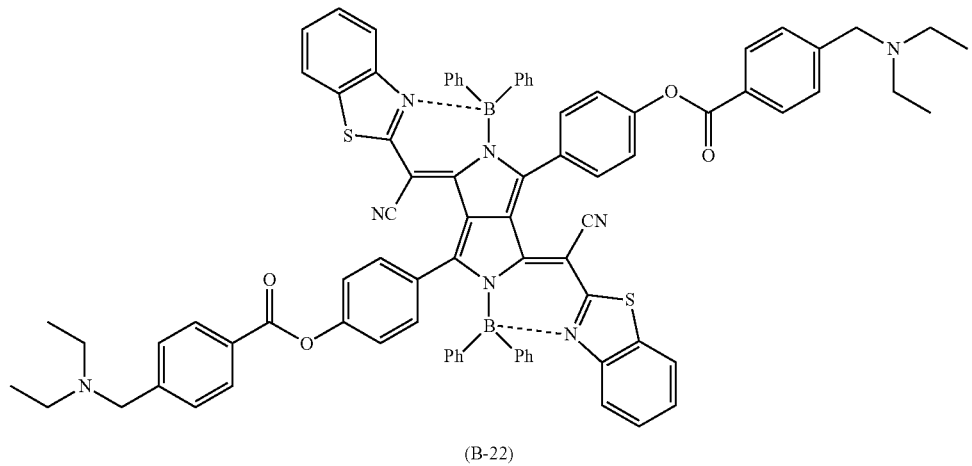

(B-22)

4.6 parts by mass of the compound (A-9), 10 parts by mass of 4-[(diethylamino)methyl]-benzoyl chloride, 87 parts by mass of DMAc, and 16.7 parts by mass of triethylamine were added and were stirred for 5 minutes. The solution was heated to an outside temperature of 110° C. and was heated for 4 hours. Next, the solution was allowed to cool to an internal temperature of 30° C., and precipitated crystals were separated by filtration. Next, the crystals were washed with 100 parts by mass of methanol and 100 parts by mass of water. 200 parts by mass of distilled water was added to the obtained crystals, the solution was heated to reflux for 30 minutes and was allowed to cool to 30° C., and precipitated crystals were separated by filtration. 200 parts by mass of dimethyl sulfoxide was added to the obtained crystals, and the solution was heated at 80° C. for 30 minutes. After completion of heating, the solution was allowed to cool to an internal temperature of 30° C., and precipitated crystals were separated by filtration. 200 parts by mass of methanol was added to the obtained crystals, the solution was heated to reflux for 30 minutes and was allowed to cool to 30° C., and precipitated crystals were separated by filtration. The obtained crystals were dried by blowing air at 50° C. for 24 hours. As a result, 5.5 parts by mass of a compound (B-22) was obtained.

$^1$H-NMR (CDCl$_3$): 1.07 (t, 12H), 2.56 (q, 8H), 3.67 (s, 4H), 6.60 (d, 4H), 6.85 (d, 4H), 6.91-7.40 (m, 26H), 7.51 (m, 6H), 8.19 (d, 4H)

Synthesis of Compounds (B-14) and (B-16)

Compounds (B-14) and (B-16) were obtained using the same method as that of the compound (B-22), except that isonicotinoyl chloride and nicotinoyl chloride were used instead of 4-[(diethylamino)methyl]-benzoyl chloride.

Synthesis of Compound (B-12)

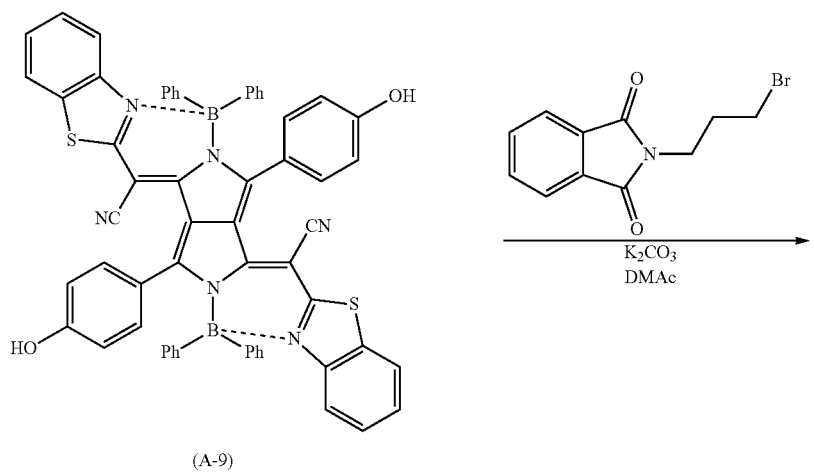

(A-9)

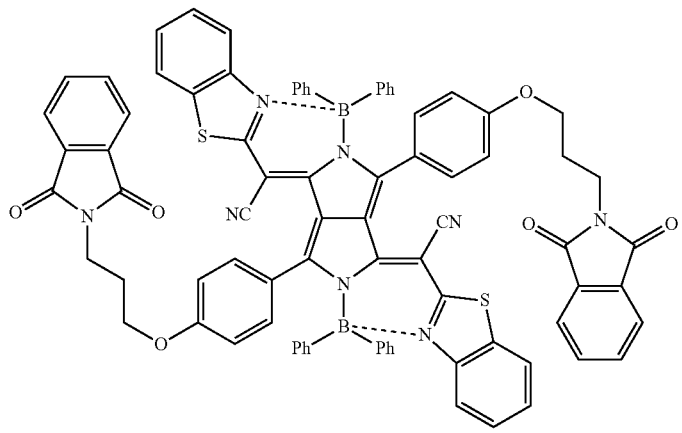

(B-12)

4.5 parts by mass of N-(3-bromopropyl)phthalimide, 2.0 parts by mass of the compound (A-9), 37.6 parts by mass of DMAc, 4.7 parts by mass of potassium carbonate were added and stirred for 5 minutes. The solution was heated to an outside temperature of 100° C. and was heated for 1 hour. Next, 2.3 parts by mass of N-(3-bromopropyl)phthalimide and 2.5 parts by mass of potassium carbonate were added to the reactor and were stirred for 6 hours. The solution was allowed to cool to an internal temperature of 30° C., and 40 parts by mass of 1 mol/L sodium hydroxide aqueous solution was added dropwise while maintaining the internal temperature at 30° C. or lower. After the dropwise addition, the solution was stirred for 30 minutes, and precipitated crystals were separated by filtration and were washed with 35 parts by mass of distilled water. The obtained crystals were dried by blowing air at 50° C. for 24 hours. As a result, 2.1 parts by mass of a compound (B-12) was obtained.

$^1$H-NMR (CDCl$_3$): 2.21 (quin, 4H), 3.96 (t, 4H), 4.02 (t, 4H), 6.35 (d, 4H), 6.40 (d, 4H), 7.00-7.25 (m, 28H), 7.73 (m, 4H), 7.89 (m, 4H)

<Synthesis of Compound (B-634)>
An intermediate C-2 was synthesized according to the following scheme.

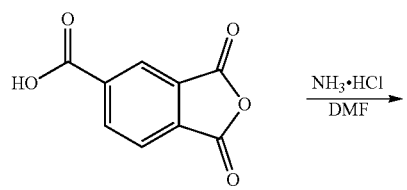

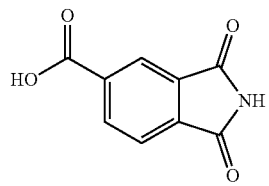

(Intermediate C-2)

60 parts by mass of trimellitic anhydride was stirred in 400 parts by mass of dimethylformamide (DMF), and 53.5 parts by mass of ammonium chloride was added. 34.7 parts by mass of triethylamine was added dropwise while maintaining the internal temperature at 35° C. or lower. After the dropwise addition, the solution was stirred for 30 minutes and was heated to an outside temperature of 160° C. and was heated to reflux for 3 hours. The reaction solution was cooled to an internal temperature of 30° C., 200 parts by mass of water and 400 parts by mass of ethyl acetate were added, and the organic layer was extracted by liquid separation operation. The organic layer was washed with 100 parts by mass of 1 mol/L hydrochloric acid aqueous solution, and then the solvent was removed by distillation under reduced pressure. As a result, 30 parts by mass of an intermediate C-2 was obtained.

A compound (B-634) was synthesized according to the following scheme.

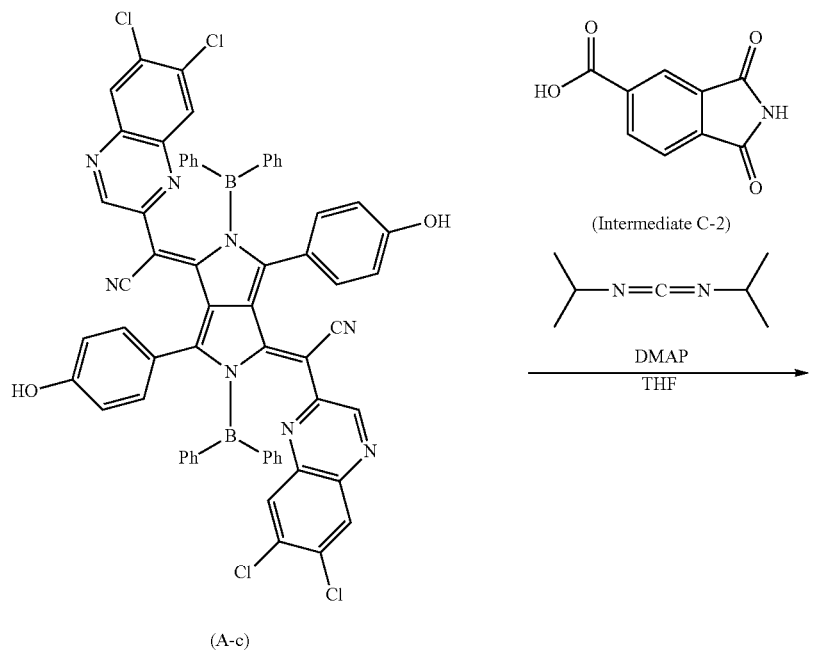
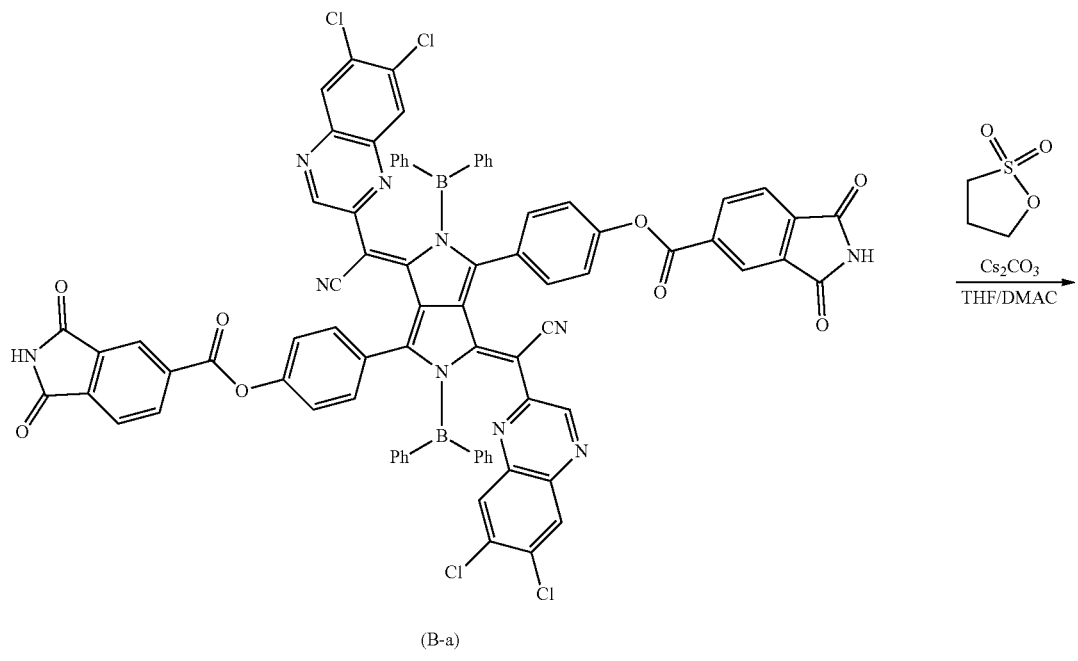

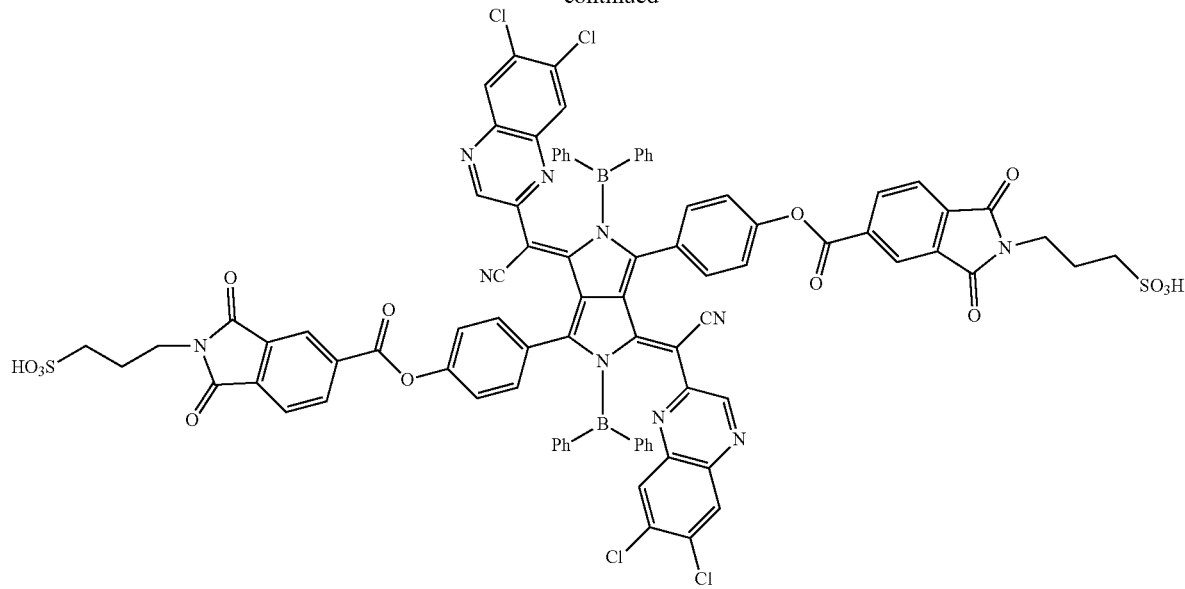

(B-634)

20 parts by mass of the compound (A-c) was stirred in 400 parts by mass of tetrahydrofuran, 28.1 parts by mass of the intermediate C-2, 18.5 parts by mass of N,N'-diisopropylcarbodiimide, and 0.2 parts by mass of dimethylaminopyridine (DMAP) were added dropwise in this order, and the solution was stirred at room temperature for 6 hours. Crystals were separated by filtration and were washed with 100 parts by mass of tetrahydrofuran. The obtained crystals were dried by blowing air at 40° C. for 12 hours. As a result, 23.5 parts by mass of a compound (B-a) was obtained.

15 parts by mass of the compound (B-a) and 22.5 parts by mass of calcium carbonate were stirred for 10 minutes in a mixed solution of 100 parts by mass of dimethylacetamide (DMAC) and 100 parts by mass of tetrahydrofuran. 10 parts by mass of propane sulfone was added, and the solution was heated to an outside temperature of 60° C. and was heated to reflux for 90 minutes. The solution was allowed to cool to an internal temperature of 30° C., 200 parts by mass of tetrahydrofuran was added, and crystals were separated by filtration. The obtained crystals were added to 100 parts by mass of 1 mol/L hydrogen chloride/ethyl acetate solution, the solution was stirred at room temperature for 30 minutes, and precipitated crystals were separated by filtration. This operation was repeated twice. 75 parts by mass of water was added to the obtained crystals, the solution was stirred at room temperature for 30 minutes, and precipitated crystals were separated by filtration. 300 parts by mass of ethyl acetate was added to the obtained crystals, the solution was heated to reflux for 30 minutes and was allowed to cool to 30° C., and crystals were separated by filtration. The obtained crystals were dried by blowing air at 40° C. for 12 hours. As a result, 9.0 parts by mass of a compound (B-634) was obtained.

A peak of molecular weight of 1676.2 was observed by MALDI-MS, and the obtained compound was identified as the compound (B-634).

<Synthesis of Compound (B-644)>

An intermediate C-3 was synthesized according to the following scheme.

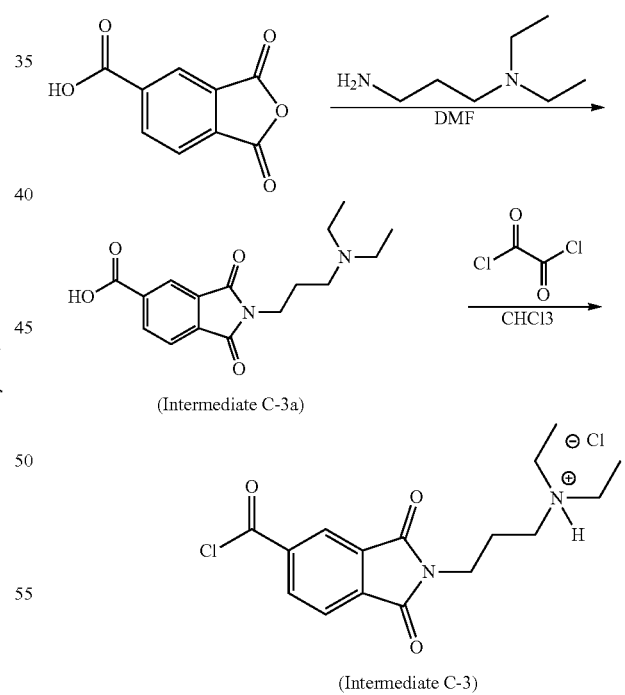

60 parts by mass of trimellitic anhydride was stirred in 400 parts by mass of dimethylformamide (DMF), and 42.7 parts by mass of N,N-diethyl-1,3-diaminopropane was added while maintaining the internal temperature at 40° C. or lower. After the dropwise addition, the solution was stirred for 30 minutes and was heated to an outside temperature of 160° C. and was heated to reflux for 4 hours. The solution was allowed to cool to an internal temperature of 30° C., 400 parts by mass of ethyl acetate was added, and the solution was stirred for 30 minutes. Crystals were separated by filtration and were washed with 200 parts by mass of ethyl acetate. The obtained crystals were dried by blowing air at 40° C. for 12 hours. As a result, 90 parts by mass of an intermediate C-3a was obtained.

30 parts by mass of the intermediate C-3a was stirred in 300 parts by mass of chloroform, and 0.1 parts by mass of dimethylformamide (DMF) and 19 parts by mass of oxalyl chloride were added. The solution was stirred at room temperature for 3 hours, and then the solvent was removed by distillation under reduced pressure. As a result, 42 parts by mass of an intermediate C-3 was obtained.

A compound (B-644) was synthesized according to the following scheme.

12 parts by mass of the compound (A-c) was stirred in 180 parts by mass of tetrahydrofuran, and 20 parts by mass of triethylamine was added. A solution in which 35 parts by mass of the intermediate C-3 was dissolved in 150 parts by mass of chloroform was added dropwise, and the solution was stirred at room temperature for 5 hours. After the reaction, crystals were separated by filtration and were washed with 100 parts by mass of tetrahydrofuran. 200 parts by mass of methanol was added to the obtained crystals, the solution was heated to reflux for 1 hour and was allowed to cool to 30° C., and crystals were separated by filtration. The obtained crystals were dried by blowing air at 40° C. for 12 hours. As a result, 15.6 parts by mass of a compound (B-644) was obtained.

$^1$H-NMR (CDCl$_3$): δ1.06 (t, 12H), δ1.97 (m, 4H), δ2.63 (m, 12H), δ3.83 (t, 4H), 6.39 (d, 4H), 6.99 (d, 4H), 7.20-7.40

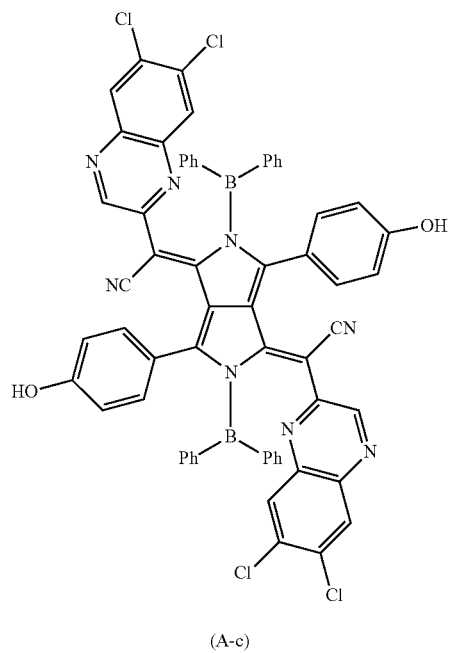

(A-c)

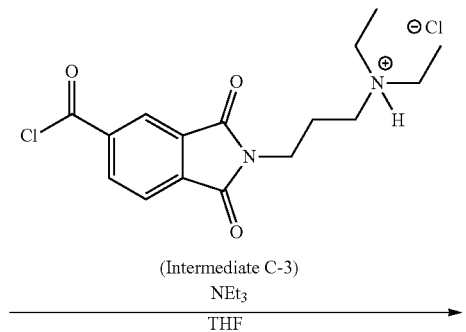

(Intermediate C-3)
NEt$_3$
THF

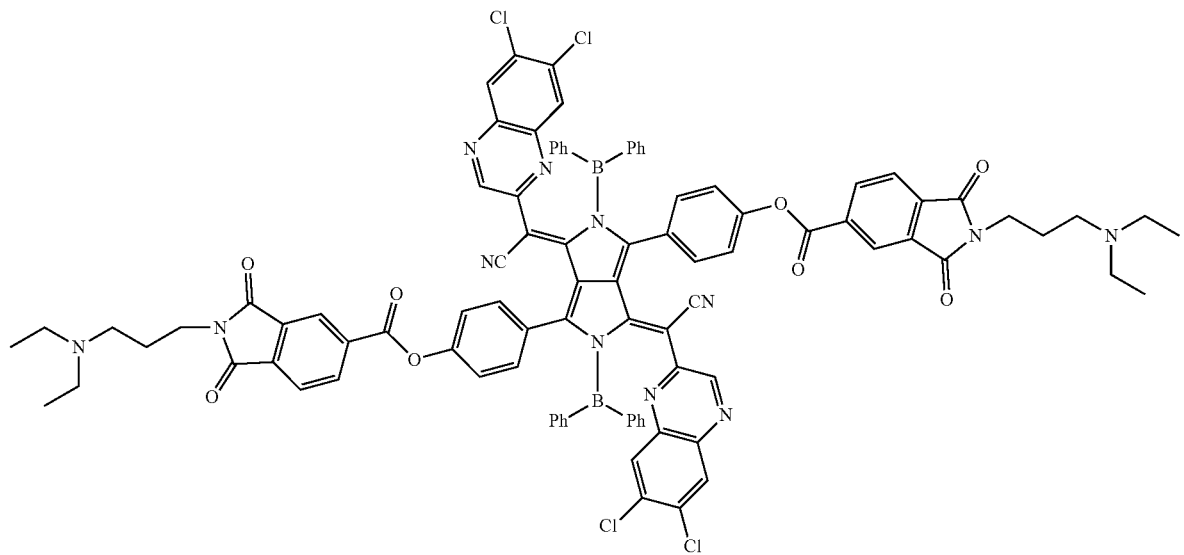

(B-644)

(m, 20H), 7.82 (s, 2H), 8.04 (s, 2H), 8.29 (s, 2H), 8.65 (s, 2H), 8.75 (s, 2H), 9.05 (s, 2H)

λmax of the compound (B-644) in chloroform was 883 nm.

<Synthesis of Compound (B-522)>

A compound (B-522) was synthesized according to the following scheme.

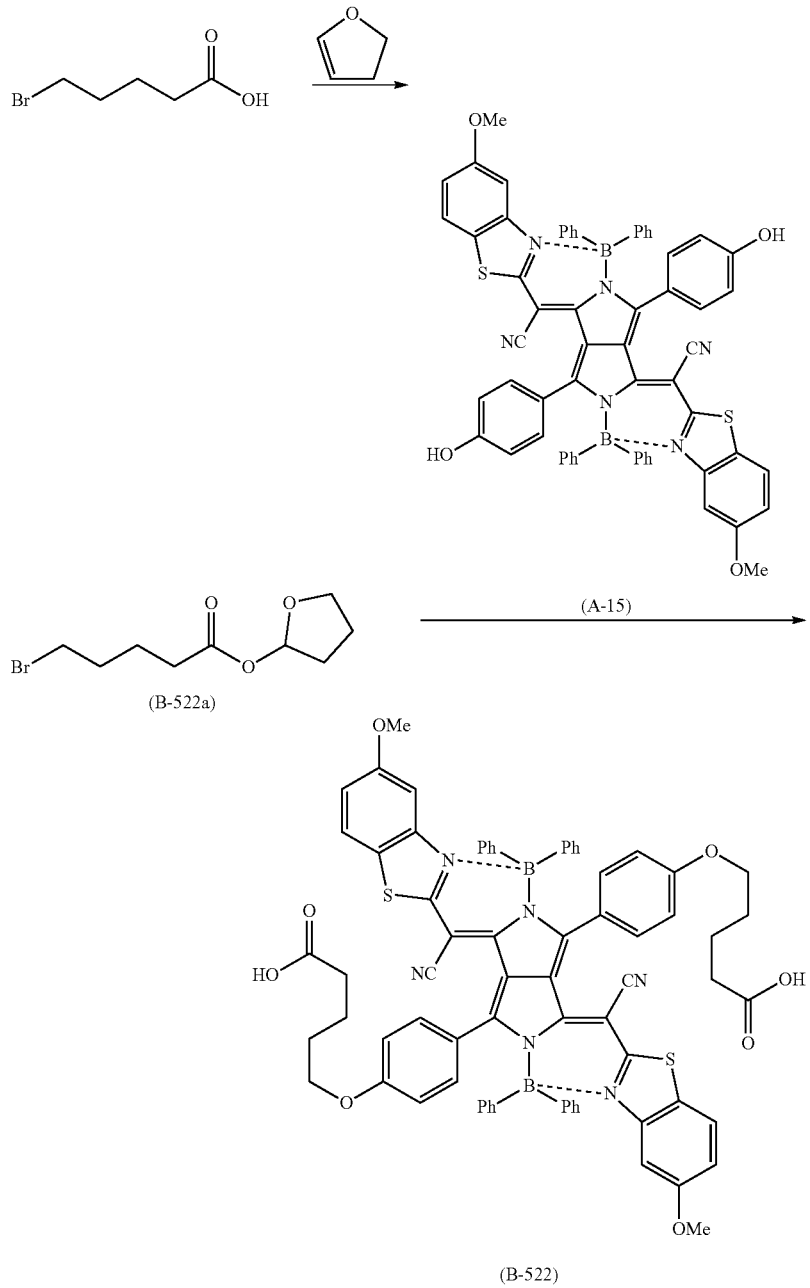

(B-522)

25 parts by mass of 5-bromovaleric acid and 96.8 parts by mass of dihydrofuran were added and were heated to reflux for 1 hour. Next, the solution was allowed to cool to an internal temperature of 30° C. or lower, and the solvent was removed by distillation under reduced pressure at an outside temperature of 30° C. As a result, 36.7 parts by mass of a compound (B-522a) was obtained.

$^1$H-NMR (CDCl$_3$): δ1.70-2.10 (m, 8H), δ2.33 (t, 2H), δ3.41 (t, 2H), δ3.90-4.08 (m, 2H), δ6.31 (d, 1H)

4 parts by mass of the compound (A-15) and 4.33 parts by mass of potassium carbonate were stirred in 75.2 parts by mass of DMAc, 7.87 parts by mass of the compound (B-522a) and 15.0 parts by mass of DMAc were added, and the solution was stirred at room temperature for 10 minutes. The solution was heated to an internal temperature of 85° C. and was stirred for 1 hour. Next, the solution was allowed to cool to an internal temperature of 30° C. or lower, and 126.7 parts by mass of methanol was added dropwise. Precipitated crystals were separated by filtration and were washed with 64.0 parts by mass of methanol, 64.0 parts by mass of deionized water, and 64.0 parts by mass of methanol in this order. The obtained crystals were added to 160 parts by mass of 1 mol/L hydrogen chloride/ethyl acetate solution, and the solution was stirred at room temperature for 1 hour. Crystals were separated by filtration and were washed with 160 parts by mass of ethyl acetate. The obtained crystals were added to 80 parts by mass of ethyl acetate, and the solution was heated to reflux for 30 minutes. Next, crystals were separated by filtration and were washed with 160 parts by mass of ethyl acetate. The obtained crystals were dried by blowing air at 50° C. for 12 hours. As a result, 3.3 parts by mass of a compound (B-522) was obtained.

A peak of molecular weight of 1221.0 was observed by MALDI-MS, and the obtained compound was identified as the compound (B-522).

Test Example 1

<Composition (Dispersion)>

Manufacturing Example 1

10 parts by mass of a pigment shown in the following table, 3 parts by mass of a pigment derivative shown in the following table, 7.8 parts by mass of a resin shown in the following table, 150 parts by mass of a solvent shown in the following table, and 230 parts by mass of zirconia beads having a diameter of 0.3 mm were mixed with each other and were dispersed using a paint shaker for 5 hours. Next, the beads were separated by filtration. As a result, a composition was manufactured. In Example 19, 5 parts by mass of a pigment A-6 and 5 parts by mass of a pigment A-9 were used. In addition, in Example 32, 1.5 parts by mass of a pigment derivative B-1 and 1.5 parts by mass of a pigment derivative B-33 were used.

TABLE 14

|  | Pigment | Pigment Derivative | Solvent | Resin |
|---|---|---|---|---|
| Example 1 | A-1 | B-1 | C-1 | D-2 |
| Example 2 | A-2 | B-1 | C-1 | D-2 |
| Example 3 | A-3 | B-1 | C-2 | D-2 |
| Example 4 | A-4 | B-1 | C-1 | D-2 |
| Example 5 | A-5 | B-1 | C-2 | D-2 |
| Example 6 | A-6 | B-1 | C-1 | D-2 |
| Example 7 | A-7 | B-1 | C-1 | D-2 |
| Example 8 | A-8 | B-1 | C-2 | D-2 |
| Example 9 | A-9 | B-1 | C-1 | D-2 |
| Example 10 | A-10 | B-1 | C-1 | D-2 |
| Example 11 | A-14 | B-1 | C-1 | D-2 |
| Example 12 | A-15 | B-1 | C-1 | D-2 |
| Example 13 | A-16 | B-1 | C-1 | D-2 |
| Example 14 | A-25 | B-1 | C-1 | D-2 |
| Example 15 | A-33 | B-1 | C-1 | D-2 |
| Example 16 | A-201 | B-1 | C-1 | D-2 |
| Example 17 | A-dpp | B-1 | C-1 | D-2 |
| Example 18 | A-ph | B-1 | C-1 | D-2 |
| Example 19 | A-6/A-9 | B-1 | C-1 | D-2 |
| Example 20 | A-1 | B-12 | C-1 | D-1 |
| Example 21 | A-1 | B-14 | C-1 | D-1 |
| Example 22 | A-1 | B-16 | C-1 | D-1 |
| Example 23 | A-1 | B-18 | C-1 | D-1 |
| Example 24 | A-1 | B-22 | C-1 | D-1 |
| Example 25 | A-1 | B-28 | C-1 | D-1 |
| Example 26 | A-1 | B-31 | C-1 | D-2 |
| Example 27 | A-1 | B-322 | C-1 | D-1 |
| Example 28 | A-1 | B-323 | C-1 | D-1 |
| Example 29 | A-1 | B-324 | C-1 | D-1 |
| Example 30 | A-1 | B-325 | C-1 | D-2 |
| Example 31 | A-1 | B-dr-1 | C-1 | D-2 |
| Example 32 | A-1 | B-1/B-12 | C-1 | D-2 |
| Comparative Example 1 | A-dpp | — | C-1 | D-2 |
| Comparative Example 2 | A-3 | B-dpp | C-1 | D-2 |
| Comparative Example 3 | A-dpp | B-dpp | C-1 | D-2 |
| Comparative Example 4 | — | B-14 | C-1 | D-2 |

Manufacturing Example 2

10 parts by mass of a pigment shown in the following table, 2 parts by mass of a pigment derivative shown in the following table, 7.8 parts by mass of a resin shown in the following table, 150 parts by mass of a solvent shown in the following table, and 230 parts by mass of zirconia beads having a diameter of 0.3 mm were mixed with each other and were dispersed using a paint shaker for 5 hours. Next, the beads were separated by filtration. As a result, a composition was manufactured.

TABLE 15

|  | Pigment | Pigment Derivative | Solvent | Resin |
|---|---|---|---|---|
| Example 41 | A-1 | B-1 | C-1 | D-2 |
| Example 42 | A-9 | B-1 | C-1 | D-2 |
| Example 43 | A-15 | B-1 | C-1 | D-2 |
| Example 44 | A-15 | B-7 | C-1 | D-2 |
| Example 45 | A-15 | B-22 | C-1 | D-1 |
| Example 46 | A-30 | B-1 | C-3 | D-2 |
| Example 47 | A-34 | B-1 | C-1 | D-2 |
| Example 48 | A-38 | B-1 | C-1 | D-2 |
| Example 49 | A-39 | B-1 | C-1 | D-2 |
| Example 50 | A-60 | B-1 | C-1 | D-2 |
| Example 51 | A-76 | B-1 | C-1 | D-2 |
| Example 52 | A-81 | B-1 | C-1 | D-2 |
| Example 53 | A-101 | B-1 | C-1 | D-2 |
| Example 54 | A-106 | B-1 | C-1 | D-2 |
| Example 55 | A-145 | B-1 | C-1 | D-2 |
| Example 56 | A-203 | B-1 | C-1 | D-2 |
| Example 57 | A-207 | B-1 | C-1 | D-2 |
| Example 58 | A-209 | B-1 | C-1 | D-2 |
| Example 59 | A-257 | B-1 | C-1 | D-2 |
| Example 60 | A-301 | B-1 | C-1 | D-2 |
| Example 61 | A-60 | B-35 | C-1 | D-2 |
| Example 62 | A-145 | B-35 | C-1 | D-2 |
| Example 63 | A-101 | B-101 | C-1 | D-2 |
| Example 64 | A-106 | B-101 | C-1 | D-2 |
| Example 65 | A-201 | B-201 | C-1 | D-2 |
| Example 66 | A-207 | B-201 | C-1 | D-2 |
| Example 67 | A-203 | B-203 | C-1 | D-2 |
| Example 68 | A-209 | B-203 | C-1 | D-2 |
| Comparative Example 11 | A-dpp | — | C-1 | D-2 |
| Comparative Example 12 | A-3 | B-dpp | C-1 | D-2 |
| Comparative Example 13 | A-dpp | B-dpp | C-1 | D-2 |
| Comparative Example 14 | — | B-14 | C-1 | D-2 |

TABLE 16

|  | Pigment | Pigment Derivative | Solvent | Resin |
|---|---|---|---|---|
| Example 201 | A-60 | B-1 | C-1 | D-2 |
| Example 202 | A-60 | B-401 | C-1 | D-2 |
| Example 203 | A-60 | B-405 | C-1 | D-2 |
| Example 204 | A-60 | B-409 | C-1 | D-2 |
| Example 205 | A-60 | B-413 | C-1 | D-2 |
| Example 206 | A-60 | B-414 | C-1 | D-2 |
| Example 207 | A-60 | B-415 | C-1 | D-2 |
| Example 208 | A-601 | B-413 | C-1 | D-2 |
| Example 209 | A-602 | B-401 | C-1 | D-2 |
| Example 210 | A-602 | B-405 | C-1 | D-2 |
| Example 211 | A-602 | B-409 | C-1 | D-2 |
| Example 212 | A-602 | B-413 | C-1 | D-2 |
| Example 213 | A-602 | B-414 | C-1 | D-2 |
| Example 214 | A-602 | B-415 | C-1 | D-2 |
| Example 215 | A-603 | B-401 | C-1 | D-2 |

TABLE 16-continued

|  | Pigment | Pigment Derivative | Solvent | Resin |
|---|---|---|---|---|
| Example 216 | A-101 | B-1 | C-1 | D-2 |
| Example 217 | A-101 | B-436 | C-1 | D-2 |
| Example 218 | A-101 | B-440 | C-1 | D-2 |
| Example 219 | A-101 | B-444 | C-1 | D-2 |
| Example 220 | A-101 | B-448 | C-1 | D-2 |
| Example 221 | A-101 | B-449 | C-1 | D-2 |
| Example 222 | A-101 | B-450 | C-1 | D-2 |
| Example 223 | A-102 | B-436 | C-1 | D-2 |
| Example 224 | A-103 | B-1 | C-1 | D-2 |
| Example 225 | A-116 | B-436 | C-1 | D-2 |
| Example 226 | A-117 | B-1 | C-1 | D-2 |
| Example 227 | A-118 | B-1 | C-1 | D-2 |
| Example 228 | A-407 | B-436 | C-1 | D-2 |
| Example 229 | A-401 | B-436 | C-1 | D-2 |
| Example 230 | A-413 | B-451 | C-1 | D-2 |
| Example 231 | A-413 | B-455 | C-1 | D-2 |
| Example 232 | A-413 | B-459 | C-1 | D-2 |
| Example 233 | A-413 | B-463 | C-1 | D-2 |
| Example 234 | A-413 | B-467 | C-1 | D-2 |
| Example 235 | A-413 | B-468 | C-1 | D-2 |
| Example 236 | A-413 | B-469 | C-1 | D-2 |
| Example 237 | A-413 | B-470 | C-1 | D-1 |
| Example 238 | A-416 | B-451 | C-1 | D-2 |
| Example 239 | A-419 | B-451 | C-1 | D-2 |
| Example 240 | A-422 | B-451 | C-1 | D-2 |
| Example 241 | A-606 | B-1 | C-1 | D-2 |
| Example 242 | A-606 | B-540 | C-1 | D-2 |

TABLE 17

|  | Pigment | Pigment Derivative | Solvent | Resin |
|---|---|---|---|---|
| Example 243 | A-606 | B-546 | C-1 | D-1 |
| Example 244 | A-16 | B-522 | C-1 | D-2 |
| Example 245 | A-1 | B-524 | C-1 | D-2 |
| Example 246 | A-504 | B-609 | C-1 | D-2 |
| Example 247 | A-504 | B-644 | C-1 | D-1 |
| Example 248 | A-509 | B-614 | C-1 | D-2 |
| Example 249 | A-509 | B-644 | C-1 | D-1 |
| Example 250 | A-512 | B-632 | C-1 | D-2 |
| Example 251 | A-512 | B-642 | C-1 | D-1 |
| Example 252 | A-513 | B-633 | C-1 | D-2 |
| Example 253 | A-513 | B-643 | C-1 | D-1 |
| Example 254 | A-514 | B-614 | C-1 | D-2 |
| Example 255 | A-514 | B-621 | C-1 | D-2 |
| Example 256 | A-514 | B-634 | C-1 | D-2 |
| Example 257 | A-514 | B-638 | C-1 | D-2 |
| Example 258 | A-514 | B-640 | C-1 | D-2 |
| Example 259 | A-514 | B-644 | C-1 | D-1 |
| Example 260 | A-514 | B-679 | C-1 | D-1 |
| Example 261 | A-517 | B-635 | C-1 | D-2 |
| Example 262 | A-517 | B-670 | C-1 | D-1 |
| Example 263 | A-518 | B-636 | C-1 | D-2 |
| Example 264 | A-518 | B-671 | C-1 | D-1 |
| Example 265 | A-531 | B-631 | C-1 | D-2 |
| Example 266 | A-531 | B-646 | C-1 | D-2 |
| Example 267 | A-531 | B-661 | C-1 | D-1 |
| Example 268 | A-534 | B-644 | C-1 | D-1 |
| Example 269 | A-534 | B-654 | C-1 | D-2 |
| Example 270 | A-534 | B-664 | C-1 | D-1 |
| Example 271 | A-539 | B-634 | C-1 | D-2 |
| Example 272 | A-539 | B-644 | C-1 | D-1 |
| Example 273 | A-540 | B-635 | C-1 | D-2 |
| Example 274 | A-540 | B-645 | C-1 | D-1 |
| Example 275 | A-544 | B-634 | C-1 | D-2 |
| Example 276 | A-544 | B-644 | C-1 | D-1 |
| Example 277 | A-545 | B-635 | C-1 | D-2 |
| Example 278 | A-545 | B-645 | C-1 | D-1 |
| Example 279 | A-552 | B-657 | C-1 | D-2 |
| Example 280 | A-552 | B-662 | C-1 | D-1 |

The materials shown above in the tables are as follows.
(Pigment)
A-1 to A-10, A-14 to A-16, A-25, A-30, A-33, A-34, A-38, A-39, A-60, A-76, A-81, A-101, A-106, A-145, A-201, A-203, A-207, A-209, A-257, A-301, A-dpp, and A-ph: compounds having the following structures A-1 to A-10, A-14 to A-16, A-25, A-30, A-33, A-34, A-38, A-39, A-60, A-76, A-81, A-101, A-106, A-145, A-201, A-203, A-207, A-209, A-257, and A-301 are compounds having a solubility of 0 to 0.1 g/L in propylene glycol monomethyl ether acetate and 2-butanol at 25° C. and having an absorption maximum in a wavelength range of 700 to 1200 nm.

A-102, A-103, A-116 to A-118, A-401, A-407, A-413, A-416, A-419, A-422, A-504, A-509, A-512, A-513, A-514, A-517, A-518, A-531, A-534, A-539, A-540, A-544, A-545, A-552, A-601 to A-603, and 606: Compounds A-102, A-103, A-116 to A-118, A-401, A-407, A-413, A-416, A-419, A-422, A-504, A-509, A-512, A-513, A-514, A-517, A-518, A-531, A-534, A-539, A-540, A-544, A-545, A-552, A-601 to A-603, and 606 described above as the specific examples of the compound represented by Formula (PP). These compounds are compounds having a solubility of 0 to 0.1 g/L in propylene glycol monomethyl ether acetate and 2-butanol at 25° C. and having an absorption maximum in a wavelength range of 700 to 1200 nm.

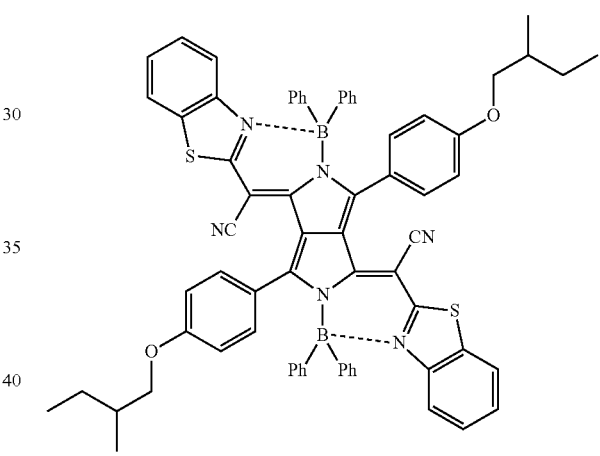

(A-1)

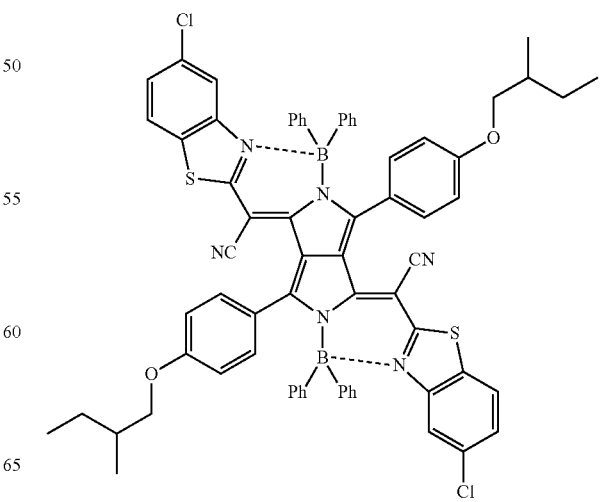

(A-2)

-continued
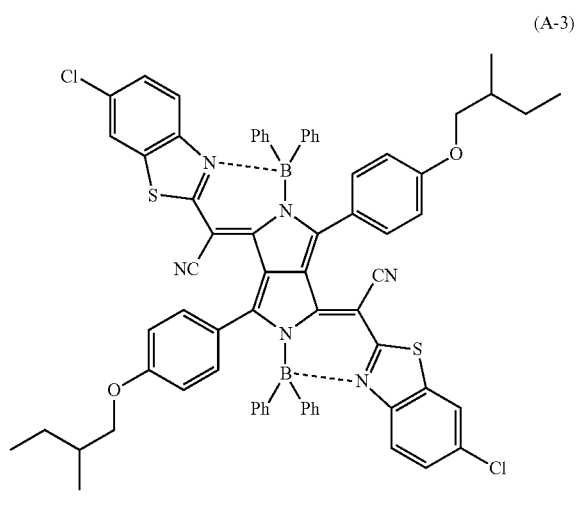
(A-3)
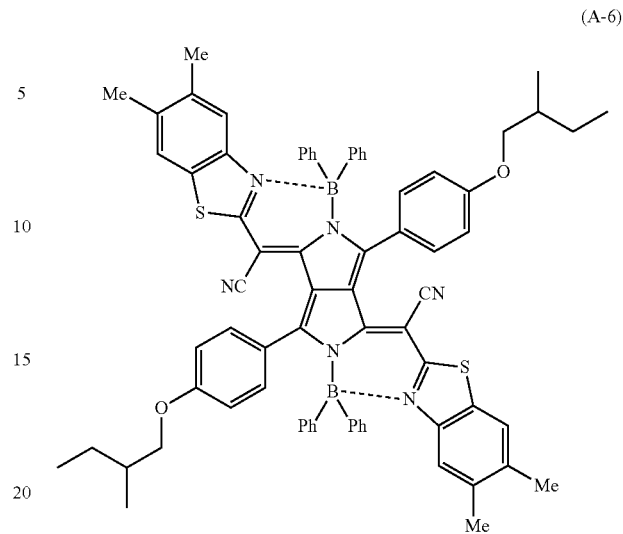
(A-6)
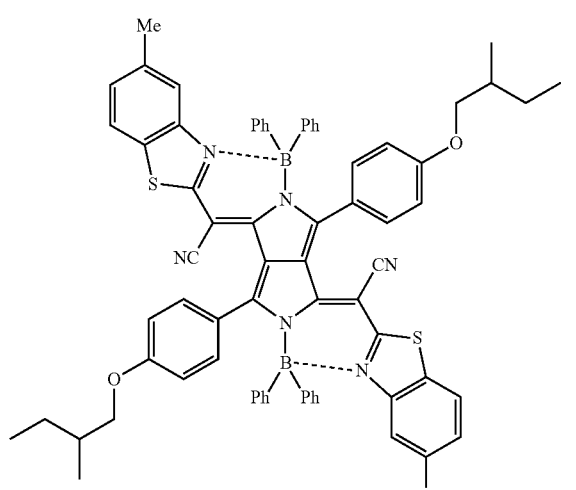
(A-4)
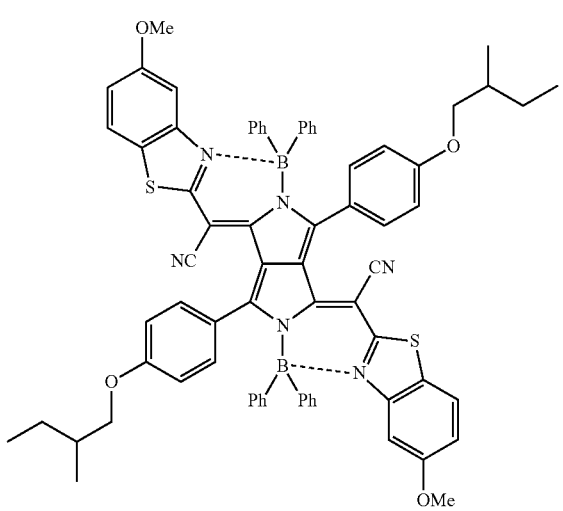
(A-7)
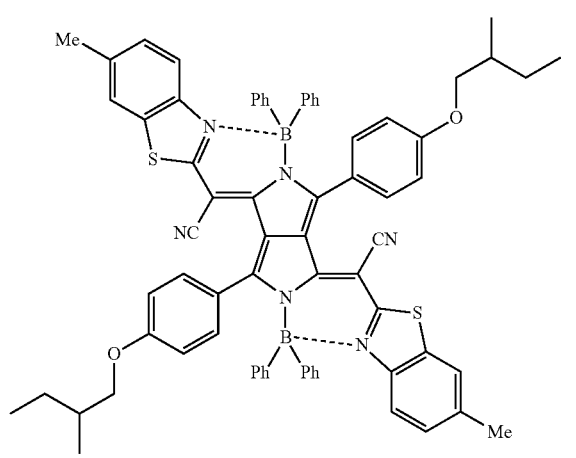
(A-5)
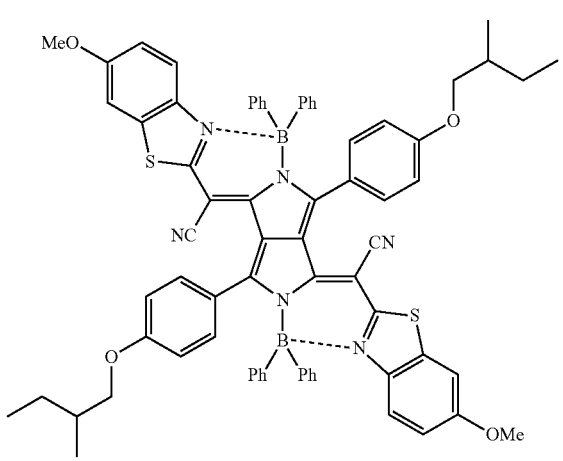
(A-8)

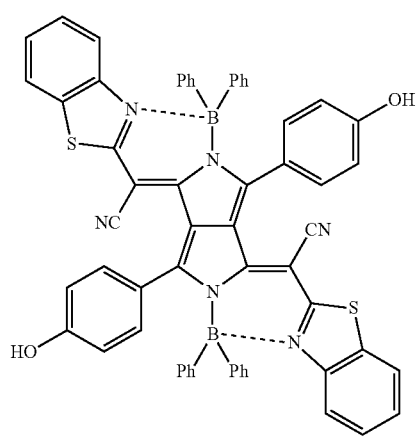
(A-9)
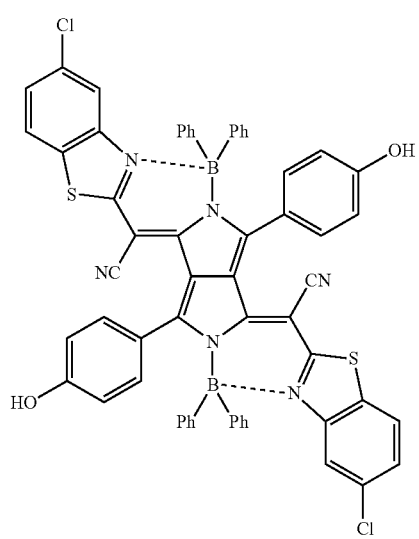
(A-10)
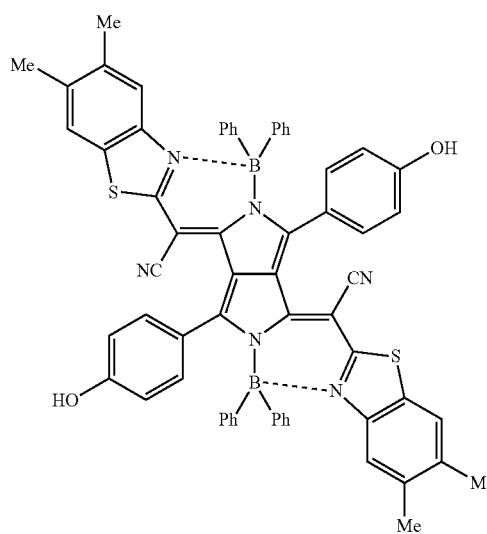
(A-14)
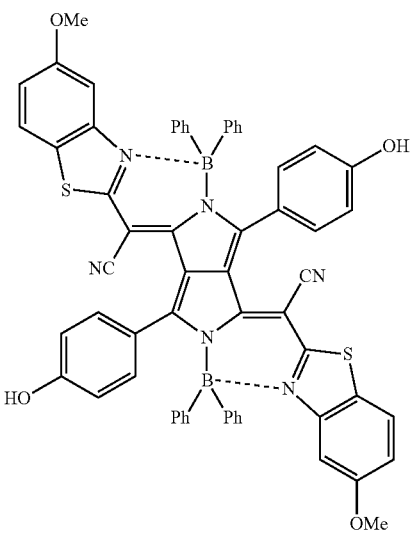
(A-15)
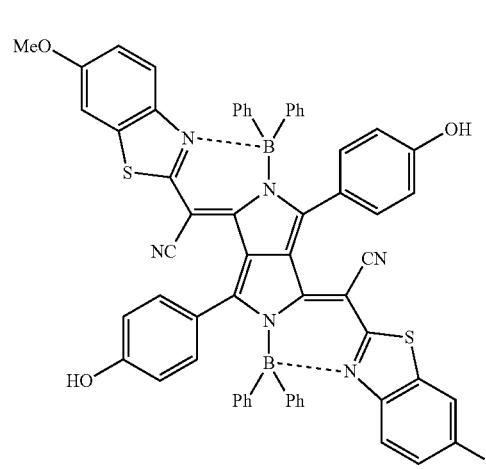
(A-16)
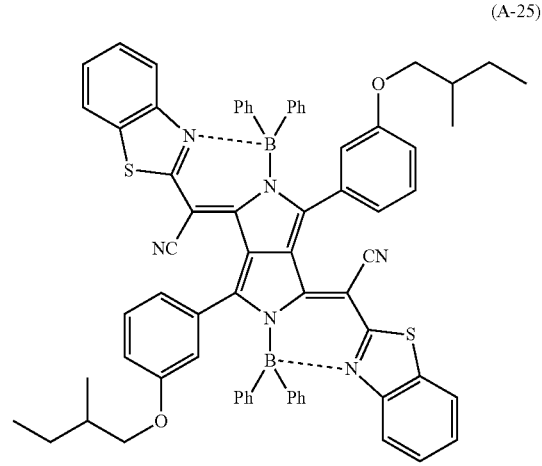
(A-25)

-continued
(A-33)
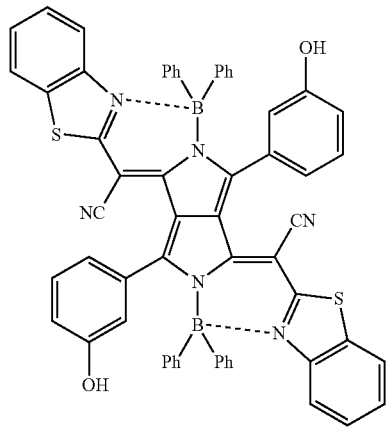
(A-201)
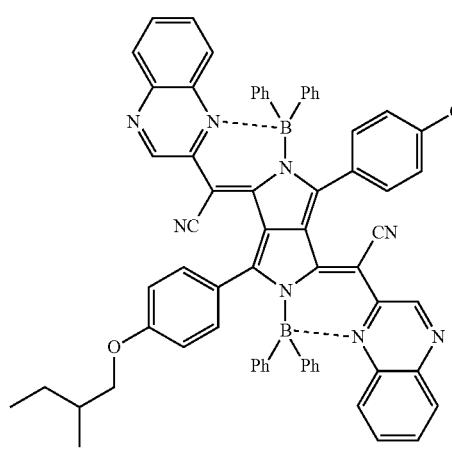
(A-dpp)
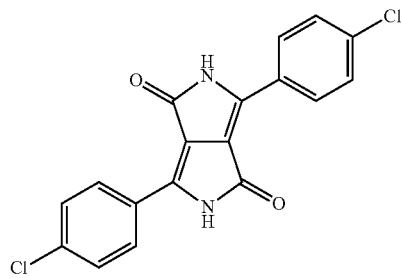
(A-ph)
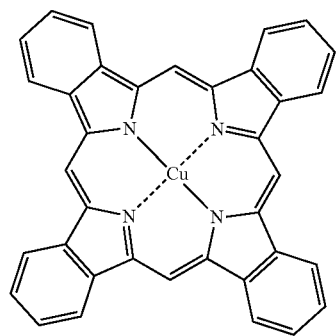
-continued
(A-30)
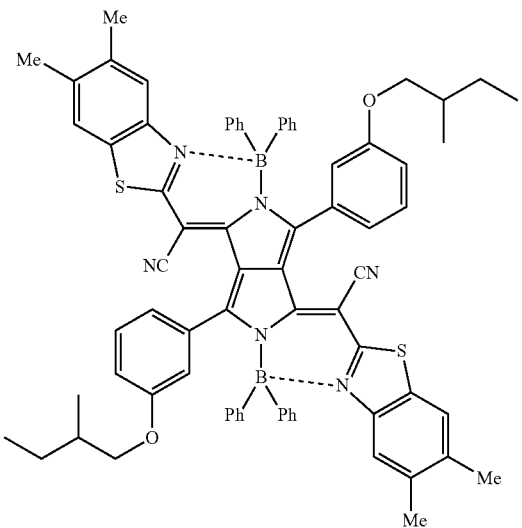
(A-34)
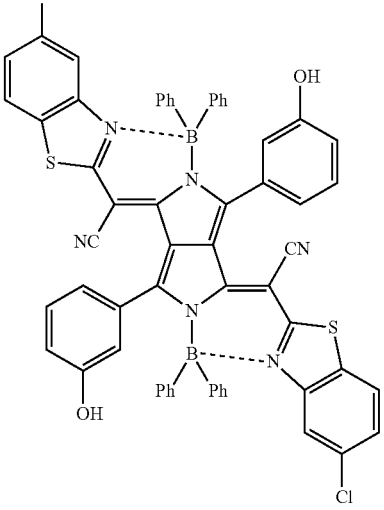
(A-38)
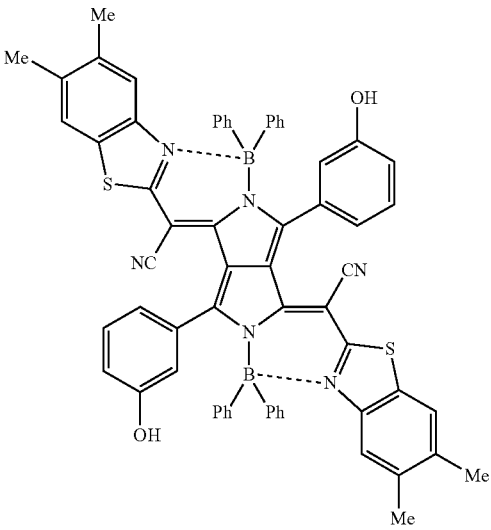

(A-39)
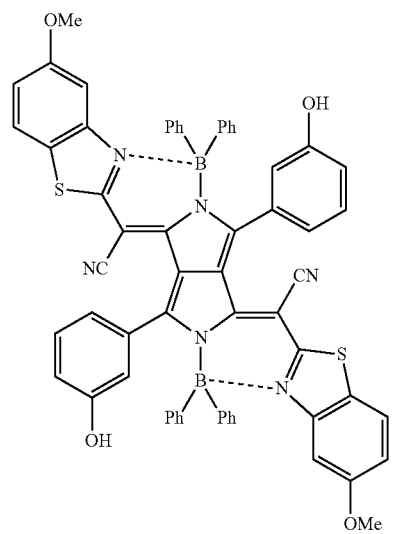
(A-60)
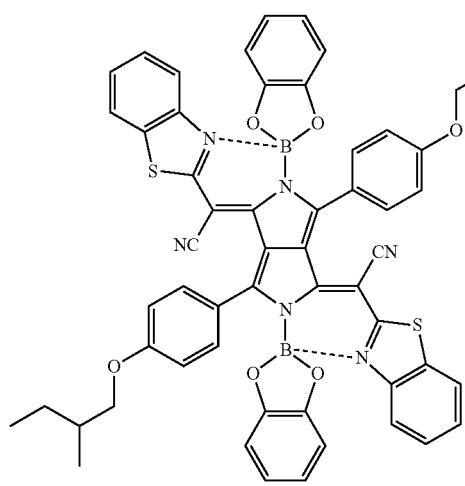
(A-76)
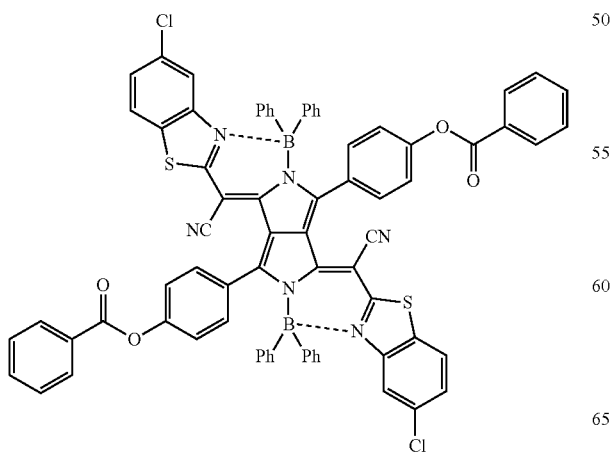
(A-81)
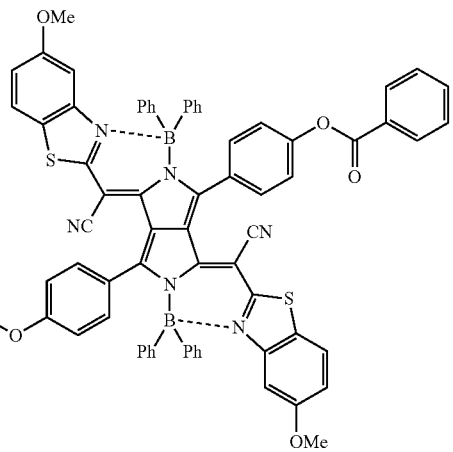
(A-101)
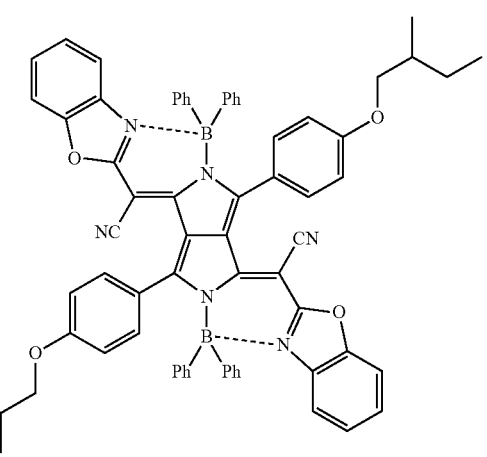
(A-106)
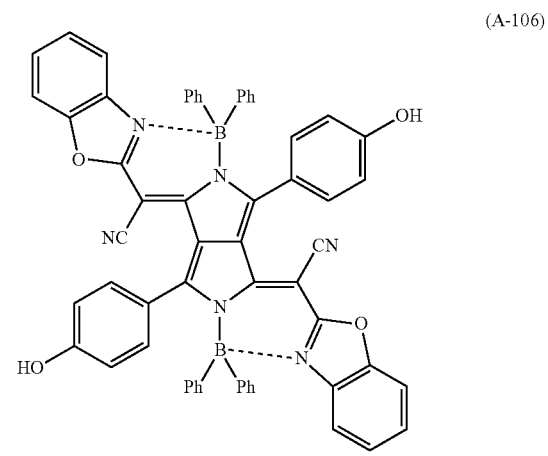

(A-145)
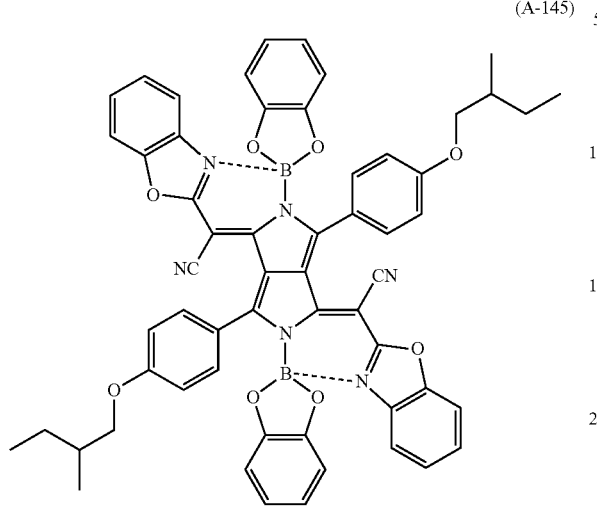
(A-203)
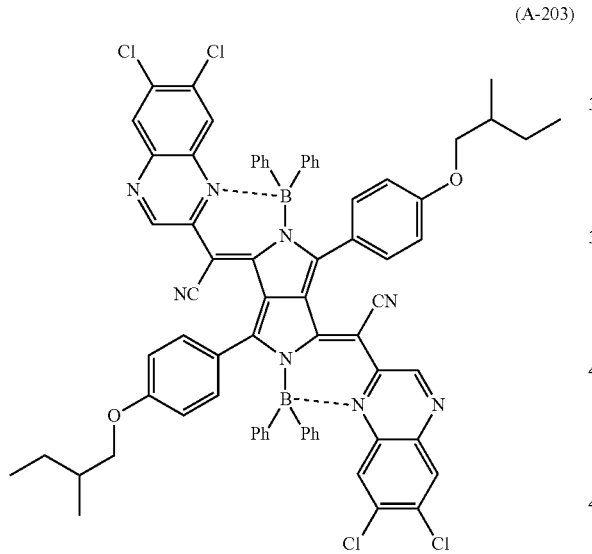
(A-207)
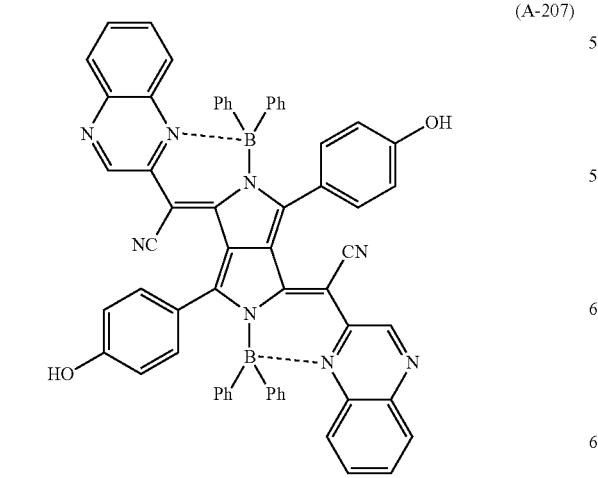
(A-209)
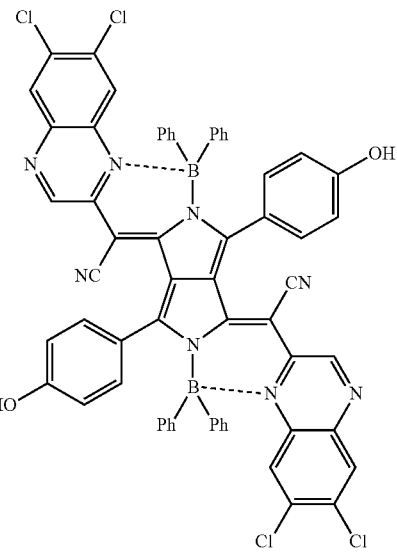
(A-257)
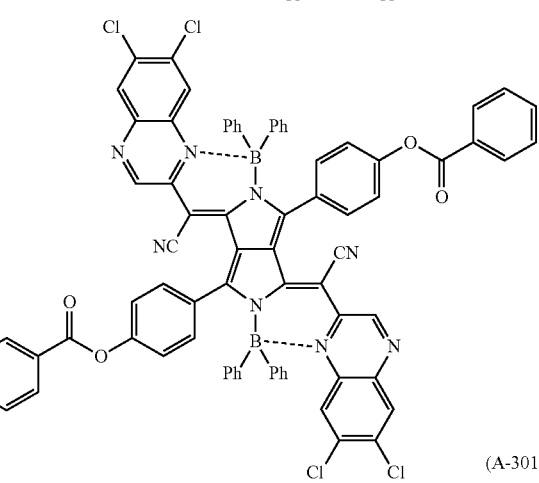
(A-301)
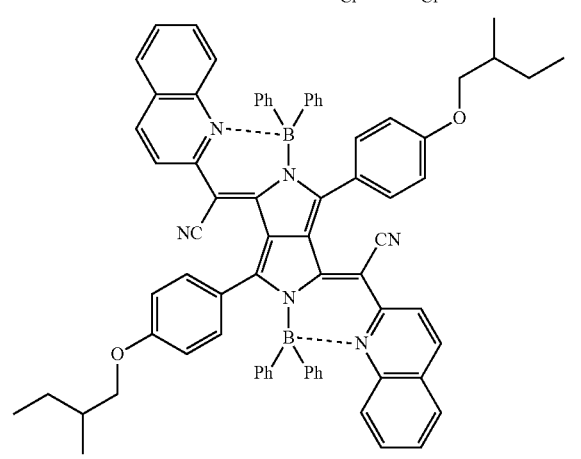
(Pigment Derivative)
B-1, B-7, B-12, B-14, B-16, B-18, B-22, B-28, B-31, B-35, B-101, B-201, B-202, B-322, B-323, B-324, B-325, B-dr-1, and B-dpp: compounds having the following structures. m in B-dr-1 represents 2 on average, and m in B-dpp represents 2 on average. B-1, B-12, B-14, B-16, B-18, B-22, B-28, B-31, B-322, B-323, B-324, B-325, and B-dr-1 are compounds having a solubility of 0 to 0.1 g/L in propylene glycol monomethyl ether acetate and 2-butanol at 25° C.

(B-1)
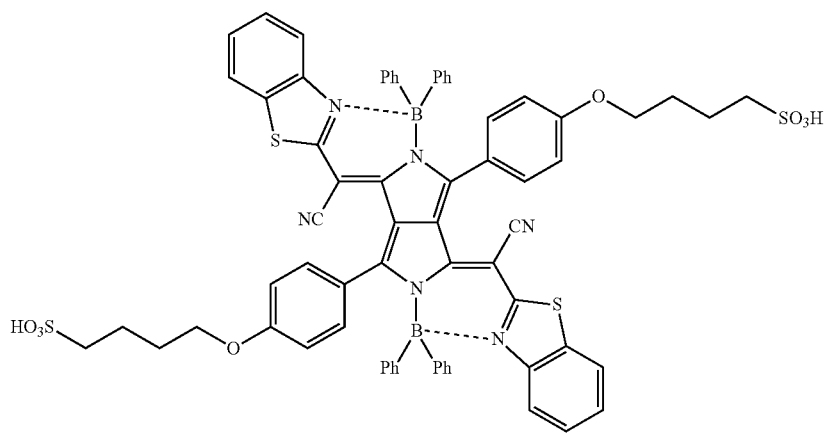
(B-12)
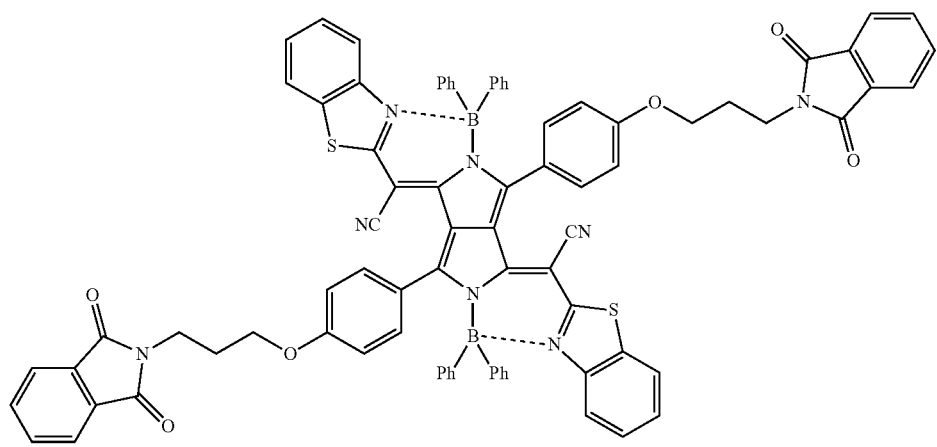
(B-15)
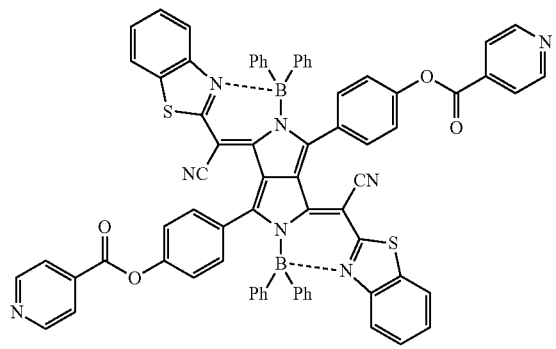
(B-16)
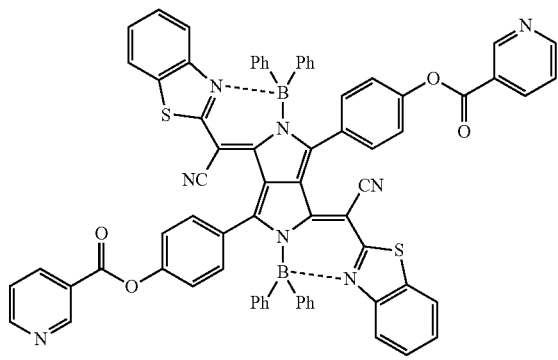

-continued
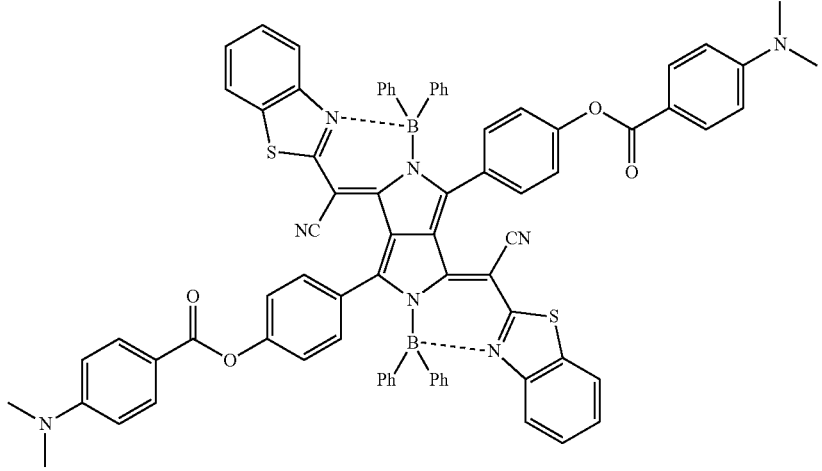
(B-18)
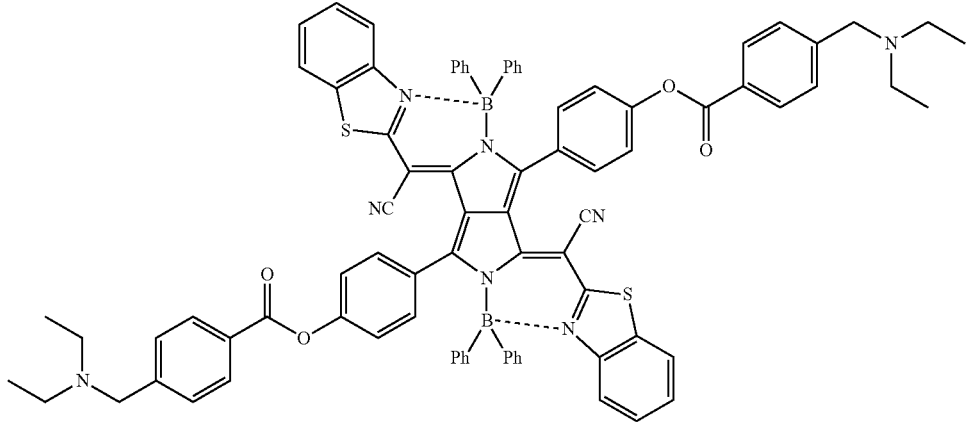
(B-22)
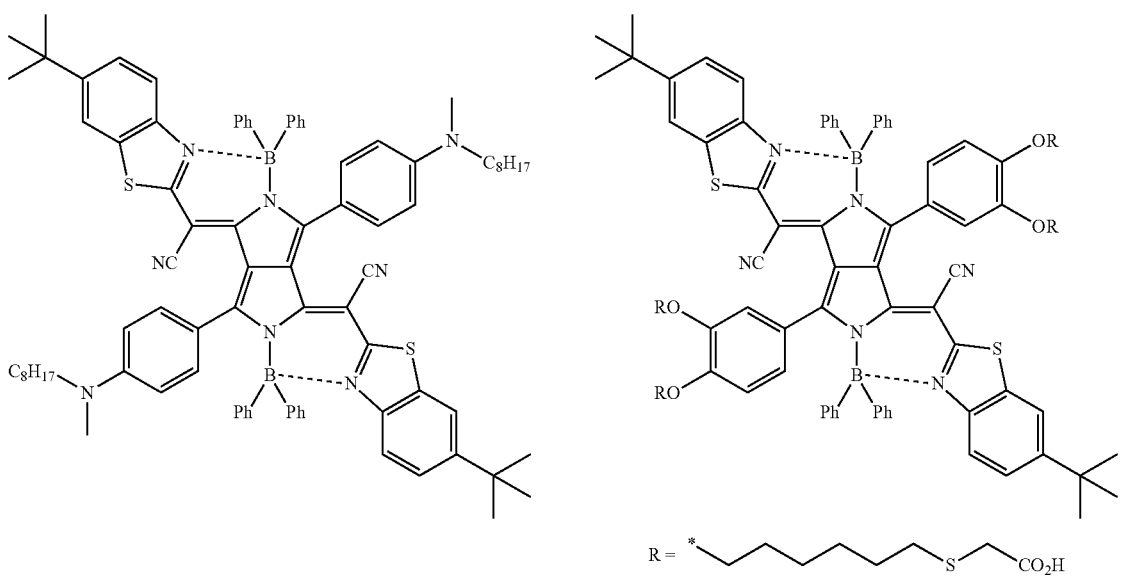
(B-28)
(B-31)
R = *~~~~~~S~CO₂H -continued
(B-322)
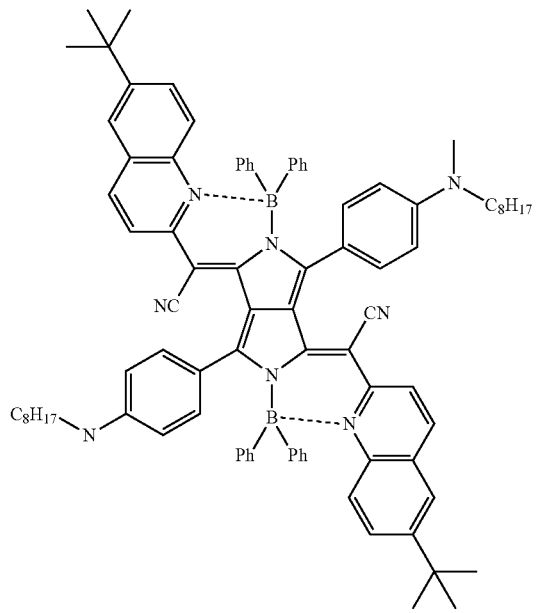
(B-323)
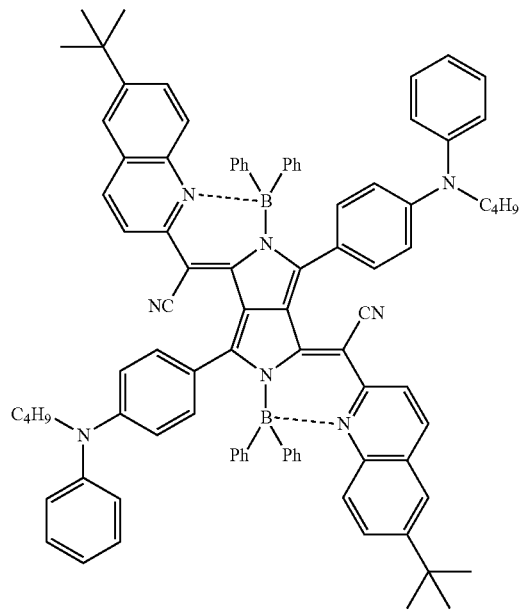
(B-324)
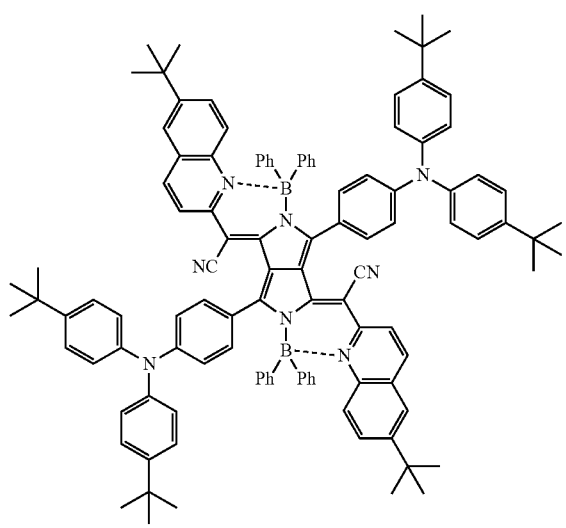
(B-325)
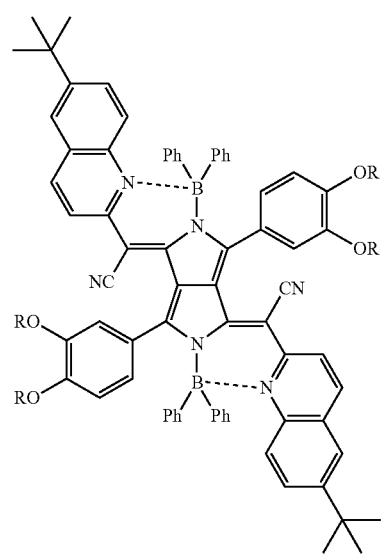

(B-dr-1)
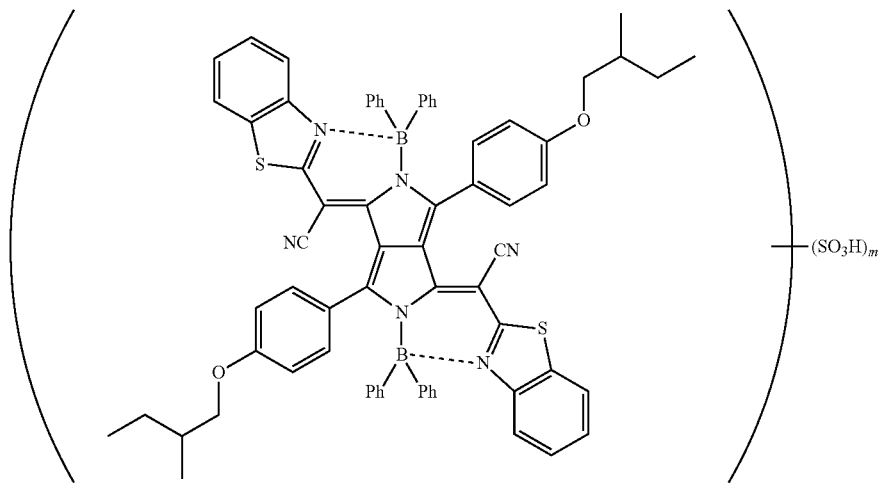
(B-dpp)
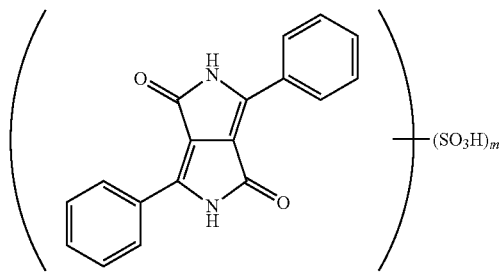
(B-7)
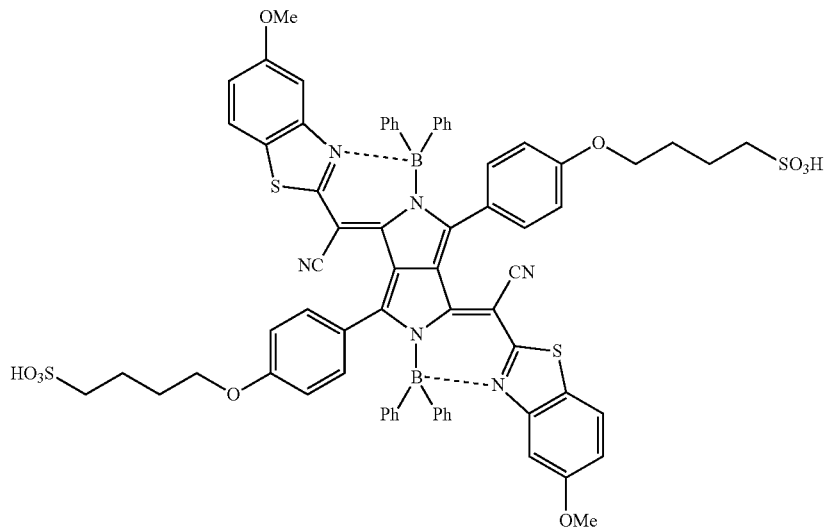

-continued
(B-35)
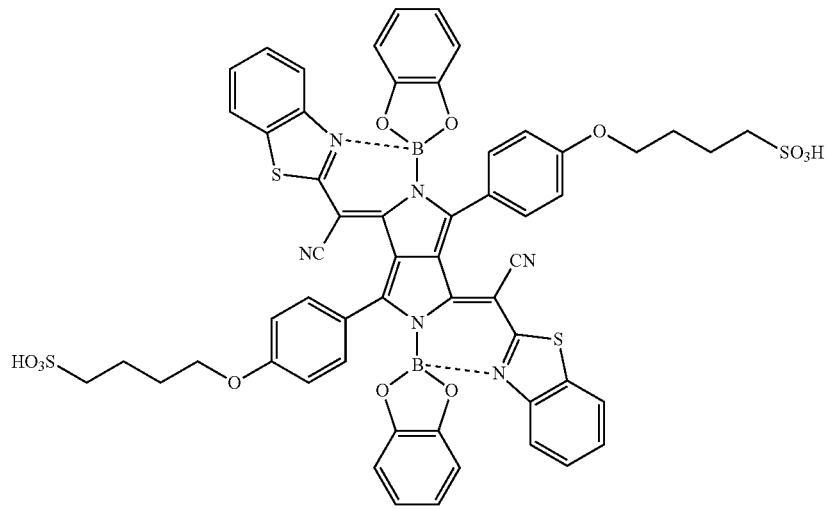
(B-101)
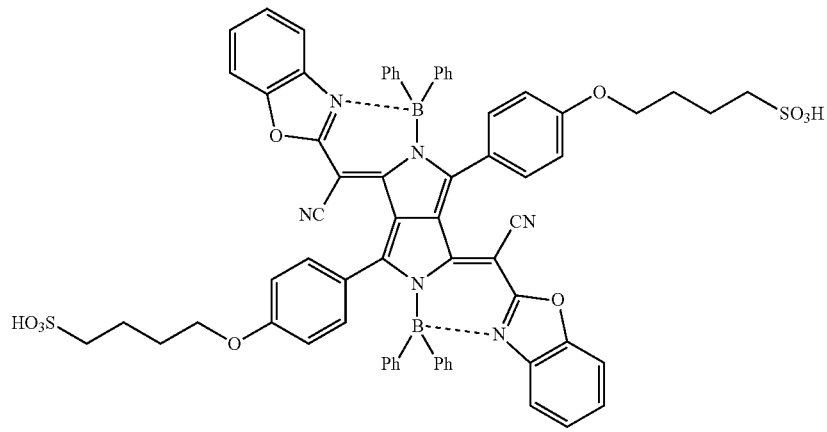
(B-201)
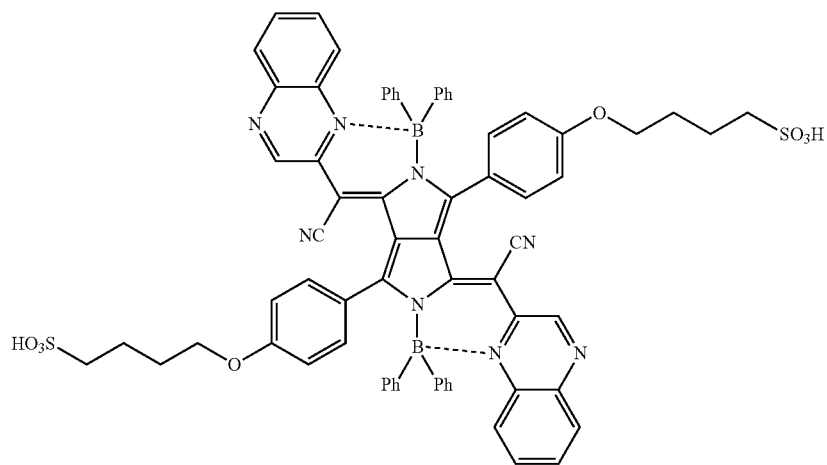

(B-203)

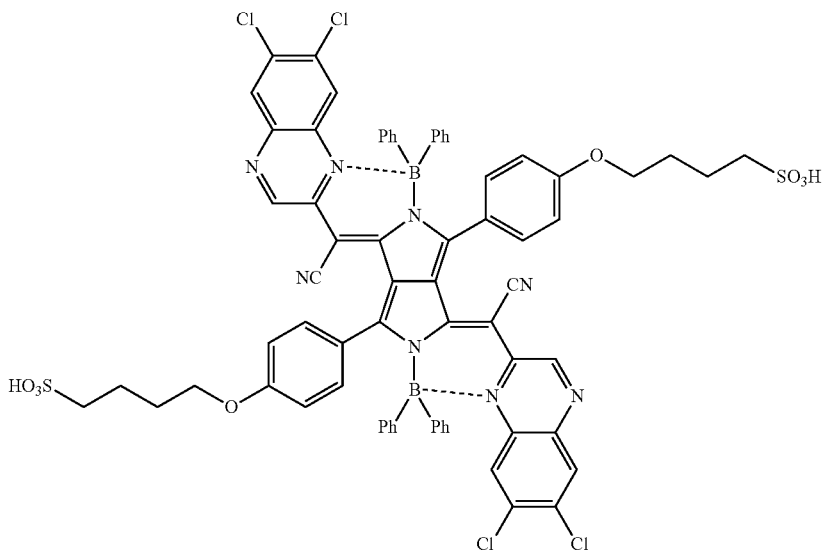

B-401, B-405, B-409, B-413 to B-415, B-436, B-440, B-444, B-448 to B-451, B-455, B-459, B-463, B-467 to B-470, B-522, B-524, B-540, B-546, B-609, B-614, B-621, B-631, B-632, B-633, B-634, B-635, B-636, B-638, B-640, B-642, B-643, B-644, B-645, B-646, B-654, B-657, B-661, B-662, B-664, B-670, B-671, and B-679: compounds B-401, B-405, B-409, B-413 to B-415, B-436, B-440, B-444, B-448 to B-451, B-455, B-459, B-463, B-467 to B-470, B-522, B-524, B-540, B-546, B-609, B-614, B-621, B-631, B-632, B-633, B-634, B-635, B-636, B-638, B-640, B-642, B-643, B-644, B-645, B-646, B-654, B-657, B-661, B-662, B-664, B-670, B-671, and B-679 described above as the specific examples of the compound represented by Formula (1). These compounds are compounds having a solubility of 0 to 0.1 g/L in propylene glycol monomethyl ether acetate and 2-butanol at 25° C.

(Resin)

D-1: a resin having the following structure (acid value=105 mgKOH/g, weight-average molecular weight=8000), a numerical value added to a main chain represents a mass ratio of a repeating unit, a numerical value added to a side chain represents the number of repeating units.

D-2: a resin having the following structure (acid value=32.3 mgKOH/g, amine value=45.0 mgKOH/g, weight-average molecular weight=22900), a numerical value added to a main chain represents a mass ratio of a repeating unit, a numerical value added to a side chain represents the number of repeating units.

(D-1)

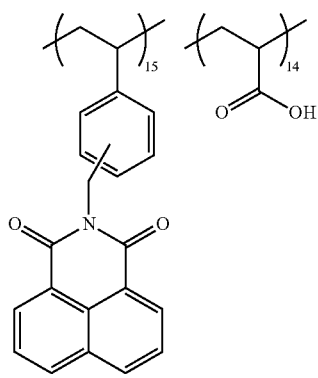

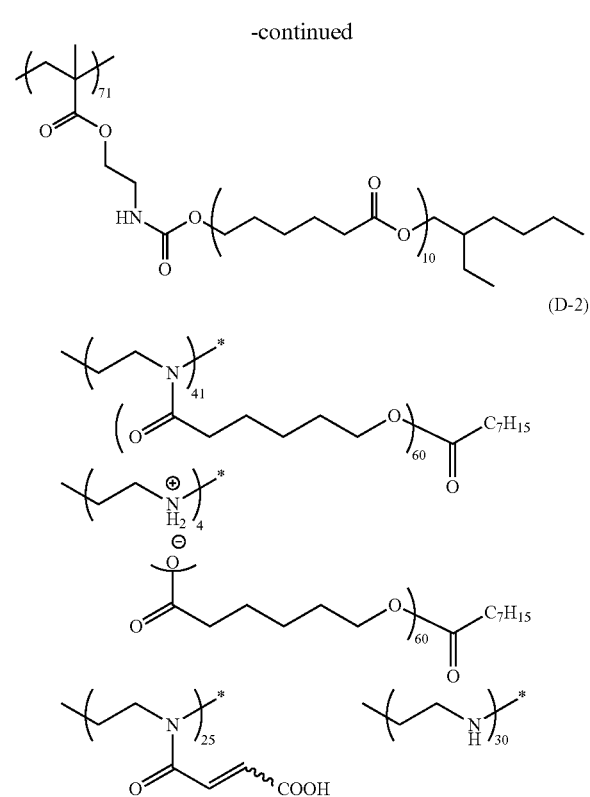

(D-2)

(Solvent)

C-1: propylene glycol monomethyl ether acetate (PG-MEA)

C-2: 2-butanol

C-3: propylene glycol monomethyl ether (PGME)

<Curable Composition>

The following components were mixed with each other to prepare a curable composition.

The composition (dispersion) obtained as described above: 55 parts by mass

Alkali-Soluble Resin (ACRYBASE FF-426, manufactured by Nippon Shokubai Co., Ltd.): 7.0 parts by mass Polymerizable compound (ARONIX M-305, a mixture of pentaerythritol triacrylate and pentaerythritol tetraacrylate, containing 55 to 63 mass % of pentaerythritol triacrylate, manufactured by Toagosei Co., Ltd.): 4.5 parts by mass Photopolymerization initiator (IRGACURE OXE02, manufactured by BASF SE): 0.8 parts by mass Polymerization inhibitor (p-methoxyphenol): 0.001 parts by mass Surfactant (the following mixture (Mw=14000); in the following formula, "%" representing the proportion of a repeating unit is mass %): 0.03 parts by mass

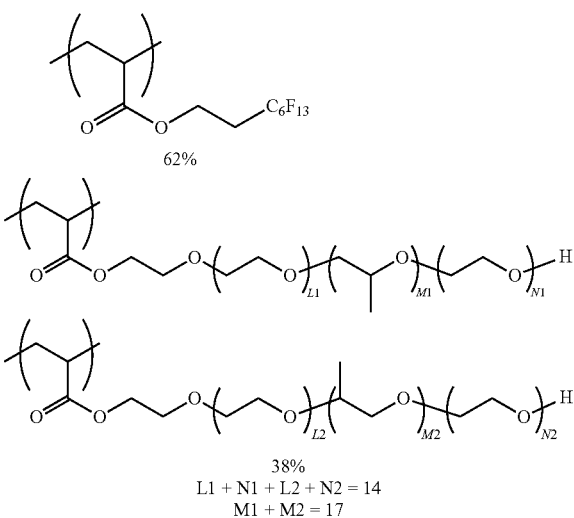

38%
L1 + N1 + L2 + N2 = 14
M1 + M2 = 17

Ultraviolet absorber (UV-503, manufactured by Daito Chemical Co., Ltd.): 1.3 parts by mass Solvent (propylene glycol monomethyl ether acetate): 31 parts by mass <Preparation of Cured Film>

The curable composition was applied to a glass substrate using a spin coating method and then was heated using a hot plate at 100° C. for 2 minutes. As a result, a coating layer was obtained. The obtained coating layer was exposed using an i-ray stepper or an aligner at an exposure dose of 500 mJ/cm². Next, a curing treatment was further performed on the exposed coating layer using a hot plate at 220° C. for 5 minutes. As a result, a cured film having a thickness of 0.7 µm was obtained.

<Dispersibility>
(Viscosity)

Using an E-type viscometer, the viscosity of the composition (dispersion) at 25° C. was measured at a rotation speed of 1000 rpm and was evaluated based on the following criteria.

A: 1 mPa·s to 15 mPa·s
B: higher than 15 mPa·s and 30 mPa·s or lower
C: higher than 30 mPa·s and 100 mPa·s or lower
D: higher than 100 mPa·s (Thixotropy)

Using an E-type viscometer, the viscosity of the composition (dispersion) at 25° C. was measured at a rotation speed of 20 rpm and at a rotation speed of 50 rpm, the viscosity at a rotation speed of 20 rpm/the viscosity at a rotation speed of 50 rpm was defined as a thixotropy index (TI value), and the TI value was evaluated based on the following criteria.

A: the TI value was 1 to 1.3
B: the TI value was higher than 1.3 and 1.5 or lower
C: the TI value was higher than 1.5 and 2 or lower
D: the TI value was higher than 2

(Particle Size)

The volume average particle size of the pigment in the composition (dispersion) was measured using MICROTRAC UPA 150 (manufactured by Nikkiso Co., Ltd.).

A: 5 nm to 50 nm
B: higher than 50 nm and 100 nm or lower
C: higher than 100 nm and 500 nm or lower
D: higher than 500 nm <Change in Visible Transmittance>

Regarding each of a cured film which was formed using a curable composition shown in the following table and a cured film which was formed using a curable composition obtained by excluding only the pigment derivative from the curable composition shown in the following table, a transmittance in a wavelength range of 400 to 650 nm was measured using a spectrophotometer U-4100 (manufactured by Hitachi High-Technologies Corporation). A maximum change in transmittance in a wavelength range of 400 to 650 nm was calculated from the following expression and was evaluated based on the following criteria.

Change in Transmittance=|Transmittance of Cured Film Formed using Curable Composition including Pigment Derivative−Transmittance of Cured Film Formed using Curable Composition Not including Pigment Derivative|

A: the change in transmittance was lower than 5%
B: the change in transmittance was 5% or higher and lower than 10%
C: the change in transmittance was 10% or higher <Heat Resistance>

The cured film was heated using a hot plate at 260° C. for 300 seconds. The transmittance of the cured film in a wavelength range of 400 to 1200 nm was measured before and after heating using a spectrophotometer U-4100 (manufactured by Hitachi High-Technologies Corporation). A maximum change in transmittance in a wavelength range of 400 nm to 1200 nm was calculated from the following expression and was evaluated based on the following criteria.

Change in transmittance=|(Transmittance after Heating−Transmittance before Heating|

A: the change in transmittance was lower than 3%
B: the change in transmittance was 3% or higher and lower than 5%
C: the change in transmittance was 5% or higher <Light Fastness>

The cured film was set in a fading tester (100000 lux) equipped with a super xenon lamp and was irradiated with light for 50 hours under conditions where an ultraviolet cut filter was not used. Next, the transmission spectrum of the cured film after the irradiation was measured using a spectrophotometer U-4100 (manufactured by Hitachi High-Technologies Corporation). Regarding an absorbance at an absorption maximum, a residual rate was calculated from the following expression and was evaluated based on the following criteria.

Residual Rate (%)={(Absorbance after Irradiation)÷(Absorbance before Irradiation)}×100

A: the residual rate was higher than 95% and 100% or lower
B: the residual rate was higher than 80% and 95% or lower
C: the residual rate was 80% or lower

TABLE 18

| | Used Composition | Dispersibility | | | Change in Visible Transmittance | Heat Resistance | Light Fastness |
| --- | --- | --- | --- | --- | --- | --- | --- |
| | | Viscosity | Thixotropy | Particle Size | | | |
| Example 101 | Example 1 | A | A | A | A | A | A |
| Example 102 | Example 2 | A | A | A | A | A | A |
| Example 103 | Example 3 | A | A | B | A | A | A |
| Example 104 | Example 4 | A | A | A | A | A | A |
| Example 105 | Example 5 | A | A | B | A | A | A |
| Example 106 | Example 6 | A | A | A | A | A | A |
| Example 107 | Example 7 | A | A | A | A | A | A |
| Example 108 | Example 8 | A | A | B | A | A | A |
| Example 109 | Example 9 | A | A | A | A | A | A |
| Example 110 | Example 10 | A | A | A | A | A | A |
| Example 111 | Example 11 | A | A | A | A | A | A |
| Example 112 | Example 12 | A | A | A | A | A | A |
| Example 113 | Example 13 | A | A | A | A | A | A |
| Example 114 | Example 14 | A | A | A | A | A | A |
| Example 115 | Example 15 | A | A | A | A | A | A |
| Example 116 | Example 16 | A | A | A | A | A | A |
| Example 117 | Example 17 | C | C | C | A | A | A |
| Example 118 | Example 18 | C | C | C | A | A | A |
| Example 119 | Example 19 | A | A | A | A | A | A |
| Example 120 | Example 20 | C | C | C | A | A | A |
| Example 121 | Example 21 | B | B | B | A | A | A |
| Example 122 | Example 22 | B | B | B | A | A | A |
| Example 123 | Example 23 | B | B | B | A | A | A |
| Example 124 | Example 24 | A | A | B | A | A | A |
| Example 125 | Example 25 | B | B | B | A | A | A |
| Example 126 | Example 26 | B | B | B | A | A | A |
| Example 127 | Example 27 | B | B | B | A | A | A |
| Example 128 | Example 28 | B | B | B | A | A | A |
| Example 129 | Example 29 | B | B | B | A | A | A |
| Example 130 | Example 30 | B | B | B | A | A | A |
| Example 131 | Example 31 | B | B | B | A | A | A |
| Example 132 | Example 32 | A | A | A | A | A | A |
| Comparative Example 101 | Comparative Example 1 | D | D | D | — | A | A |
| Comparative Example 102 | Comparative Example 2 | C | C | C | C | A | A |
| Comparative Example 103 | Comparative Example 3 | B | B | B | C | A | A |
| Comparative Example 104 | Comparative Example 4 | D | D | D | — | A | B |

TABLE 19

| | Used Composition | Dispersibility | | | Change in Visible Transmittance | Heat Resistance | Light Fastness |
| --- | --- | --- | --- | --- | --- | --- | --- |
| | | Viscosity | Thixotropy | Particle Size | | | |
| Example 141 | Example 41 | A | A | A | A | A | A |
| Example 142 | Example 42 | A | A | A | A | A | A |
| Example 143 | Example 43 | B | B | B | A | A | A |
| Example 144 | Example 44 | A | A | A | A | A | A |
| Example 145 | Example 45 | C | C | C | A | A | A |
| Example 146 | Example 46 | B | B | B | A | A | A |
| Example 147 | Example 47 | B | B | B | A | A | A |
| Example 148 | Example 48 | B | B | B | A | A | A |
| Example 149 | Example 49 | B | B | B | A | A | A |
| Example 150 | Example 50 | C | C | C | A | A | A |
| Example 151 | Example 51 | C | C | C | A | A | A |
| Example 152 | Example 52 | C | C | C | A | A | A |
| Example 153 | Example 53 | B | B | B | A | A | A |
| Example 154 | Example 54 | B | B | B | A | A | A |
| Example 155 | Example 55 | C | C | C | A | A | A |
| Example 156 | Example 56 | C | C | C | A | A | A |
| Example 157 | Example 57 | C | C | C | A | A | A |
| Example 158 | Example 58 | C | C | C | A | A | A |

TABLE 19-continued

| | Used Composition | Dispersibility | | | Change in Visible Transmittance | Heat Resistance | Light Fastness |
|---|---|---|---|---|---|---|---|
| | | Viscosity | Thixotropy | Particle Size | | | |
| Example 159 | Example 59 | C | C | C | A | A | A |
| Example 160 | Example 60 | C | C | C | A | A | A |
| Example 161 | Example 61 | A | A | A | A | A | A |
| Example 162 | Example 62 | B | B | B | A | A | A |
| Example 163 | Example 63 | A | A | A | A | A | A |
| Example 164 | Example 64 | A | A | A | A | A | A |
| Example 165 | Example 65 | A | A | A | A | A | A |
| Example 166 | Example 66 | A | A | A | A | A | A |
| Example 167 | Example 67 | A | A | A | A | A | A |
| Example 168 | Example 68 | A | A | A | A | A | A |
| Comparative Example 111 | Comparative Example 11 | D | D | D | — | A | A |
| Comparative Example 112 | Comparative Example 12 | D | D | D | C | A | A |
| Comparative Example 113 | Comparative Example 13 | D | D | D | C | A | A |
| Comparative Example 114 | Comparative Example 14 | D | D | D | — | A | B |

TABLE 20

| | Used Composition | Dispersibility | | | Change in Visible Transmittance | Heat Resistance | Light Fastness |
|---|---|---|---|---|---|---|---|
| | | Viscosity | Thixotropy | Particle Size | | | |
| Example 301 | Example 201 | B | B | B | A | A | A |
| Example 302 | Example 202 | B | B | B | A | A | A |
| Example 303 | Example 203 | A | A | A | A | A | A |
| Example 304 | Example 204 | A | A | A | A | A | A |
| Example 305 | Example 205 | B | B | B | A | A | A |
| Example 306 | Example 206 | A | A | A | A | A | A |
| Example 307 | Example 207 | A | A | A | A | A | A |
| Example 308 | Example 208 | B | B | B | A | A | A |
| Example 309 | Example 209 | B | B | B | A | A | A |
| Example 310 | Example 210 | A | A | A | A | A | A |
| Example 311 | Example 211 | A | A | A | A | A | A |
| Example 312 | Example 212 | B | B | B | A | A | A |
| Example 313 | Example 213 | A | A | A | A | A | A |
| Example 314 | Example 214 | A | A | A | A | A | A |
| Example 315 | Example 215 | B | B | B | A | A | A |
| Example 316 | Example 216 | A | A | A | A | A | A |
| Example 317 | Example 217 | B | B | B | A | A | A |
| Example 318 | Example 218 | A | A | A | A | A | A |
| Example 319 | Example 219 | A | A | A | A | A | A |
| Example 320 | Example 220 | B | B | B | A | A | A |
| Example 321 | Example 221 | A | A | A | A | A | A |
| Example 322 | Example 222 | A | A | A | A | A | A |
| Example 323 | Example 223 | B | B | B | A | A | A |
| Example 324 | Example 224 | A | A | A | A | A | A |
| Example 325 | Example 225 | B | B | B | A | A | A |
| Example 326 | Example 226 | A | A | A | A | A | A |
| Example 327 | Example 227 | A | A | A | A | A | A |
| Example 328 | Example 228 | B | B | B | A | A | A |
| Example 329 | Example 229 | B | B | B | A | A | A |
| Example 330 | Example 230 | A | A | A | A | A | A |
| Example 331 | Example 231 | A | A | A | A | A | A |
| Example 332 | Example 232 | A | A | A | A | A | A |
| Example 333 | Example 233 | A | A | A | A | A | A |
| Example 334 | Example 234 | A | A | A | A | A | A |
| Example 335 | Example 235 | A | A | A | A | A | A |
| Example 336 | Example 236 | A | A | A | A | A | A |
| Example 337 | Example 237 | A | A | A | A | A | A |
| Example 338 | Example 238 | A | A | A | A | A | A |
| Example 339 | Example 239 | A | A | A | A | A | A |
| Example 340 | Example 240 | A | A | A | A | A | A |
| Example 341 | Example 241 | C | C | C | A | A | A |
| Example 342 | Example 242 | B | B | B | A | A | A |

TABLE 21

| | Used Composition | Viscosity | Dispersibility Thixotropy | Particle Size | Change in Visible Transmittance | Heat Resistance | Light Fastness |
|---|---|---|---|---|---|---|---|
| Example 343 | Example 243 | B | B | B | A | A | A |
| Example 344 | Example 244 | B | B | B | A | A | A |
| Example 345 | Example 245 | A | A | A | A | A | A |
| Example 346 | Example 246 | A | A | A | A | A | A |
| Example 347 | Example 247 | A | A | A | A | A | A |
| Example 348 | Example 248 | A | A | A | A | A | A |
| Example 349 | Example 249 | A | A | A | A | A | A |
| Example 350 | Example 250 | A | A | A | A | A | A |
| Example 351 | Example 251 | A | A | A | A | A | A |
| Example 352 | Example 252 | A | A | A | A | A | A |
| Example 353 | Example 253 | A | A | A | A | A | A |
| Example 354 | Example 254 | A | A | A | A | A | A |
| Example 355 | Example 255 | B | B | B | A | A | A |
| Example 356 | Example 256 | A | A | A | A | A | A |
| Example 357 | Example 257 | A | A | A | A | A | A |
| Example 358 | Example 258 | A | A | A | A | A | A |
| Example 359 | Example 259 | A | A | A | A | A | A |
| Example 360 | Example 260 | A | A | A | A | A | A |
| Example 361 | Example 261 | A | A | A | A | A | A |
| Example 362 | Example 262 | A | A | A | A | A | A |
| Example 363 | Example 263 | A | A | A | A | A | A |
| Example 364 | Example 264 | A | A | A | A | A | A |
| Example 365 | Example 265 | B | B | B | A | A | A |
| Example 366 | Example 266 | A | A | A | A | A | A |
| Example 367 | Example 267 | A | A | A | A | A | A |
| Example 368 | Example 268 | B | B | B | A | A | A |
| Example 369 | Example 269 | A | A | A | A | A | A |
| Example 370 | Example 270 | A | A | A | A | A | A |
| Example 371 | Example 271 | A | A | A | A | A | A |
| Example 372 | Example 272 | A | A | A | A | A | A |
| Example 373 | Example 273 | A | A | A | A | A | A |
| Example 374 | Example 274 | A | A | A | A | A | A |
| Example 375 | Example 275 | A | A | A | A | A | A |
| Example 376 | Example 276 | A | A | A | A | A | A |
| Example 377 | Example 277 | A | A | A | A | A | A |
| Example 378 | Example 278 | A | A | A | A | A | A |
| Example 379 | Example 279 | A | A | A | A | A | A |
| Example 380 | Example 280 | A | A | A | A | A | A |

As can be clearly seen from the results, in Examples, the pigment dispersibility was excellent, the change in visible transmittance was small, and the color in a visible range was excellent. Further, a cured film having excellent heat resistance and light fastness was able to be formed.

On the other hand, in Comparative Examples, at least either the pigment dispersibility or the change in visible transmittance depending on whether or not the pigment derivative was present was poor.

(Evaluation of Photolithographic Properties)

Each of the curable compositions according to Examples 101 to 116, 119, and 132 obtained as described above was applied to a silicon wafer with a undercoat layer using a spin coating method such that the thickness after the application was 0.7 μm, and then was heated using a hot plate at 100° C. for 2 minutes. As a result, a curable composition layer was obtained. Next, using an i-ray stepper exposure device FPA-3000 i5+(manufactured by Canon Corporation), the obtained curable composition layer was exposed (an optimum exposure dose was selected such that the line width was 1.1 μm) through a mask having a 1.1 μm×1.1 μm Bayer pattern. Next, puddle development was performed on the exposed curable composition layer at 23° C. for 60 seconds using a tetramethylammonium hydroxide (TMAH) 0.3 mass % aqueous solution. Next, the silicon wafer was rinsed by spin showering and was washed with pure water. As a result, a pattern was obtained. The amount of residues remaining on the underlayer of the obtained pattern was evaluated by binarization of the image based on the following criteria.

A: the amount of the residues was lower than 1% with respect to the total area of the underlayer B: the amount of the residues was higher than 1% and 3% or lower with respect to the total area of the underlayer C: the amount of the residues was higher than 3% with respect to the total area of the underlayer It was found that all the patterns obtained using the curable compositions according to Examples 101 to 116, 119, and 132 were evaluated as A and were suitable for photolithography.

In Examples, even in a case where ARONIX M-510 (manufactured by Toagosei Co., Ltd.) or KAYARAD DPHA (manufactured by Nippon Kayaku Co., Ltd.) was used as the polymerizable compound instead of ARONIX M-305 (manufactured by Toagosei Co., Ltd.), the same effects were obtained.

In addition, in Examples, even in a case where KAYARAD DPHA (manufactured by Nippon Kayaku Co., Ltd.) and NK ESTER A-DPH-12E (manufactured by Shin-Nakamura Chemical Co., Ltd. were used in combination at a mass ratio of 1:1 as the polymerizable compound instead of ARONIX M-305 (manufactured by Toagosei Co., Ltd.), the same effects were obtained.

In addition, in Examples, even in a case where NK ESTER A-TMMT (manufactured by Shin-Nakamura Chemical Co., Ltd.) and NK ESTER A-DPH-12E (manufactured by Shin-Nakamura Chemical Co., Ltd. were used in combination at a mass ratio of 1:1 as the polymerizable compound instead of ARONIX M-305 (manufactured by Toagosei Co., Ltd.), the same effects were obtained.

In addition, in Examples, even in a case where ARONIX TO-2349 (manufactured by Toagosei Co., Ltd.) and NK ESTER A-DPH-12E (manufactured by Shin-Nakamura Chemical Co., Ltd. were used in combination at a mass ratio of 1:1 as the polymerizable compound instead of ARONIX M-305 (manufactured by Toagosei Co., Ltd.), the same effects were obtained.

In Examples, even in a case where ACRYCURE RD-F8 (manufactured by Nippon Shokubai Co., Ltd.) or ACRYBASE FFS-6752 (manufactured by Nippon Shokubai Co., Ltd.) was used as the alkali-soluble resin instead of ACRYBASE FF-426 (manufactured by Nippon Shokubai Co., Ltd.), the same effects were obtained.

In Examples, even in a case where a pigment having undergone kneading and polishing using the following method was used as the pigment, the same effects were obtained.

5.3 parts by mass of the crude pigment after the synthesis, 74.7 parts by mass of a milling agent, and 14 parts by mass of a binder were added to a LABO PLASTOMILL (manufactured by Toyo Seiki Seisaku-sho, Ltd.) and were kneaded for 2 hours while controlling the temperature such that the temperature of a kneaded material in the device was 70° C. As the milling agent, a neutral anhydrous mirabilite E (average particle size (a 50% diameter (D50) in terms of volume))=20 μm, manufactured by Mitajiri Chemical Industry Co., Ltd.) was used. As the binder, diethylene glycol was used. The kneaded material having undergone kneading and polishing was washed with 10 L of water at 24° C. to remove the milling agent and the binder and then was treated using a heating oven at 80° C. for 24 hours.

Test Example 2

(Preparation of Curable Composition for Forming Infrared Transmitting Filter)

The following components were mixed and stirred, and the obtained mixture was filtered through a nylon filter (manufactured by Pall Corporation) having a pore size of 0.45 μm to prepare a curable composition for forming an infrared transmitting filter.

(Composition 101)

| | |
|---|---|
| Composition of Example 12 | 22.67 parts by mass |
| Pigment Dispersion 1-1 | 11.33 parts by mass |
| Pigment Dispersion 1-2 | 22.67 parts by mass |
| Pigment Dispersion 1-3 | 10.34 parts by mass |
| Pigment Dispersion 1-4 | 6.89 parts by mass |
| Polymerizable compound (ARONIX M-305, manufactured by Toagosei Co., Ltd.) | 1.37 parts by mass |
| Resin 101 | 3.52 parts by mass |
| Photopolymerization initiator (IRGACURE OXE01, manufactured by BASF SE) | 0.86 parts by mass |
| Surfactant 101 | 0.42 parts by mass |
| Polymerization inhibitor (p-methoxyphenol) | 0.001 parts by mass |
| PGMEA | 19.93 parts by mass |

Resin 101: a resin having the following structure (Mw=40000, a numerical value added to a main chain represents a mass ratio of a repeating unit)

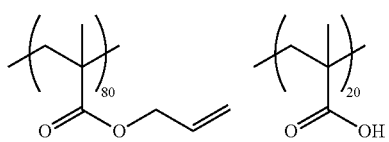

Surfactant 101: the following mixture (Mw=14000, in the following formula, "%" representing the proportion of a repeating unit is mass %)

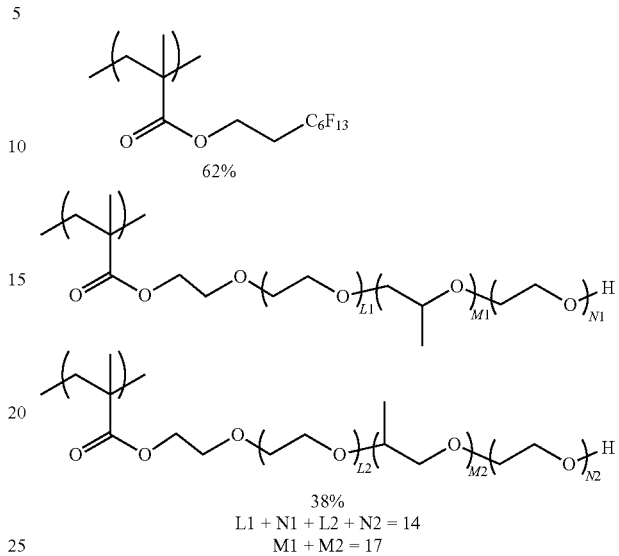

38%
L1 + N1 + L2 + N2 = 14
M1 + M2 = 17

(Pigment Dispersion 1-1)

A mixed solution having a composition shown below was mixed and dispersed using a beads mill (a high-pressure disperser with a pressure reducing mechanism, NANO-3000-10 (manufactured by Nippon BEE Chemical Co., Ltd.)) with zirconia beads having a diameter of 0.3 mm. This way, pigment dispersions were prepared.

| | |
|---|---|
| C.I. Pigment Red | 13.5 parts by mass |
| Resin 11 | 2 parts by mass |
| Resin 12 | 2 parts by mass |
| PGMEA | 82.5 parts by mass |

Resin 11: a resin having the following structure (Mw=7950, a numerical value added to a main chain represents a mass ratio of a repeating unit, a numerical value added to a side chain represents the number of repeating units)

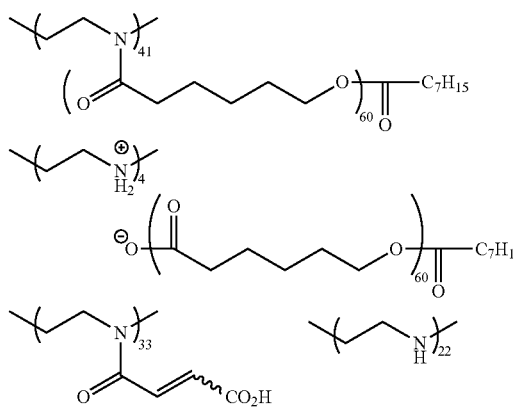

Resin 12: a resin having the following structure (Mw=12000, a numerical value added to a main chain represents a mass ratio of a repeating unit)

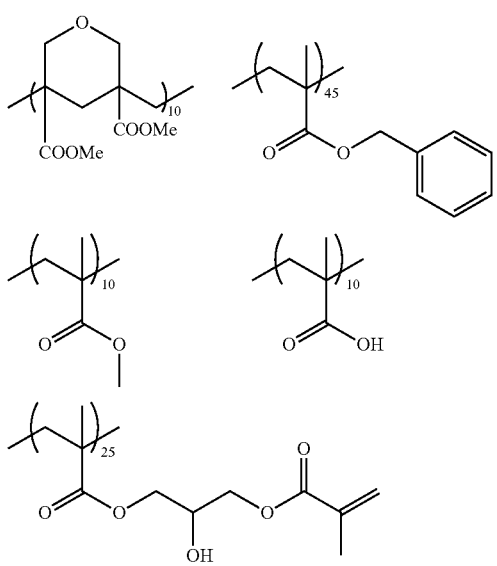

(Pigment Dispersion 1-2)

A mixed solution having a composition shown below was mixed and dispersed using a beads mill (a high-pressure disperser with a pressure reducing mechanism, NANO-3000-10 (manufactured by Nippon BEE Chemical Co., Ltd.)) with zirconia beads having a diameter of 0.3 mm. This way, pigment dispersions were prepared.

| C.I. Pigment Blue 15:6 | 13.5 parts by mass |
| Resin 13 | 4 parts by mass |
| PGMEA | 82.5 parts by mass |

Resin 13: a resin having the following structure (Mw=30000, a numerical value added to a main chain represents a mass ratio of a repeating unit, a numerical value added to a side chain represents the number of repeating units)

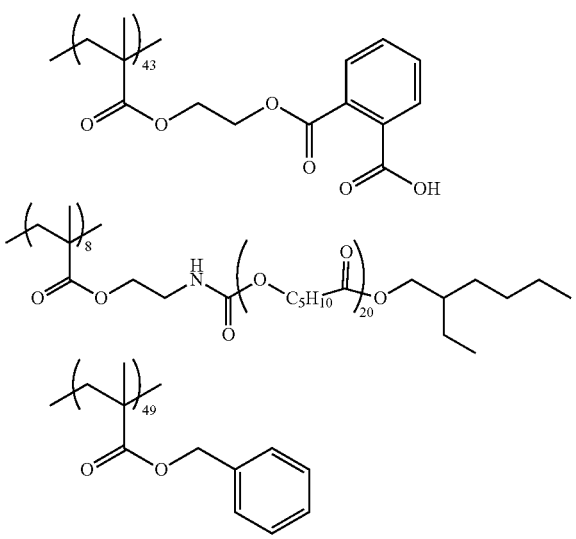

(Pigment Dispersion 1-3)

A mixed solution having a composition shown below was mixed and dispersed using a beads mill (a high-pressure disperser with a pressure reducing mechanism, NANO-3000-10 (manufactured by Nippon BEE Chemical Co., Ltd.)) with zirconia beads having a diameter of 0.3 mm. This way, pigment dispersions were prepared.

| C.I. Pigment Yellow 139 | 14.8 parts by mass |
| Resin (Disperbyk-111, manufactured by BYK Chemie) | 3 parts by mass |
| Resin 12 | 2.2 parts by mass |
| PGMEA | 80 parts by mass |

(Pigment Dispersion 1-4)

A mixed solution having a composition shown below was mixed and dispersed using a beads mill (a high-pressure disperser with a pressure reducing mechanism, NANO-3000-10 (manufactured by Nippon BEE Chemical Co., Ltd.)) with zirconia beads having a diameter of 0.3 mm. This way, pigment dispersions were prepared.

| C.I. Pigment Violet 23 | 14.8 parts by mass |
| Resin (Disperbyk-111, manufactured by BYK Chemie) | 3 parts by mass |
| Resin 12 | 2.2 parts by mass |
| PGMEA | 80 parts by mass |

(Preparation of Red Composition)

9.6 parts by mass of C.I. Pigment Red 254, 4.3 parts by mass of C.I. Pigment Yellow 139, 6.8 parts by mass of a dispersant (Disperbyk-161, manufactured by BYK Chemie), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

The following components were mixed and stirred, and the obtained mixture was filtered through a nylon filter (manufactured by Pall Corporation) having a pore size of 0.45 µm to prepare a Red composition.

| Red Pigment Dispersion | 51.7 parts by mass |
| Resin 102 (40% PGMEA solution) | 0.6 parts by mass |
| Polymerizable Compound 102 | 0.6 parts by mass |
| Photopolymerization initiator (IRGACURE OXE01, manufactured by BASF SE) | 0.3 parts by mass |
| Surfactant 101 | 4.2 parts by mass |
| PGMEA | 42.6 parts by mass |

Polymerizable compound 102: the following compound

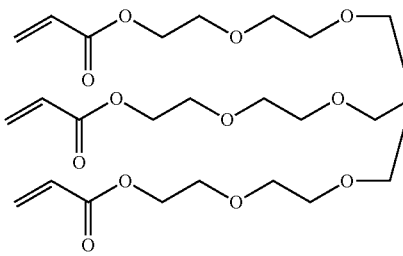
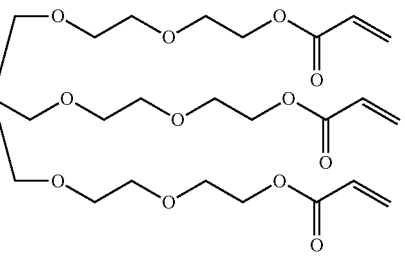

Resin 102: a resin having the following structure (acid value=70 mgKOH/g, Mw=11000, a numerical value added to a main chain represents a mass ratio of a repeating unit)

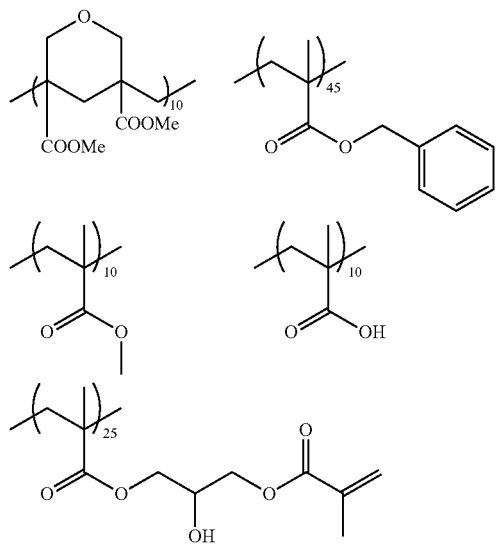

(Preparation of Green Composition)

6.4 parts by mass of C.I. Pigment Green 36, 5.3 parts by mass of C.I. Pigment Yellow 150, 5.2 parts by mass of a dispersant (Disperbyk-161, manufactured by BYK Chemie), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Green pigment dispersion was obtained.

The following components were mixed and stirred, and the obtained mixture was filtered through a nylon filter (manufactured by Pall Corporation) having a pore size of 0.45 μm to prepare a Green composition.

| | |
|---|---|
| Green Pigment Dispersion | 73.7 parts by mass |
| Resin 102 (40% PGMEA solution) | 0.3 parts by mass |
| Polymerizable compound (KAYARAD DPHA, manufactured by Nippon Kayaku Co., Ltd.) | 1.2 parts by mass |
| Photopolymerization initiator (IRGACURE OXE01, manufactured by BASF SE) | 0.6 parts by mass |
| Surfactant 101 | 4.2 parts by mass |
| Ultraviolet absorber (UV-503, manufactured by Daito Chemical Co., Ltd.) | 0.5 parts by mass |
| PGMEA | 19.5 parts by mass |

(Preparation of Blue Composition)

9.7 parts by mass of C.I. Pigment Blue 15:6, 2.4 parts by mass of C.I. Pigment Violet 23, 5.5 parts by mass of a dispersant (Disperbyk-161 (manufactured by BYK Chemie)), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

The following components were mixed and stirred, and the obtained mixture was filtered through a nylon filter (manufactured by Pall Corporation) having a pore size of 0.45 m to prepare a Blue composition.

| | |
|---|---|
| Blue Pigment Dispersion | 44.9 parts by mass |
| Resin 102 (40% PGMEA solution) | 2.1 parts by mass |
| Polymerizable compound (KAYARAD DPHA, manufactured by Nippon Kayaku Co., Ltd.) | 1.5 parts by mass |
| Polymerizable Compound 102 | 0.7 parts by mass |
| Photopolymerization initiator (IRGACURE OXE01, manufactured by BASF SE) | 0.8 parts by mass |
| Surfactant 101 | 4.2 parts by mass |
| PGMEA | 45.8 parts by mass |

(Pattern Formation)

The curable composition according to Example 116 was applied to a silicon wafer using a spin coating method such that the thickness of the formed film was 1.0 μm, was heated using a hot plate at 100° C. for 2 minutes, and then was heated using a hot plate at 200° C. for 5 minutes. Next, a 2 μm Bayer pattern (near infrared cut filter) was formed using a dry etching method.

Next, the Red composition was applied to the Bayer pattern of the near infrared cut filter using a spin coating method such that the thickness of the formed film was 1.0 μm. Next, the silicon wafer was heated using a hot plate at 100° C. for 2 minutes. Next, using an i-ray stepper exposure device FPA-3000 i5+(manufactured by Canon Corporation) at 1000 mJ/cm$^2$, a 2 μm dot pattern was exposed through a mask at 1000 mJ/cm². Next, puddle development was performed at 23° C. for 60 seconds using a tetramethylammonium hydroxide (TMAH) 0.3 mass % aqueous solution. Next, the silicon wafer was rinsed by spin showering, was washed with pure water, and was heated using a hot plate at 200° C. for 5 minutes. As a result, a cured film of the Red composition was patterned on the Bayer pattern of the near infrared cut filter. Likewise, a cured film of the Green composition and a cured film of the Blue composition were sequentially patterned to form red, blue, and green color patterns.

Next, the curable composition for forming an infrared transmitting filter having the composition 101 was applied to the pattern-formed film using a spin coating method such that the thickness of the formed film was 2.0 µm. Next, the silicon wafer was heated using a hot plate at 100° C. for 2 minutes. Next, using an i-ray stepper exposure device FPA-3000 i5+(manufactured by Canon Corporation) at 1000 mJ/cm², a 2 µm Bayer pattern was exposed through a mask at 1000 mJ/cm². Next, puddle development was performed at 23° C. for 60 seconds using a tetramethylammonium hydroxide (TMAH) 0.3 mass % aqueous solution. Next, the silicon wafer was rinsed by spin showering, was washed with pure water, and was heated using a hot plate at 200° C. for 5 minutes. As a result, the infrared transmitting filter was patterned on a portion where the Bayer pattern of the near infrared cut filter was not formed. This filter was incorporated into a solid image pickup element using a well-known method Using the obtained solid image pickup element, a subject was irradiated with light having an emission wavelength of 940 nm emitted from an infrared light emitting diode (infrared LED) light source in a low-illuminance environment (0.001 Lux) to obtain an image. The object was able to be clearly recognized on the image.

Test Example 3

(Preparation of Curable Composition for Forming Infrared Transmitting Filter)

The following components were mixed and stirred, and the obtained mixture was filtered through a nylon filter (manufactured by Pall Corporation) having a pore size of 0.45 µm to prepare a curable composition for forming an infrared transmitting filter.

| | |
|---|---|
| Pigment Dispersion 10-1 | 46.5 parts by mass |
| Pigment Dispersion 10-2 | 37.1 parts by mass |
| Polymerizable Compound 201 | 1.8 parts by mass |
| Resin 201 | 1.1 parts by mass |
| Photopolymerization Initiator 201 | 0.9 parts by mass |
| Surfactant 101 | 4.2 parts by mass |
| Polymerization inhibitor (p-methoxyphenol) | 0.001 parts by mass |
| Silane coupling agent 201 | 0.6 parts by mass |
| PGMEA | 7.8 parts by mass |

(Pigment Dispersion 10-1)

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a pigment dispersion 10-1 was prepared.

| | |
|---|---|
| A mixed pigment including a red pigment (C.I. Pigment Red 254) and a yellow pigment (C.I. Pigment Yellow 139) | 11.8 parts by mass |
| Resin (Disperbyk-111, manufactured by BYK Chemie) | 9.1 parts by mass |
| PGMEA | 79.1 parts by mass |

(Pigment Dispersion 10-2)

A mixed solution having a composition shown below was mixed and dispersed for 3 hours using a beads mill (a high-pressure disperser with a pressure reducing mechanism, NANO-3000-10 (manufactured by Nippon BEE Chemical Co., Ltd.)) in which zirconia beads having a diameter of 0.3 mm were used. As a result, a pigment dispersion 10-2 was prepared.

| | |
|---|---|
| A mixed pigment including a blue pigment (C.I. Pigment Blue 15:6) and a violet pigment (C.I. Pigment Violet 23) | 12.6 parts by mass |
| Resin (Disperbyk-111, manufactured by BYK Chemie) | 2.0 parts by mass |
| Resin 202 | 3.3 parts by mass |
| Cyclohexanone | 31.2 parts by mass |
| PGMEA | 50.9 parts |

Polymerizable compound 201: the following structures (a mixture in which a molar ratio between a left compound and a right compound is 7:3)

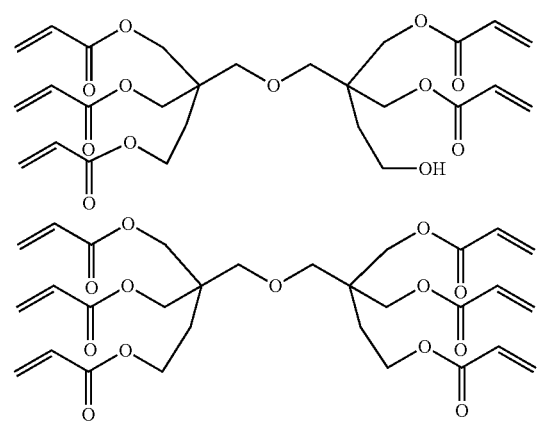

Resin 201: a resin having the following structure (acid value=70 mgKOH/g, Mw=11000, a numerical value added to a main chain represents a mass ratio of a repeating unit)

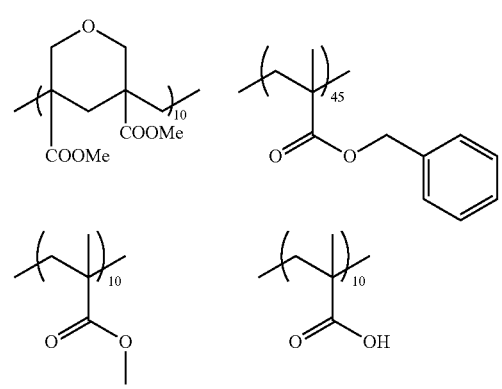

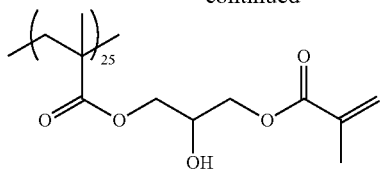

Resin 202: a resin having the following structure (Mw=14000, a numerical value added to a main chain represents a mass ratio of a repeating unit)

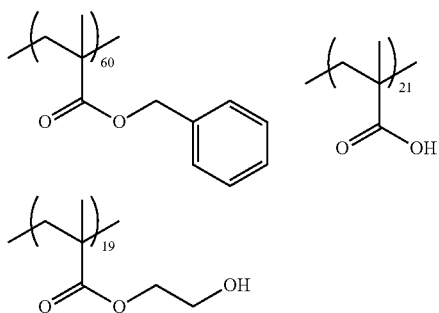

Photopolymerization initiator 201: a compound having the following structure

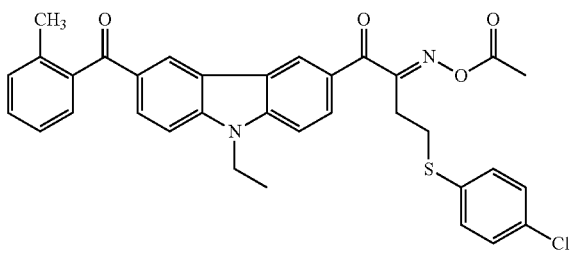 [SMILES: CCn1c2ccc(C(=O)/C(CCSc3ccc(Cl)cc3)=N/OC(C)=O)cc2c2cc(C(=O)c3ccccc3C)ccc21]

Silane coupling agent 201: a compound having the following structure

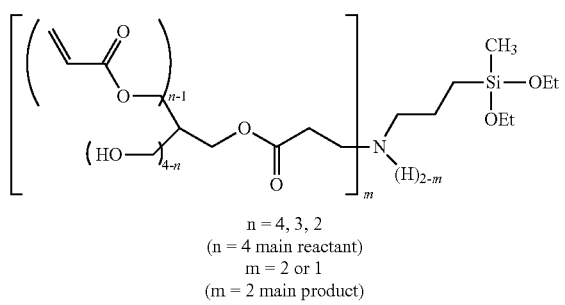

n = 4, 3, 2
(n = 4 main reactant)
m = 2 or 1
(m = 2 main product)

(Pattern Formation)

The curable composition according to Example 112 was applied to a silicon wafer using a spin coating method such that the thickness of the formed film was 1.0 μm, was heated using a hot plate at 100° C. for 2 minutes, and then was heated using a hot plate at 200° C. for 5 minutes. Next, a 2 μm Bayer pattern (near infrared cut filter) was formed using a dry etching method.

Next, the Red composition was applied to the Bayer pattern of the near infrared cut filter using a spin coating method such that the thickness of the formed film was 1.0 μm. Next, the silicon wafer was heated using a hot plate at 100° C. for 2 minutes. Next, using an i-ray stepper exposure device FPA-3000 i5+(manufactured by Canon Corporation) at 1000 mJ/cm$^2$, a 2 μm dot pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering, was washed with pure water, and was heated using a hot plate at 200° C. for 5 minutes. As a result, a cured film of the Red composition was patterned on the Bayer pattern of the near infrared cut filter. Likewise, a cured film of the Green composition and a cured film of the Blue composition were sequentially patterned to form red, blue, and green color patterns.

Next, the curable composition for forming an infrared transmitting filter having the composition 201 was applied to the pattern-formed film using a spin coating method such that the thickness of the formed film was 2.0 μm. Next, the silicon wafer was heated using a hot plate at 100° C. for 2 minutes. Next, using an i-ray stepper exposure device FPA-3000 i5+(manufactured by Canon Corporation) at 1000 mJ/cm$^2$, a 2 μm Bayer pattern was exposed through a mask at 1000 mJ/cm$^2$. Next, puddle development was performed at 23° C. for 60 seconds using a tetramethylammonium hydroxide (TMAH) 0.3 mass % aqueous solution. Next, the silicon wafer was rinsed by spin showering, was washed with pure water, and was heated using a hot plate at 200° C. for 5 minutes. As a result, the infrared transmitting filter was patterned on a portion where the Bayer pattern of the near infrared cut filter was not formed. This filter was incorporated into a solid image pickup element using a well-known method Using the obtained solid image pickup element, a subject was irradiated with light having an emission wavelength of 850 nm emitted from an infrared light emitting diode (infrared LED) light source in a low-illuminance environment (0.001 Lux) to obtain an image. The object was able to be clearly recognized on the image.

<Preparation of Cesium Tungsten Oxide-Containing Composition>

49.84 parts by mass of YMS-01A-2 (cesium tungsten oxide particle dispersion; manufactured by Sumitomo Metal Mining Co., Ltd.), 39.5 parts by mass of the following resin 301 (PGMEA solution having a solid content of 40%), 6.80 parts by mass of KAYARAD DPHA (manufactured by Nippon Kayaku Co., Ltd.), 2.18 parts by mass of IRGACURE 369 (manufactured by BASF SE), and 1.68 parts by mass of PGMEA were mixed and stirred to prepare a cesium tungsten oxide-containing composition.

Resin 301: a resin having the following structure (acid value=70 mgKOH/g, Mw=11000, a numerical value added to a main chain represents a mass ratio of a repeating unit)

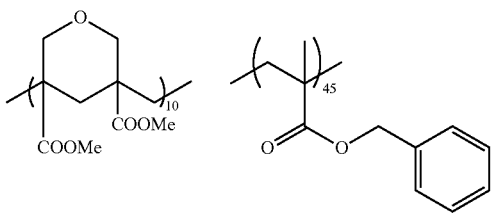

-continued

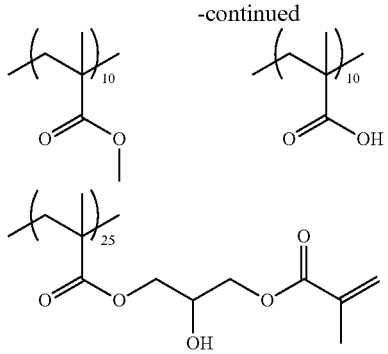

<Preparation of Near Infrared Cut Filter>

Each of the compositions according to Examples 101 to 132 was applied to a glass substrate using a spin coating method and then was heated using a hot plate at 100° C. for 2 minutes. As a result, a coating layer was obtained. The obtained coating layer was exposed using an i-ray stepper or an aligner at an exposure dose of 500 mJ/cm². Next, a curing treatment was further performed on the exposed coating layer using a hot plate at 220° C. for 5 minutes. As a result, a cured film having a thickness of 1.0 μm was obtained. The cesium tungsten oxide-containing composition was applied to the substrate using a spin coating method to a film and then was heated using a hot plate at 100° C. for 2 minutes to obtain a coating layer. The obtained coating layer was exposed using an i-ray stepper or an aligner at an exposure dose of 500 mJ/cm². Next, a curing treatment was further performed on the exposed coating layer using a hot plate at 220° C. for 5 minutes. As a result, a cured film having a thickness of 3.0 μm was obtained. The transmittance of the obtained near infrared cut filter in a wavelength range of 800 to 1300 nm was 10% or lower.

EXPLANATION OF REFERENCES

110: solid image pickup element
111: near infrared cut filter
112: color filter
114: infrared transmitting filter
115: microlens
116: planarizing layer

What is claimed is:
1. A composition comprising:
a pigment;
a pigment derivative; and
a solvent,
wherein the pigment derivative includes a compound represented by the following Formula (1),

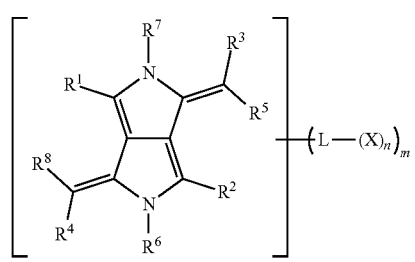

in Formula (1), $R^1$ and $R^2$ each independently represent an alkyl group, an aryl group, or a heteroaryl group, $R^3$, $R^4$, $R^5$, and $R^6$ each independently represent a cyano group, an acyl group, an alkoxycarbonyl group, an alkylsulfinyl group, an arylsulfinyl group, or a heteroaryl group, $R^7$ and $R^8$ each independently represent a hydrogen atom, an alkyl group, an aryl group, a heteroaryl group, —$BR^9R^{10}$, or a metal atom, $R^7$ may form a covalent bond or a coordinate bond with $R^1$, $R^3$, or $R^5$, $R^8$ may form a covalent bond or a coordinate bond with $R^2$, $R^4$, or $R^6$, $R^9$ and $R^{10}$ each independently represent a hydrogen atom, a halogen atom, an alkyl group, an alkenyl group, an aryl group, a heteroaryl group, an alkoxy group, an aryloxy group, or a heteroaryloxy group, $R^9$ and $R^{10}$ may be bonded to each other to form a ring, L represents a group including a combination of a group represented by formulae (L-1) and an alkylene group; a group including a combination of a group represented by formulae (L-1) and an arylene group; a group including a combination of a group represented by formulae (L-1), —$SO_2$—, and an alkylene group; a group including a combination of a group represented by formulae (L-1), —S—, and an alkylene group; a group including a combination of a group represented by formulae (L-1), —O—, and an arylene group; a group including a combination of a group represented by formulae (L-1), —NR'—, —CO—, and an arylene group; a group including a combination of a group represented by formulae (L-1) and —COO—, a group including a combination of a group represented by formulae (L-1) and —OCO—; a group including a combination of a group represented by formulae (L-1), —COO—, and an alkylene group; or a group including a combination of a group represented by formulae (L-1), —OCO—, and an alkylene group, R' represents a hydrogen atom, an alkyl group, or an aryl group,

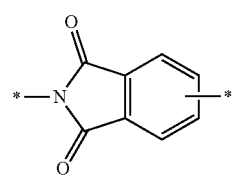

(L-1)

in the formulae (L-1), * represents a direct bond,
X represents an acidic group, a basic group, a group having a salt structure, or a phthalimido group,
m represents an integer of 1 to 10,
n represents an integer of 1 to 10,
in a case where m represents 2 or more, a plurality of L's and a plurality of X's may be different from each other, and
in a case where n represents 2 or more, a plurality of X's may be different from each other.

2. The composition according to claim 1,
wherein X in Formula (1) represents at least one selected from the group consisting of a carboxyl group, a sulfo group, a phthalimido group, and groups represented by the following Formulae (X-1) to (X-9),

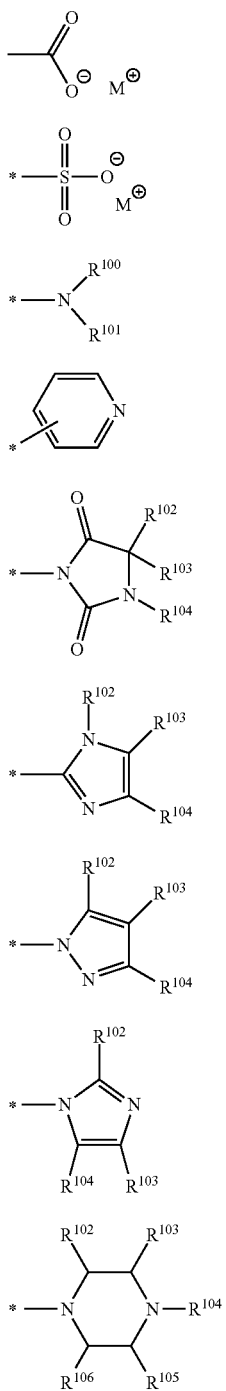

in Formulae (X-1) to (X-9), * represents a direct bond to L of Formula (1), $R^{100}$ to $R^{106}$ each independently represent a hydrogen atom, an alkyl group, an alkenyl group, or an aryl group, $R^{100}$ and $R^{101}$ may be linked to each other to form a ring, and M represents an atom or atomic group constituting an anion and a salt.

3. The composition according to claim 2,
wherein X in Formula (1) represents at least one selected from the group consisting of a carboxyl group, a sulfo group, and a group represented by Formula (X-3).

4. The composition according to claim 1,
wherein the pigment is a compound having an absorption maximum in a wavelength range of 700 to 1200 nm.

5. The composition according to claim 1,
wherein the pigment is a compound represented by the following Formula (PP), (PP)

in Formula (PP), $R^{21}$ and $R^{22}$ each independently represent an alkyl group, an aryl group, or a heteroaryl group,
$R^{23}$, $R^{24}$, $R^{25}$, and $R^{26}$ each independently represent a cyano group, an acyl group, an alkoxycarbonyl group, an alkylsulfinyl group, an arylsulfinyl group, or a heteroaryl group,
$R^{27}$ and $R^{28}$ each independently represent a hydrogen atom, an alkyl group, an aryl group, a heteroaryl group, —$BR^{29}R^{30}$, or a metal atom,
$R^{27}$ may form a covalent bond or a coordinate bond with $R^{21}$, $R^{23}$, or $R^{25}$,
$R^{28}$ may form a covalent bond or a coordinate bond with $R^{22}$, $R^{24}$, or $R^{26}$,
$R^{29}$ and $R^{30}$ each independently represent a hydrogen atom, a halogen atom, an alkyl group, an alkenyl group, an aryl group, a heteroaryl group, an alkoxy group, an aryloxy group, or a heteroaryloxy group, and
$R^{29}$ and $R^{30}$ may be bonded to each other to form a ring.

6. The composition according to claim 1,
wherein a viscosity at 25° C. is 1 to 100 mPa·s.

7. The composition according to claim 1,
wherein an average particle size of the pigment in the composition is 5 to 500 nm.

8. The composition according to claim 1,
wherein a content of the pigment derivative is 1 to 50 parts by mass with respect to 100 parts by mass of the pigment.

9. The composition according to claim 1,
wherein the pigment includes at least two pigments having different absorption maximums.

10. The composition according to claim 1,
wherein a solubility of the pigment in the solvent at 25° C. is 0 to 0.1 g/L.

11. The composition according to claim 1,
wherein a solubility of the compound represented by Formula (1) in the solvent at 25° C. is 0 to 0.1 g/L.

12. The composition according to claim 1, further comprising:
a resin.

13. The composition according to claim 12,
wherein the resin includes a resin having a polycaprolactone structure.

14. A curable composition comprising:
the composition according to claim 1; and
a curable compound.

15. The curable composition according to claim 14, wherein the curable compound is a polymerizable compound, and
the curable composition further comprises a photopolymerization initiator.

16. The curable composition according to claim 14, further comprising:
an alkali-soluble resin.

17. The curable composition according to claim 14, further comprising:
a coloring material that allows transmission of at least a part of light in a near infrared range and shields light in a visible range.

18. A cured film which is formed by curing the curable composition according to claim 14.

19. A solid image pickup element comprising:
the cured film according to claim 18.

20. An infrared sensor comprising:
the cured film according to claim 18.

21. A near infrared cut filter which is formed using the curable composition according to claim 14.

22. A camera module comprising:
a solid image pickup element; and
the near infrared cut filter according to claim 21.

23. An infrared transmitting filter which is formed using the curable composition according to claim 1.

24. The composition according to claim 1, wherein L represents a group including a combination of the group represented by formulae (L-1) and —COO—; a group including a combination of the group represented by formulae (L-1) and —OCO—; a group including a combination of the group represented by formulae (L-1), —COO—, and an alkylene group; or a group including a combination of the group represented by formulae (L-1), —OCO—, and an alkylene group.

* * * * *